(12) United States Patent
Hoki et al.

(10) Patent No.: US 9,352,585 B2
(45) Date of Patent: May 31, 2016

(54) THERMAL PRINT HEAD AND THERMAL PRINTER

(71) Applicant: ROHM CO., LTD., Kyoto-shi, Kyoto (JP)

(72) Inventors: Hideaki Hoki, Kyoto (JP); Tomohiko Horikawa, Kyoto (JP); Shinobu Obata, Kyoto (JP); Tomoharu Horio, Kyoto (JP); Minoru Sakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/980,765

(22) Filed: Dec. 28, 2015

(65) Prior Publication Data

US 2016/0107452 A1 Apr. 21, 2016

Related U.S. Application Data

(63) Continuation of application No. 14/423,336, filed as application No. PCT/JP2013/072864 on Aug. 27, 2013, now Pat. No. 9,248,663.

(30) Foreign Application Priority Data

| Aug. 29, 2012 | (JP) | ................. | 2012-188441 |
| Aug. 29, 2012 | (JP) | ................. | 2012-188442 |
| Aug. 29, 2012 | (JP) | ................. | 2012-188443 |
| Oct. 10, 2012 | (JP) | ................. | 2012-224918 |
| Oct. 10, 2012 | (JP) | ................. | 2012-224919 |
| Apr. 30, 2013 | (JP) | ................. | 2013-095613 |
| Aug. 23, 2013 | (JP) | ................. | 2013-173046 |

(51) Int. Cl.
*B41J 2/335* (2006.01)

(52) U.S. Cl.
CPC .................. *B41J 2/3351* (2013.01)

(58) Field of Classification Search
CPC .... B41J 2/33515; B41J 2/335; B41J 2/33595; B41J 2/3351; B41J 2/33535; B41J 2/345
See application file for complete search history.

(56) References Cited

U.S. PATENT DOCUMENTS

| 5,278,580 | A | 1/1994 | Nishikawa et al. | |
| 6,151,054 | A * | 11/2000 | Shimizu | ............... B41J 2/33515 347/200 |
| 6,335,750 | B2 * | 1/2002 | Horiuchi | ....................... 347/200 |
| 2010/0053294 | A1 * | 3/2010 | Fukumoto | ............ B41J 2/33535 347/200 |
| 2012/0133724 | A1 | 5/2012 | Nishi | |

FOREIGN PATENT DOCUMENTS

| JP | 61-109739 | 7/1986 |
| JP | 4-82750 | 3/1992 |

(Continued)

OTHER PUBLICATIONS

International Search Report, issued in the corresponding International PCT Application No. PCT/JP2013/072864, dated Nov. 26, 2013, 4 pages.

*Primary Examiner* — Kristal Feggins
(74) *Attorney, Agent, or Firm* — Hamre, Schumann, Mueller & Larson, P.C.

(57) ABSTRACT

The object is to provide a thermal print head capable of improving printing quality on a medium. The Solution is to provide a base member 11 including a recess 113a, a heat storage region 2 formed in the recess 113a, a resistor layer 4 formed on the base member 11, and an electrode layer 3 formed on the base member 11 and electrically connected to the resistor layer 4. The resistor layer 4 includes a heating portion 41 spanned between two portions of the electrode layer 3 spaced from each other as viewed in a thickness direction Z of the base member 11. The heating portion 41 is located so as to overlap the recess 113a as viewed in the thickness direction Z. The base member 11 is made of a material having a thermal conductivity of 100 to 300 W/(m·K).

32 Claims, 120 Drawing Sheets

(56) References Cited

FOREIGN PATENT DOCUMENTS

| JP | 5-138908 | 6/1993 |
| JP | 8-315966 | 11/1996 |
| JP | 9-123501 | 5/1997 |
| JP | 11-34374 | 2/1999 |
| JP | 2001-246771 | 9/2001 |
| JP | 2012-51319 | 3/2012 |
| JP | 2012-116065 | 6/2012 |

* cited by examiner

THERMAL PRINT HEAD AND THERMAL PRINTER

TECHNICAL FIELD

The present invention relates to a thermal print head and a thermal printer.

BACKGROUND ART

A thermal print head thus far known includes a substrate, a glaze layer, a heating resistor, and an electrode. Such a thermal print head is disclosed, for example, in Patent Document 1. In the thermal print head according to the document, the glaze layer is formed on the substrate. The glaze layer serves to accumulate heat generated in the heating resistor. The heating resistor is formed on the glaze layer. The heating resistor includes a plurality of heating portions. The heating portions are each spanned between two portions of the electrode spaced from each other. The cover layer is formed of glass for example, so as to cover both of the two portions of the electrode, and also the heating portion spanned between the two portions.

In the thermal print head configured as above, the heat generated by the heating portion may be transmitted through the glaze layer to a region in the glaze layer where another heating portion, adjacent to the first mentioned heating portion, is located. In such a case, an image printed on a printing medium may be blurred.

In the mentioned thermal print head, when the glaze layer is thin the glaze layer is unable to accumulate a sufficient amount of heat out of the heat generated by the heating portion. In this case the image may not be clearly printed on the printing medium. Accordingly, it has been a common approach to form a thicker glaze layer in order to obtain a clear image on the printing medium. However, a high-level technique is required to increase the thickness of the glaze layer.

In addition, when a considerable part of the heat transmitted from the heating portion to the glaze layer escapes to the substrate, a clear image may not be obtained on the printing medium.

With the mentioned thermal print head, the heat generated by the heating portion is transmitted to the printing medium through the cover layer. However, a part of the heat generated by the heating portion is transmitted to the glaze layer, and besides the heat diffuses while being transmitted through the cover layer. Accordingly, it is difficult to efficiently transmit the heat to the printing medium, and therefore the heating portion has to be configured to generate a larger amount of heat. To increase the amount of heat generated by the heating portion, a larger power has to be supplied to the electrode, which constitutes an obstacle against reduction of power consumption in the printing operation.

DOCUMENT OF RELATED ART

Patent Document

Patent Document 1: JP-A-2012-51319

SUMMARY OF THE INVENTION

Technical Problem to be Solved by the Invention

The present invention has been accomplished in view of the foregoing situation, and primarily provides a thermal print head capable of improving printing quality on a printing medium. The present invention has been accomplished in view of the foregoing situation, and primarily provides a thermal print head that suppresses appearance of blur on the printing medium in a printing operation. The present invention has been accomplished in view of the foregoing situation, and primarily provides a thermal print head that simplifies the manufacturing process thereof. The present invention has been accomplished in view of the foregoing situation, and primarily provides a thermal print head and a thermal printer, configured to transmit heat from a heating portion to the printing medium with higher efficiency, thereby reducing power consumption.

Solution to the Problem

In a first aspect, the present invention provides a thermal print head including a base member including a recess, a heat storage region formed in the recess, a resistor layer formed on the base member, and an electrode layer formed on the base member and electrically connected to the resistor layer. The resistor layer includes a heating portion spanned between two portions of the electrode layer spaced from each other as viewed in a thickness direction of the base member. The heating portion is located so as to overlap the recess as viewed in the thickness direction. The base member is made of a material having a thermal conductivity of 100 to 300 W/(m·K).

Preferably, a ratio of a thermal conductivity of a material constituting the heat storage region to the thermal conductivity of the material constituting the base member may be 1:10 to 600.

Preferably, the heat storage region may include a portion protruding from the heating portion in a first direction along a sub scanning direction and a portion protruding from the heating portion in a second direction opposite to the first direction, as viewed in the thickness direction of the base member.

Preferably, the thermal print head may further include a first barrier made of a material lower in thermal conductivity than the material constituting the base member. The base member may include a first groove spaced from the recess in the sub scanning direction, and the first barrier may be formed in the first groove.

Preferably, the first barrier may be spaced from the heating portion in the sub scanning direction, as viewed in the thickness direction of the base member.

Preferably, the first groove may be deeper than a depth of the recess.

Preferably, the first groove may be formed in a shape extending in a main scanning direction.

Preferably, the first barrier may be made of the same material as the material constituting the heat storage region.

Preferably, the thermal print head may further include a second barrier made of a material lower in thermal conductivity than the material constituting the base member. The base member may include a second groove spaced from the recess in the sub scanning direction, the recess may be located between the first groove and the second groove as viewed in the thickness direction of the base member, and the second barrier may be formed in the second groove.

Preferably, the second barrier may be spaced from the heating portion in the sub scanning direction, as viewed in the thickness direction of the base member.

Preferably, the second groove may be deeper than the depth of the recess.

Preferably, the second groove may be formed in a shape extending in the main scanning direction.

Preferably, the second barrier may be made of the same material as the material constituting the heat storage region.

Preferably, the thermal print head may further include an intermediate layer interposed between the heating portion and the heat storage region.

Preferably, the intermediate layer may include a surface oriented toward the heating portion, and the surface may include a flat region located so as to overlap the heating portion as viewed in the thickness direction of the base member.

Preferably, the flat region may be larger in size in the sub scanning direction than the heating portion.

Preferably, the surface of the intermediate layer may include a first curved region continuously extending from the flat region. The first curved region may be formed so as to be closer to the base member at a position more distant from the flat region, and the electrode layer may include a portion located so as to overlap the first curved region, as viewed in the thickness direction of the base member.

Preferably, the surface of the intermediate layer may include a second curved region continuously extending from the flat region, and the flat region may be located between the first curved region and the second curved region. The second curved region may be formed so as to be closer to the base member at a position more distant from the flat region, and the electrode layer may include a portion located so as to overlap the second curved region, as viewed in the thickness direction of the base member.

Preferably, the thermal print head may further include an insulating layer interposed between the electrode layer and the base member.

Preferably, the base member may include a surface including the recess, and the insulating layer may be formed in direct contact with the surface of the base member.

Preferably, the resistor layer may include a first end face oriented to a side in the sub scanning direction, and the insulating layer may include a portion covering the first end face.

Preferably, the resistor layer may include a second end face oriented to a side opposite to the first end face, and the insulating layer may include a portion covering the second end face.

Preferably, the base member may be made of a semiconductor material.

Preferably, the thermal print head may further include a cover layer covering the resistor layer, the electrode layer, and the insulating layer.

Preferably, the thermal print head may further include a circuit board, a plurality of wires, and a resin layer covering the circuit board, the plurality of wires, and the cover layer.

Preferably, the cover layer may include a through window, the electrode layer may include a bonding portion exposed in the through window, and one of the plurality of wires may be bonded to the bonding portion.

Preferably, the resin layer may be formed in direct contact with the cover layer.

Preferably, the thermal print head may further include a driver IC that supplies a current to the electrode layer, the driver IC being mounted inside the base member.

Preferably, the thermal print head may further include a driver IC that supplies a current to the electrode layer, the driver IC being mounted on the circuit board.

Preferably, the insulating layer may be made of $SiO_2$ or $SiAlO_2$.

Preferably, the resistor layer may be made of at least one of polysilicon, $TaSiO_2$, and TiON.

Preferably, the electrode layer may be made of at least one of Au, Ag, Cu, Cr, Al—Si, and Ti.

Preferably, the thermal print head may further include a heat dissipation plate that supports the base member.

Preferably, the heat storage region may include a first portion formed in a shape intruding into the base member.

Preferably, the heat storage region may include a second portion interposed between the first portion and the heating portion.

Preferably, the first portion may include thereinside a plurality of voids.

In a second aspect, the present invention provides a thermal printer including the thermal print head according to the first aspect of the present invention, and a platen roller opposed to the thermal print head.

Other features and advantages of the present invention will become more apparent through detailed description given below with reference to the accompanying drawings.

BRIEF DESCRIPTION OF DRAWINGS

FIG. 88 is a view taken in the direction of arrows LXXVIII-LXXVIII in FIG. 86, with a part seen through.

FIG. 120 is an enlarged fragmentary cross-sectional view of a thermal print head according to an embodiment C2 of the present invention.

MODES FOR CARRYING OUT THE INVENTION

Hereafter, embodiments of the present invention will be described with reference to the drawings.

Embodiment A1

Referring to FIG. 1 to FIG. 27, an embodiment A1 of the present invention will be described.

Figure 1:
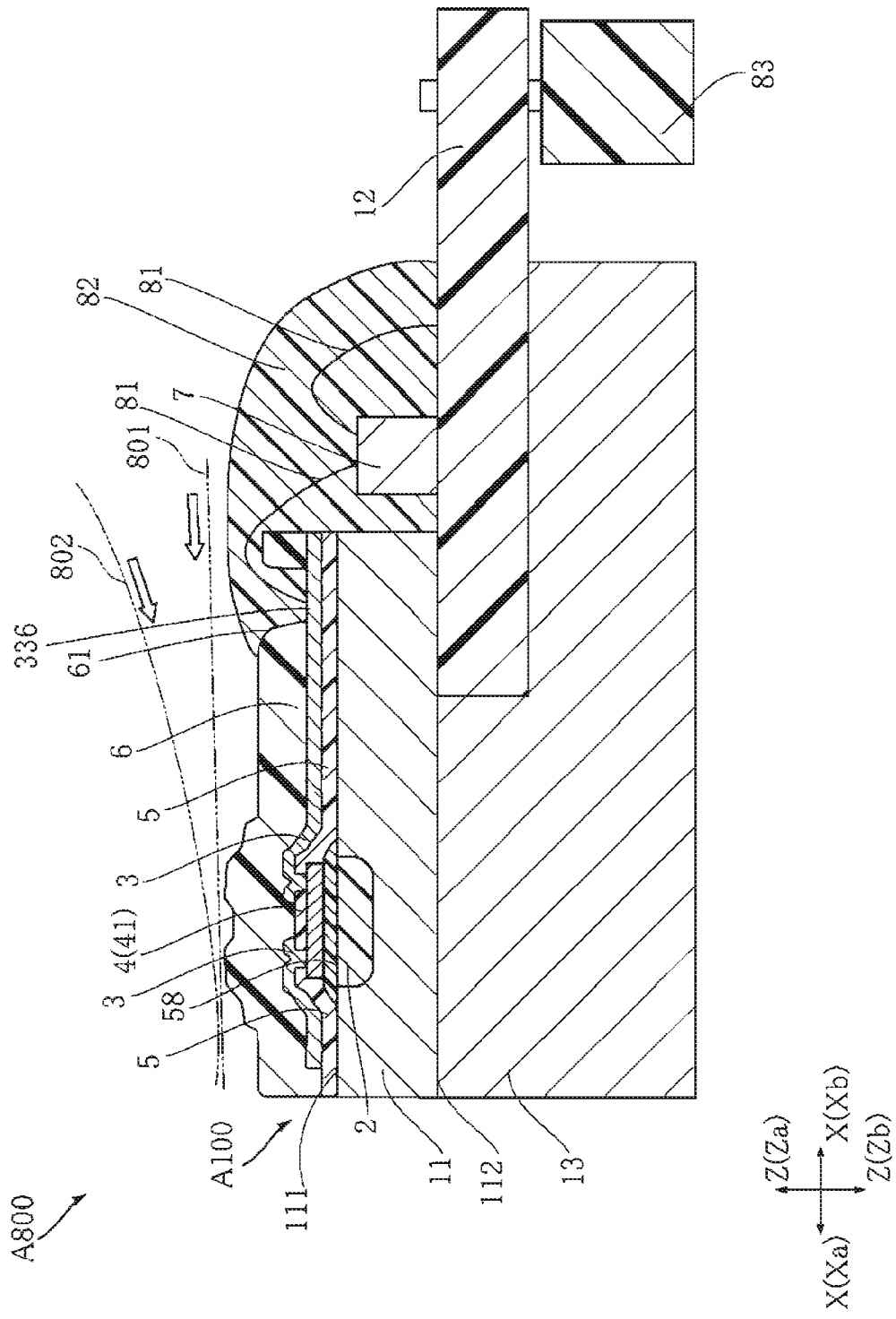
FIG. 1 is a fragmentary cross-sectional view of a thermal printer according to an embodiment A1 of the present invention.

FIG. 1 is a fragmentary cross-sectional view of a thermal printer according to the embodiment A1 of the present invention.

The thermal printer A800 shown in FIG. 1 is configured to perform a printing operation on a printing medium 801. The printing medium 801 may be, for example, a thermal paper for making out a barcode sheet or a receipt. The thermal printer A800 includes a thermal print head A100 and a platen roller 802.

The thermal print head A100 includes a base member 11, a circuit board 12, a heat dissipation plate 13, a heat storage region 2, an electrode layer 3, a resistor layer 4, an insulating layer 5, an intermediate layer 58, a cover layer 6, a driver IC 7, a plurality of wires 81, an encapsulating resin 82, and a connector 83.

The heat dissipation plate 13 serves to emit heat from the base member 11. The heat dissipation plate 13 may be made of, for example, Al, AlN, Ag, or Cu. The heat dissipation plate 13 supports the base member 11 and the circuit board 12.

Figure 2:
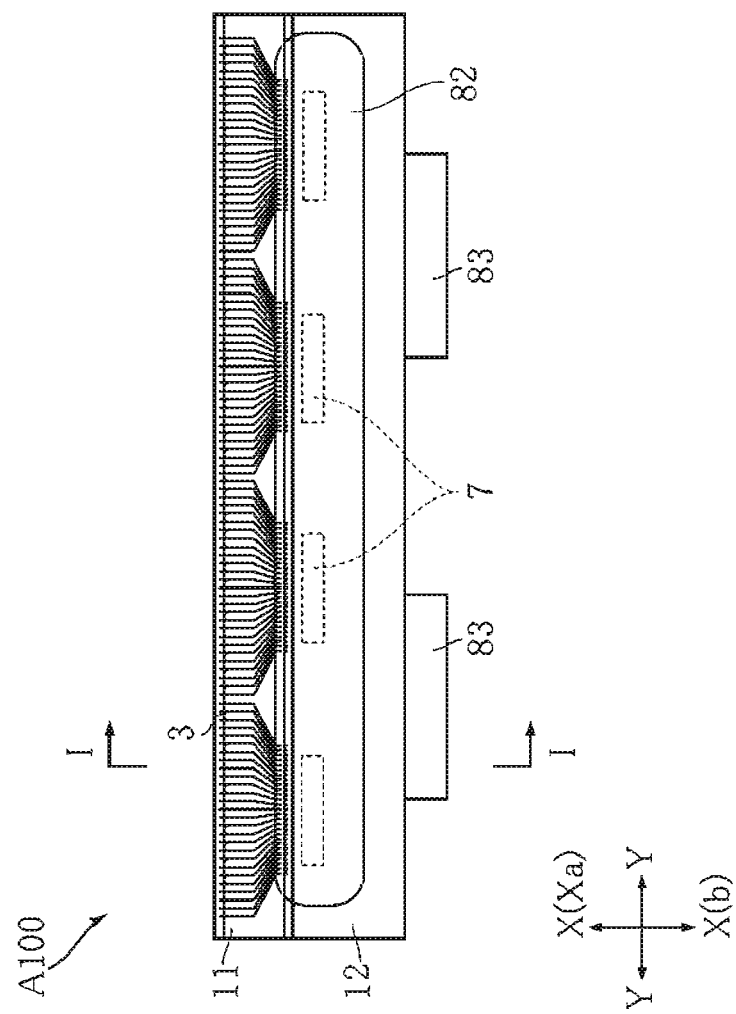
FIG. 2 is a plan view of a thermal print head according to the embodiment A1 of the present invention.

FIG. 2 is a plan view of a thermal print head according to the embodiment A1 of the present invention. FIG. 1 corresponds to a cross-sectional view taken along a line I-I in FIG. 2.

The base member 11 has a plate shape. In this embodiment, the base member 11 is made of a semiconductor material. Examples of the semiconductor material to form the base member 11 include Si, SiC, GaP, GaAs, InP, and GaN. Although in this embodiment the base member 11 is made of a semiconductor material, it is not mandatory to employ a semiconductor material to form the base member 11. For example, the base member 11 may be made of an insulative material such as a ceramic. It is preferable that the material constituting the base member 11 has a thermal conductivity of 100 to 300 W/(m·K). Assuming that the base member 11 is made of Si for example, the thermal conductivity of Si is 140 to 170 W/(m·K). The thermal conductivity of a material constituting the heat storage region 2 (described later) is 0.5 to 5 W/(m·K). Assuming that the heat storage region 2 is made of $SiO_2$ for example, the thermal conductivity of $SiO_2$ is 1.1 W/(m·K). It is preferable that a ratio of the thermal conductivity of the material constituting the heat storage region 2 to the thermal conductivity of the material constituting the base member 11 is 1:10 to 600, and more preferably 1:100 to 200. The base member 11 has a thickness of, for example, 0.625 to 0.720 mm. As shown in FIG. 2, the base member 11 has a flat plate shape extending in a main scanning direction Y. The base member 11 has a width (size in a sub scanning direction X of the base member 11) of, for example, 3 to 20 mm. The size of the base member 11 in the main scanning direction Y is, for example, 10 to 300 mm.

The base member 11 includes a front surface 111 and a rear surface 112. The base member front surface 111 is a flat plane extending in the sub scanning direction X and the main scanning direction Y. The base member front surface 111 has longitudinal sides extending in the main scanning direction Y. The base member front surface 111 is oriented to one side in a thickness direction Z of the base member 11 (hereinafter, Za-side; upward in FIG. 1). In other words, the base member front surface 111 is oriented toward the resistor layer 4. The base member rear surface 112 is a flat plane extending in the sub scanning direction X and the main scanning direction Y. The base member rear surface 112 has longitudinal sides extending in the main scanning direction Y. The base member rear surface 112 is oriented to the opposite side in the thickness direction Z of the base member 11 (hereinafter, Zb-side; downward in FIG. 1). In other words, the base member rear surface 112 is oriented to the side opposite to the resistor layer 4.

Figure 3:
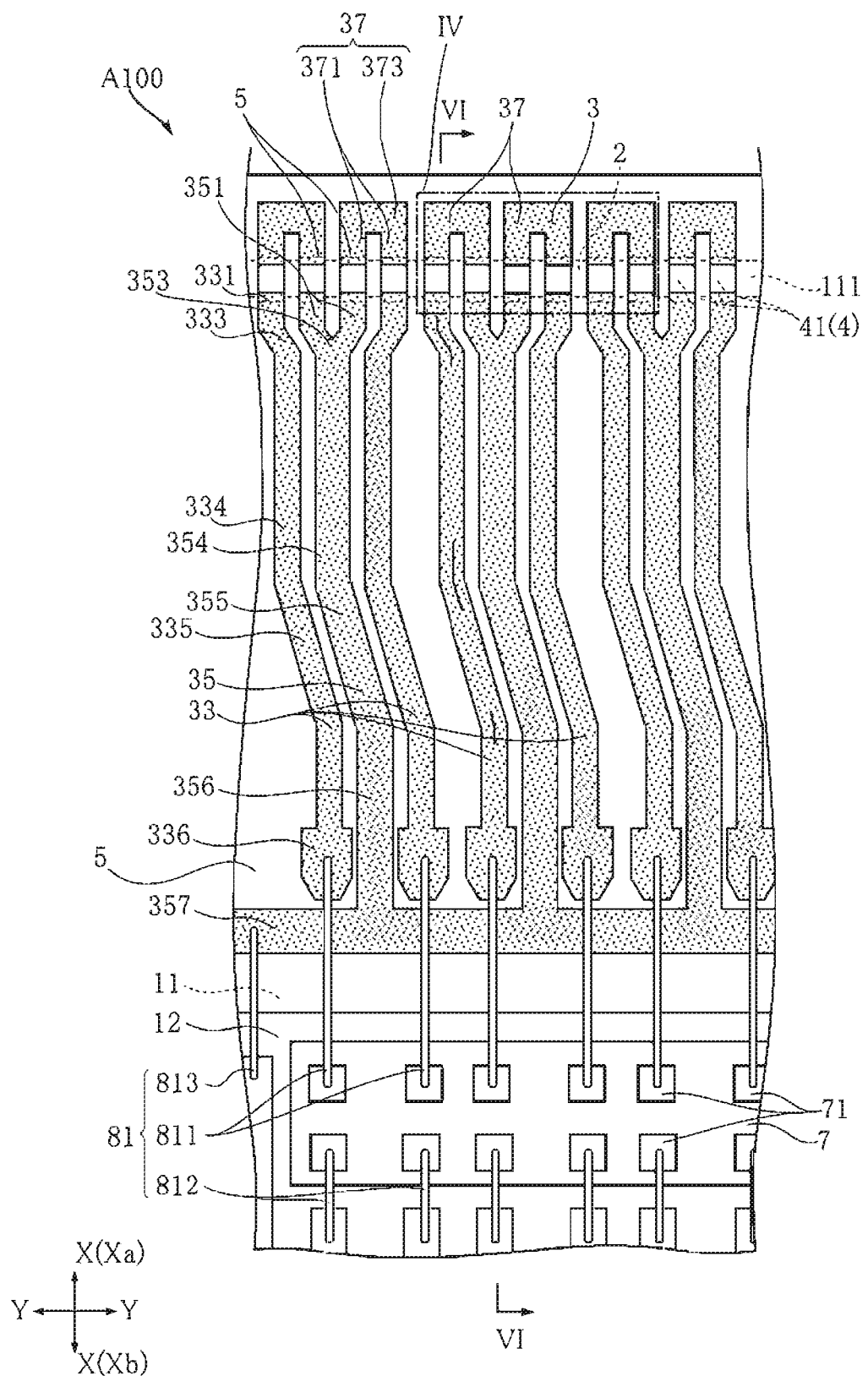
FIG. 3 is an enlarged fragmentary plan view of the thermal print head shown in FIG. 2, with a part of the structure omitted.
Figure 4:
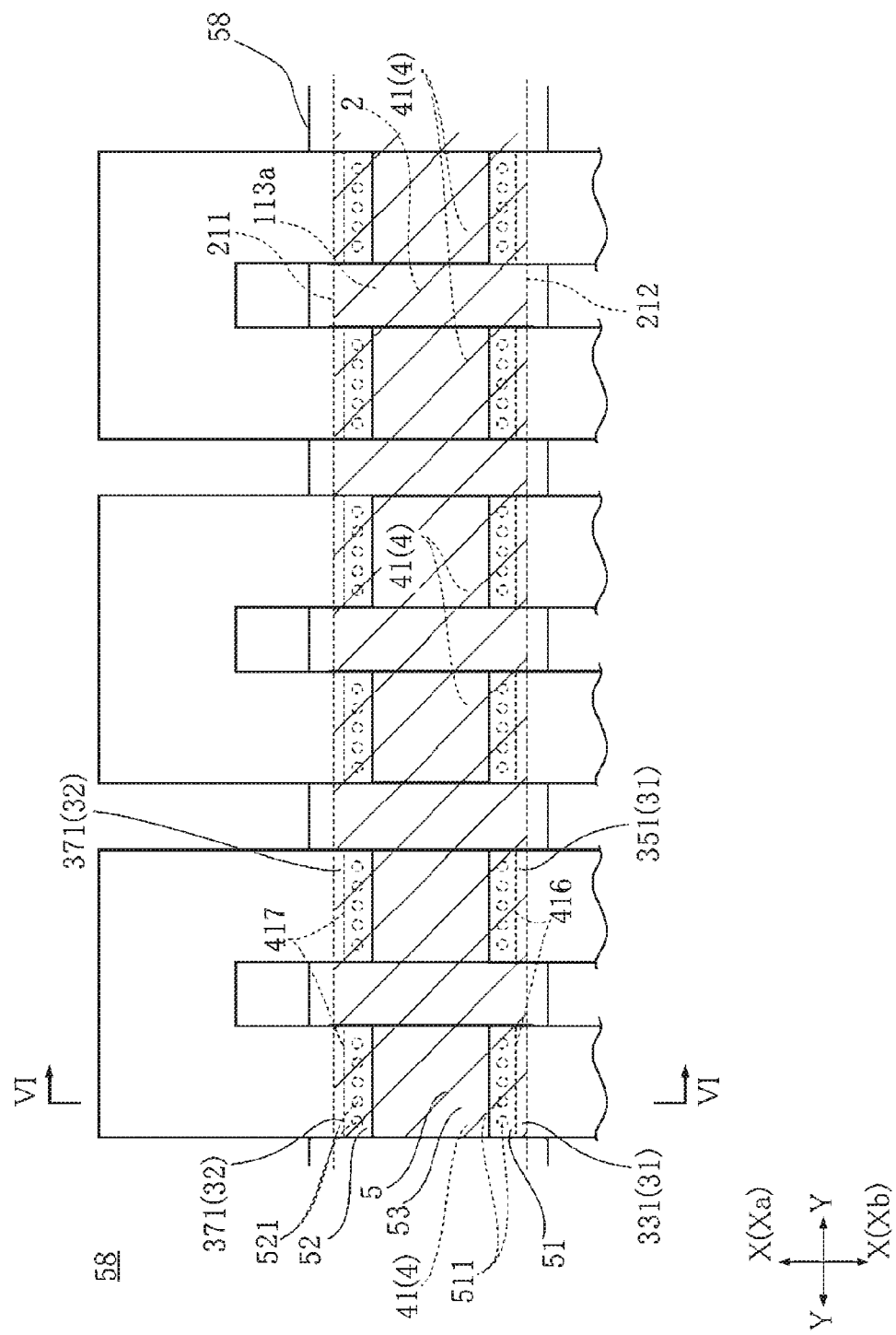
FIG. 4 is an enlarged fragmentary plan view of a region IV in FIG. 3.
Figure 5:
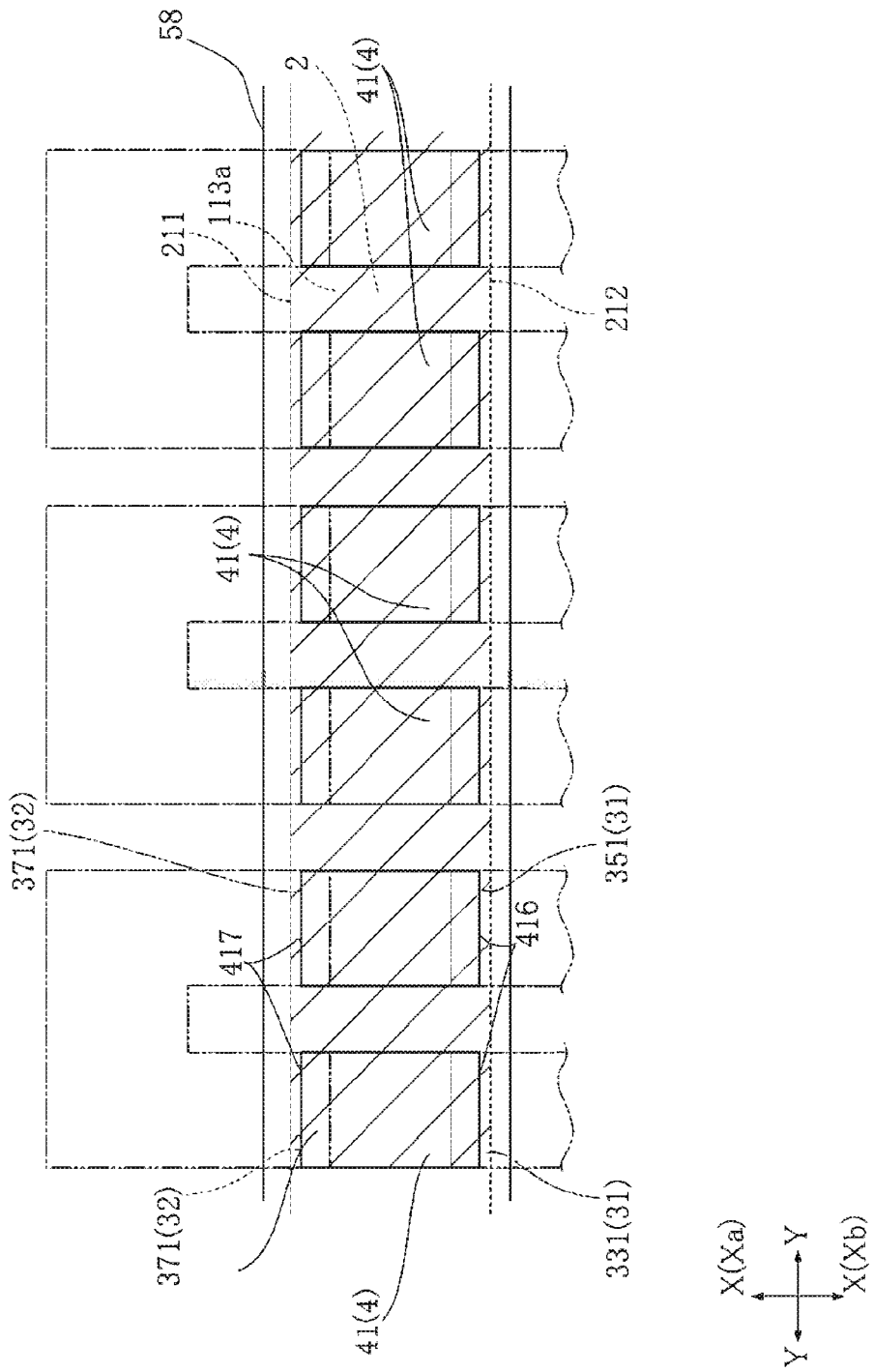
FIG. 5 is a plan view of the same region as FIG. 4, from which the electrode layer and the insulating layer are excluded.
Figure 6:
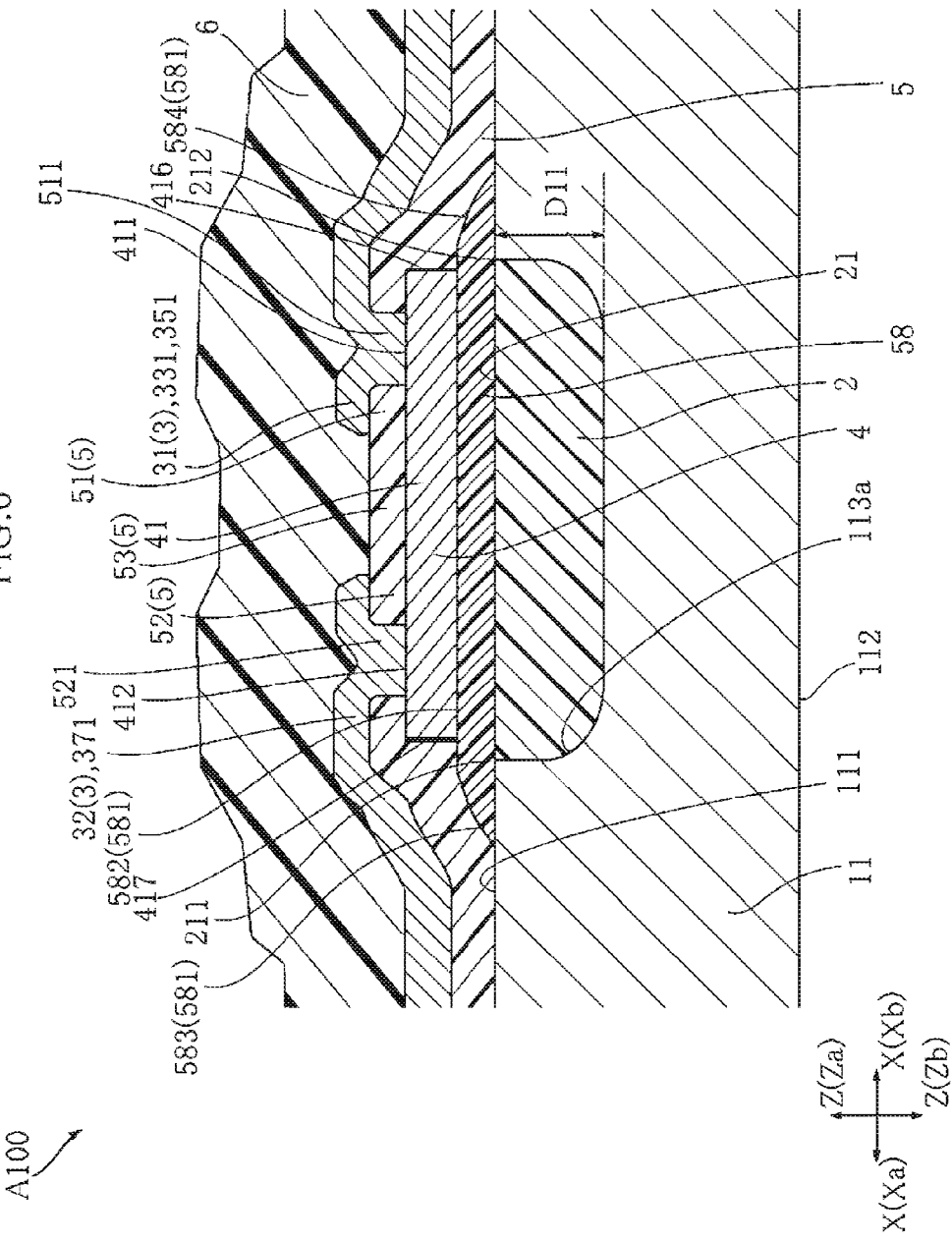
FIG. 6 is an enlarged fragmentary cross-sectional view taken along a line VI-VI in FIG. 3 and FIG. 4.

FIG. 3 is an enlarged fragmentary plan view of the thermal print head shown in FIG. 2, with a part of the structure omitted. FIG. 4 is an enlarged fragmentary plan view of a region IV in FIG. 3. FIG. 5 is a plan view of the same region as FIG. 4, from which the electrode layer and the insulating layer are excluded. FIG. 6 is an enlarged fragmentary cross-sectional view taken along a line VI-VI in FIG. 3 and FIG. 4.

As shown in FIG. 4 to FIG. 6, the base member 11 includes a recess 113a. In FIG. 4 and FIG. 5, the region corresponding to the recess 113a is hatched. The recess 113a is recessed from the base member front surface 111. In this embodiment, the recess 113a has a shape extending in the main scanning direction Y. It is preferable that the recess 113a has a depth D11 (distance between the base member front surface 111 and the bottom face of the recess 113a, in the thickness direction Z) of 10 to 100 μm, and more preferably 10 to 30 μm.

As shown in FIG. 6, the heat storage region 2 is formed on the base member 11. In this embodiment, the heat storage region 2 is formed in the recess 113a. The heat storage region 2 serves to accumulate heat generated by the heating portion 41 (described later). The heat storage region 2 is made of a material lower in thermal conductivity than the material constituting the base member 11. The heat storage region 2 is, for example, made of $SiO_2$. As shown in FIG. 6, the heat storage region 2 includes a surface 21. The heat storage region surface 21 is oriented to the Za-side. In other words, the heat storage region surface 21 is oriented toward the resistor layer 4. In this embodiment, the heat storage region surface 21 is substantially flush with the base member front surface 111.

The heat storage region surface 21 includes a first edge 211 and a second edge 212. The first edge 211 corresponds to an end portion of the heat storage region surface 21 on a first side Xa, which is one of the sides in the sub scanning direction X. The second edge 212 corresponds to the opposite end on a second side Xb in the sub scanning direction X. The first edge 211 and the second edge 212 extend in the main scanning direction Y.

The electrode layer 3 shown in FIG. 1, FIG. 3, and FIG. 6 is formed on the base member 11. In FIG. 3, the electrode layer 3 is hatched for the sake of clarity. The electrode layer 3 is stacked on the resistor layer 4. In this embodiment, the resistor layer 4 is interposed between the electrode layer 3 and the heat storage region 2. The electrode layer 3 is electrically connected to the resistor layer 4. The electrode layer 3 provides a path for supplying power to the resistor layer 4. Examples of the material to form the electrode layer 3 include Au, Ag, Cu, Cr, Al—Si, and Ti. Unlike this embodiment, the electrode layer 3 may be interposed between the heat storage region 2 and the resistor layer 4.

As shown in FIG. 4 and FIG. 5, the electrode layer 3 includes a first conductive portion 31 and a second conductive portion 32. The first conductive portion 31 and the second conductive portion 32 are spaced from each other. The clearance between the first conductive portion 31 and the second conductive portion 32 is, for example, 105 μm.

In this embodiment, as shown in FIG. 3, the electrode layer 3 includes a plurality of individual electrodes 33 (FIG. 3 illustrates six), a common electrode 35, and a plurality of intermediate electrodes 37 (FIG. 3 illustrates six). Further details are as described hereunder. The following pattern of the electrode layer 3 is merely exemplary, and different patterns may be adopted.

The individual electrodes 33 are not electrically connected to each other. Accordingly, different potentials can be applied to the respective individual electrodes 33, when the printer incorporated with the thermal print head A100 is in use. The individual electrodes 33 each include a belt-like portion 331, a bent portion 333, a linear portion 334, an oblique portion 335, and a bonding portion 336. As shown in FIG. 4 and FIG. 5, the individual electrode belt-like portion 331 constitutes the first conductive portion 31 in the electrode layer 3, and extend in a belt-like shape in the sub scanning direction X. The belt-like portions 331 are stacked on the resistor layer 4. The bent portion 333 continuously extends from the individual electrode belt-like portion 331, and is inclined with respect to both of the main scanning direction Y and the sub scanning direction X. The individual electrode linear portion 334 straightly extends in the sub scanning direction X. The individual electrode oblique portion 335 extends in a direction inclined with respect to both of the main scanning direction Y and the sub scanning direction X. The bonding portion 336 is a section where the wires 81 are to be bonded. In this embodiment, the individual electrode belt-like portion 331, the bent portion 333, the individual electrode linear portion 334, and the individual electrode oblique portion 335 have a width of approximately 47.5 μm for example, and the bonding portion 336 has a width of, for example, approximately 80 μm.

The common electrode 35 assumes the reverse polarity with respect to the plurality of individual electrodes 33, when the printer incorporated with the thermal print head A100 is in use. The common electrode 35 includes a plurality of belt-like portions 351, a plurality of branched portions 353, a plurality of linear portions 354, a plurality of oblique portions 355, a plurality of extending portions 356, and a stem portion 357. The common electrode belt-like portions 351 each extend in a belt-like shape in the sub scanning direction X. In the common electrode 35, as shown in FIG. 4 and FIG. 5, the common electrode belt-like portions 351 constitute the first conductive portion 31 in the electrode layer 3, and are spaced from each other in the main scanning direction Y but electrically connected to each other. The common electrode belt-like portions 351 are stacked on the resistor layer 4. The common electrode belt-like portions 351 are spaced from the individual electrode belt-like portions 331 in the main scanning direction Y. In this embodiment, a pair of common electrode belt-like portions 351 adjacent to each other is located between two belt-like portions 331. The plurality of common electrode belt-like portions 351 and the plurality of individual electrode belt-like portions 331 are aligned in the main scanning direction Y. The branched portion 353 is formed in a Y-shape so as to connect the pair of common electrode belt-like portions 351 to a single common electrode linear portion 354. The common electrode linear portion 354 straightly extends in the sub scanning direction X. The common electrode oblique portion 355 extends in a direction inclined with respect to both of the main scanning direction Y and the sub scanning direction X. The extending portion 356 continuously extends from the common electrode oblique portion 355 in the sub scanning direction X. The stem portion 357 has a belt-like shape extending in the main scanning direction Y, and the extending portions 356 are connected thereto. In this embodiment, the common electrode belt-like portion 351, the common electrode linear portion 354, the common electrode oblique portion 355, and the extending portion 356 have a width of, for example, approximately 47.5 μm.

The intermediate electrodes 37 each electrically intermediate between one of the plurality of individual electrodes 33 and the common electrode 35. The intermediate electrodes 37 each connect two heating portions 41 adjacent to each other in the main scanning direction Y out of the plurality of heating portions 41 (described later). The intermediate electrodes 37 each include a pair of belt-like portions 371 and a joint portion 373. As shown in FIG. 4 and FIG. 5, the intermediate electrode belt-like portions 371 each constitute the second conductive portion 32 in the electrode layer 3, and extend in a belt-like shape in the sub scanning direction X. Thus, the second conductive portion 32 and the first conductive portion 31 in the electrode layer 3 are spaced from each other, in the sub scanning direction X this embodiment. The intermediate electrode belt-like portions 371 are spaced from each other in the main scanning direction Y. The intermediate electrode belt-like portions 371 are stacked on the resistor layer 4. The intermediate electrode belt-like portions 371 are located on the side opposite to the belt-like portions 331 and 351 in the sub scanning direction X, on the resistor layer 4. One of the pair of intermediate electrode belt-like portions 371 in each of the intermediate electrodes 37 is spaced from one of the plurality of common electrode belt-like portions 351 in the sub scanning direction X. The other of the pair of intermediate electrode belt-like portions 371 in each of the intermediate electrode 37 is spaced from one of the plurality of belt-like portions 331, in the sub scanning direction X. The joint portions 373 each extend in the main scanning direction Y. The joint portions 373 are each connected to the pair of intermediate electrode belt-like portions 371 in one of the intermediate electrodes 37. Thus, the intermediate electrode belt-like portions 371 constituting a pair are electrically connected to each other, in each of the intermediate electrodes 37.

It is not mandatory that the electrode layer 3 includes the intermediate electrodes 37. Instead, for example, the electrode layer 3 may include a plurality of individual electrodes and a common electrode located adjacent to the individual electrodes.

The resistor layer 4 shown in FIG. 1 and FIG. 3 to FIG. 6 is formed on the base member 11. In this embodiment, as shown in FIG. 4 and FIG. 5, the resistor layer 4 includes a plurality of rectangular portions. In the resistor layer 4, a portion where a current from the electrode layer 3 is applied generates heat. The heat thus generated forms printing dots. The resistor layer 4 is made of a material having higher resistivity than the material constituting the electrode layer 3. Examples of the material to form the resistor layer 4 include polysilicon, $TaSiO_2$, and TiON. In this embodiment, the resistor layer 4 is doped with an ion (for example, boron) so as to adjust the resistivity. The resistor layer 4 has a thickness of, for example, 0.2 μm to 1 μm.

As shown in FIG. 4 to FIG. 6, the resistor layer 4 includes a first end face 416 and a second end face 417.

The first end face 416 is oriented to the side opposite to the second conductive portion 32 (intermediate electrode belt-like portion 371), i.e., to the right in FIG. 6. The second end face 417 is oriented to the side opposite to the first conductive portion 31 (individual electrode belt-like portion 331 or common electrode belt-like portion 351), i.e., to the left in FIG. 6.

The resistor layer 4 includes a plurality of heating portions 41 that generate heat when the thermal print head A100 is in use. The heating portions 41 are each spanned between two portions of the electrode layer 3 spaced from each other. In this embodiment, the heating portions 41 are each spanned between the first conductive portion 31 and the second conductive portion 32, as viewed in the thickness direction Z of the base member 11. The heating portions 41 are aligned in one direction (main scanning direction Y).

As shown in FIG. 5 and FIG. 6, the heating portions 41 are each located so as to overlap the recess 113a, as viewed in the thickness direction Z of the base member 11. In this embodiment, the heat storage region 2 includes, as viewed in the thickness direction Z of the base member 11, a portion protruding from the heating portion 41 to the first side Xa in the sub scanning direction X. In other words, in FIG. 6 the left end portion of the heat storage region 2 is on the left of the left end portion of the heating portion 41. Accordingly, in a view in the thickness direction Z of the base member 11, the first edge 211 of the base member front surface 111 is located ahead of the heating portion 41 to the first side Xa. Likewise, the heat storage region 2 includes, as viewed in the thickness direction Z of the base member 11, a portion protruding from the heating portion 41 to the second side Xb in the sub scanning direction X. In other words, in FIG. 6 the right end portion of the heat storage region 2 is on the right of the right end portion of the heating portion 41. Accordingly, in a view in the thickness direction Z of the base member 11, the second edge 212 of the base member front surface 111 is located ahead of the heating portion 41 to the second side Xb.

As shown in FIG. 6, the heating portions 41 each include a first abutment portion 411 and a second abutment portion 412. The first abutment portion 411 is in contact with the first conductive portion 31 of the electrode layer 3. The second abutment portion 412 is in contact with the second conductive portion 32 of the electrode layer 3.

As shown in FIG. 6, the intermediate layer 58 is interposed between the heating portion 41 and the heat storage region 2. To be more detailed, the intermediate layer 58 is in direct contact with the heating portion 41 and the heat storage region 2. In this embodiment, the intermediate layer 58 is made of an insulative material. Examples of the insulative material to form the intermediate layer 58 include $SiO_2$ and polyimide. Unlike this embodiment, the intermediate layer 58 may be made of a conductive material. The intermediate layer 58 has a thickness (size in the thickness direction Z of the base member 11) is, for example, 10 to 100 μm.

The intermediate layer 58 includes a surface 581. The intermediate layer surface 581 is oriented toward the heating portion 41. The intermediate layer surface 581 includes a flat region 582, a first curved region 583, and a second curved region 584.

The flat region 582 is located so as to overlap the heating portion 41 as viewed in the thickness direction Z of the base member 11. It is preferable that the flat region 582 is larger in size in the sub scanning direction X than the heating portion 41. The first curved region 583 continuously extends from the flat region 582. The first curved region 583 comes closer to the base member 11 at a position farther from the flat region 582. In this embodiment, the first curved region 583 is in contact with the base member front surface 111. The electrode layer 3 includes a portion located so as to overlap the first curved region 583 as viewed in the thickness direction Z of the base member 11. The second curved region 584 continuously extends from the flat region 582. The flat region 582 is located between the second curved region 584 and the first curved region 583. The second curved region 584 comes closer to the base member 11 at a position farther from the flat region 582. In this embodiment, the second curved region 584 is in contact with the base member front surface 111. The electrode layer 3 includes a portion located so as to overlap the second curved region 584 as viewed in the thickness direction Z of the base member 11.

Unlike this embodiment, the intermediate layer 58 may be excluded from the thermal print head A100.

As shown in FIG. 6, the insulating layer 5 is interposed between the electrode layer 3 and the base member 11. In this embodiment, the insulating layer 5 covers a region of the base member front surface 111 other than the region where the intermediate layer 58 is provided. The insulating layer 5 is in direct contact with the base member front surface 111. The insulating layer 5 includes a portion covering the first end face 416 of the resistor layer 4, and a portion covering the second end face 417 of the resistor layer 4.

The insulating layer 5 includes a portion interposed between the heating portion 41 and the electrode layer 3. Examples of the material to form the insulating layer 5 include $SiO_2$ and $SiAlO_2$. The insulating layer 5 includes a first interposed portion 51, a second interposed portion 52, and a middle portion 53. As shown in FIG. 6, the first interposed portion 51 is interposed between the first conductive portion 31 and the heating portion 41. The second interposed portion 52 is interposed between the second conductive portion 32 and the heating portion 41. The middle portion 53 is located between the first interposed portion 51 and the second interposed portion 52 as viewed in the thickness direction Z of the base member 11. The middle portion 53 is continuous with the first interposed portion 51 and the second interposed portion 52.

As shown in FIG. 4 and FIG. 6, the first interposed portion 51 includes one or more first openings 511 in this embodiment. FIG. 4 illustrates the first opening 511 in a circular shape, however the first opening 511 may be formed in different shapes, for example in a rectangular shape. Although FIG. 4 illustrates a plurality of first openings 511 in the first interposed portion 51, the first interposed portion 51 may only include one first opening 511. The first abutment portion 411 of the heating portion 41 is located so as to overlap the first opening 511. In this embodiment, further, the first opening 511 includes a part of the first conductive portion 31, as shown in FIG. 6.

In this embodiment, the second interposed portion 52 includes one or more second openings 521. FIG. 4 and FIG. 6 illustrate the second opening 521 in a circular shape, however the second opening 521 may be formed in different shapes, for example in a rectangular shape. Although FIG. 4 illustrates a plurality of second openings 521 in the second interposed portion 52, the second interposed portion 52 may only include one second opening 521. The second abutment portion 412 of the heating portion 41 is located so as to overlap the second opening 521. In this embodiment, further, the second opening 521 includes a part of the second conductive portion 32, as shown in FIG. 6.

Unlike this embodiment, the insulating layer 5 may be formed without the portion interposed between the heating portion 41 and the electrode layer 3.

The cover layer 6 shown in FIG. 1 and FIG. 6 covers the electrode layer 3, the resistor layer 4, and the insulating layer 5, so as to protect the electrode layer 3, the resistor layer 4, and the insulating layer 5. The cover layer 6 is made of an insulative material. Examples of the insulative material to form the cover layer 6 include polyimide, polyamide, polyethylene, SiN and $SiO_2$. In this embodiment, the cover layer 6 is in direct contact with the electrode layer 3 and the insulating layer 5. The cover layer 6 has a thickness of, for example, 1 to 20 μm.

The cover layer 6 includes a plurality of through windows 61 (FIG. 1 illustrates one). In each of the through windows 61, the bonding portion 336 is exposed.

The circuit board 12 shown in FIG. 1 is, for example, a printed circuit board. The circuit board 12 includes a base member layer and a non-illustrated wiring layer stacked thereon. For example, the base member may be formed of a glass epoxy resin and the wiring layer may be formed of Cu.

The driver IC 7 shown in FIG. 1 and FIG. 2 serves to supply a potential to each of the individual electrodes 33 and control a current supplied to the heating portion 41. When the potential is supplied to each of the individual electrodes 33, a voltage is applied between the common electrode 35 and each of the individual electrodes 33, and a current selectively flows to the heating portions 41. The driver IC 7 is mounted on the circuit board 12. As shown in FIG. 3, the driver IC 7 includes a plurality of pads 71 which are aligned, for example, in two rows.

The plurality of wires 81 shown in FIG. 1 and FIG. 3 are formed of a conductive material such as Au. Among the plurality of wires 81, wires 811 are bonded to the driver IC 7 and to the electrode layer 3. To be more detailed, the wires 811 are each bonded to one of the pads 71 of the driver IC 7 and one of the bonding portions 336. Accordingly, the driver IC 7 and each of the individual electrodes 33 are electrically connected to each other. As shown in FIG. 3, wires 812 in the plurality of wires 81 are each bonded to one of the pads 71 of the driver IC 7, and to the wiring layer of the circuit board 12. Accordingly, the driver IC 7 and the connector 83 are electrically connected to each other through the wiring layer. As shown in FIG. 3, wires 813 in the plurality of wires 81 are bonded to the stem portion 357 of the common electrode 35, and to the wiring layer of the circuit board 12. Accordingly, the common electrode 35 and the wiring layer are electrically connected to each other.

The encapsulating resin 82 shown in FIG. 1 is formed of, for example, a black resin. The encapsulating resin 82 covers the driver IC 7, the plurality of wires 81, and the cover layer 6, so as to protect the drive: IC 7 and the plurality of wires 81. The encapsulating resin 82 is in direct contact with the cover layer 6. The connector 83 is fixed to the circuit board 12. The connector 83 serves to introduce power from outside to the thermal print head A100.

Hereunder, an example of the method of use of the thermal print head A100 will be briefly described.

The thermal print head A100 is incorporated in the thermal printer A800, to be put to use. As shown in FIG. 1, the thermal print head A100 is opposed to the platen roller 802, in thermal printer A800. When the thermal printer A800 is used, the platen roller 802 rotates to thereby feed the printing medium 801 in the sub scanning direction X between the platen roller 802 and the heating portions 41 at a constant velocity. The printing medium 801 is pressed by the platen roller 802 against the portion of the cover layer 6 covering the heating portions 41. To each of the plurality of individual electrodes 33 shown in FIG. 3, the driver IC 7 selectively supplies a potential. Accordingly, a voltage is applied between the common electrode 35 and each of the individual electrodes 33. Then a current selectively flows to the plurality of heating portions 41, so as to generate heat. The heat generated by the heating portions 41 is transmitted to the printing medium 801 through the cover layer 6. Accordingly, a plurality of dots are printed on a first line region linearly extending in the main scanning direction Y on the printing medium 801. The heat generated by the heating portions 41 is also transmitted to the heat storage region 2, to be accumulated therein.

As the platen roller 802 rotates further, the printing medium 801 continues to be fed in the sub scanning direction X at a constant velocity. Then the printing is performed on a second line region, adjacent to the first line region, linearly extending in the main scanning direction Y on the printing medium 801, as in the printing operation on the first line region. During the printing on the second line region, the heat accumulated in the heat storage region 2 is also transmitted to the printing medium 801 in addition to the heat generated by the heating portions 41. The printing on the second line region is thus performed. The printing on the printing medium 801 can thus be performed by printing a plurality of dots on each of the line regions on the printing medium 801 linearly extending in the main scanning direction Y.

Hereunder, an example of the manufacturing method of the thermal print head A100 will be briefly described. In this embodiment, the thermal print head A100 is manufactured primarily through a semiconductor process.

Figure 7:
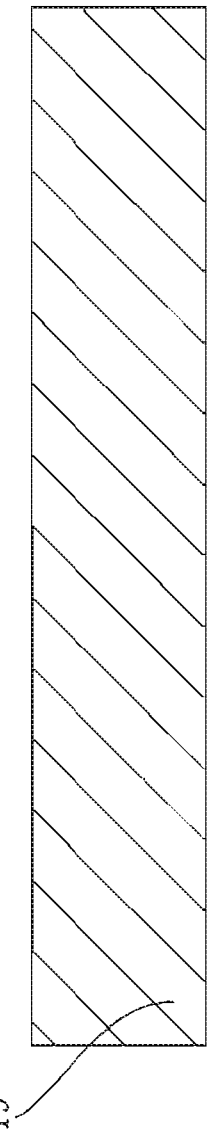
FIG. 7 is a cross-sectional view showing a step in the manufacturing process of the thermal print head according to the embodiment A1 of the present invention.
Figure 8:
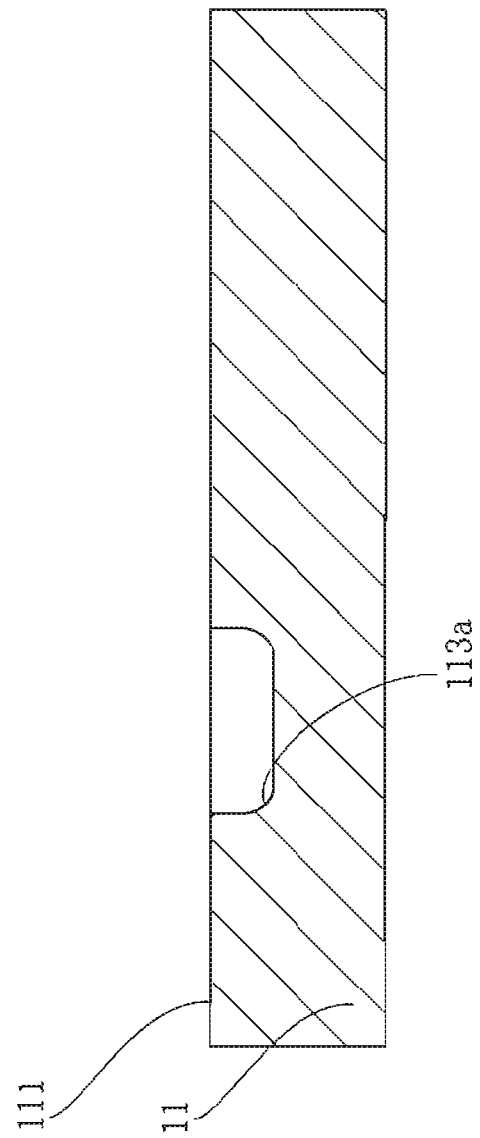
FIG. 8 is a cross-sectional view showing a step subsequent to FIG. 7.
Figure 9:
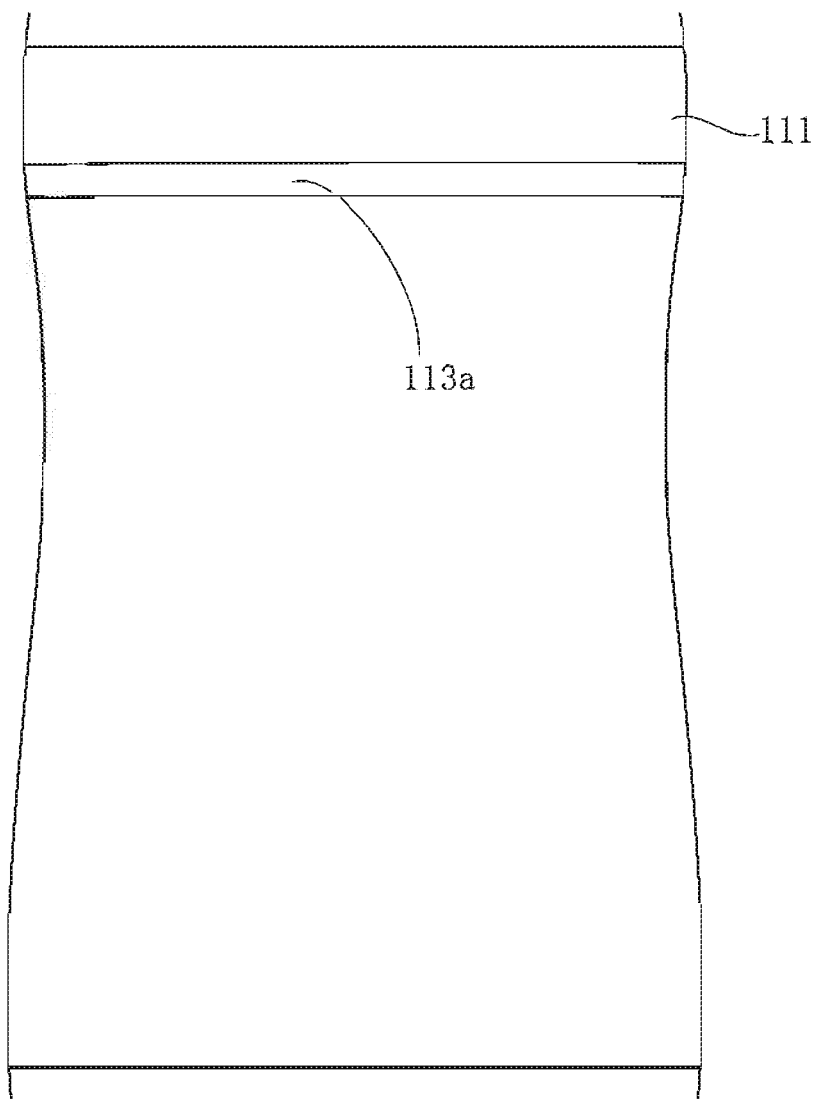
FIG. 9 is an enlarged fragmentary plan view showing a state obtained through the step of FIG. 8.
Figure 10:
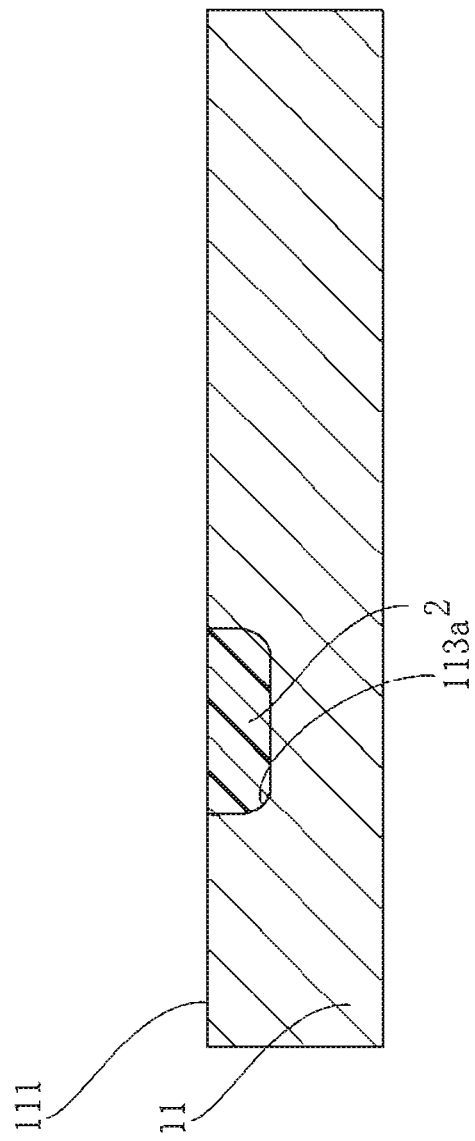
FIG. 10 is a cross-sectional view showing a step subsequent to FIG. 8.

Referring first to FIG. 7, a semiconductor substrate 19 is prepared. In this embodiment, the semiconductor substrate 19 is made of Si. Then a recess 113a is formed in the semiconductor substrate 19 to obtain the base member 11, as shown in FIG. 8 and FIG. 9. The recess 113a may be formed in the semiconductor substrate 19, for example, by etching. Referring to FIG. 10, the heat storage region 2 is formed in the recess 113a. The heat storage region 2 may be formed, for example, by sputtering, CVD, or printing.

Figure 11:
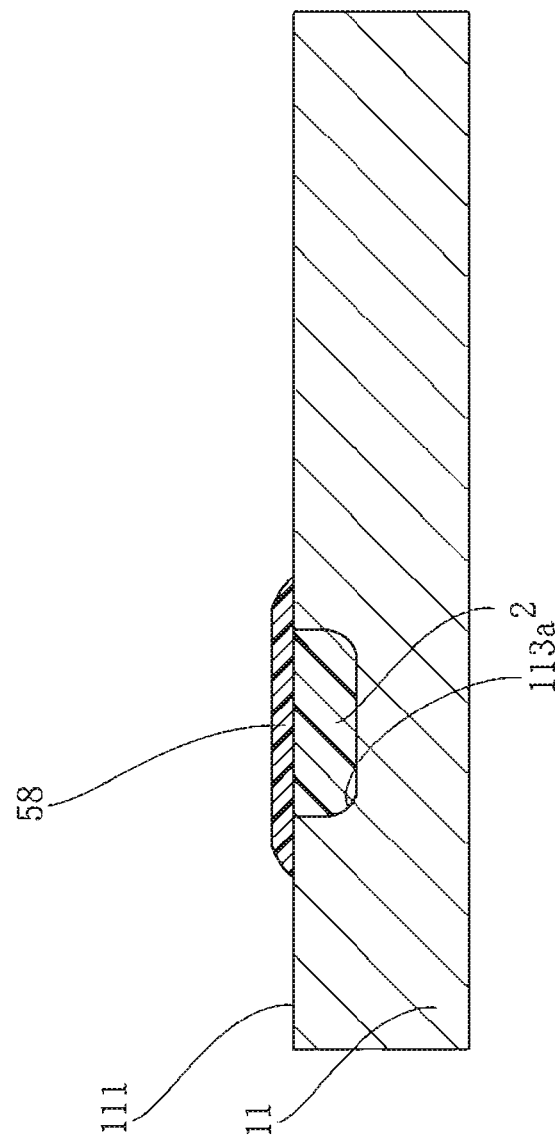
FIG. 11 is a cross-sectional view showing a step subsequent to FIG. 10.

Proceeding to FIG. 11, the intermediate layer 58 is formed on the base member front surface 111 and the heat storage region surface 21. The intermediate layer 58 may be formed, for example, by CVD or sputtering. Unlike this embodiment, the intermediate layer 58 and the heat storage region 2 may be formed at the same time.

Figure 12:
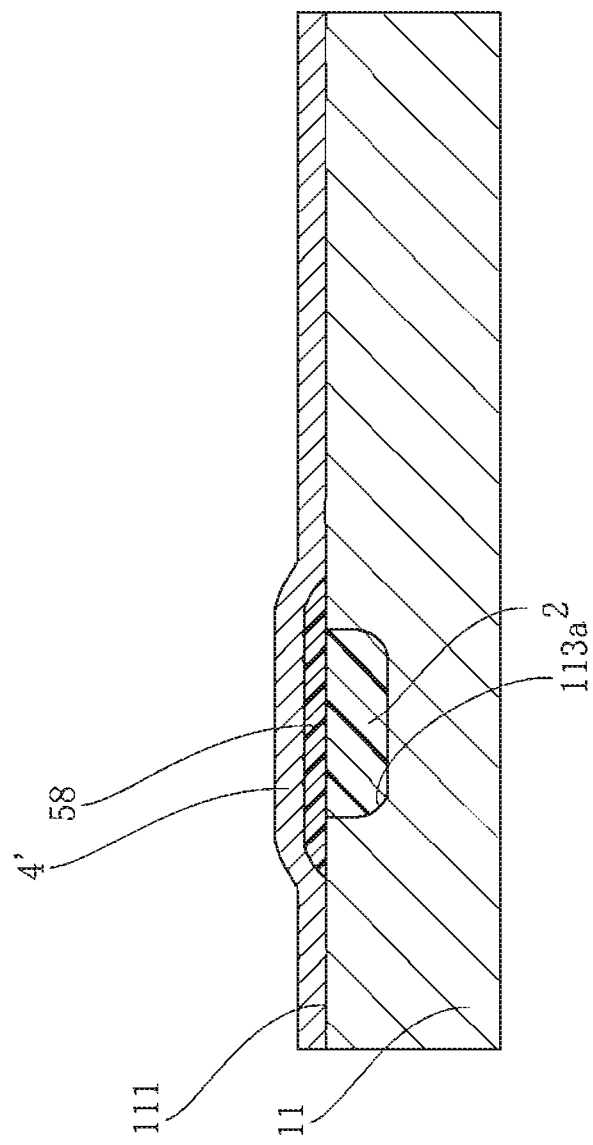
FIG. 12 is a cross-sectional view showing a step subsequent to FIG. 11.
Figure 13:
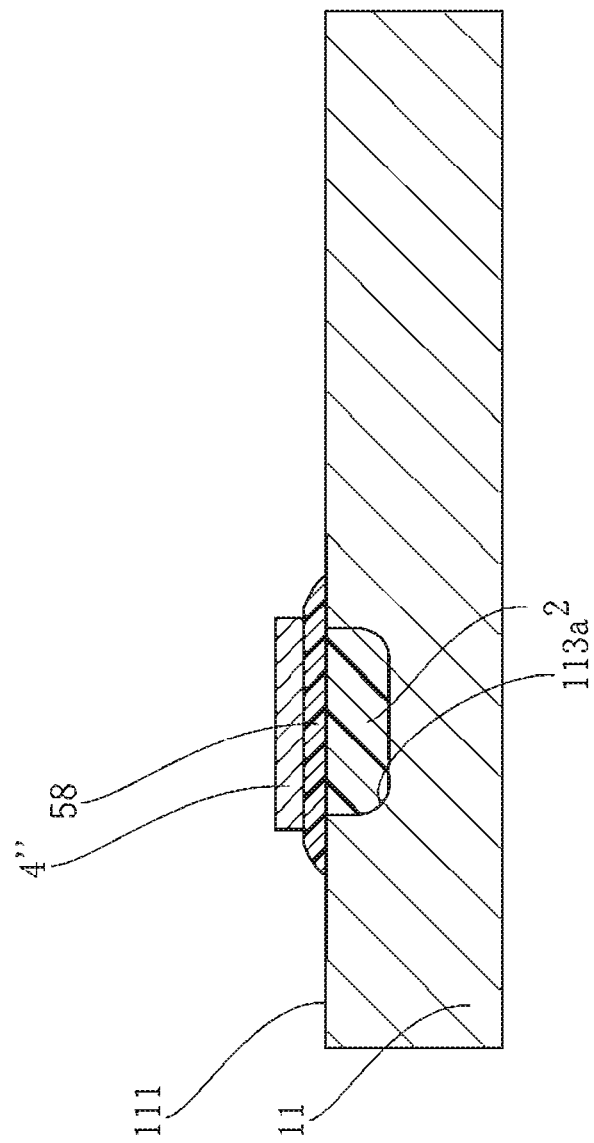
FIG. 13 is a cross-sectional view showing a step subsequent to FIG. 12.
Figure 14:
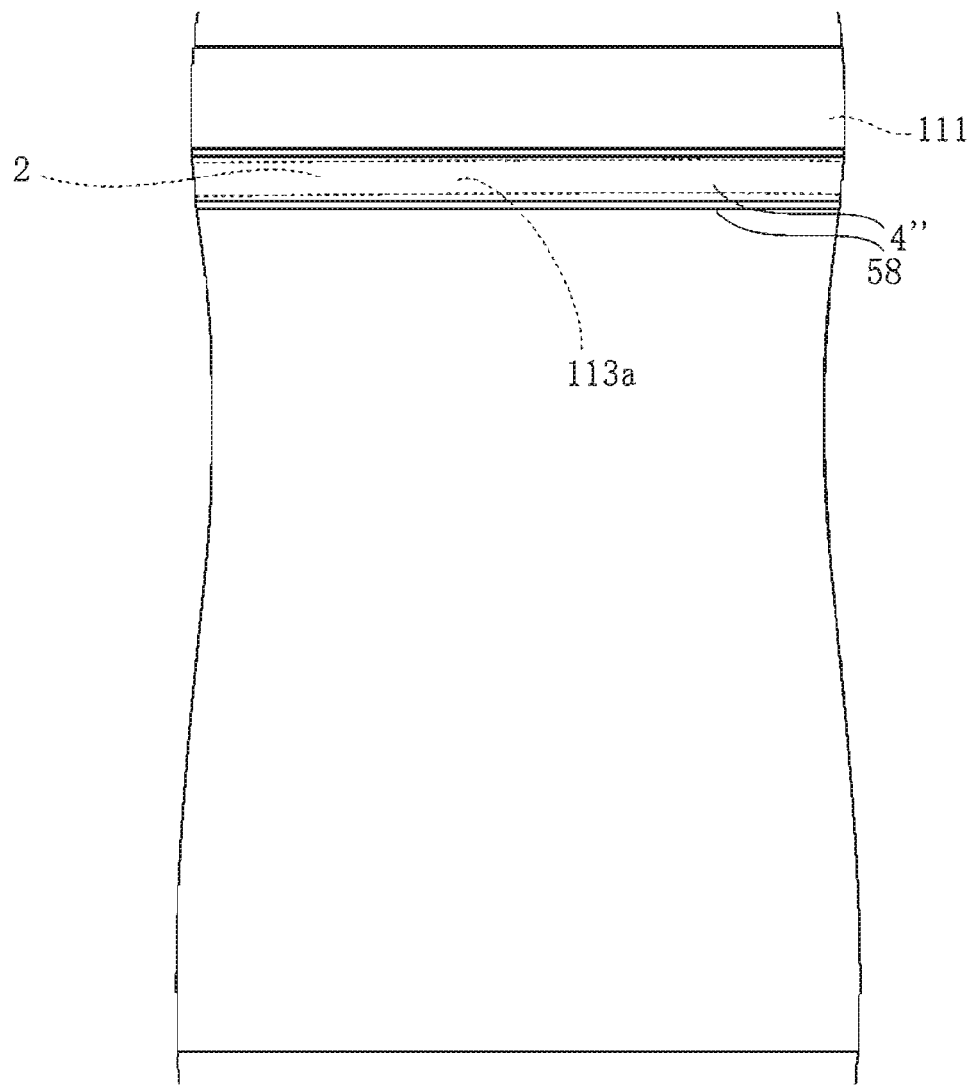
FIG. 14 is an enlarged fragmentary plan view showing a state obtained through the step of FIG. 13.

Referring then to FIG. 12, a resistor layer 4' is formed. The resistor layer 4' may be formed, for example, by CVD or sputtering. The resistor layer 4' is formed over the entirety of the surface of the base member 11. Then etching is performed on the resistor layer 4' so as to form a resistor layer 4" as shown in FIG. 13 and FIG. 14. For the etching of the resistor layer 4', a photolithography process may be employed. As shown in FIG. 14, the resistor layer 4" extends in a belt-like shape in one direction in this embodiment. Then the resistor layer 4" is doped with ion (unshown) so as to grant a desired resistivity to the resistor layer 4.

Figure 15:
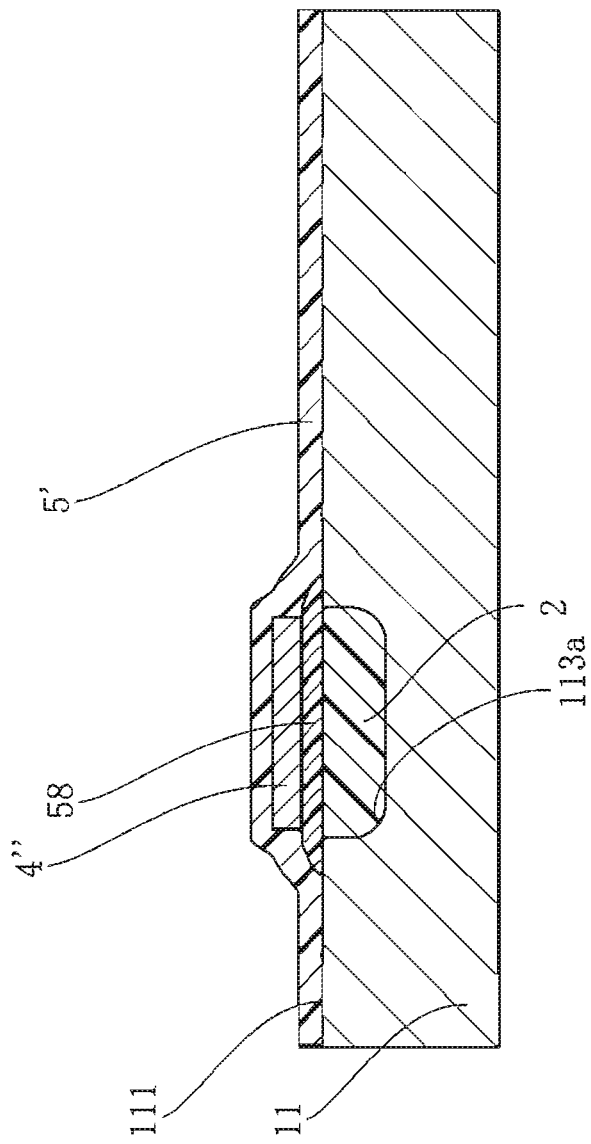
FIG. 15 is a cross-sectional view showing a step subsequent to FIG. 13.
Figure 16:
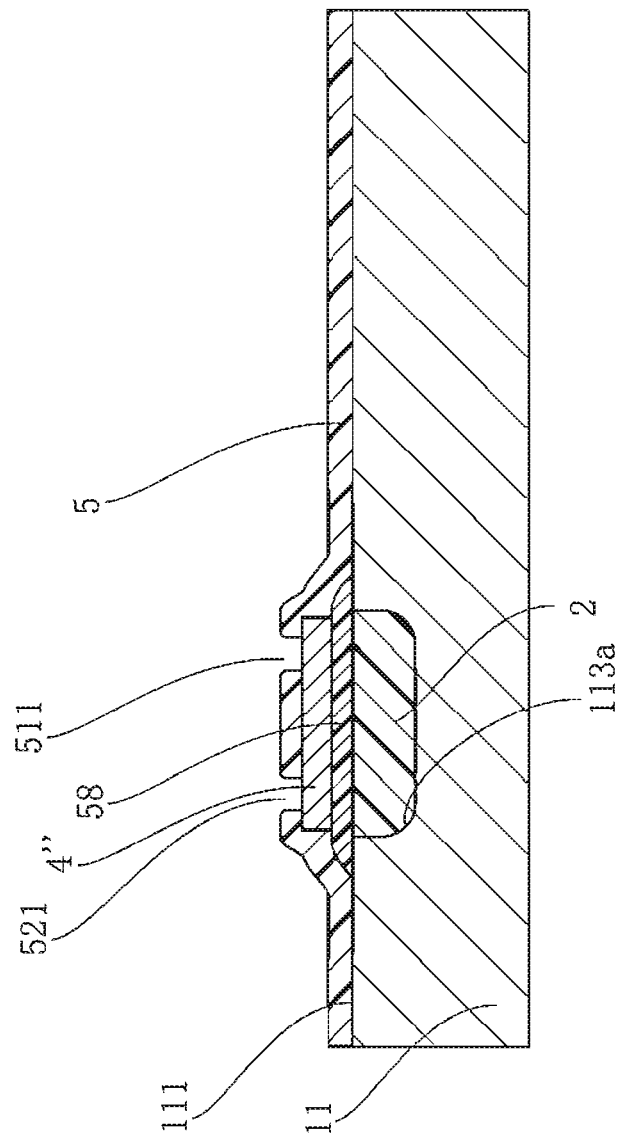
FIG. 16 is a cross-sectional view showing a step subsequent to FIG. 15.

Proceeding to FIG. 15, an insulating layer 5' is formed. The insulating layer 5' may be formed, for example, by CVD or sputtering. Then as shown in FIG. 16, etching is performed on the insulating layer 5' so as to form the insulating layer 5. Through the etching process of the insulating layer 5', the first opening 511 and the second opening 521 are also formed.

Figure 17:
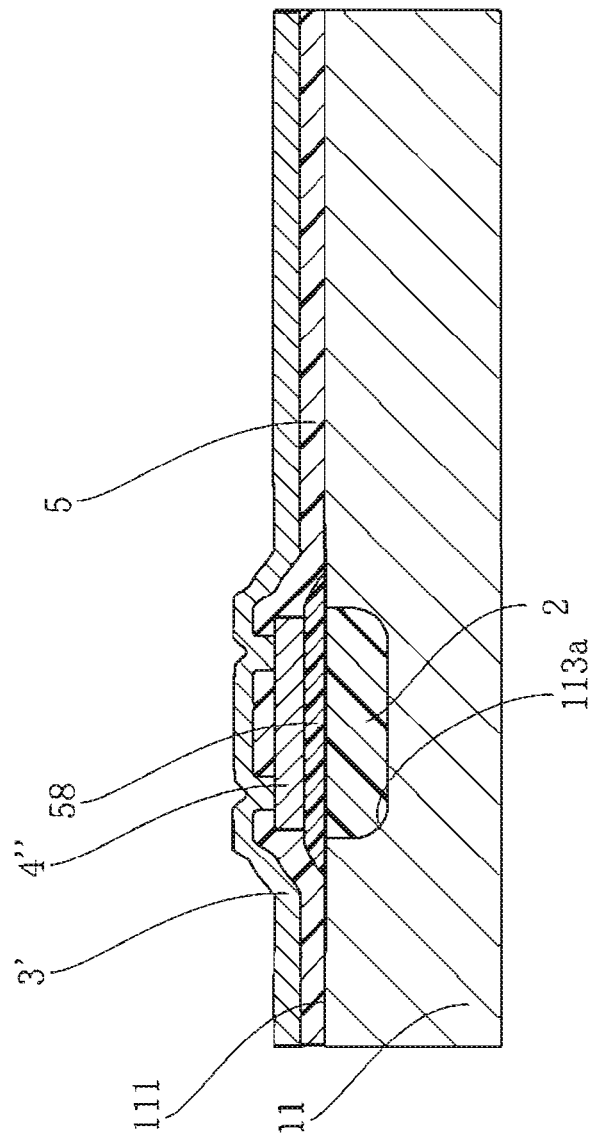
FIG. 17 is a cross-sectional view showing a step subsequent to FIG. 16.
Figure 18:
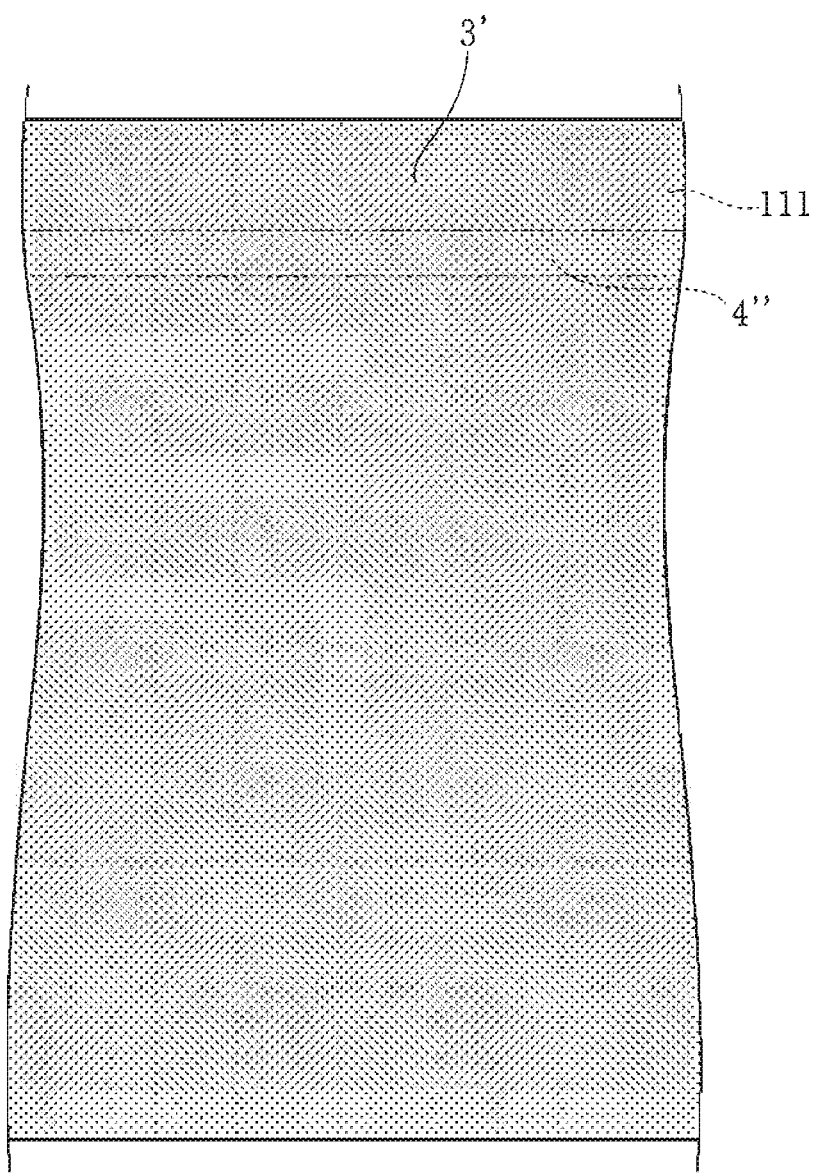
FIG. 18 is an enlarged fragmentary plan view showing a state obtained through the step of FIG. 17.
Figure 19:
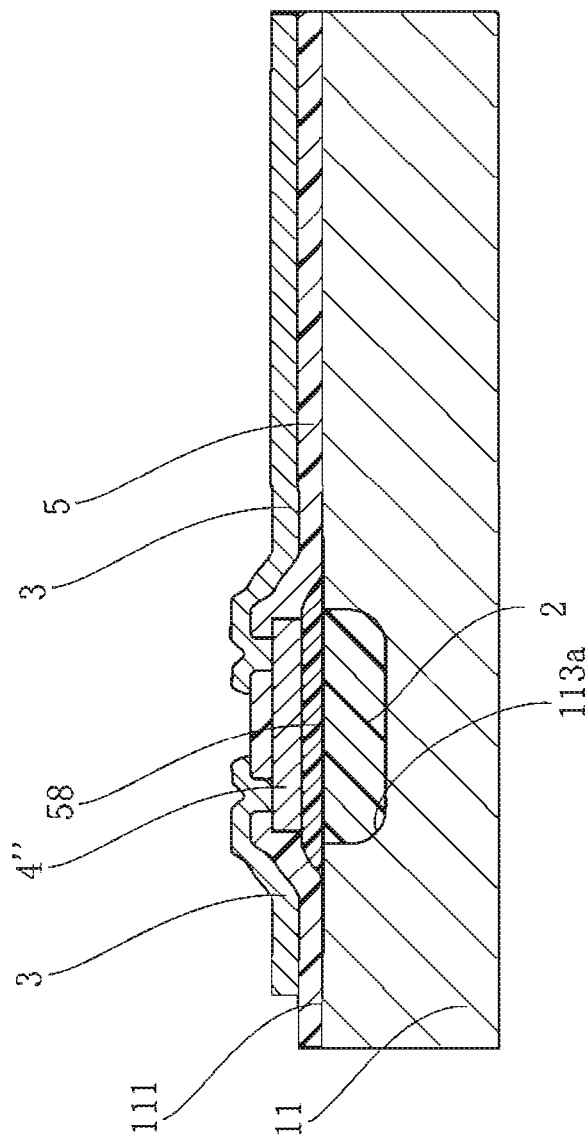
FIG. 19 is a cross-sectional view showing a step subsequent to FIG. 17.
Figure 20:
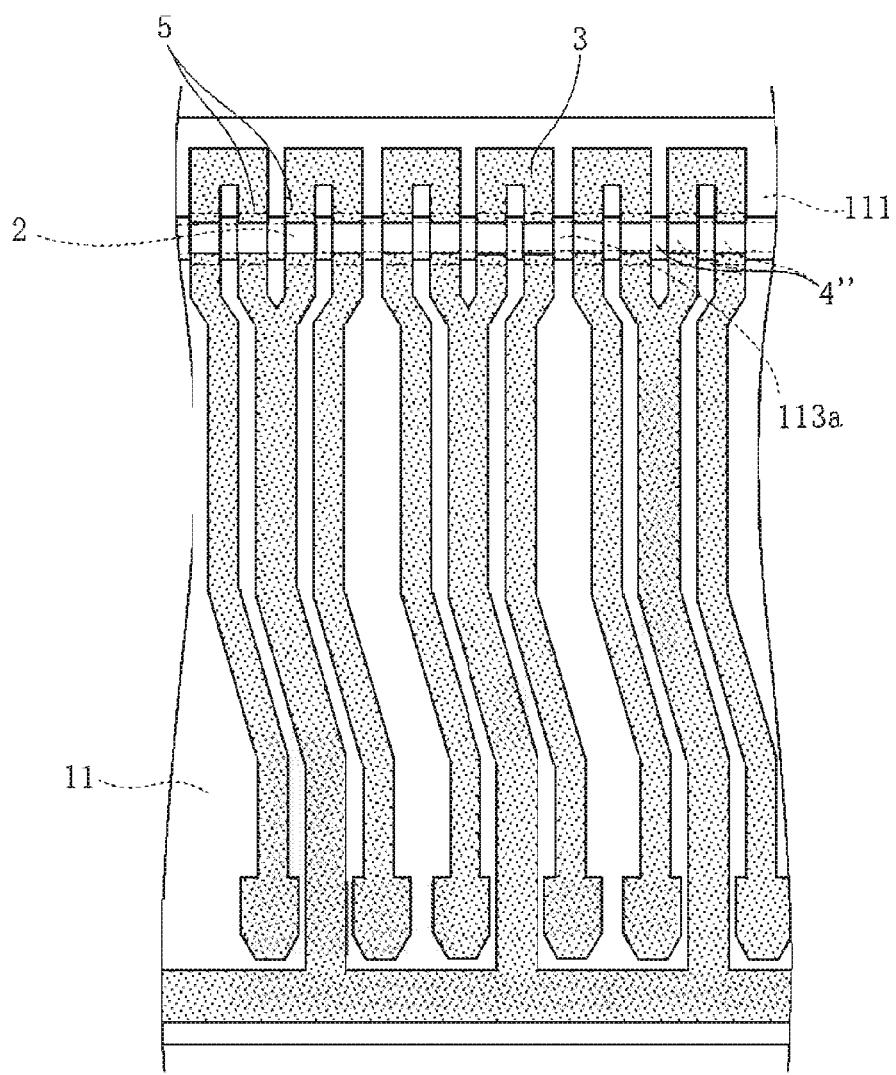
FIG. 20 is an enlarged fragmentary plan view showing a step subsequent to FIG. 19.

Referring to FIG. 17 and FIG. 18, an electrode layer 3' is formed. The electrode layer 3' may be formed, for example, by sputtering or CVD. Then etching is performed on the electrode layer 3' so as to form the electrode layer 3 of the mentioned shape, as shown in FIG. 19 and FIG. 20. For the etching of the electrode layer 3', a photolithography process may be employed.

Figure 21:
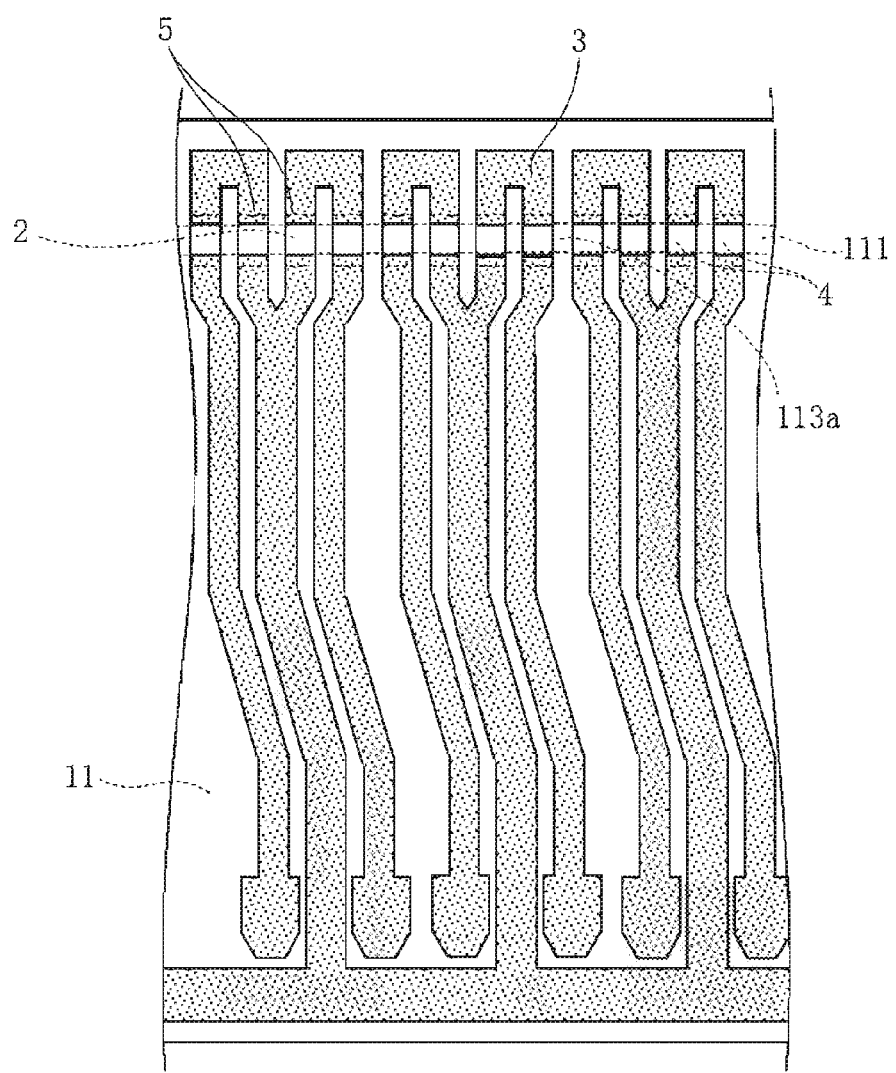
FIG. 21 is an enlarged fragmentary plan view showing a step subsequent to FIG. 20.

Then etching is performed on the resistor layer 4" so as to form the resistor layer 4 including the plurality of rectangular portions, as shown in FIG. 21. The rectangular portions serve to prevent the current from flowing through the resistor layer 4 in a horizontal direction in FIG. 21 when the thermal print head A100 is in use. Unlike this embodiment, the resistor layer 4 including the plurality of rectangular portions may be formed through a single etching process on the resistor layer 4', without forming the resistor layer 4" in the belt-like shape.

Figure 22:
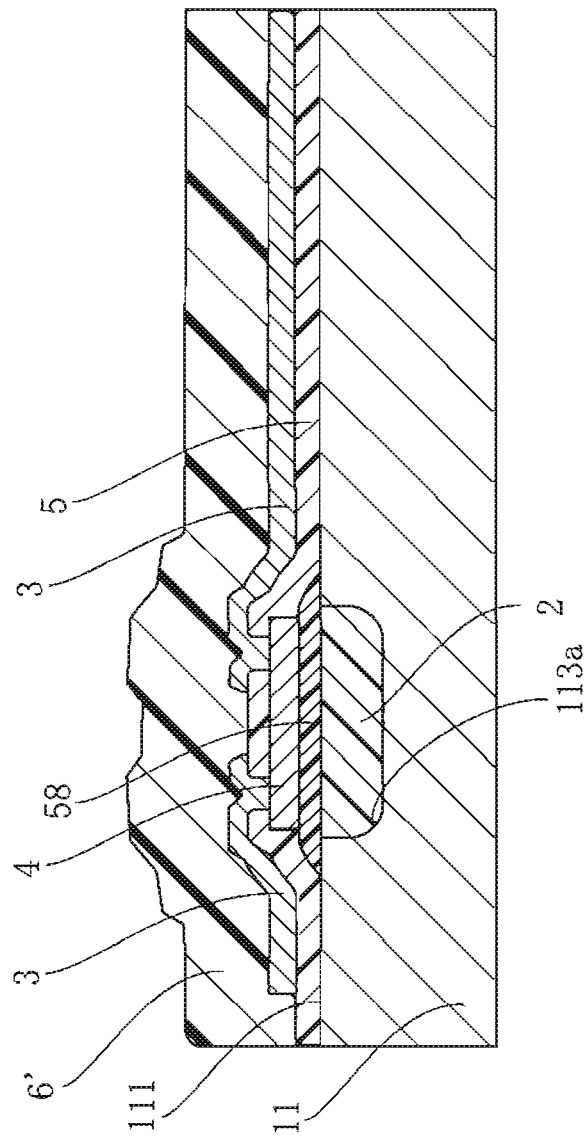
FIG. 22 is a cross-sectional view showing a step subsequent to FIG. 21.
Figure 23:
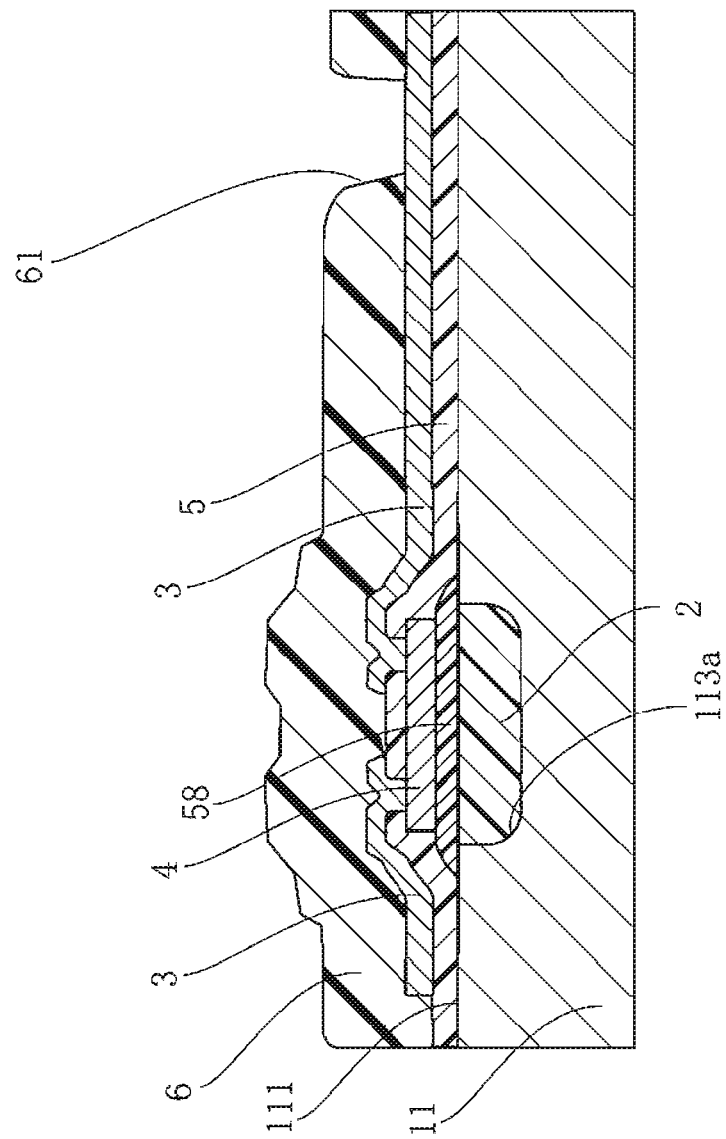
FIG. 23 is a cross-sectional view showing a step subsequent to FIG. 22.

Proceeding to FIG. 22, a cover layer 6' is formed. The cover layer 6' may be formed, for example, by CVD. Then as shown in FIG. 23, etching is performed on the cover layer 6' so as to form the plurality of through windows 61 (FIG. 23 illustrates just one). For the etching of the cover layer 6', a photolithography process may be employed.

Thereafter, though not shown, the rear surface of the base member 11 is polished to reduce the thickness thereof. Then after measuring the resistance of the resistor layer 4 and dicing the base member 11, the diced pieces and the circuit board 12 are placed on the heat dissipation plate 13. The driver IC 7 shown in FIG. 1 is then mounted on the circuit board 12, the wires 81 are bonded to predetermined positions, and the encapsulating resin 82 is formed. Through the foregoing process, the thermal print head A100 shown in FIG. 1 can be obtained.

The advantageous effects of the foregoing embodiment will be described hereunder.

In this embodiment, the base member 11 includes the recess 113a, in which the heat storage region 2 is formed. The heating portions 41 are located so as to overlap the recess 113a as viewed in the thickness direction Z, and the thermal conductivity of the material constituting the base member 11 is 100 to 300 W/(m·K). Accordingly, the heat storage region 2, located so as to overlap the heating portions 41 as viewed in the thickness direction Z of the base member 11, can be formed in a larger volume, and hence a larger amount of heat can be accumulated in the heat storage region 2, out of the heat generated by the heating portions 41. Such a configuration prevents the heat generated by the heating portions 41 from escaping to the base member 11 despite the material constituting the base member 11 having a high thermal conductivity, thereby allowing a larger amount of heat to be transmitted to the printing medium 801 out of the heat generated by the heating portion 41. Therefore, higher printing quality can be obtained on the printing medium 801. In addition, since a larger amount of heat can be transmitted to the printing medium 801 out of the heat generated by the heating portion 41, the power consumption of the thermal print head A100 can be reduced.

In this embodiment, the heat storage region 2 includes the portions protruding from heating portion 41 to the first side Xa and to the second side Xb opposite to the first side Xa in the sub scanning direction X, as viewed in the thickness direction Z of the base member 11. Accordingly, an even larger amount of heat can accumulated in the heat storage region 2 out of the heat generated by the heating portion 41. Such a configuration more securely prevents the heat generated by the heating portion 41 from escaping to the base member 11, thereby further increasing the amount of heat that can be transmitted to the printing medium 801, out of the heat generated by the heating portion 41. Consequently, higher printing quality can be obtained on the printing medium 801. In particular, darker prints can be obtained on the printing medium 801.

In this embodiment, the thermal print head A100 includes the intermediate layer 58 interposed between the heating portion 41 and the heat storage region 2. Such a configuration allows a portion of the cover layer 6 covering the heating portion 41 to be formed in an elevated shape, thereby facilitating the cover layer 6 to contact the printing medium 801. Therefore, the heat generated by the heating portion 41 can be more efficiently transmitted to the printing medium 801.

In this embodiment, the intermediate layer surface 581 of the intermediate layer 58 includes the first curved region 583 continuously extending from the flat region 582. The first curved region 583 comes closer to the base member 11 at a position farther from the flat region 582. The electrode layer 3 includes a portion located so as to overlap the first curved region 583 as viewed in the thickness direction Z of the base member 11. Such a configuration prevents formation of a steep step in the intermediate layer 58, thereby preventing the electrode layer 3 formed on the intermediate layer 58 from being disconnected.

In this embodiment, the intermediate layer surface 581 of the intermediate layer 58 includes the second curved region 584 continuously extending from the flat region 582. The second curved region 584 comes closer to the base member 11 at a position farther from the flat region 582. The electrode layer 3 includes a portion located so as to overlap the second curved region 584 as viewed in the thickness direction Z of the base member 11. Such a configuration prevents formation of a steep step in the intermediate layer 58, thereby preventing the electrode layer 3 formed on the intermediate layer 58 from being disconnected.

In this embodiment, the thermal print head A100 includes the insulating layer 5. The insulating layer 5 includes a portion interposed between the electrode layer 3 and the heating portion 41. Such a configuration reduces the contact area between the electrode layer 3 and the heating portion 41. Accordingly, a eutectic composition of the electrode layer 3 and the heating portion 41 is generated only in a small area when the heating portion 41 receives a current and generates heat. Reducing thus the area where eutectic reaction takes place between the electrode layer 3 and the heating portion 41 suppresses fluctuation of the resistance of the thermal print head A100 during the use.

In this embodiment, the insulating layer 5 includes the first interposed portion 51 and the second interposed portion 52. The first interposed portion 51 is interposed between the first conductive portion 31 and the heating portion 41. Such a configuration suppresses eutectic reaction between the first conductive portion 31 and the heating portion 41. In this embodiment, in addition, the second interposed portion 52 is interposed between the second conductive portion 32 and the heating portion 41. Such a configuration suppresses eutectic reaction between the second conductive portion 32 and the heating portion 41. Suppressing the eutectic reaction between the first conductive portion 31 and the heating portion 41, or between the second conductive portion 32 and the heating portion 41, leads to reduction of the area where the eutectic reaction takes place between the electrode layer 3 and the heating portion 41. Consequently, fluctuation of the resistance of the thermal print head A100 during the use can be suppressed.

In the case where the electrode layer 3 is interposed between the resistor layer 4 and the heat storage region 2, the heat generated by the heating portion 41 of the resistor layer 4 may escape to the electrode layer 3. The heat that has escaped to the electrode layer 3 is not involved in the heat transmission to the printing medium 801. In this embodiment, on the other hand, the resistor layer 4 is interposed between the electrode layer 3 and the heat storage region 2. With such a configuration, even though the heat generated by the heating portion 41 of the resistor layer 4 is transmitted to the electrode layer 3, the heat transmitted to the electrode layer 3 can participate in the heat transmission to the printing medium 801. Therefore, the heat generated by the heating portion 41 can be more efficiently transmitted to the printing medium 801, so that the portion of the thermal print head A100 to be brought into contact with the printing medium 801, i.e., the cover layer 6, can be more quickly heated up. Consequently, high-speed printing can be performed on the printing medium 801.

In this embodiment, the base member 11 is made of Si. Since Si has a high thermal conductivity, the heat generated by the heating portion 41 can be rapidly transmitted to outside of the base member 11 (in this embodiment, heat dissipation plate 13). Therefore, the raised temperature of the heating portion 41 can be quickly lowered, which contributes to increasing the printing speed on the printing medium 801.

In this embodiment, the through window 61 in the cover layer 6 is formed by etching on the cover layer 6'. Through the etching process the through window 61 can be formed at a desired position in the cover layer 6, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head A100.

In the description given hereunder (embodiments and variations thereof related to drawings up to FIG. 50), the constituents same as or similar to those cited above will be given the same numeral and the description thereof may be omitted.

<First Variation of Embodiment A1>

Figure 24:
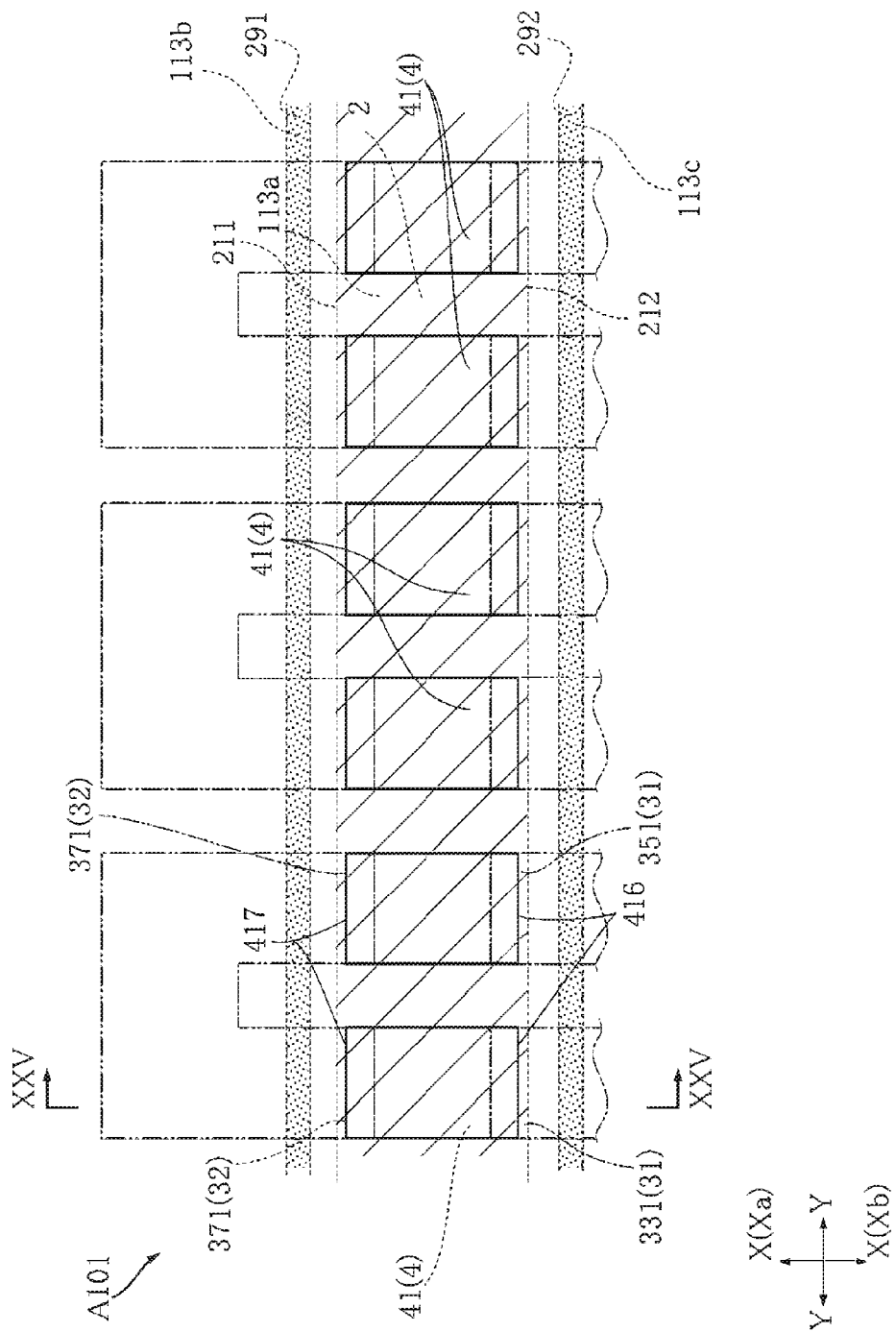
FIG. 24 is an enlarged fragmentary plan view of a thermal print head according to a first variation of the embodiment A1 of the present invention, with a part of the structure omitted.
Figure 25:
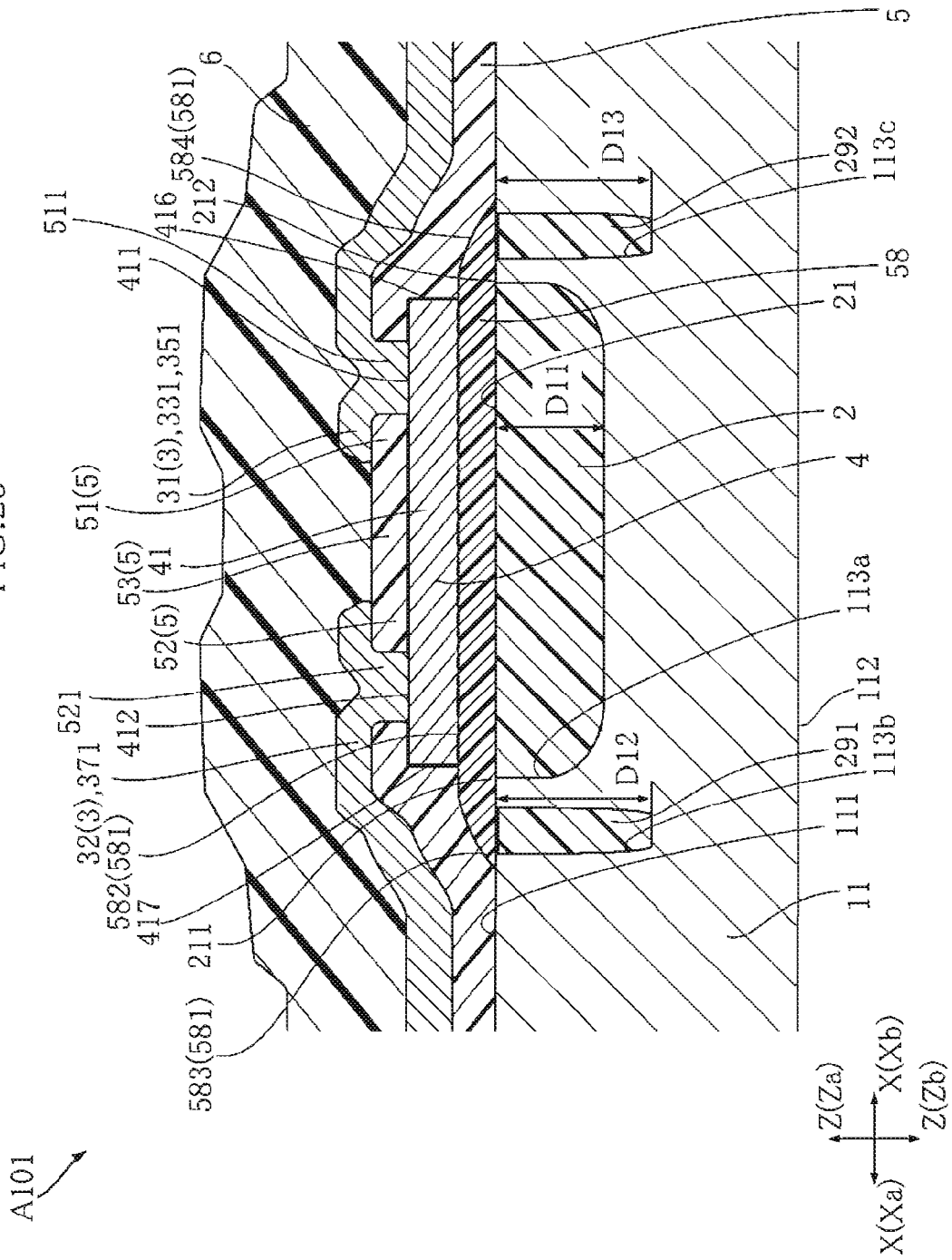
FIG. 25 is an enlarged fragmentary cross-sectional view taken along a line XXV-XXV in FIG. 24.

Referring to FIG. 24 and FIG. 25, a first variation of the embodiment A1 of the present invention will be described hereunder.

FIG. 24 is an enlarged fragmentary plan view of a thermal print head according to a first variation of the embodiment A1 of the present invention, with a part of the structure omitted. FIG. 25 is an enlarged fragmentary cross-sectional view taken along a line XXV-XXV in FIG. 24.

The thermal print head A101 shown in FIG. 24 includes the base member 11, the circuit board 12 (unshown in this variation), the heat dissipation plate 13 (unshown in this variation), the heat storage region 2, a first barrier 291, a second barrier 292, the electrode layer 3, the resistor layer 4, the insulating layer 5, the intermediate layer 58, the cover layer 6, the driver IC 7 (unshown in this variation), the plurality of wires 81, the encapsulating resin 82 (unshown in this variation), and the connector 83 (unshown in this variation).

A main difference between the thermal print head A101 and the thermal print head A100 is that the former further includes a first barrier 291 and a second barrier 292. In FIG. 24, the regions corresponding to the first barrier 291 and the second barrier 292 are grained. The constituents of the thermal print head A101 except the base member 11, the first barrier 291, and the second barrier 292, namely the circuit board 12, the heat dissipation plate 13, the heat storage region 2, the electrode layer 3, the resistor layer 4, the insulating layer 5, the intermediate layer 58, the cover layer 6, the driver IC 7, the plurality of wires 81, the encapsulating resin 82, and the connector 83 are the same as those of the thermal print head A100, and hence the description of these constituents will not be repeated.

In the thermal print head A101, the base member 11 includes the recess 113a, a first groove 113b, and a second groove 113c. Since the recess 113a is the same as that of the thermal print head A100, the description will not be repeated.

The first groove 113b is formed at a position spaced from the recess 113a in the sub scanning direction X. In this variation, the first groove 113b is spaced from the recess 113a to the first side Xa. The first groove 113b is recessed from the base member front surface 111. In this embodiment, the first groove 113b extends in the main scanning direction Y. The first groove 113b has a depth D12 (distance between the base member front surface 111 and the bottom face of the first groove 113b in the thickness direction Z) of, for example, 15 to 150 µm. Preferably, the depth D12 of the first groove 113b may be deeper than the depth D11 of the recess 113a. Unlike this variation, the depth D12 of the first groove 113b may be the same as or shallower than the depth D11 of the recess 113a.

The second groove 113c is formed at a position spaced from the recess 113a in the sub scanning direction X. In this variation, the second groove 113 is spaced from the recess 113a to the second side Xb. In a view in the thickness direction Z of the base member 11, the recess 113a is located between the second groove 113c and the first groove 113b. The second groove 113 is recessed from the base member front surface 111. In this embodiment, the second groove 113 extends in the main scanning direction Y. The second groove 113 has a depth D13 (distance between the base member front surface 111 and the bottom face of the second groove 113 in the thickness direction Z) of, for example, 15 to 150 µm. Preferably, the depth D13 of the second groove 113 may be deeper than the depth D11 of the recess 113a. Unlike this variation, the depth D13 of the second groove 113 may be the same as or shallower than the depth D11 of the recess 113a.

The first barrier 291 is formed in the first groove 113b. The first barrier 291 is made of a material lower in thermal conductivity than the material constituting the base member 11. The first barrier 291 is made of, for example, $SiO_2$. The material constituting the first barrier 291 may be the same as or different from the material constituting the heat storage region 2. In this variation, the first barrier 291 is covered with the intermediate layer 58.

The second barrier 292 is formed in the second groove 113c. The second barrier 292 is made of a material lower in thermal conductivity than the material constituting the base member 11. The second barrier 292 is made of, for example, $SiO_2$. The material constituting the second barrier 292 may be the same as or different from the material constituting the heat storage region 2. In this variation, the second barrier 292 is covered with the intermediate layer 58.

The advantageous effects of the foregoing variation will be described hereunder.

This variation provides the following advantageous effects, in addition to the aforementioned ones.

In this variation, the thermal print head A101 includes the first barrier 291 made of a material lower in thermal conductivity than the material constituting the base member 11. The base member 11 includes the first groove 113b formed at a position spaced from the recess 113a in the sub scanning direction X. The first barrier 291 is formed in the first groove 113b. Accordingly, the heat transmitted from the heat storage region 2 to the base member 11 is stored in the first barrier 291, and therefore the heat is prevented from being transmitted from the heat storage region 2 to a region spaced therefrom in the sub scanning direction X. Such a configuration prevents transmission of heat to a region on the printing medium 801 other than a target region, thereby suppressing appearance of printing blur on the printing medium 801.

In this variation, the depth D12 of the first groove 113b is deeper than the depth D11 of the recess 113a. Such a configuration allows the first barrier 291 to store a larger amount of heat, thereby further suppressing heat transmission from the heat storage region 2 to a region spaced therefrom in the sub scanning direction X. Therefore, transmission of heat to a region on the printing medium 801 other than a target region can be more efficiently prevented, and consequently appearance of printing blur on the printing medium 801 can be more securely suppressed.

In this variation, the first barrier 291 and the heat storage region 2 are made of the same material. Therefore, the heat storage region 2 and the first barrier 291 can be formed at a time in the same process, which contributes to improving the manufacturing efficiency of the thermal print head A101.

In this variation, the thermal print head A101 includes the second barrier 292 made of a material lower in thermal conductivity than the material constituting the base member 11. The base member 11 includes the second groove 113c formed at a position spaced from the recess 113a in the sub scanning direction X. In a view in the thickness direction 2 of the base member 11, the recess 113a is located between the first groove 113b and the second groove 113c. The second barrier 292 is formed in the second groove 113c. Such a configuration prevents, for the same reason as above, transmission of heat to a region on the printing medium 801 other than a target region, thereby suppressing appearance of printing blur on the printing medium 801.

In this variation, the depth D13 of the second groove 113c is deeper than the depth D11 of the recess 113a. Such a configuration further suppresses appearance of printing blur on the printing medium 801, for the same reason as above.

In this variation, the second barrier 292 and the heat storage region 2 are made of the same material. Such a configuration contributes, for the same reason as above, to improving the manufacturing efficiency of the thermal print head A101.

<Second Variation of Embodiment A1>

Figure 26:
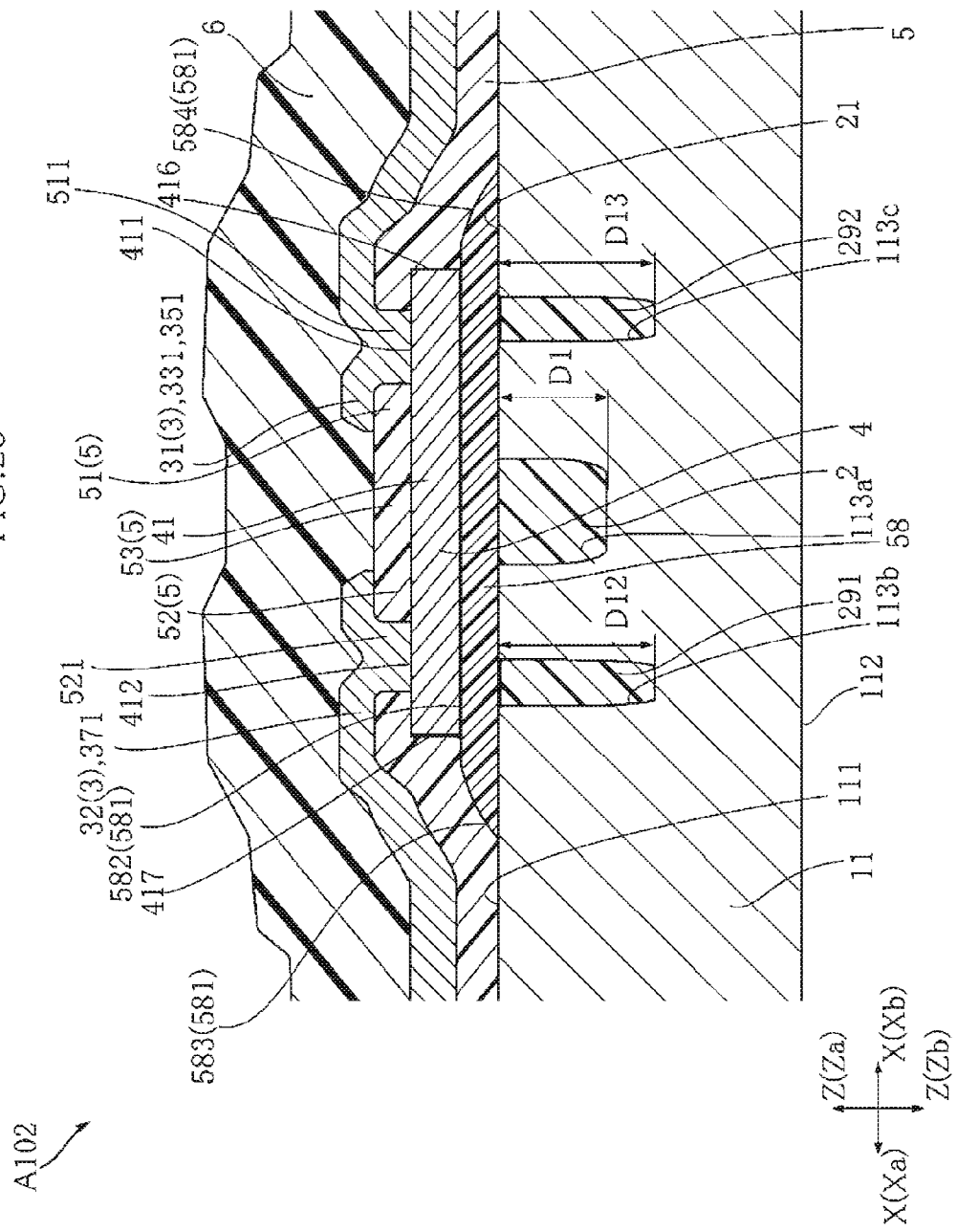
FIG. 26 is an enlarged fragmentary cross-sectional view of a thermal print head according to a second variation of the embodiment A1 of the present invention.

Referring to FIG. 26, a second variation of the embodiment A1 of the present invention will be described hereunder.

FIG. 26 is an enlarged fragmentary cross-sectional view of a thermal print head according to a second variation of the embodiment A1 of the present invention.

The thermal print head A102 shown in FIG. 26 is the same as the thermal print head A101, only except that the size of the heat storage region 2 in the sub scanning direction X is smaller than the heating portion 41, and therefore further description will be omitted.

<Third Variation of Embodiment A1>

Figure 27:
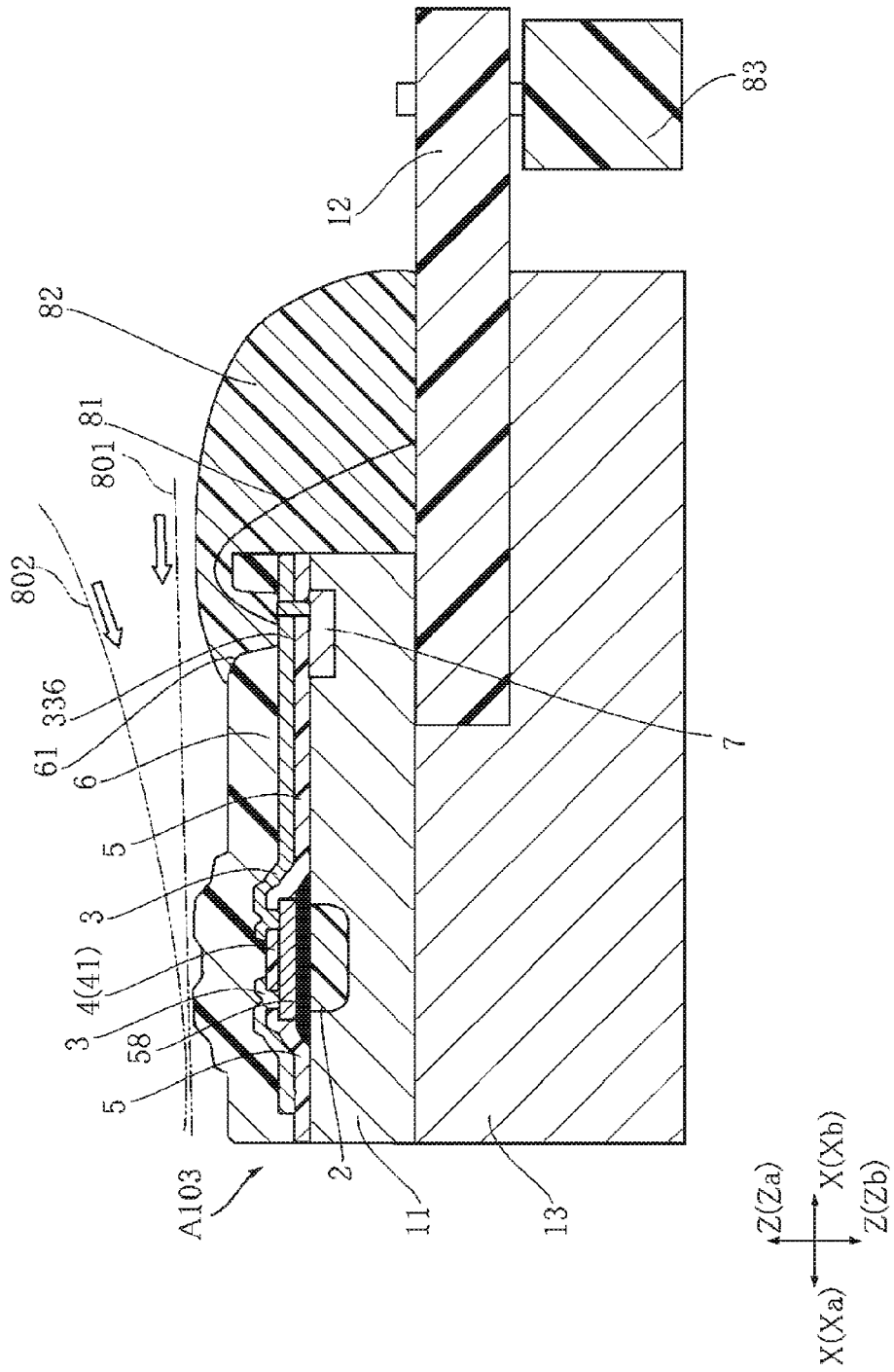
FIG. 27 is a cross-sectional view of a thermal print head according to a third variation of the embodiment A1 of the present invention.

Referring to FIG. 27, a third variation of the embodiment A1 of the present invention will be described hereunder.

FIG. 27 is a cross-sectional view of a thermal print head according to a third variation of the embodiment A1 of the present invention.

The thermal print head A103 shown in FIG. 27 is the same as the thermal print head A100 only except that the driver IC 7 is mounted inside the base member 11, and therefore detailed description will be omitted. In the thermal print head A103, the base member 11 is made of a semiconductor material. In addition, the driver IC 7 and the electrode layer 3 are electrically connected to each other through a via penetrating through the insulating layer 5. Such a configuration reduces the number of parts for manufacturing the thermal print head A103. Further, the thermal print head A103 also provides the same advantageous effects as those provided by the thermal print head A100.

Embodiment A2

Referring to FIG. 28 to FIG. 36, an embodiment A2 of the present invention will be described hereunder.

Figure 28:
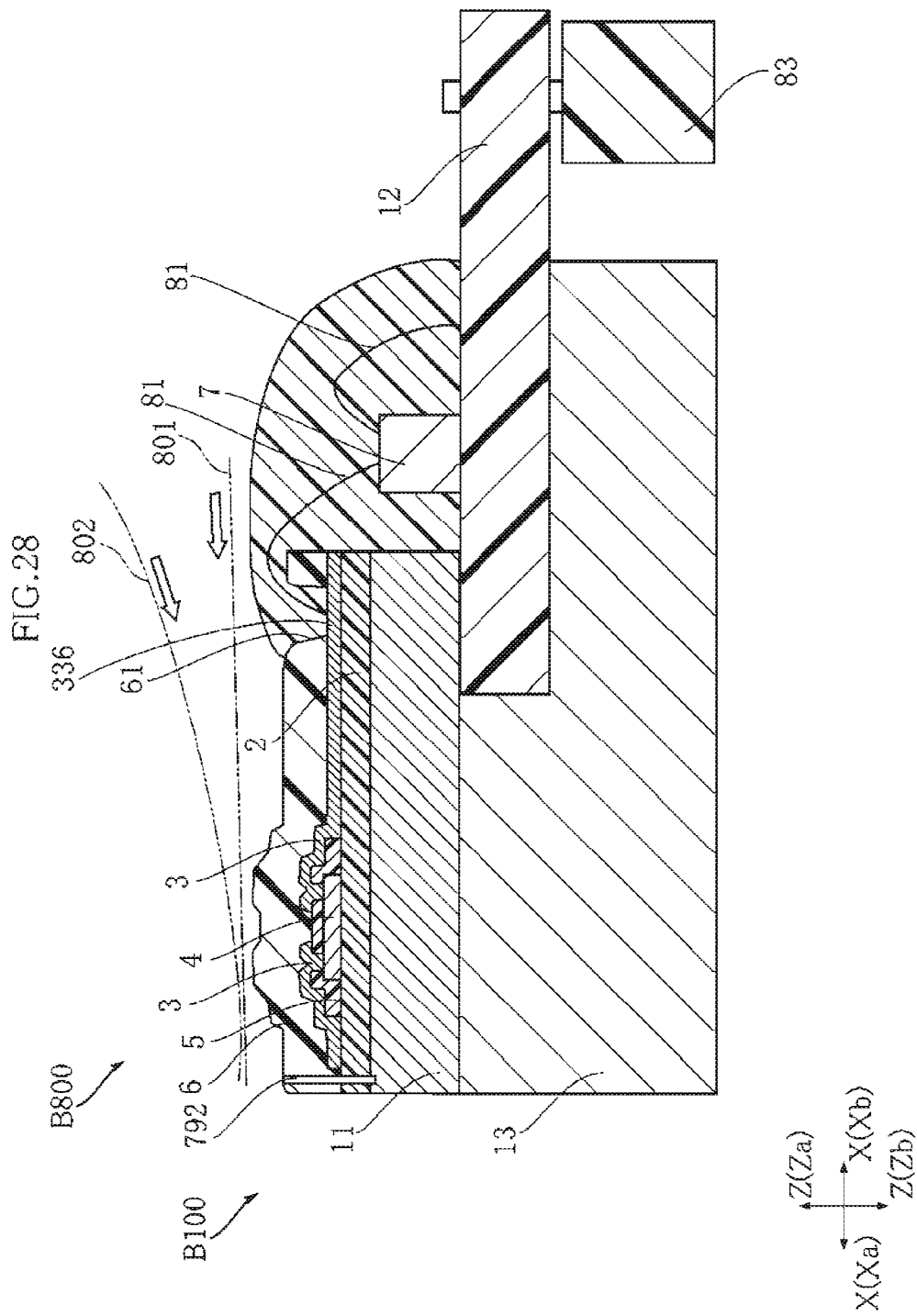
FIG. 28 is a fragmentary cross-sectional view of a thermal printer according to an embodiment A2 of the present invention.

FIG. 28 is a fragmentary cross-sectional view of a thermal printer according to the embodiment A2 of the present invention.

The thermal printer B800 shown in FIG. 28 is configured to perform a printing operation on the printing medium 801. The printing medium 801 may be, for example, a thermal paper for making out a barcode sheet or a receipt. The thermal printer B800 includes a thermal print head B100 and the platen roller 802.

Figure 29:
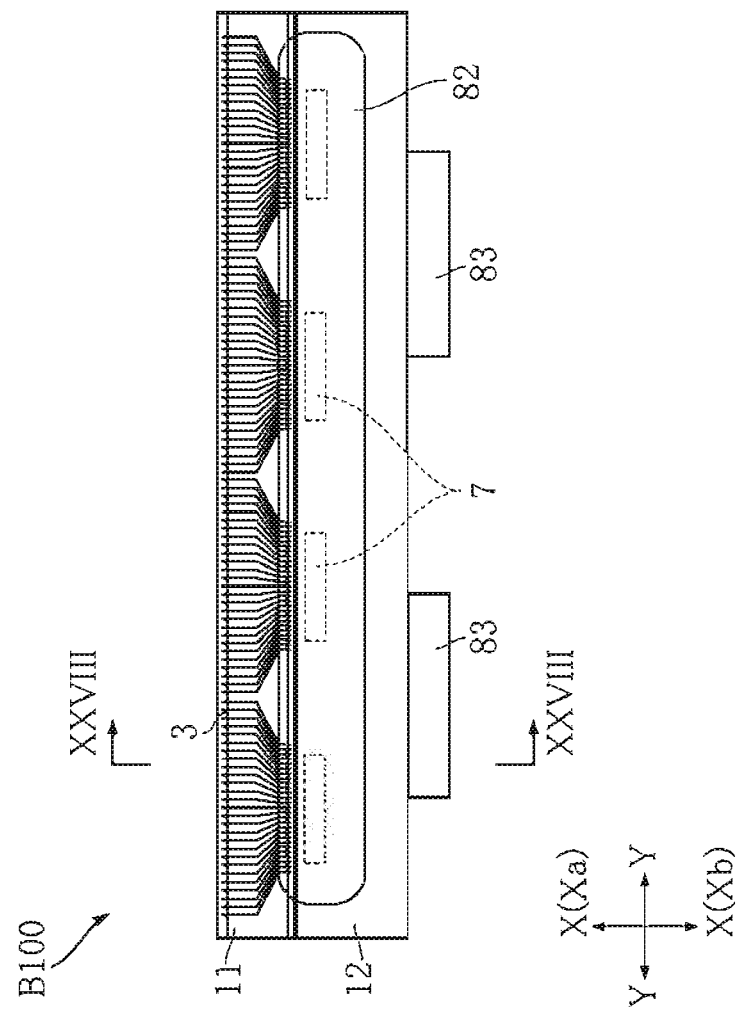
FIG. 29 is a plan view of a thermal print head according to the embodiment A2 of the present invention.
Figure 30:
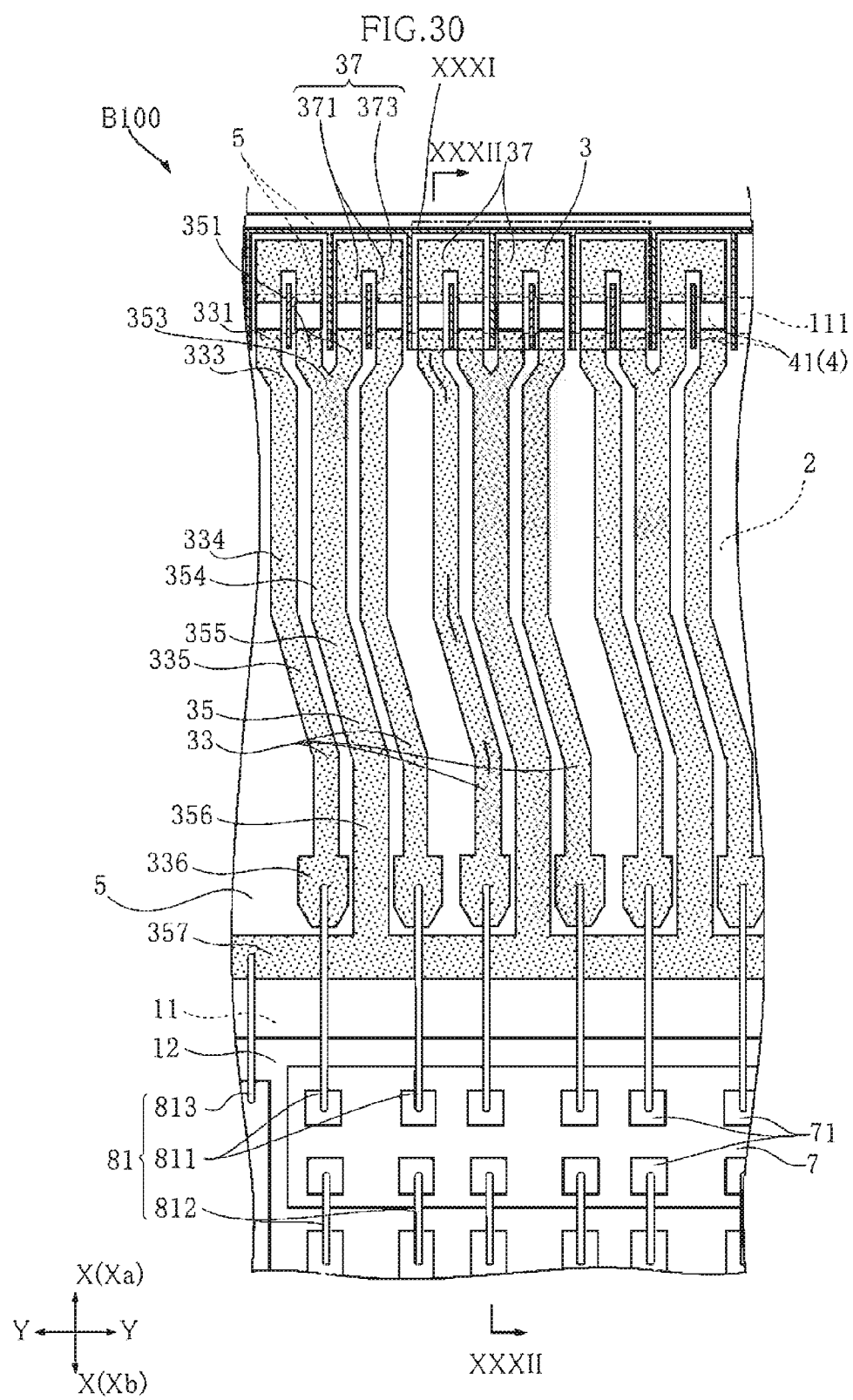
FIG. 30 is an enlarged fragmentary plan view of the thermal print head shown in FIG. 29, with a part of the structure omitted.
Figure 31:
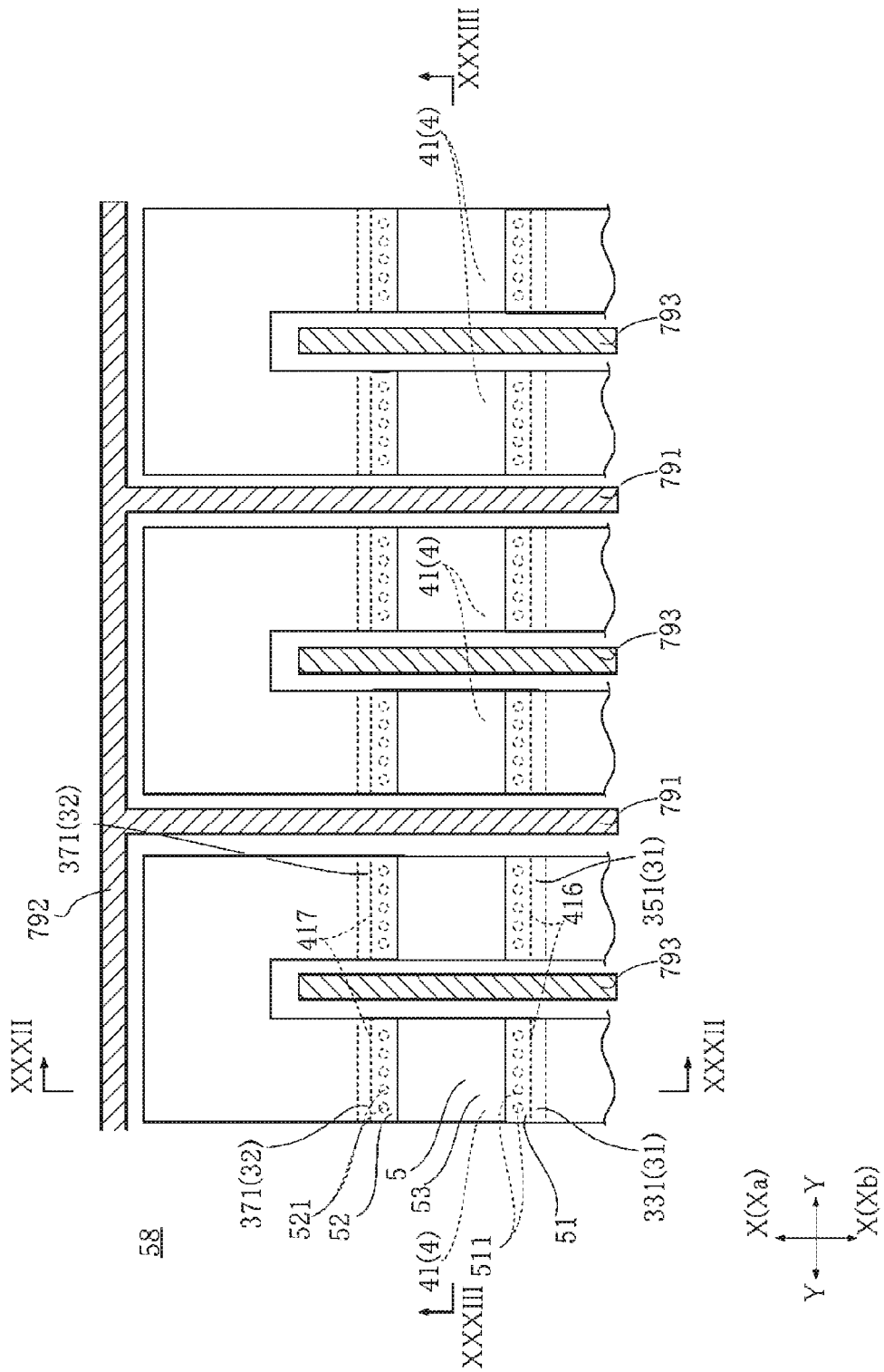
FIG. 31 is an enlarged fragmentary plan view of a region XXXI in FIG. 30.
Figure 32:
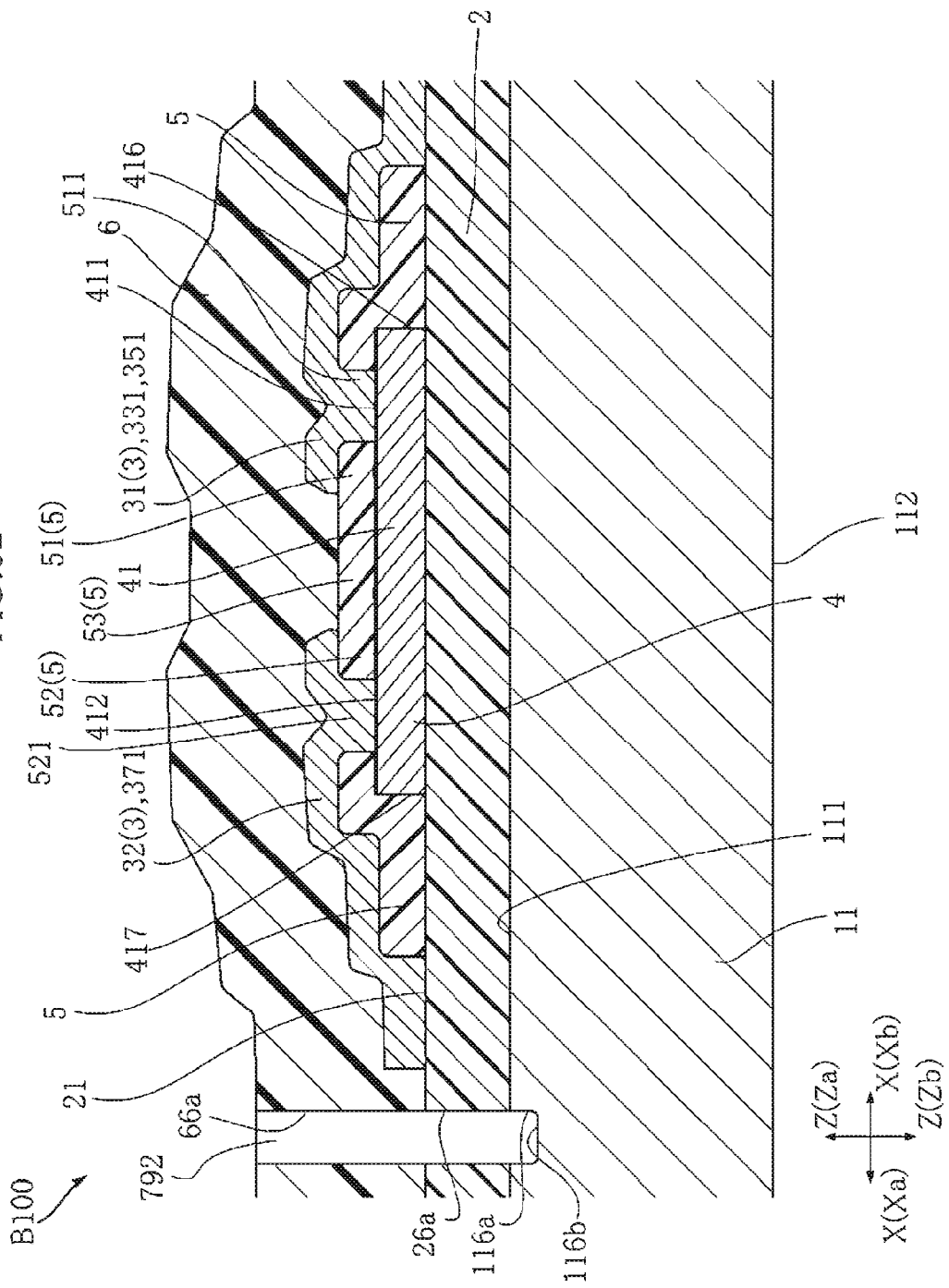
FIG. 32 is an enlarged fragmentary cross-sectional view taken along a line XXXII-XXXII in FIG. 30 and FIG. 31.
Figure 33:
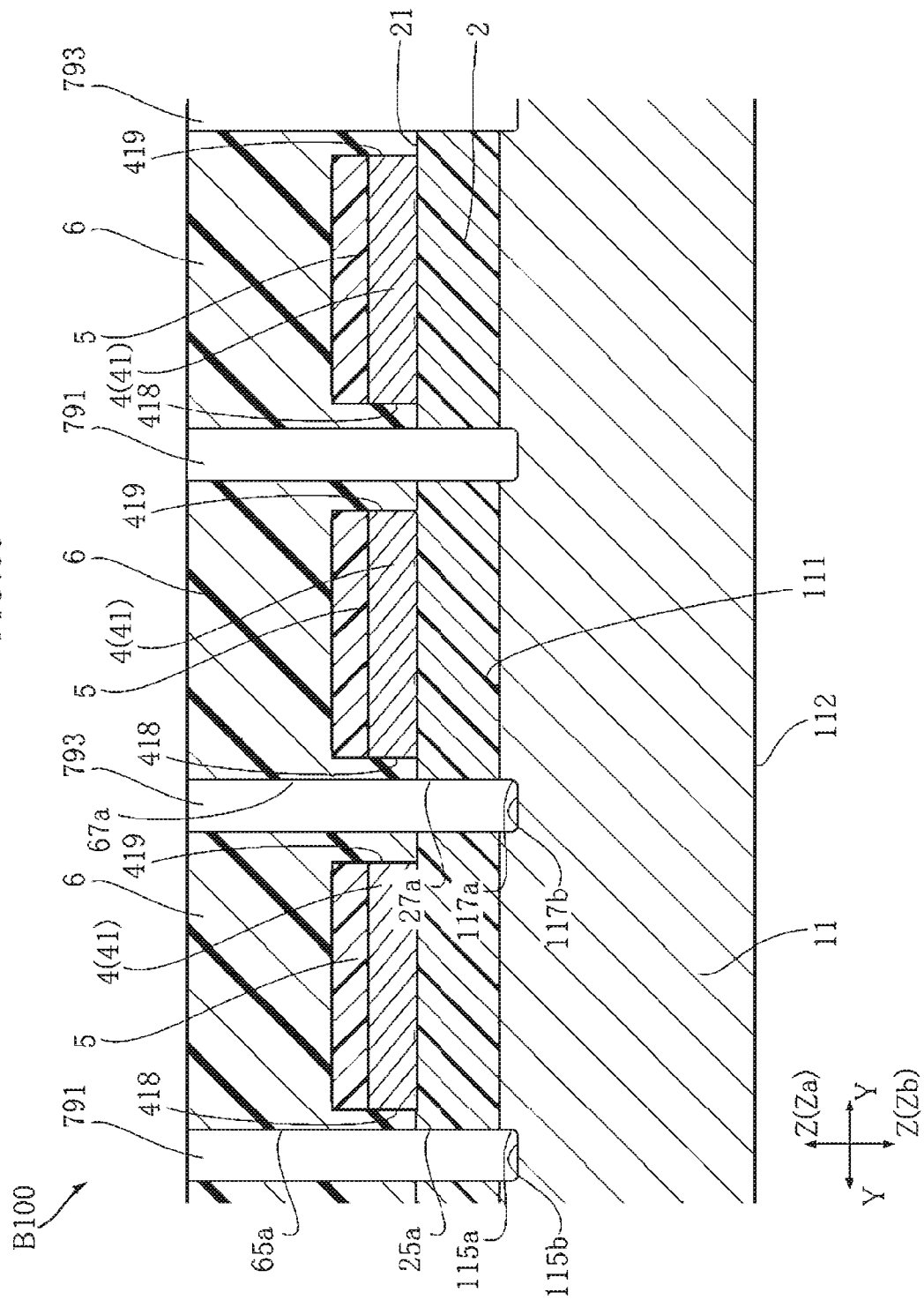
FIG. 33 is an enlarged fragmentary cross-sectional view taken along a line XXXIII-XXXIII in FIG. 31.

FIG. 29 is a plan view of a thermal print head according to the embodiment A2 of the present invention. FIG. 30 is an enlarged fragmentary plan view of the thermal print head shown in FIG. 29, with a part of the structure omitted. FIG. 31 is an enlarged fragmentary plan view of a region XXXI in FIG. 30. FIG. 32 is an enlarged fragmentary cross-sectional view taken along a line XXXII-XXXII in FIG. 30 and FIG. 31. FIG. 33 is an enlarged fragmentary cross-sectional view taken along a line XXXIII-XXXIII in FIG. 31. FIG. 28 corresponds to a cross-sectional view taken along a line XXVIII-XXVIII in FIG. 29.

The thermal print head B100 shown in the cited drawings includes the base member 11, the circuit board 12, the heat dissipation plate 13, the heat storage region 2, the electrode layer 3, the resistor layer 4, the insulating layer 5, the intermediate layer 58, the cover layer 6, the driver IC 7, the plurality of wires 81, the encapsulating resin 82, and the connector 83.

In this embodiment, the constituents except the base member 11, the heat storage region 2, the insulating layer 5, and the cover layer 6, namely the circuit board 12, the heat dissipation plate 13, the electrode layer 3, the resistor layer 4, the driver IC 7, the plurality of wires 81, the encapsulating resin 82, and the connector 83 are the same as those of the thermal print head A100, and hence the description of these constituents will not be repeated. In addition, the thermal print head B100 is without the intermediate layer 58, unlike the thermal print head A100. The thermal print head B100 is different from the thermal print head A100 mainly in including first groove segments 791, a second groove segment 792, and third groove segments 793. The insulating layer 5 has a different cross-sectional shape from the insulating layer 5 of the thermal print head A100.

The base member 11 has a plate shape. In this embodiment, the base member 11 is made of a semiconductor material. Examples of the semiconductor material to form the base member 11 include Si, SiC, GaP, GaAs, InP, and GaN. Although in this embodiment the base member 11 is made of a semiconductor material, it is not mandatory to employ a semiconductor material to form the base member 11. For example, the base member 11 may be made of an insulative material such as a ceramic. It is preferable that the material constituting the base member 11 has a thermal conductivity of 100 to 300 W/(m·K). Assuming that the base member 11 is made of Si for example, the thermal conductivity of Si is 140 to 170 W/(m·K). The thermal conductivity of a material constituting the heat storage region 2 (described later) is 0.5 to 5 W/(m·K). Assuming that the heat storage region 2 is made of $SiO_2$ for example, the thermal conductivity of $SiO_2$ is 1.1 W/(m·K). It is preferable that a ratio of the thermal conductivity of the material constituting the heat storage region 2 to the thermal conductivity of the material constituting the base member 11 is 1:10 to 600, and more preferably 1:100 to 200. The base member 11 has a thickness of, for example, 0.625 to 0.720 mm. The base member 11 has a flat plate shape extending in the main scanning direction Y. The base member 11 has a width (size in the sub scanning direction X of the base member 11) of, for example, 3 to 20 mm. The size of the base member 11 in the main scanning direction Y is, for example, 10 to 300 mm.

As shown in FIG. 32, the base member 11 includes the base member front surface 111 and the base member rear surface 112. The base member front surface 111 is a flat plane extending in the sub scanning direction X and the main scanning direction Y. The base member front surface 111 has longitudinal sides extending in the main scanning direction Y. The base member front surface 111 is oriented to one side (Za-side) in the thickness direction Z of the base member 11. In other words, the base member front surface 111 is oriented toward the resistor layer 4. The base member rear surface 112 is a flat plane extending in the sub scanning direction X and the main scanning direction Y. The base member rear surface 112 has longitudinal sides extending in the main scanning direction Y. The base member rear surface 112 is oriented to the opposite side (Zb-side) in the thickness direction Z of the base member 11. In other words, the base member rear surface 112 is oriented to the side opposite to the resistor layer 4.

As shown in FIG. 28 and FIG. 32, the heat storage region 2 is formed in the base member 11. The heat storage region 2 covers substantially the entirety of the base member front surface 111. The heat storage region 2 serves to accumulate the heat generated by the heating portion 41. The heat storage region 2 has a thickness of, for example, at least 3 μm. As shown in FIG. 32, the heat storage region 2 includes the surface 21. The heat storage region surface 21 is oriented to the Za-side. In other words, the heat storage region surface 21 is oriented toward the resistor layer 4. In this embodiment, the heat storage region surface 21 is flat over its entirety. Forming thus the heat storage region surface 21 in a flat shape facilitates the formation of the resistor layer 4 and the insulating layer 5 through the semiconductor process.

The cover layer 6 shown in FIG. 28, FIG. 32, and FIG. 33 covers the electrode layer 3, the resistor layer 4, and the insulating layer 5, so as to protect the electrode layer 3, the resistor layer 4, and the insulating layer 5. The cover layer 6 is made of an insulative material. Examples of the insulative material to form the cover layer 6 include polyimide, polyamide, polyethylene, SiN and SiO$_2$. In this embodiment, the cover layer 6 is in direct contact with the electrode layer 3 and the insulating layer 5.

As shown in FIG. 33, the heating portions 41 each include a first side face 418 and a second side face 419. The first side face 418 and the second side face 419 are oriented to the respective sides in the main scanning direction Y, which are opposite to each other. The cover layer 6 covers both of the first side face 418 and the second side face 419.

The cover layer 6 includes the plurality of through windows 61 (FIG. 28 illustrates just one). In each of the through windows 61, the bonding portion 336 is exposed.

As shown in FIG. 31 to FIG. 33, the thermal print head B100 includes the first groove segments 791, the second groove segment 792, and the third groove segments 793. In FIG. 31, the regions corresponding to the first groove segments 791, the second groove segment 792, and the third groove segments 793 are hatched.

The first groove segments 791 shown in FIG. 31 and FIG. 33 are each located between two heating portions 41 adjacent to each other in the main scanning direction Y out of the plurality of heating portions. In this embodiment, the first groove segment 791 extends in the sub scanning direction X. The first groove segment 791 is larger in size in the sub scanning direction X than the heating portions 41. The first groove segment 791 is located so as to overlap the entirety of the corresponding heating portion 41, in the sub scanning direction X.

As shown in FIG. 33, the first groove segment 791 is formed in the heat storage region 2. The heat storage region 2 includes a first groove sidewall 25a constituting the first groove segment 791. In this embodiment, the first groove segment 791 is formed all the way between the cover layer 6 and the base member 11. The cover layer 6 includes a first groove sidewall 65a constituting the first groove segment 791. The base member 11 includes a first groove sidewall 115a and a first groove bottom face 115b. The first groove sidewall 115a and the first groove bottom face 115b constitute the first groove segment 791.

In this embodiment, the first groove segment 791 is formed after the heat storage region 2 and the cover layer 6 are formed on the base member 11. The first groove segment 791 is not filled with anything. Accordingly, the first groove sidewall 115a, the first groove bottom face 115b, the first groove sidewall 25a, and the first groove sidewall 65a are exposed to an open space. The first groove segment 791 may be formed, for example, by etching.

The second groove segment 792 shown in FIG. 31 and FIG. 32 is located on the first side Xa with respect to the intermediate electrode 37, as viewed in the thickness direction Z of the base member 11. In the sub scanning direction X, the intermediate electrode 37 is located between the second groove segment 792 and the plurality of heating portions 41. The second groove segment 792 extend in the main scanning direction Y. In this embodiment, the second groove segment 792 is formed all the way between one end and the other end of the base member 11 in the main scanning direction Y. In this embodiment, further, the second groove segment 792 is connected to each of the first groove segments 791. Unlike this embodiment, the second groove segment 792 may be disconnected from the first groove segments 791.

As shown in FIG. 32, the second groove segment 792 is formed in the heat storage region 2. The heat storage region 2 includes a second groove sidewall 26a constituting the second groove segment 792. In this embodiment, the second groove segment 792 is formed all the way between the cover layer 6 and the base member 11. The cover layer 6 includes a second groove sidewall 66a constituting the second groove segment 792. The base member 11 includes a second groove sidewall 116a and a second groove bottom face 116b. The second groove sidewall 116a and the second groove bottom face 116b constitute the second groove segment 792.

In this embodiment, the second groove segment 792 is formed after the heat storage region 2 and the cover layer 6 are formed on the base member 11. The second groove segment 792 is not filled with anything. Accordingly, the second groove sidewall 116a, the second groove bottom face 116b, the second groove sidewall 26a, and the second groove sidewall 66a are exposed to an open space. The second groove segment 792 may be formed, for example, by etching.

The third groove segment 793 shown in FIG. 31 and FIG. 33 is located between two heating portions 41 connected to each other via the intermediate electrode 37, out of the plurality of heating portions 41. In this embodiment, the third groove segment 793 extends in the sub scanning direction X. The third groove segment 793 is larger in size in the sub scanning direction X than the heating portion 41. The third groove segment 793 is located so as to overlap the entirety of one of the plurality of heating portions 41, in the sub scanning direction X.

As shown in FIG. 33, the third groove segment 793 is formed in the heat storage region 2. The heat storage region 2 includes a third groove sidewall 27a constituting the third groove segment 793. In this embodiment, the third groove segment 793 is formed all the way between the cover layer 6 and the base member 11. The cover layer 6 includes a third groove sidewall 67a constituting the third groove segment 793. The base member 11 includes a third groove sidewall 117a and a third groove bottom face 117b. The third groove sidewall 117a and the third groove bottom face 117b constitute the third groove segment 793.

In this embodiment, the third groove segment 793 is formed after the heat storage region 2 and the cover layer 6 are formed on the base member 11. The third groove segment 793 is not filled with anything. Accordingly, the third groove sidewall 117a, the third groove bottom face 117b, the third groove sidewall 27a, and the third groove sidewall 67a are exposed to an open space. The third groove segment 793 may be formed, for example, by etching. Preferably, the third groove segment 793, the second groove segment 792, and the first groove segment 791 may be formed at the same time.

The advantageous effects of the foregoing embodiment will be described hereunder.

In this embodiment, the first groove segment 791 is formed in the heat storage region 2. The first groove segment 791 is located between two heating portions 41 adjacent to each other in the main scanning direction Y, out of the plurality of heating portions 41. Accordingly, the heat generated in one of the heating portion 41 can be prevented from being transmitted through the heat storage unit 2 to the region in the heat storage unit 2 corresponding to the adjacent heating portion 41. Such a configuration prevents transmission of heat to a region on the printing medium 801 other than a target region, thereby suppressing appearance of printing blur on the printing medium 801. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the first groove segment 791 is located so as to overlap one of the plurality of heating portions 41 in the sub scanning direction X. Such a configuration more securely prevents the heat generated in one of the heating portion 41 from being transmitted through the heat storage unit 2 to the region in the heat storage unit 2 corresponding to the adjacent heating portion 41. Accordingly, the heat transmission to a region on the printing medium 801 other than a target region can be more securely suppressed, and consequently appearance of printing blur on the printing medium 801 can be more securely prevented.

In this embodiment, the first groove segment 791 extends as far as the base member 11. Such a configuration further suppresses the heat generated in one of the heating portion 41 from being transmitted through the heat storage unit 2 to the region in the heat storage unit 2 corresponding to the adjacent heating portion 41. Accordingly, the heat transmission to a region on the printing medium 801 other than a target region can be more securely suppressed, and consequently appearance of printing blur on the printing medium 801 can be more securely prevented.

In this embodiment, the first groove sidewall 25a is exposed to an open space. With the mentioned configuration, the heat transmitted from the heating portion 41 to the heat storage region 2 is released to the open space through the first groove sidewall 25a. Accordingly, the heat accumulated in the heat storage region 2 can be more efficiently emitted to outside of the thermal print head B100. Therefore, the raised temperature of the heating portion 41 can be quickly lowered, which contributes to increasing the printing speed on the printing medium 801.

In this embodiment, the plurality of heating portions 41 each include the first side face 418 and the second side face 419 oriented to either side in the main scanning direction Y. The first side face 418 is oriented opposite to the second side face 419. The first side face 418 and the second side face 419 are both covered with the cover layer 6. Such a configuration prevents the heating portion 41 from being exposed to air, thereby suppressing oxidation of the heating portion 41 and preventing fluctuation of the resistance of the heating portion 41.

In this embodiment, the electrode layer 3 includes the intermediate electrode 37 connecting two heating portions 41 adjacent to each other in the main scanning direction Y, out of the plurality of heating portions 41. The heat storage region 2 includes the second groove segment 792. The intermediate electrode 37 is located between the second groove segment 792 and the plurality of heating portions 41 in the sub scanning direction X. Such a configuration prevents heat transmission to the first side Xa beyond the second groove segment 792. Accordingly, the heat transmission to a region on the printing medium 801 other than the target region can be prevented, and therefore appearance of printing blur on the printing medium 801 can be suppressed. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the second groove segment 792 extends as far as the base member 11. Such a configuration further suppresses the heat transmission to the first side Xa beyond the second groove segment 792. Accordingly, the heat transmission to a region on the printing medium 801 other than the target region can be more securely suppressed, and consequently appearance of printing blur on the printing medium 801 can be more securely prevented.

In this embodiment, the second groove sidewall 26a is exposed to an open space. With the mentioned configuration, the heat transmitted from the heating portion 41 to the heat storage region 2 is released to the open space through the second groove sidewall 26a. Accordingly, the heat accumulated in the heat storage region 2 can be more efficiently emitted to outside of the thermal print head B100. Therefore, the raised temperature of the heating portion 41 can be quickly lowered, which contributes to increasing the printing speed on the printing medium 801.

In this embodiment, the third groove segment 793 is formed at least in the heat storage region 2. The third groove segment 793 is located between two heating portions 41 connected to each other via the intermediate electrode 37, out of the plurality of heating portion 41. The third groove segment 793 also provides the same advantageous effects as those provided by the first groove segment 791 in the thermal print head B100.

In this embodiment, the thermal print head B100 includes the insulating layer 5. The insulating layer 5 includes a portion interposed between the electrode layer 3 and the heating portion 41. Such a configuration reduces the contact area between the electrode layer 3 and the heating portion 41. Accordingly, a eutectic composition of the electrode layer 3 and the heating portion 41 is generated only in a small area when the heating portion 41 receives a current and generates heat. Reducing thus the area where eutectic reaction takes place between the electrode layer 3 and the heating portion 41 suppresses fluctuation of the resistance of the thermal print head B100 during the use.

In this embodiment, the insulating layer 5 includes the first interposed portion 51 and the second interposed portion 52. The first interposed portion 51 is interposed between the first conductive portion 31 and the heating portion 41. Such a configuration suppresses eutectic reaction between the first conductive portion 31 and the heating portion 41. In this embodiment, in addition, the second interposed portion 52 is interposed between the second conductive portion 32 and the heating portion 41. Such a configuration suppresses eutectic reaction between the second conductive portion 32 and the heating portion 41. Suppressing the eutectic reaction between the first conductive portion 31 and the heating portion 41, or between the second conductive portion 32 and the heating portion 41, leads to reduction of the area where the eutectic reaction takes place between the electrode layer 3 and the heating portion 41. Consequently, fluctuation of the resistance of the thermal print head B100 during the use can be suppressed.

In the case where the electrode layer 3 is interposed between the resistor layer 4 and the heat storage region 2, the heat generated by the heating portion 41 of the resistor layer 4 may escape to the electrode layer 3. The heat that has escaped to the electrode layer 3 is not involved in the heat transmission to the printing medium 801. In this embodiment, on the other hand, the resistor layer 4 is interposed between the electrode layer 3 and the heat storage region 2. With such a configuration, even though the heat generated by the heating portion 41 of the resistor layer 4 is transmitted to the electrode layer 3, the heat transmitted to the electrode layer 3 can participate in the heat transmission to the printing medium 801. Therefore, the heat generated by the heating portion 41 can be more efficiently transmitted to the printing medium 801, so that the portion of the thermal print head B100 to be brought into contact with the printing medium 801, i.e., the cover layer 6, can be more quickly heated up. Consequently, high-speed printing can be performed on the printing medium 801.

In this embodiment, the base member 11 is made of Si. Since Si has a high thermal conductivity, the heat generated by the heating portion 41 can be rapidly transmitted to outside of the base member 11 (in this embodiment, heat dissipation plate 13). Therefore, the raised temperature of the heating portion 41 can be quickly lowered, which contributes to increasing the printing speed on the printing medium 801.

In this embodiment, the through window 61 in the cover layer 6 is formed by etching on the cover layer 6'. Through the etching process the through window 61 can be formed at a desired position in the cover layer 6, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head B100.

<First Variation of Embodiment A2>

Figure 34:
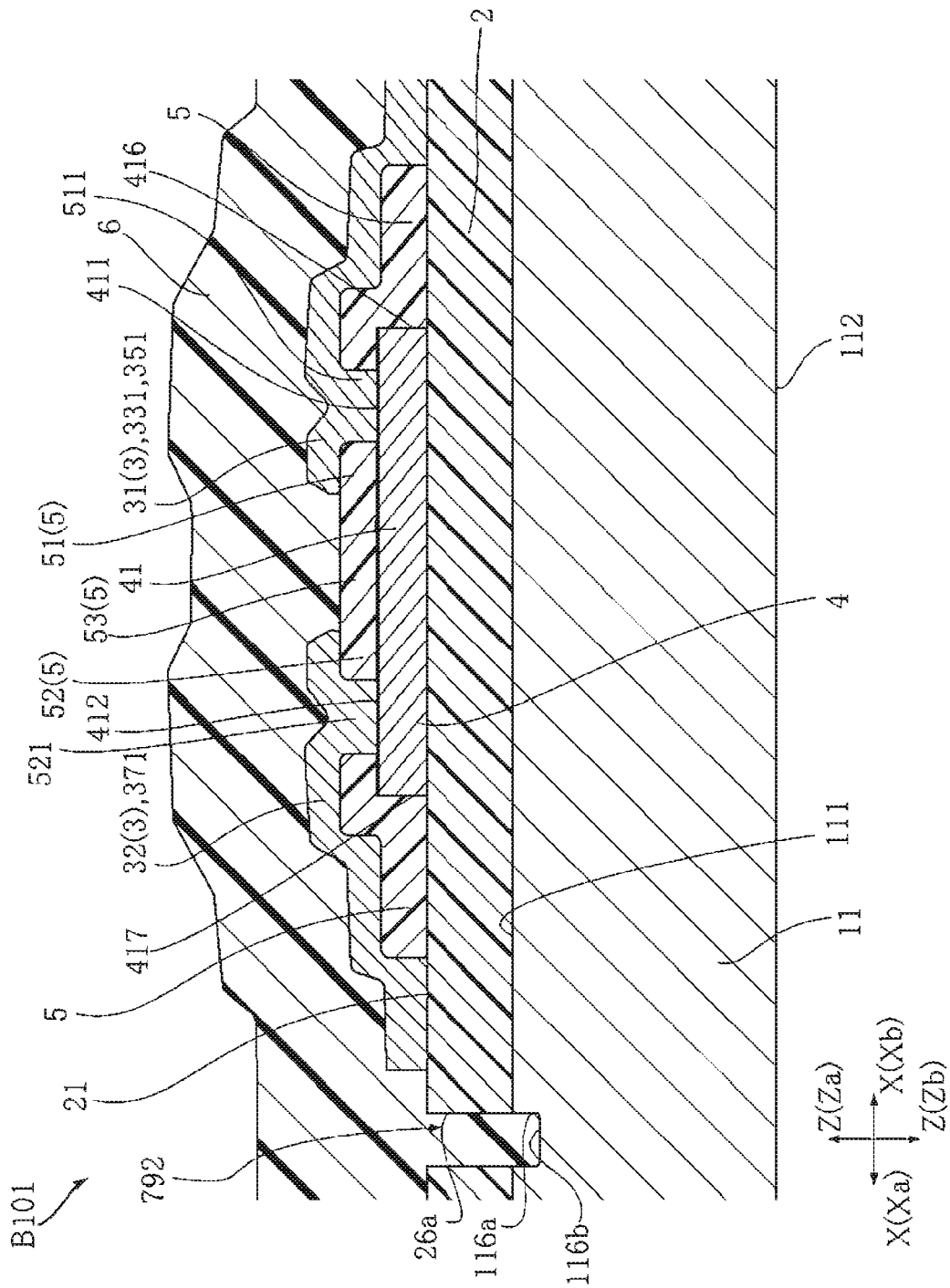
FIG. 34 is an enlarged fragmentary cross-sectional view of a thermal print head according to a first variation of the embodiment A2 of the present invention.
Figure 35:
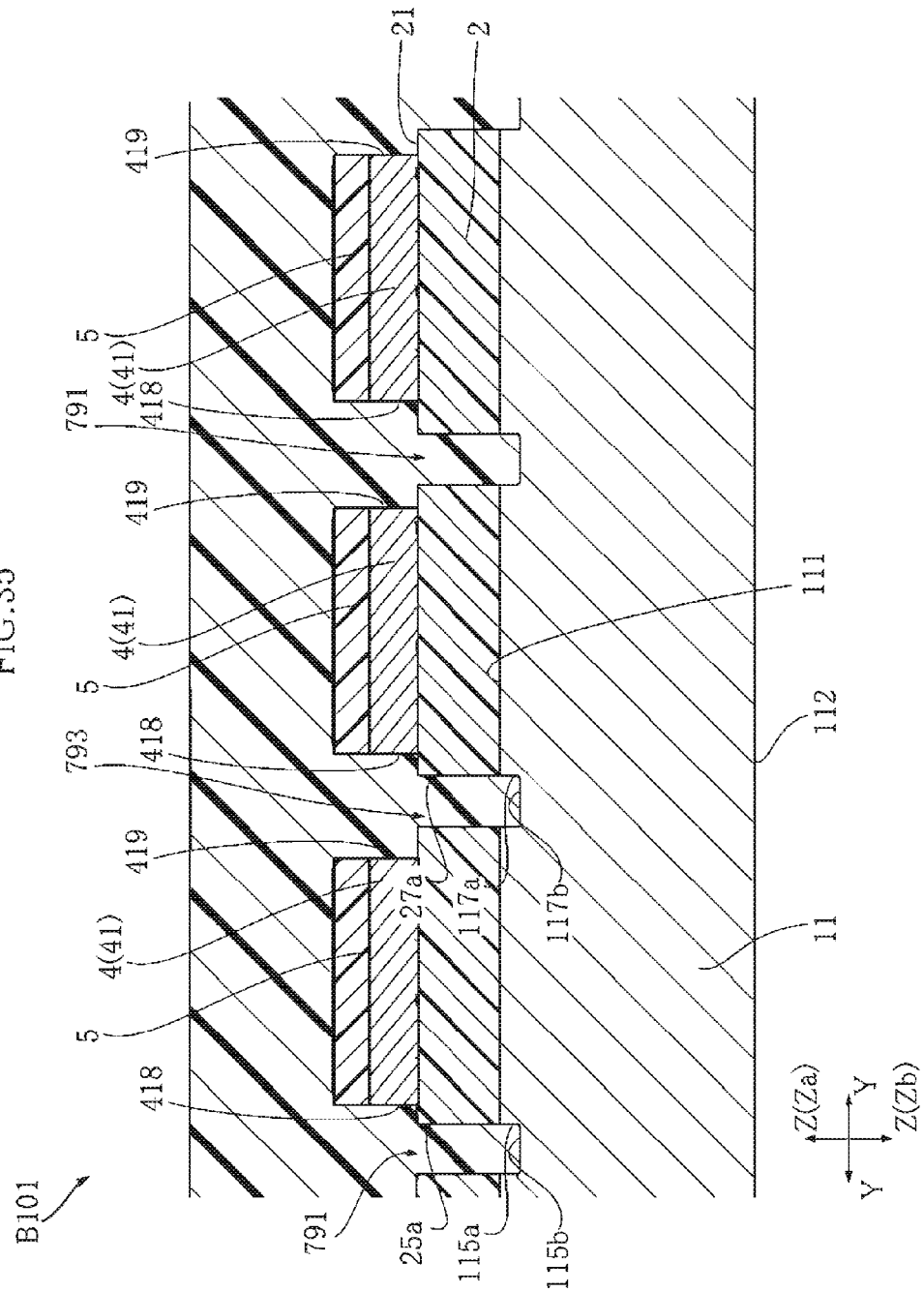
FIG. 35 is another enlarged fragmentary cross-sectional view of the thermal print head according to the first variation of the embodiment A2 of the present invention.

Referring to FIG. 34 and FIG. 35, a first variation of the embodiment A2 of the present invention will be described hereunder.

FIG. 34 is an enlarged fragmentary cross-sectional view of a thermal print head according to the first variation of the embodiment A2 of the present invention. FIG. 35 is another enlarged fragmentary cross-sectional view of the thermal print head according to the first variation of the embodiment A2 of the present invention.

The thermal print head B101 shown in FIG. 34 and FIG. 35 includes the base member 11, the circuit board 12 (unshown in this variation), the heat dissipation plate 13 (unshown in this variation), the heat storage region 2, the electrode layer 3, the resistor layer 4, the insulating layer 5, the cover layer 6, the driver IC 7 (unshown in this variation), the plurality of wires 81 (unshown in this variation), the encapsulating resin 82 (unshown in this variation), and the connector 83 (unshown in this variation).

The constituents of this embodiment except the cover layer 6, namely the base member 11, the circuit board 12, the heat dissipation plate 13, the heat storage region 2, the electrode layer 3, the resistor layer 4, the insulating layer 5, the driver IC 7, the plurality of wires 81, the encapsulating resin 82, and the connector 83 are the same as those of the thermal print head B100, and hence the description of these constituents will not be repeated.

In this embodiment, the cover layer 6 is formed after the first groove segment 791, the second groove segment 792, and the third groove segment 793 are formed. Accordingly, the first groove segment 791, the second groove segment 792, and the third groove segment 793 are filled with a part of the cover layer 6.

To be more detailed, the first groove sidewall 115a, the first groove bottom face 115b, and the first groove sidewall 25a are in direct contact with the cover layer 6. The second groove sidewall 116a, the second groove bottom face 116b, and the second groove sidewall 26a are in direct contact with the cover layer 6. The third groove sidewall 117a, the third groove bottom face 117b, and the third groove sidewall 27a are also in direct contact with the cover layer 6.

Unlike this variation, the configuration in which the cover layer 6 is not formed in the first groove segment 791 (see thermal print head B100) and the configuration in which the second groove segment 792 is filled with a part of the cover layer 6 (see thermal print head B101) may be combined. Alternatively, the configuration in which the first groove segment 791 is filled with a part of the cover layer 6 (see thermal print head B101) and the configuration in which the cover layer 6 is not formed in the second groove segment 792 (see thermal print head B100) may be combined.

<Second Variation of Embodiment A2>

Figure 36:
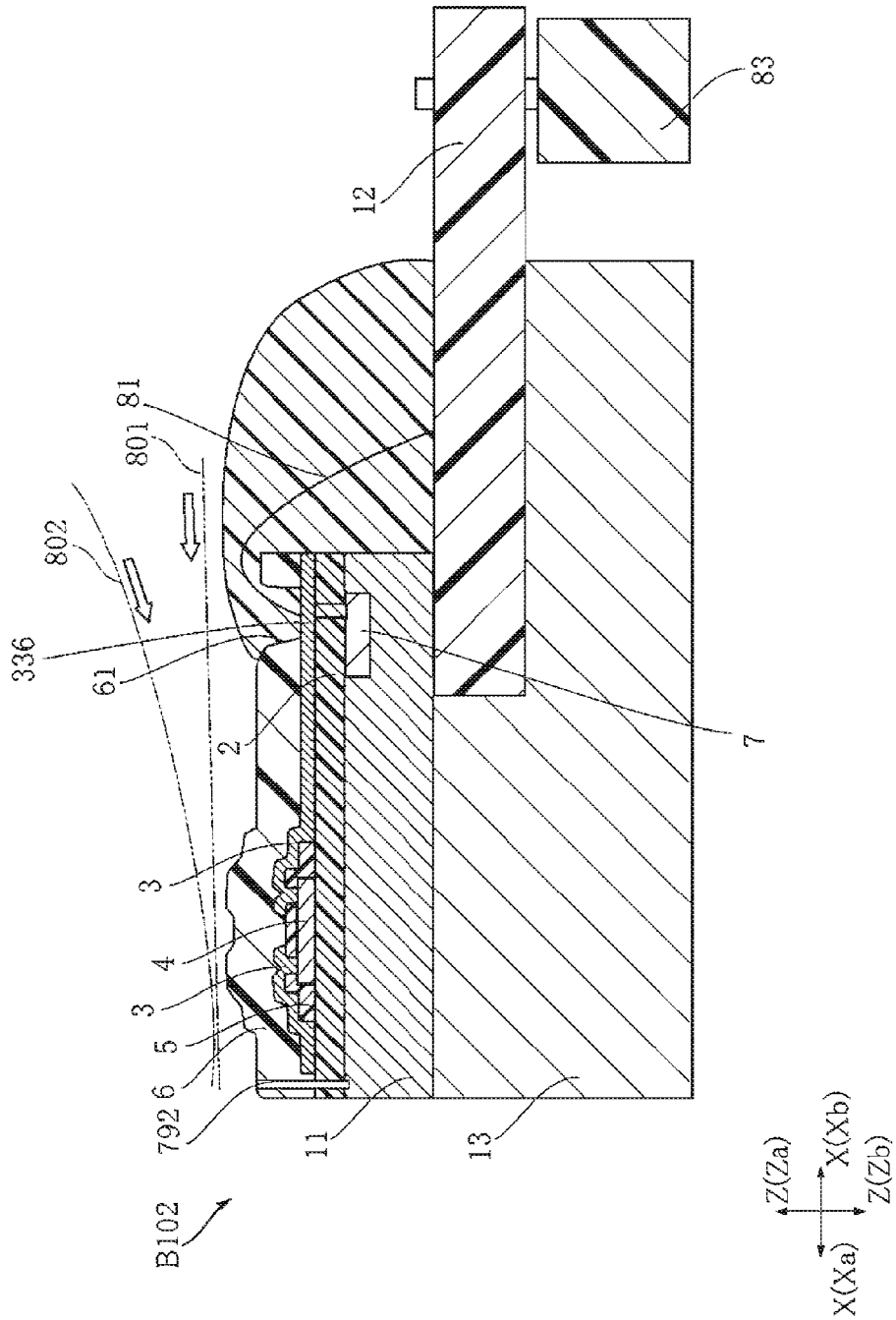
FIG. 36 is a cross-sectional view of a thermal print head according to a second variation of the embodiment A2 of the present invention.

Referring to FIG. 36, a second variation of the embodiment A2 of the present invention will be described hereunder.

FIG. 36 is a cross-sectional view of a thermal print head according to the second variation of the embodiment A2 of the present invention.

The thermal print head B102 shown in FIG. 27 is the same as the thermal print head B100 only except that the driver IC 7 is mounted inside the base member 11, and therefore detailed description will be omitted. In the thermal print head B102, the base member 11 is made of a semiconductor material. In addition, the driver IC 7 and the electrode layer 3 are electrically connected to each other through a via penetrating through the insulating layer 5. Such a configuration reduces the number of parts for manufacturing the thermal print head B102. Further, the thermal print head B102 also provides the same advantageous effects as those provided by the thermal print head B100.

Although the thermal print head B102 has been described as a variation of the thermal print head B100, the driver IC 7 may be mounted inside the base member 11, as a variation of the thermal print head B101.

Although the first groove segment 791, the second groove segment 792, and the third groove segment 793 are formed so as to extend as far as the base member 11 in the thermal print head B100, the thermal print head B101, and the thermal print head B102, different configurations may be adopted. For example, at least one of the first groove segment 791, the second groove segment 792, and the third groove segment 793 may be formed so as not to reach the base member 11.

In addition, the thermal print head may be without the second groove segment 792 and the third groove segment 793.

Embodiment A3

Referring to FIG. 37 to FIG. 40, an embodiment A3 of the present invention will be described hereunder.

Figure 37:
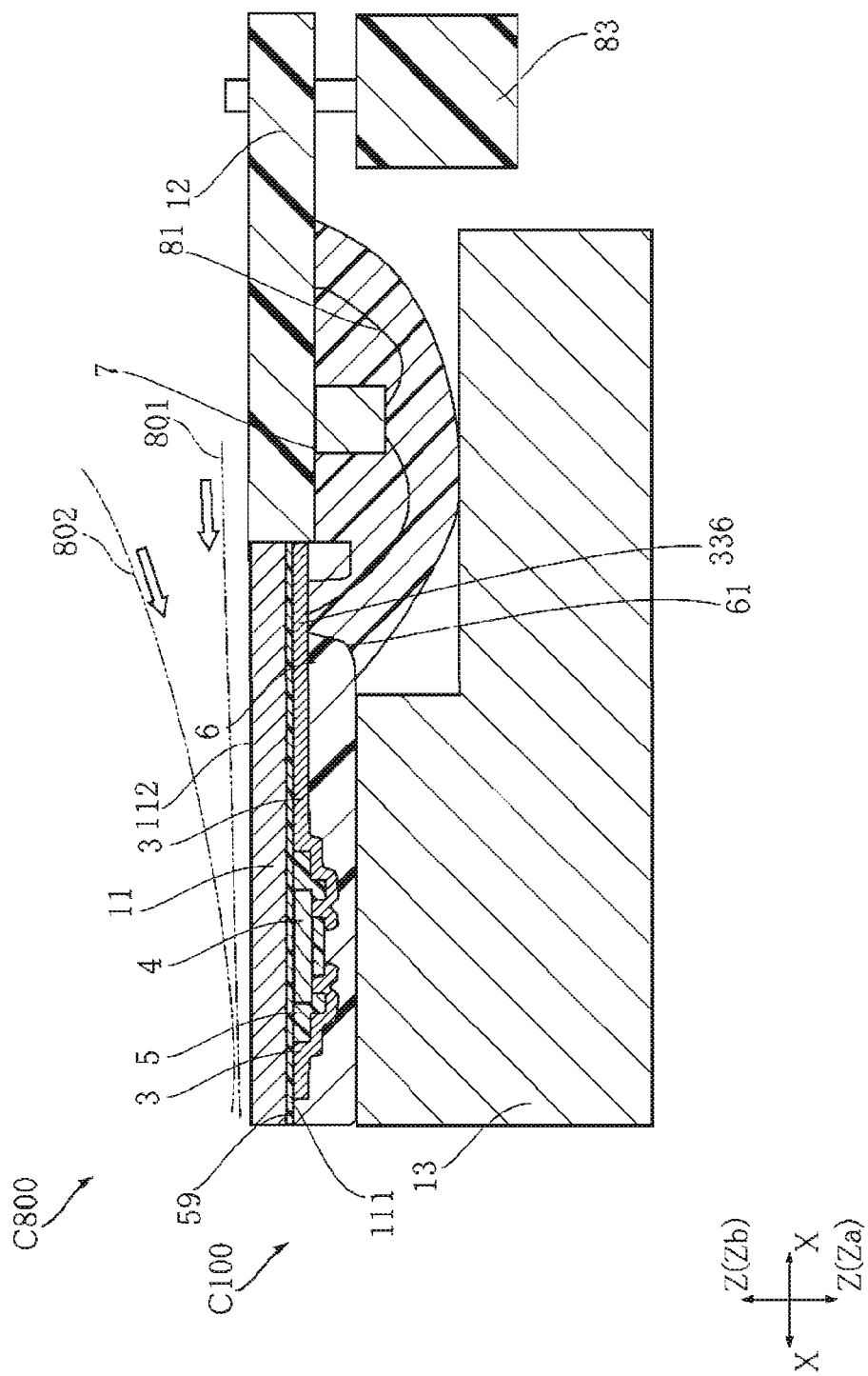
FIG. 37 is a fragmentary cross-sectional view of a thermal printer according to an embodiment A3 of the present invention.

FIG. 37 is a fragmentary cross-sectional view of a thermal printer according to the embodiment A3 of the present invention.

The thermal printer C800 shown in FIG. 37 is configured to perform a printing operation on the printing medium 801. The printing medium 801 may be, for example, a thermal paper for making out a barcode sheet or a receipt. The thermal printer C800 includes a thermal print head C100 and the platen roller 802.

The thermal print head C100 includes the base member 11, the circuit board 12, the heat dissipation plate 13, the electrode layer 3, the resistor layer 4, the insulating layer 5, an insulating 59, the cover layer 6, the driver IC 7, the plurality of wires 81, the encapsulating resin 82, and the connector 83.

The constituents of this embodiment except the base member 11 and the insulating layer 59, namely the circuit board 12, the heat dissipation plate 13, the electrode layer 3, the resistor layer 4, the insulating layer 5, the cover layer 6, the driver IC 7, the plurality of wires 81, the encapsulating resin 82, and the connector 93 are the same as those of the thermal print head A100, and hence the description of these constituents will not be repeated. In addition, the thermal print head C100 is without the heat storage region 2 and the intermediate layer 58, unlike the thermal print head A100. In the thermal print head C100, the heat dissipation plate 13 is located on the side to which the base member front surface 111 is oriented, unlike the thermal print head A100.

Figure 38:
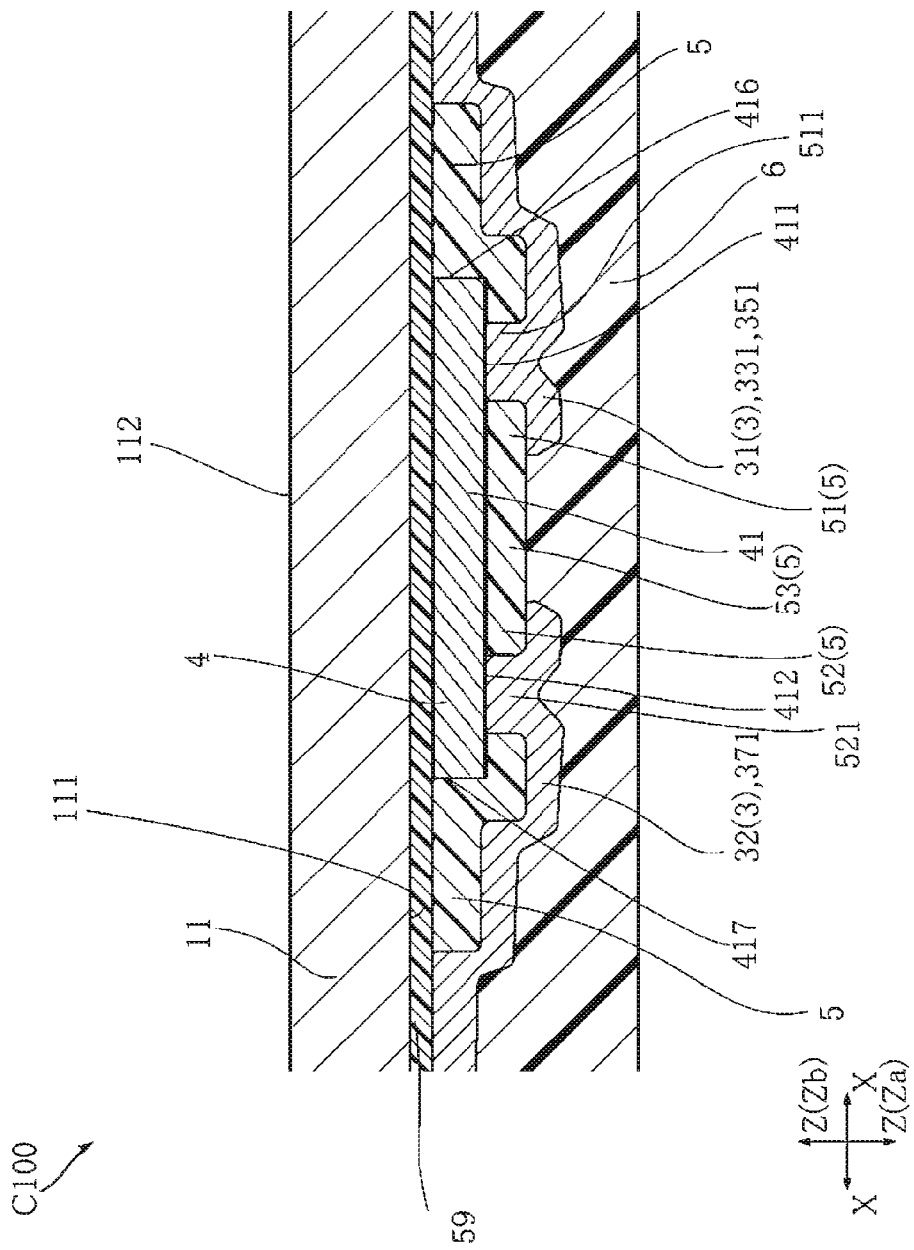
FIG. 38 is an enlarged fragmentary cross-sectional view of a thermal print head according to the embodiment A3 of the present invention.

FIG. 38 is an enlarged fragmentary cross-sectional view of the thermal print head according to the embodiment A3 of the present invention (heat dissipation plate 13 unshown).

The base member 11 has a plate shape. In this embodiment, the base member 11 is made of a semiconductor material. Examples of the semiconductor material to form the base member 11 include Si, SiC, GaP, GaAs, InP, and GaN. Although in this embodiment the base member 11 is made of a semiconductor material, it is not mandatory to employ a semiconductor material to form the base member 11. For example, the base member 11 may be made of an insulative material such as a ceramic. It is preferable that the material constituting the base member 11 has a thermal conductivity of 100 to 300 W/(m·K). Assuming that the base member 11 is made of Si for example, the thermal conductivity of Si is 140 to 170 W/(m·K). The base member 11 has a thickness of 10 to 50 μm, which is by far thinner than the foregoing embodiments. The base member 11 has a flat plate shape extending in the main scanning direction Y. The base member 11 has a width (size in the sub scanning direction X of the base member 11) of, for example, 3 to 20 mm. The size of the base member 11 in the main scanning direction Y is, for example, 10 to 300 mm.

As shown in FIG. 38, the recess 113a is not formed in the base member 11 in this embodiment.

Figure 39:
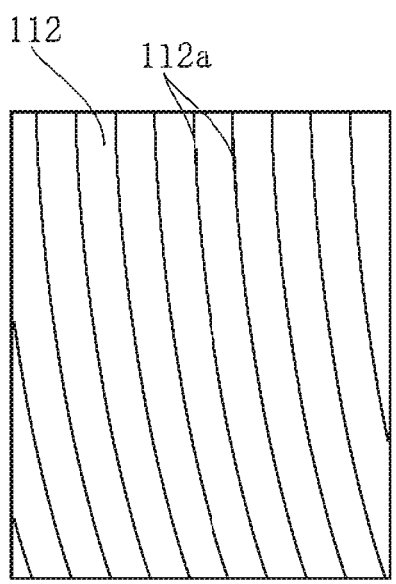
FIG. 39 is enlarged fragmentary plan view of the rear surface of the base member according to the embodiment A3 of the present invention.

The base member 11 includes the base member front surface 111 and the base member rear surface 112. The base member front surface 111 is a flat plane extending in the sub scanning direction X and the main scanning direction Y. The base member front surface 111 has longitudinal sides extending in the main scanning direction Y. The base member front surface 111 is oriented to one side (Za-side) in the thickness direction Z of the base member 11. In other words, the base member front surface 111 is oriented toward the resistor layer 4. The base member rear surface 112 is a flat plane extending in the sub scanning direction X and the main scanning direction Y. The base member rear surface 112 has longitudinal sides extending in the main scanning direction Y. The base member rear surface 112 is oriented to the opposite side (Zb-side) in the thickness direction Z of the base member 11. In other words, the base member rear surface 112 is oriented to the side opposite to the resistor layer 4. In this embodiment, the platen roller 802 is located on the side to which the base member rear surface 112 is oriented, and the base member rear surface 112 is opposed to the platen roller 802. The printing medium 801 is transported between the base member rear surface 112 and the platen roller 802. As a result of polishing the base member 11 to a thickness of 10 to 50 μm, a linear scratch 112a (see FIG. 39) is formed on the base member rear surface 112. As shown in FIG. 39, the linear scratch 112a is composed of a plurality of parallel lines.

As shown in FIG. 37 and FIG. 38, the insulating layer 59 is formed on the base member front surface 111. The insulating layer 59 covers substantially the entirety of the base member front surface 111.

In this embodiment, the cover layer 6 is opposed to the heat dissipation plate 13. In addition, the cover layer 6 is in direct contact with the heat dissipation plate 13. The cover layer 6 has a thickness of, for example, 1 to 5 μm. In this embodiment, the driver IC 7, the encapsulating resin 82, and the connector 83 are located opposite to the platen roller 802 with respect to the circuit board 12. The cover layer 6 has a thermal conductivity of, for example, 0.1 to 0.5 W/(m·K).

The advantageous effects of this embodiment will be described hereunder.

In this embodiment, the heat dissipation plate 13 is located on the side to which the base member front surface 111 is oriented. With such a configuration, the heat generated by the heating portion 41 is transmitted to the printing medium 801 through the base member 11, to perform printing operation on the printing medium 801. The heat generated by the heating portion 41 is also transmitted to the cover layer 6, to be accumulated therein. Thus, the cover layer 6 also serves as a heat storage region. Such a configuration eliminates the need for the thermal print head C100 to have a thick heat storage region. Forming a thick heat storage region requires a high-level technique, and therefore the thermal print head C100 which eliminates the need to form a thick heat storage region contributes to simplifying the manufacturing process.

The semiconductor process to form the electrode layer 3 and the resistor layer 4 is performed under a temperature as high as several hundred degrees Celsius. In this embodiment, the cover layer 6 is formed after the electrode layer 3 and the resistor layer 4 are formed on the base member 11. Accordingly, there is no need to perform the semiconductor process after the cover layer 6 is formed. In other words, the cover layer 6 is exempted from being exposed to a high temperature of several hundred degrees Celsius. Therefore, a material of a low heat-resistant temperature may be employed to form the cover layer 6. For example, polyimide may be employed to form the cover layer 6 in this embodiment. Although the heat-resistant temperature of polyimide is approximately 400 degrees Celsius, polyimide has a very low thermal conductivity and hence has a high heat storing capacity.

In this embodiment, the base member 11 is made of a material having a thermal conductivity as high as 100 to 300 W/(m·K). Such a configuration is advantageous for efficiently transmit the heat generated by the heating portion 41 to the printing medium 801.

In this embodiment, the base member 11 has a thickness of to 50 μm, which is very thin. Such a configuration is advantageous for efficiently transmit the heat generated by the heating portion 41 to the printing medium 801. Therefore, higher printing quality can be obtained on the printing medium 801.

In this embodiment, the encapsulating resin 82 is located on the side to which the base member front surface 111 is oriented. Such a configuration prevents the encapsulating resin 82 from interfering with the printing medium 801. Accordingly, the size of the base member 11 in the sub scanning direction X can be reduced, which leads to reduction in size of the thermal print head C100. The reduction in size of the base member 11 in the sub scanning direction X also leads to reduction in manufacturing cost of the thermal print head C100.

In this embodiment, the through window 61 in the cover layer 6 is formed by etching on the cover layer 6'. Through the etching process the through window 61 can be formed at a desired position in the cover layer 6, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head C100.

<First Variation of Embodiment A3>

Figure 40:
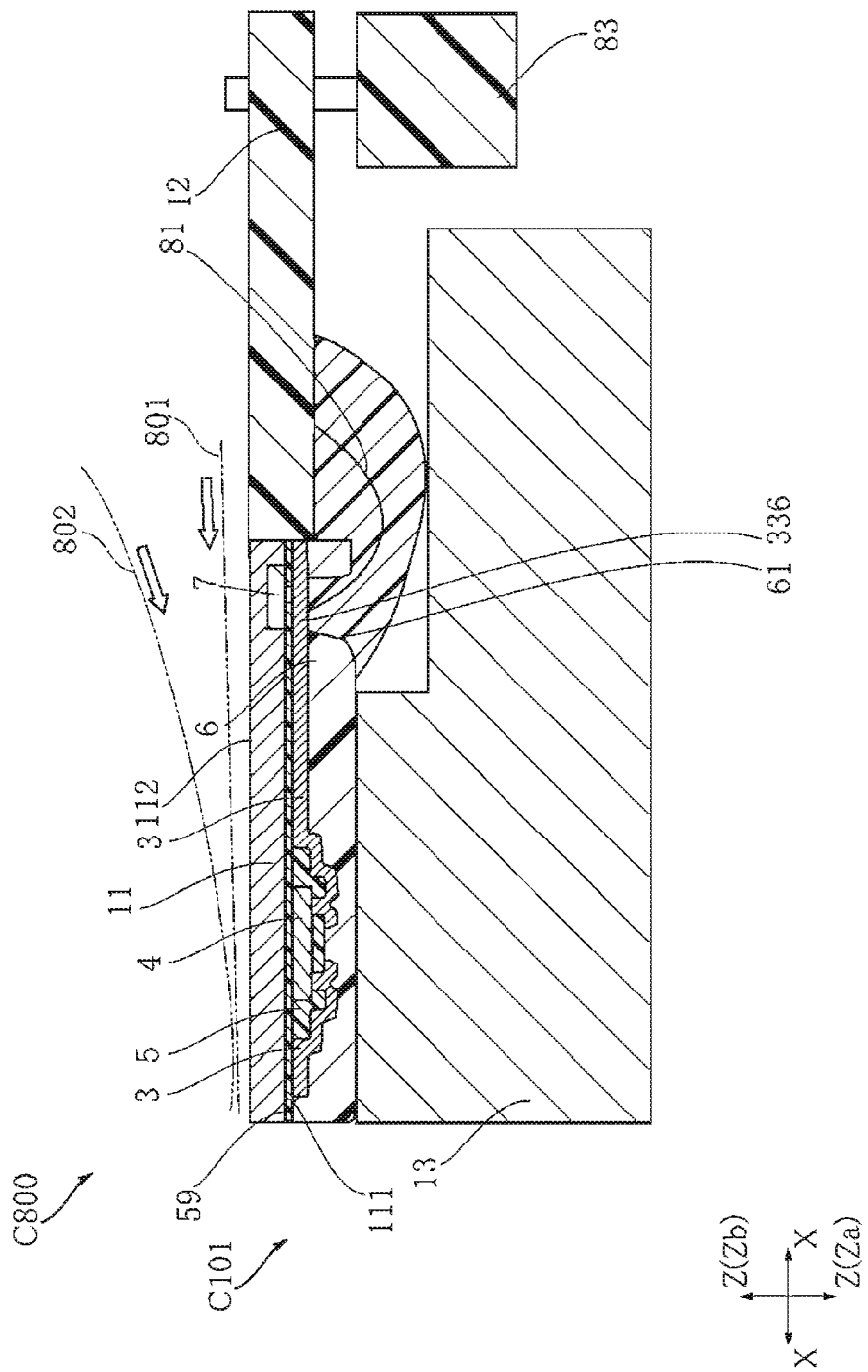
FIG. 40 is a cross-sectional view of a thermal printer according to a first variation of the embodiment A3 of the present invention.
Figure 41:
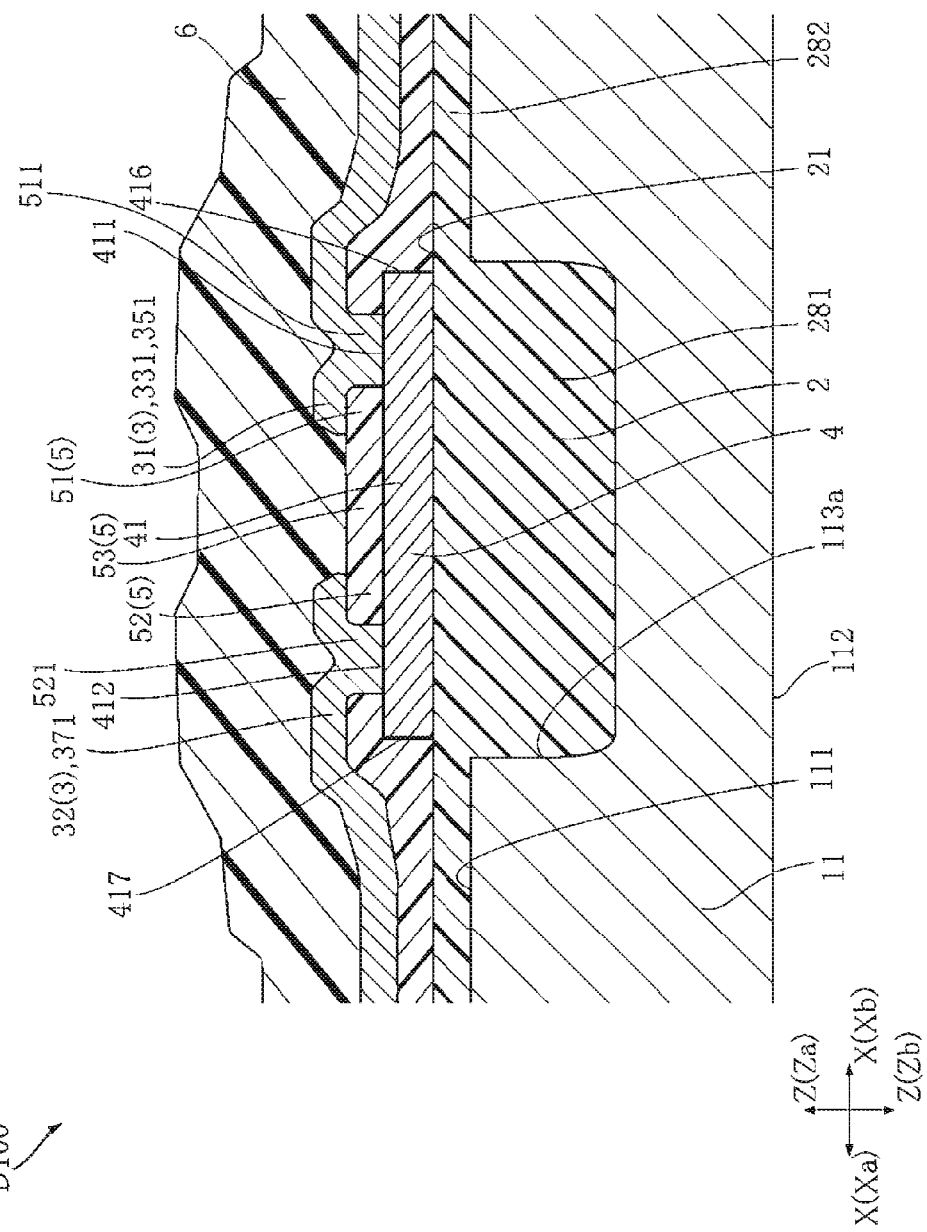
FIG. 41 is a fragmentary cross-sectional view of a thermal print head according to another embodiment of the present invention.

Referring to FIG. 40, a first variation of the embodiment A3 of the present invention will be described hereunder.

FIG. 40 is a cross-sectional view of a thermal printer according to the first variation of the embodiment A3 of the present invention.

The thermal print head C101 shown in FIG. 40 is the same as the thermal print head C100 only except that the driver IC 7 is mounted inside the base member 11, and therefore detailed description will be omitted. In the thermal print head C101, the base member 11 is made of a semiconductor material. In addition, the driver IC 7 and the electrode layer 3 are electrically connected to each other through a via penetrating through the insulating layer 5. Such a configuration reduces the number of parts for manufacturing the thermal print head C101. Further, the thermal print head C101 also provides the same advantageous effects as those provided by the thermal print head C100.

Other Embodiments

Referring to FIG. 41 to FIG. 46, other embodiments of the present invention will be described hereunder.

The thermal print head D100 according to this embodiment is different from the foregoing thermal print head in the formation process of the heat storage region 2.

In this embodiment, the heat storage region 2 includes a plurality of first portions 281 and second portions 282.

Figure 42:
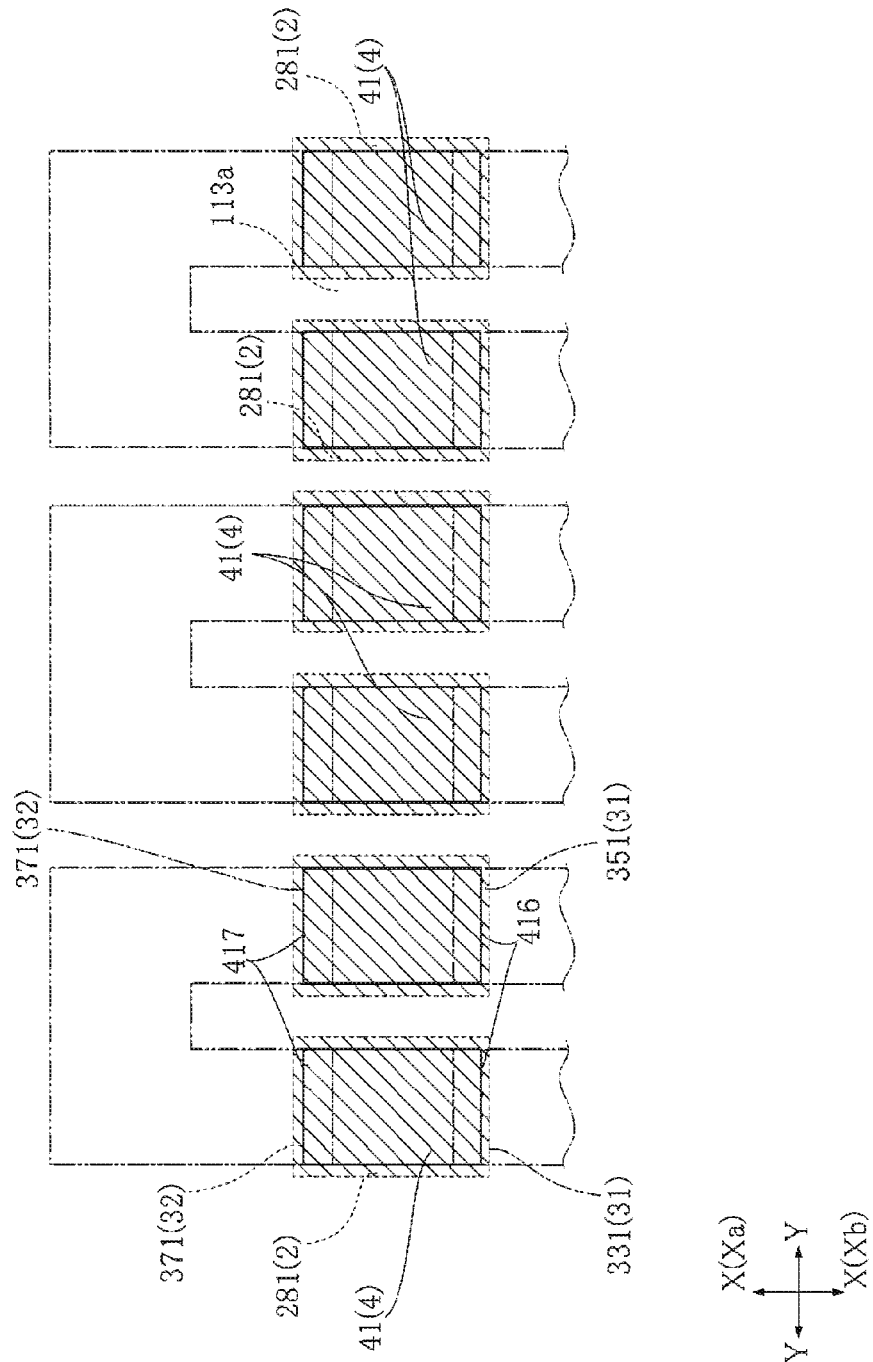
FIG. 42 is a plan view of the thermal print head shown in FIG. 41.

The first portions 281 are each formed so as to penetrate into the base member 11. In other words, the recesses 113a are formed in the base member 11 also in this embodiment, and the first portions 281 are formed in the respective recesses 113a. In this embodiment, the heat storage region is formed by oxidizing the material constituting the base member 11. For example, in the case where the base member 11 is formed of Si, the first portion 281 is formed of $SiO_2$. As shown in FIG. 42, the first portions 281 are located so as to overlap the respective heating portions 41 as viewed in the thickness direction 2, and are of substantially the same size. The first portions 281 are spaced from each other. In FIG. 42, the regions corresponding to the first portions 281 are hatched. The first portions 281 are formed through forming trench 113f in the base member 11, further details of which will be subsequently described.

The second portions 282 are each located between the first portion 281 and the corresponding heating portion 41. In this embodiment, the second portions 282 are formed along a plane perpendicular to the thickness direction Z. The second portion 282 is formed of, for example, $SiO_2$.

Hereunder, the manufacturing method of the thermal print head D100 will be described.

Figure 43:
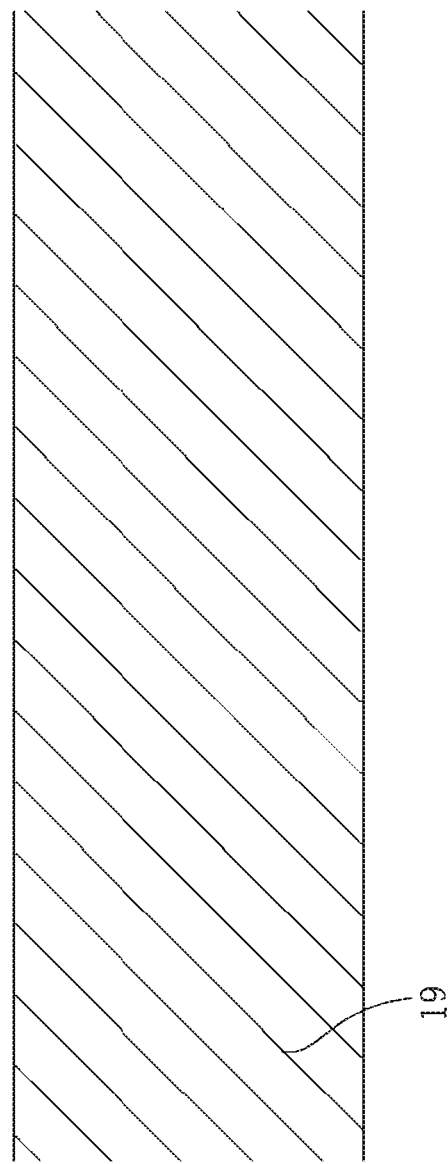
FIG. 43 is a cross-sectional view showing a step in the manufacturing process of the thermal print head shown in FIG. 41.
Figure 44:
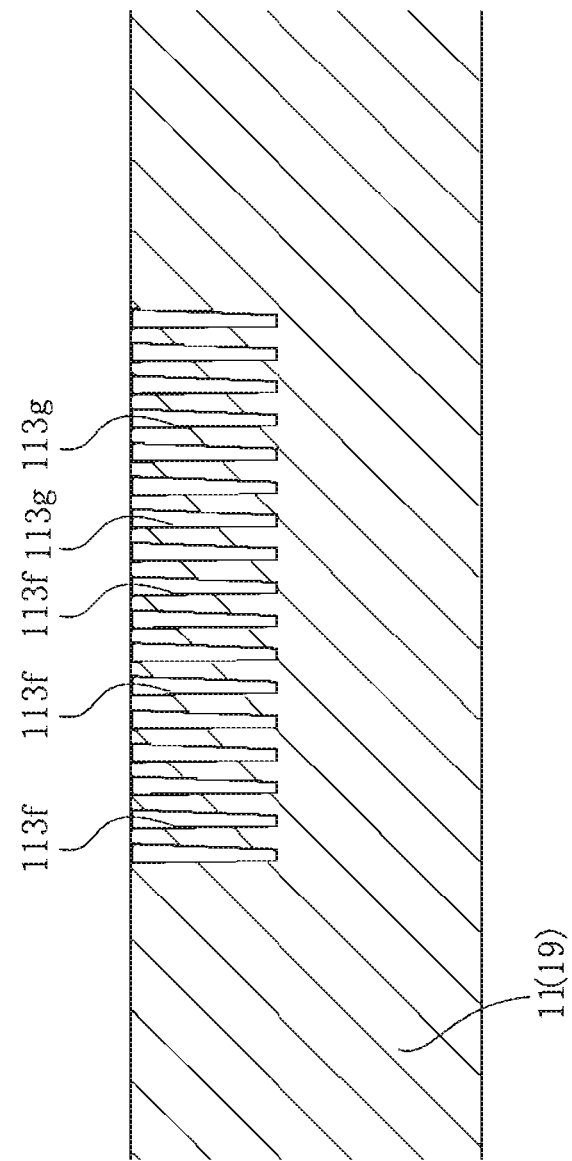
FIG. 44 is a cross-sectional view showing a step subsequent to FIG. 43.

Referring to FIG. 43, the semiconductor substrate 19 is first prepared. The semiconductor substrate 19 is formed of Si in this embodiment. Proceeding to FIG. 44, the trenches 113f are formed in the semiconductor substrate 19. To form the trenches 113f in the semiconductor substrate 19, for example etching may be performed on the semiconductor substrate 19. In this embodiment, anisotropic deep reactive ion etching (RIE) is performed utilizing a resist pattern (unshown) as the mask, and more specifically a Bosch process is performed to deeply dig the semiconductor substrate 19. The trenches 113f are formed in a polka dot pattern (for example a matrix or checkerboard pattern) in a plan view.

In the Bosch process, etching on the semiconductor substrate 19 using sulfur hexafluoride (SF6) and formation of a cover layer on the etched surface with perfluorocyclobutane (C4F8) are repeatedly performed. Through such a process, the semiconductor substrate 19 can be etched in a high aspect ratio, however a corrugated pattern called scallop is formed on the etched surface (inner circumferential surface of trench 113f). After the formation of the trenches 113f, the non-illustrated resist pattern is removed. In this embodiment, the inner circumferential surface 113g of each of the trenches 113f has an opening area increasing toward an upper position in FIG. 44.

Figure 45:
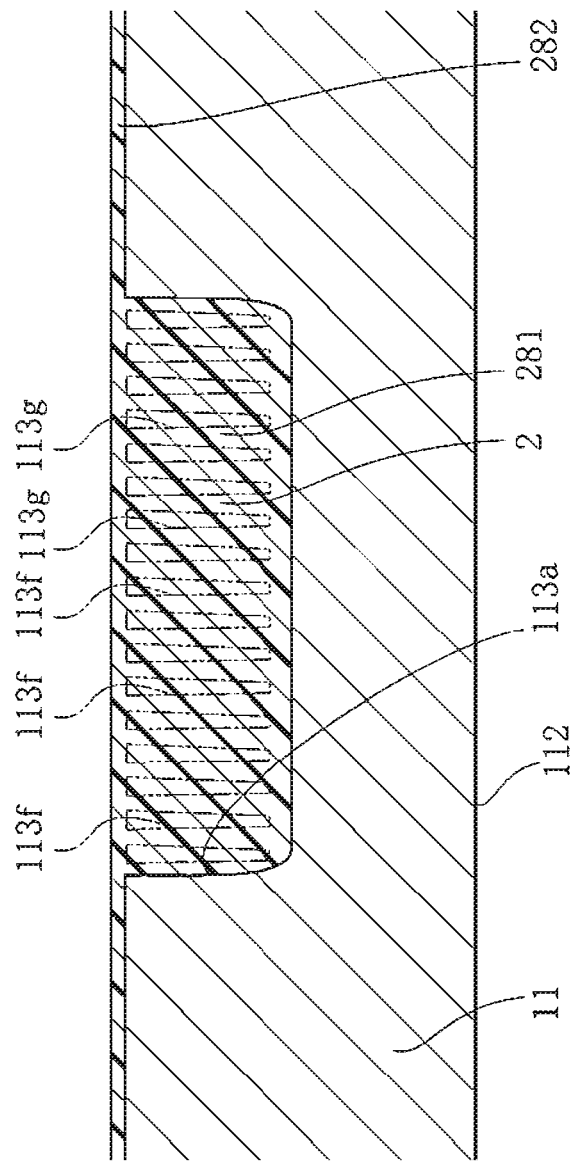
FIG. 45 is a cross-sectional view showing a step subsequent to FIG. 44.

Then the first portions 281 of the heat storage region 2 and a part of the second portions 282 of the heat storage region 2 are formed in the base member 11, as shown in FIG. 45. The formation of the first portions 281 of the heat storage region 2 and a part of the second portions 282 of the heat storage region 2 is formed through thermal oxidation. To be more detailed, the substrate 11 is thermally oxidized (for example, 24 hours under 1100 to 1150 degrees Celsius), for example in a vacuum state. Through the thermal oxidation of the substrate 11, a part of the substrate 11 (formed of silicon in this embodiment) is altered into a silicon oxide film, concentrically from the inner circumferential surface of each of the trenches 113f. Then the silicon oxide film thermally expands so as to fill in the trench 113f.

Figure 46:
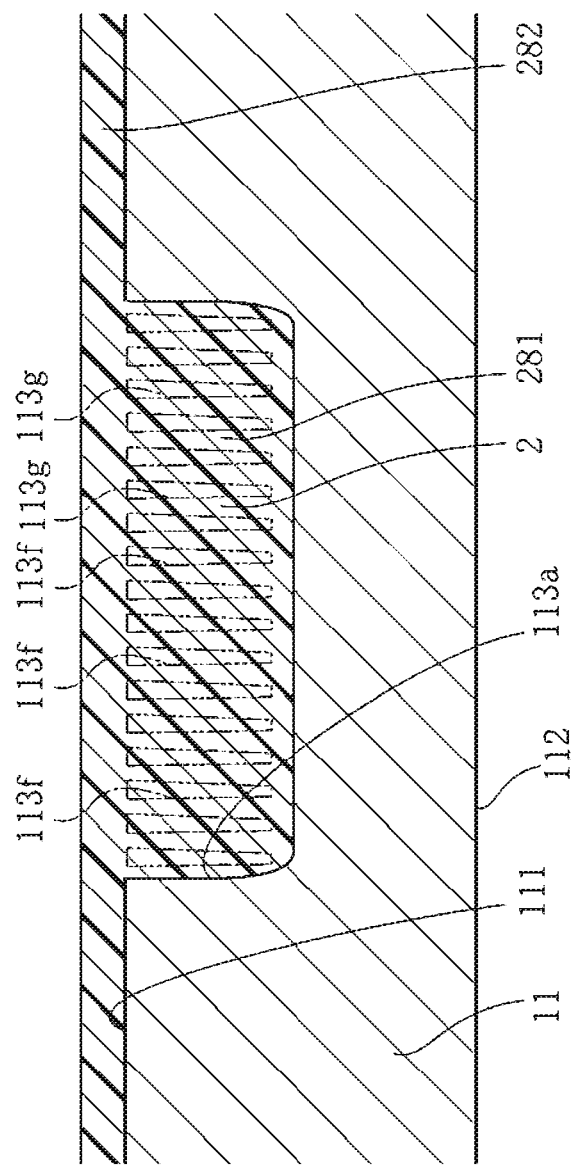
FIG. 46 is a cross-sectional view showing a step subsequent to FIG. 45.

Proceeding to FIG. 46, the remaining portion of the second portions 282 of the heat storage region 2 is formed. The remaining portion of the second portion 282 may be formed, for example, by thermal oxidation, sputtering, CVD, or printing. In this embodiment, the second portion 282 is a low temperature oxide (LTO) film. After the formation of the second portion 282, the upper surface of the second portion 282 is made flat.

Thereafter, the same steps as those described with reference to FIG. 12 and subsequent drawings are performed, and resultantly the thermal print head can be obtained.

The thermal print head D100 thus configured is also capable of storing a large amount of heat in the heat storage region 2, and provides the same advantageous effects as those provided by the thermal print head A100.

<Variation>

Figure 47:
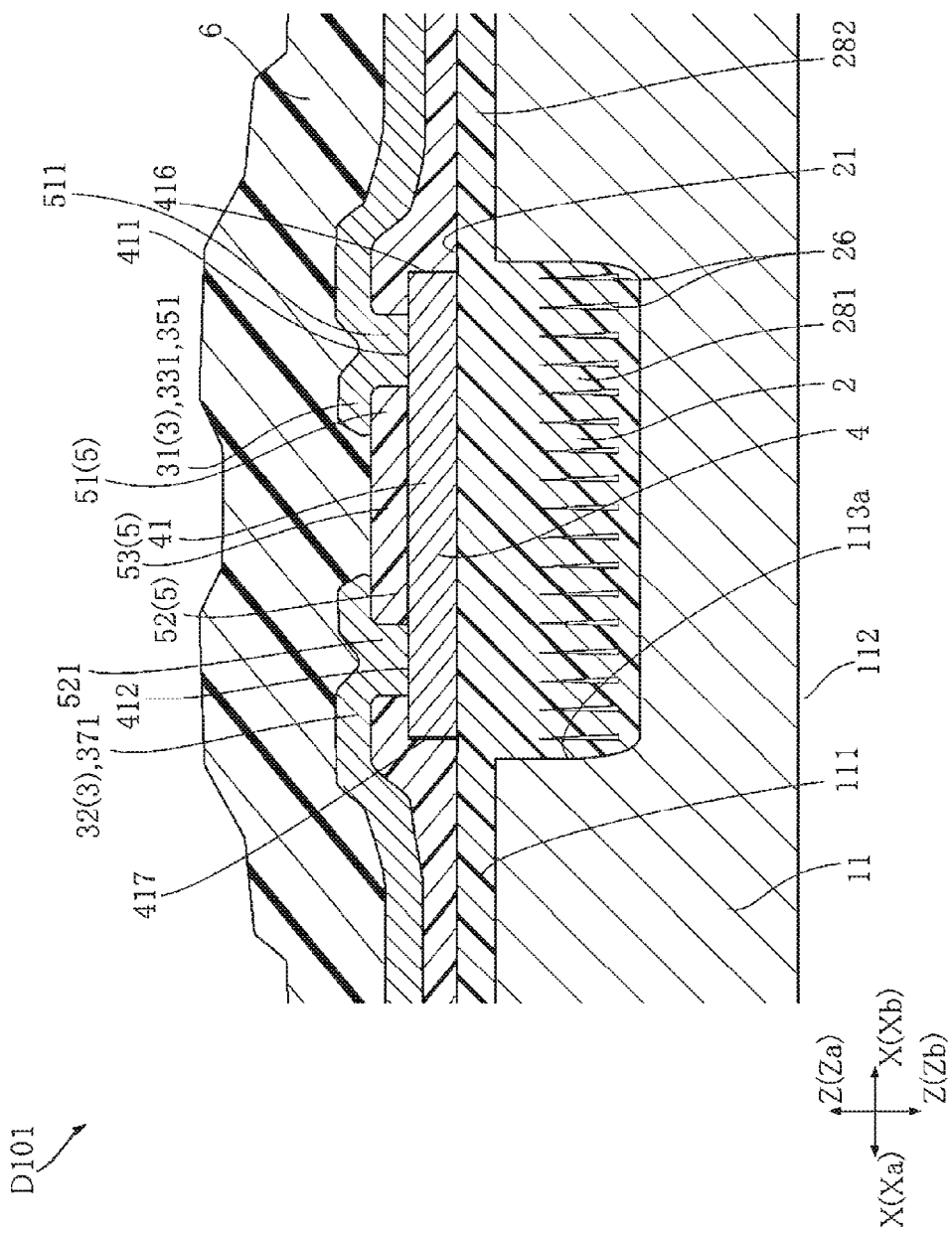
FIG. 47 is a fragmentary cross-sectional view of the thermal print head according to a variation of the embodiment shown in FIG. 41.

The thermal print head D101 shown in FIG. 47 is different from the thermal print head D100 in that the first portion 281 of the heat storage region 2 includes a plurality of voids 26. The voids 26 serve as a heat insulating portion. The other portions are configured in the same way as in the thermal print head D100, and hence the description will not be repeated.

Hereunder, the manufacturing method of the thermal print head D101 will be described.

Figure 48:
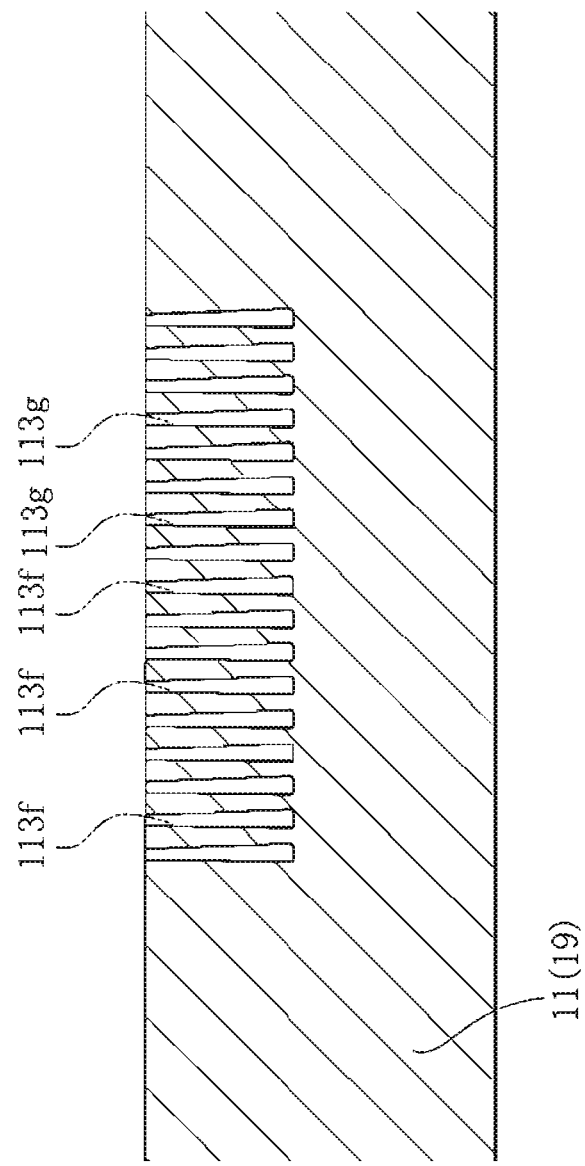
FIG. 48 is a cross-sectional view showing a step in the manufacturing process of the thermal print head shown in FIG. 47.

In this variation also, the trenches 113f are formed in the semiconductor substrate 19 as shown in FIG. 48. In this variation, the inner circumferential surface 113g of the trench 113f has an opening area decreasing toward an upper position in FIG. 48. In other words, the inner circumferential surface 113g of the trench 113f is formed in a reverse tapered shape.

Figure 49:
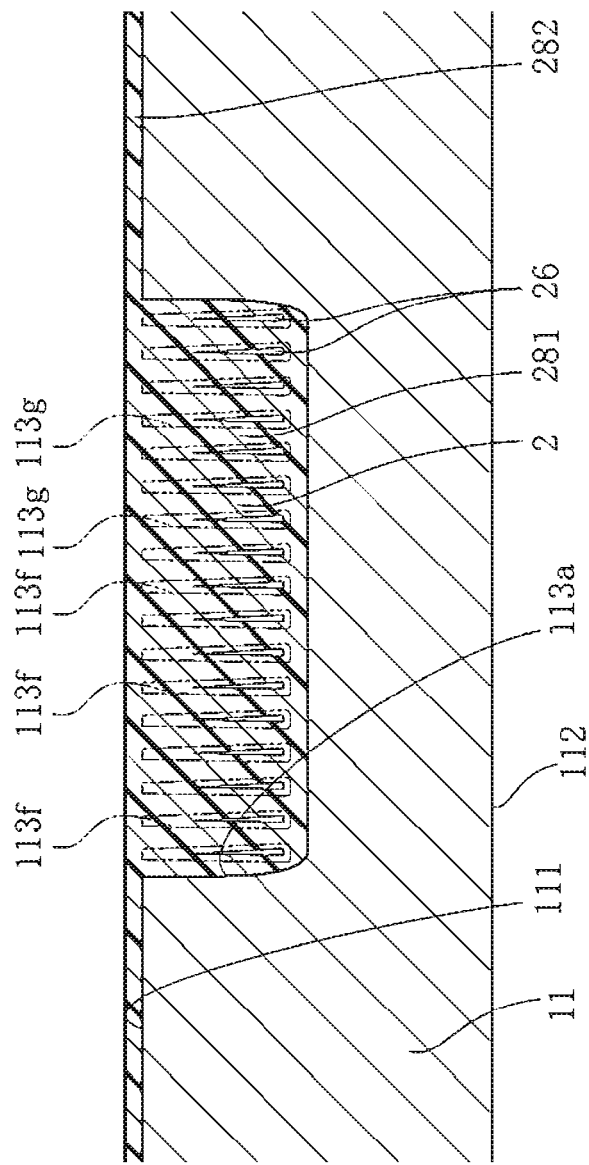
FIG. 49 is a cross-sectional view showing a step subsequent to FIG. 48.

Proceeding to FIG. 49, the first portions 281 of the heat storage region 2 and a part of the second portions 282 of the heat storage region 2 are formed in the base member 11. The formation of the first portions 281 of the heat storage region 2 and a part of the second portions 282 of the heat storage region 2 is formed through thermal oxidation. To be more detailed, the substrate 11 is thermally oxidized (for example, 24 hours under 1100 to 1150 degrees Celsius), for example in a vacuum state. Through the thermal oxidation of the substrate 11, a part of the substrate 11 (formed of silicon in this embodiment) is altered into a silicon oxide film, concentrically from the inner circumferential surface of each of the trenches 113f. Then the silicon oxide film thermally expands so as to fill in a major part of the trenches 113f. In this embodiment, the trenches 113f are not completely filled but the voids 26 remain in each of the trenches 113f.

Figure 50:
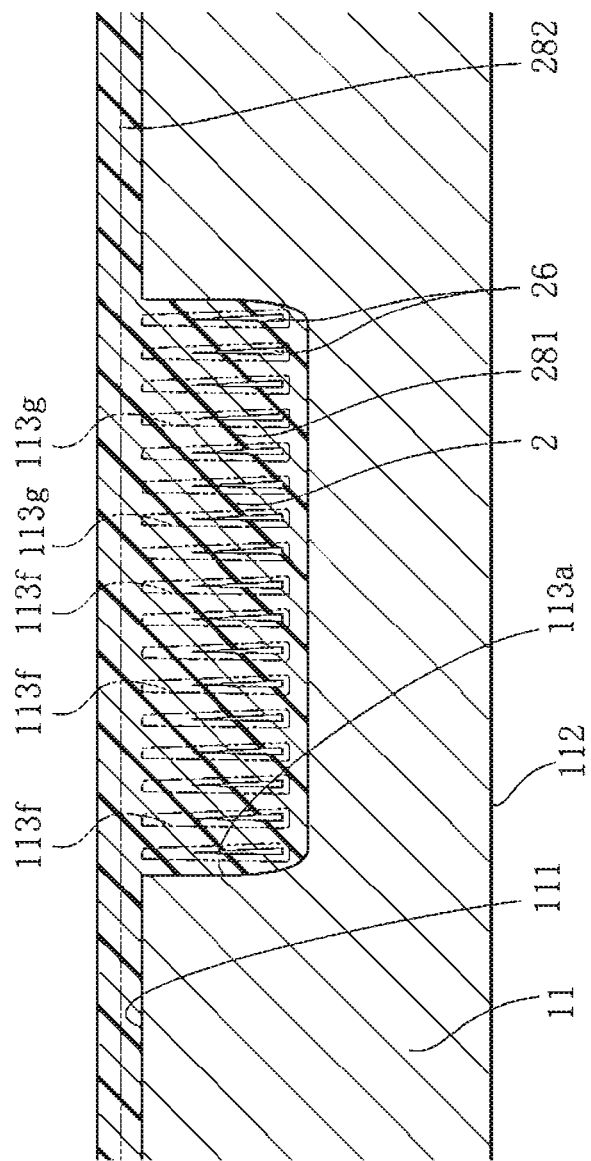
FIG. 50 is a cross-sectional view showing a step subsequent to FIG. 49.

Proceeding to FIG. 50, the remaining portion of the second portions 282 of the heat storage region 2 is formed. The remaining portion of the second portion 282 may be formed, for example, by thermal oxidation, sputtering, CVD, or printing. In this embodiment, the second portion 282 is a low temperature oxide (LTO) film. After the formation of the second portion 282, the upper surface of the second portion 282 is made flat.

Thereafter, the same steps as those described with reference to FIG. 12 and subsequent drawings are performed, and resultantly the thermal print head can be obtained.

The thermal print head D0101 thus configured is also capable of storing a large amount of heat in the heat storage region 2, and provides the same advantageous effects as those provided by the thermal print head D100.

Variations of the present invention illustrated in FIG. 1 to FIG. 50 and described thus far with reference to these drawings will be cited as appendices hereunder.

[Appendix α1] A thermal print head including a base member, a heat storage region formed on the base member, a resistor layer formed on the base member, an electrode layer formed on the base member and electrically connected to the resistor layer, and a cover layer covering the resistor layer, in which the resistor layer includes a plurality of heating portions spanned between two portions of the electrode layer spaced from each other as viewed in a thickness direction of the base member, a first groove segment is formed at least in the heat storage region, and the first groove segment is located between two heating portions adjacent to each other in a main scanning direction, out of the plurality of heating portions. [Appendix α2] The thermal print head according to appendix α1, in which the first groove segment is located so as to overlap an entirety of one of the plurality of heating portion in a sub scanning direction. [Appendix α3] The thermal print head according to appendix α1 or α2, in which the heat storage region includes a first groove sidewall constituting the first groove segment. [Appendix α4] The thermal print head according to appendix α3, in which the first groove segment extends as far as the base member. [Appendix α5] The thermal print head according to appendix α3 or α4, in which the first groove sidewall is exposed to an open space. [Appendix α6] The thermal print head according to any one of appendices α1 to α5, in which the first groove segment is constituted of the cover layer. [Appendix α7] The thermal print head according to any one of appendices α1 to α5, in which a part of the cover layer is formed so as to fill in the first groove segment. [Appendix α8] The thermal print head according to any one of appendices α1 to α7, in which the plurality of heating portions each include a first side face and a second side face oriented to either side in the main scanning direction, the first side face being oriented opposite to the second side face, and the first side face and the second side face are both covered with the cover layer. [Appendix α9] The thermal print head according to any one of appendices α1 to α8, in which the electrode layer includes an intermediate electrode connecting two heating portions adjacent to each other in the main scanning direction out of the plurality of generators, a second groove segment is formed at least in the heat storage region, and the intermediate electrode is located between the second groove segment and the plurality of heating portions in the sub scanning direction. [Appendix α10] The thermal print head according to appendix α9, in which the second groove is formed in a shape extending in the main scanning direction. [Appendix α11] The thermal print head according to appendix α10, in which the heat storage region includes a second groove sidewall constituting the second groove segment. [Appendix α12] The thermal print head according to appendix α11, in which the second groove segment extends as far as the base member. [Appendix α13] The thermal print head according to appendix α11 or α12, in which the second groove sidewall is exposed to an open space. [Appendix α14] The thermal print head according to any one of appendices α9 to α13, in which the second groove segment is formed of the cover layer. [Appendix α15] The thermal print head according to any one of appendices α9 to α13, in which a part of the cover layer is formed so as to fill in the second groove segment. [Appendix α16] The thermal print head according to any one of appendices α9 to α15, in which the second groove segment is continuous with the first groove segment. [Appendix α17] The thermal print head according to any one of appendices α9 to α16, in which a third groove segment is formed at least in the heat storage region, and the third groove segment is located between two heating portions connected to each other via the intermediate electrode, out of the plurality of heating portions. [Appendix α18] The thermal print head according to appendix α17, in which the heat storage region includes a surface oriented to the side opposite to the base member, the first groove segment is recessed from the surface, and the second groove segment is recessed from the surface. [Appendix α19] The thermal print head according to any one of appendices α1 to α18, in which the resistor layer is interposed between the electrode layer and the heat storage region. [Appendix α20] The thermal print head according to any one of appendices α1 to α19, further including an insulating layer interposed between the resistor layer and the electrode layer, in which the heat storage region includes a portion disposed in direct contact with the insulating layer. [Appendix α21] The thermal print head according to any one of appendices α1 to α20, in which the base member is made of a semiconductor material. [Appendix α22] The thermal print head according to appendix α20, in which the cover layer is in direct contact with the insulating layer. [Appendix α23] The thermal print head according to any one of appendices α1 to α22, further including a circuit board, a plurality of wires, and a resin layer covering the circuit board, the plurality of wires, and the cover layer. [Appendix α24] The thermal print head according to appendix α23, in which the cover layer includes a through window, the electrode layer includes a bonding portion exposed in the through window, and one of the plurality of wires is bonded to the bonding portion. [Appendix α25] The thermal print head according to appendix α23 or α24, in which the resin layer is in direct contact with the cover layer. [Appendix α26] The thermal print head according to any one of appendices α1 to α25, further including a driver IC that supplies a current to the electrode layer, the driver IC being mounted inside the base member. [Appendix α27] The thermal print head according to any one of appendices α23 to α25, further including a driver IC that supplies a current to the electrode layer, the driver IC being mounted on the circuit board. [Appendix α28] The thermal print head according to appendix α20, in which the insulating layer is made of $SiO_2$ or $SiAlO_2$. [Appendix α29] The thermal print head according to any one of appendices α1 to α28, in which the resistor layer is made of at least one of polysilicon, $TaSiO_2$, and TiON. [Appendix α30] The thermal print head according to any one of appendices α1 to α29, in which the electrode layer is made of at least one of Au, Ag, Cu, Cr, Al—Si, and Ti. [Appendix α31] The thermal print head according to any one of appendices α1 to α30, further including a heat dissipation plate that supports the base member. [Appendix α32] A thermal printer including the thermal print head according to any one of appendices α1 to α31, and a platen roller opposed to the thermal print head. [Appendix β1] A thermal print head including a base member having a front surface and a rear surface oriented opposite to each other, a resistor layer formed on the front surface of the base member, an electrode layer formed on the front surface of the base member and electrically connected to the resistor layer, a cover layer made of a resin and covering the resistor layer, and a heat dissipation plate, in which the resistor layer includes a plurality of heating portions spanned between two portions of the electrode layer spaced from each other as viewed in a thickness direction of the base member, the plurality of heating portions are aligned in a main scanning direction, and the heat dissipation plate is located on the side to which the front surface of the base member is oriented. [Appendix β2] The thermal print head according to appendix β1, in which the resin constituting the cover layer is one of polyimide, polyamide, and polyethylene. [Appendix β3] The thermal print head according to appendix β1 or β2, in which the base member is made of a material having a thermal conductivity of 100 to 300 W/(m·K). [Appendix β4] The thermal print head according to any one of appendices β1 to β3, in which the base member is made of a semiconductor material. [Appendix β5] The thermal print head according to any one of appendices β1 to β4, in which the base member has a thickness of 10 to 50 μm. [Appendix β6] The thermal print head according to any one of appendices β1 to β5, in which the rear surface of the base member includes linear scratches composed of a plurality of parallel lines. [Appendix β7] The thermal print head according to any one of appendices β1 to β6, in which the cover layer has a thickness of 1 to 5 μm. [Appendix β8] The thermal print head according to any one of appendices β1 to β7, further including an insulating layer formed on the front surface of the base member. [Appendix β9] The thermal print head according to appendix β8, in which the insulating layer is in direct contact with the resistor layer and the electrode layer. [Appendix β10] The thermal print head according to any one of appendices β1 to β9, in which the cover layer is in direct contact with the electrode layer. [Appendix β11] The thermal print head according to any one of appendices β1 to β10, further including a circuit board, a plurality of wires, and a resin layer covering the circuit board, the plurality of wires, and the cover layer, in which the resin layer is formed on the side to which the front surface of the base member is oriented. [Appendix β12] The thermal print head according to appendix β11, in which the cover layer includes a through window, the electrode layer includes a bonding portion exposed in the through window, and one of the plurality of wires is bonded to the bonding portion. [Appendix β13] The thermal print head according to appendix β11 or β12, in which the resin layer is in direct contact with the cover layer. [Appendix β14] The thermal print head according to any one of appendices β1 to β13, further including a driver IC that supplies a current to the electrode layer, the driver IC being mounted inside the base member. [Appendix β15] The thermal print head according to any one of appendices β11 to β13, further including a driver IC that supplies a current to the electrode layer, the driver IC being mounted on the circuit board. [Appendix β16] The thermal print head according to appendix β8 or β9, in which the insulating layer is made of $SiO_2$ or $SiAlO_2$. [Appendix β17] The thermal print head according to any one of appendices β1 to β16, in which the resistor layer is made of at least one of polysilicon, $TaSiO_2$, and TiON. [Appendix β18] The thermal print head according to any one of appendices β1 to β17, in which the electrode layer is made of at least one of Au, Ag, Cu, Cr, Al—Si, and Ti. [Appendix β19] A thermal printer including the thermal print head according to any one of appendices β1 to β18 and a platen roller, in which the platen roller is located on the side to which the rear surface of the base member is oriented.

Embodiment B1

Figure 51:
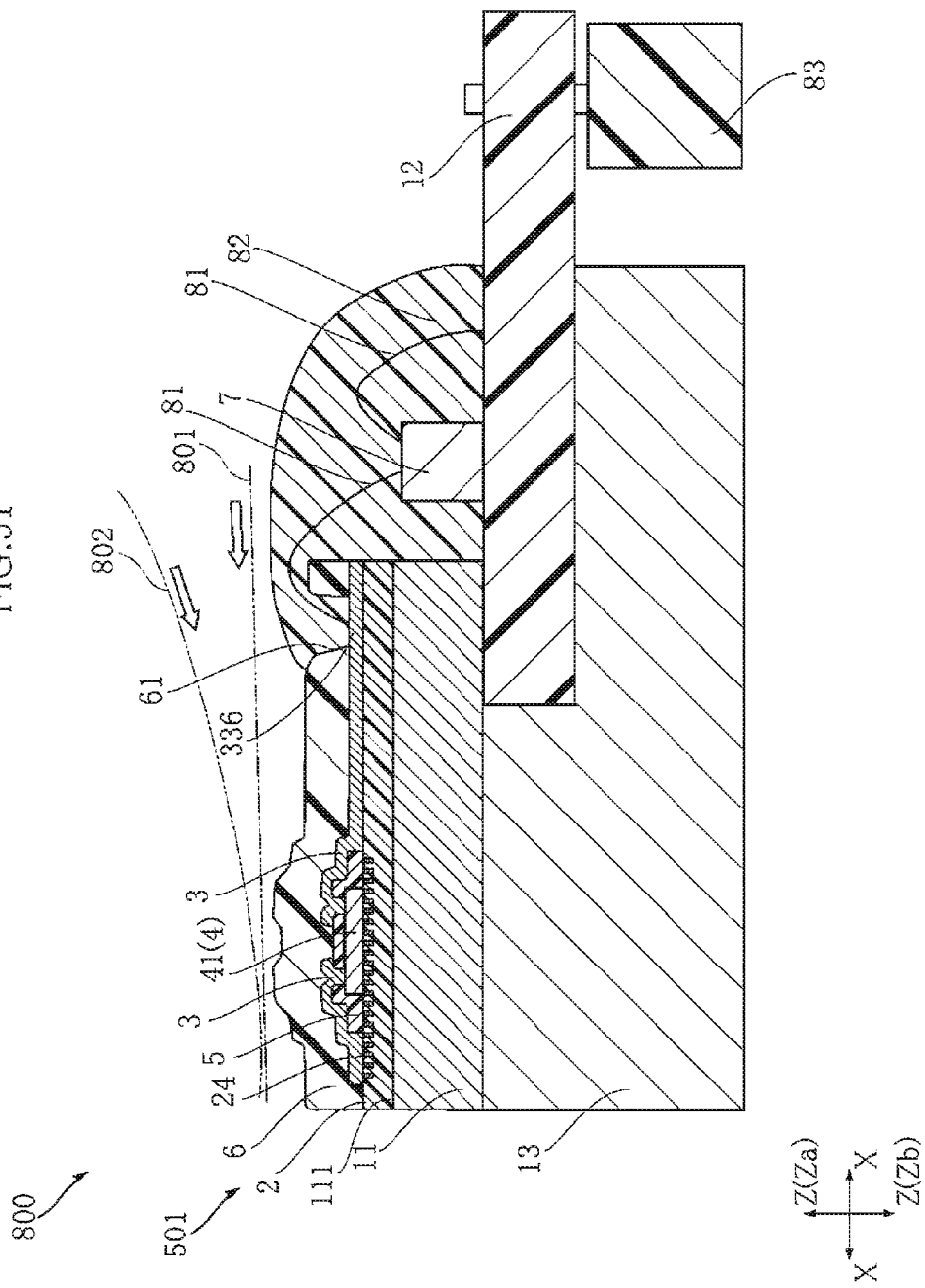
FIG. 51 is a fragmentary cross-sectional view of a thermal printer according to an embodiment B1 of the present invention.

FIG. 51 is a fragmentary cross-sectional view of a thermal printer according to an embodiment B1 of the present invention.

The thermal printer 800 shown in FIG. 51 is configured to perform a printing operation on the printing medium 801. The printing medium 801 may be, for example, a thermal paper for making out a barcode sheet or a receipt. The thermal printer 800 includes a thermal print head 501 and the platen roller 802.

Figure 52:
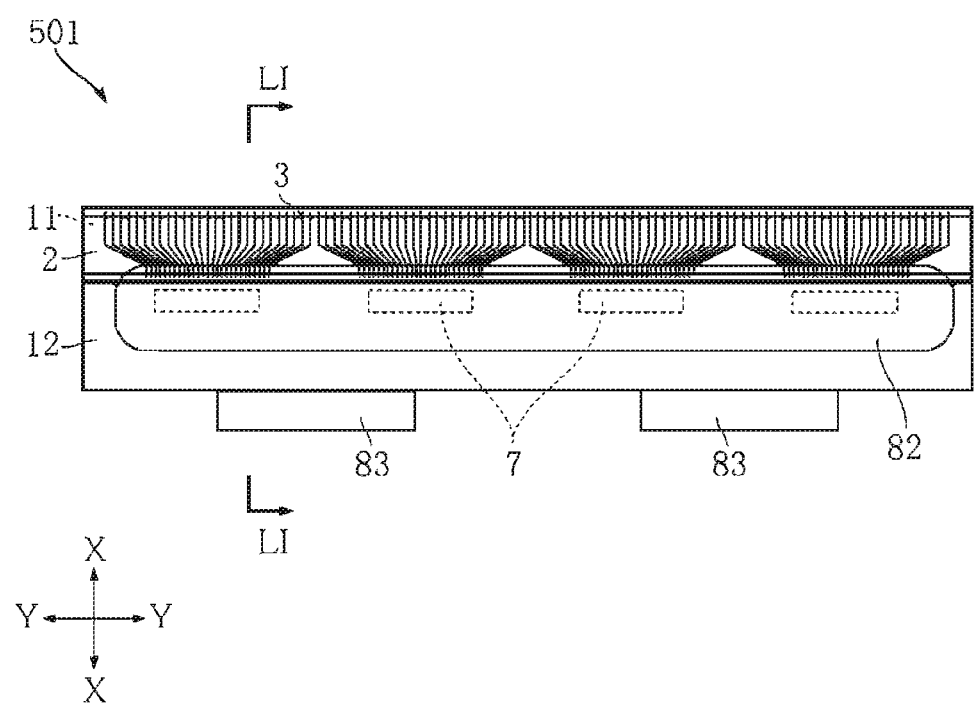
FIG. 52 is a plan view of a thermal print head according to the embodiment B1 of the present invention.

FIG. 52 is a plan view of a thermal print head according to the embodiment B1 of the present invention. FIG. 51 corresponds to a cross-sectional view taken along a line LI-LI in FIG. 52.

The thermal print head 501 shown in the cited drawings includes the base member 11, the circuit board 12, the heat dissipation plate 13, the heat storage region 2, a plurality of heat insulating portions 26 (see FIG. 56 to FIG. 58), an intermediate layer 27 (see FIG. 58), the electrode layer 3, the resistor layer 4, the insulating layer 5, the cover layer 6 (unshown in FIG. 52), the driver IC 7, the plurality of wires 81, the encapsulating resin 82, and the connector 83. The base member 11 and the heat storage region 2 constitute a substrate.

The heat dissipation plate 13 shown in FIG. 51 serves to emit heat from the base member 11. Examples of the material to form the heat dissipation plate 13 include Al, AlN, Ag, and Cu. The heat dissipation plate 13 supports the base member 11 and the circuit board 12.

The base member 11 has a plate shape. In this embodiment, the base member 11 is made of a semiconductor material. Examples of the semiconductor material to form the base member 11 include Si, SiC, GaP, GaAs, InP, and GaN. Although in this embodiment the base member 11 is made of a semiconductor material, it is not mandatory to employ a semiconductor material to form the base member 11. For example, the base member 11 may be made of an insulative material such as a ceramic. In this embodiment, the material constituting the base member 11 has a thermal conductivity of 100 to 300 W/(m·K). In this embodiment, a ratio of the thermal conductivity of the material constituting the heat storage region 2 (described later) to the thermal conductivity of the material constituting the base member 11 is 1:10 to 600, and more preferably 1:100 to 200. The base member 11 has a thickness of, for example, 0.625 to 0.720 mm. As shown in FIG. 52, the base member 11 has a flat plate shape extending in a main scanning direction Y. The base member 11 has a width (size in the sub scanning direction X of the base member 11) of, for example, 3 to 20 mm. The size of the base member 11 in the main scanning direction Y is, for example, 10 to 300 mm.

Figure 53:
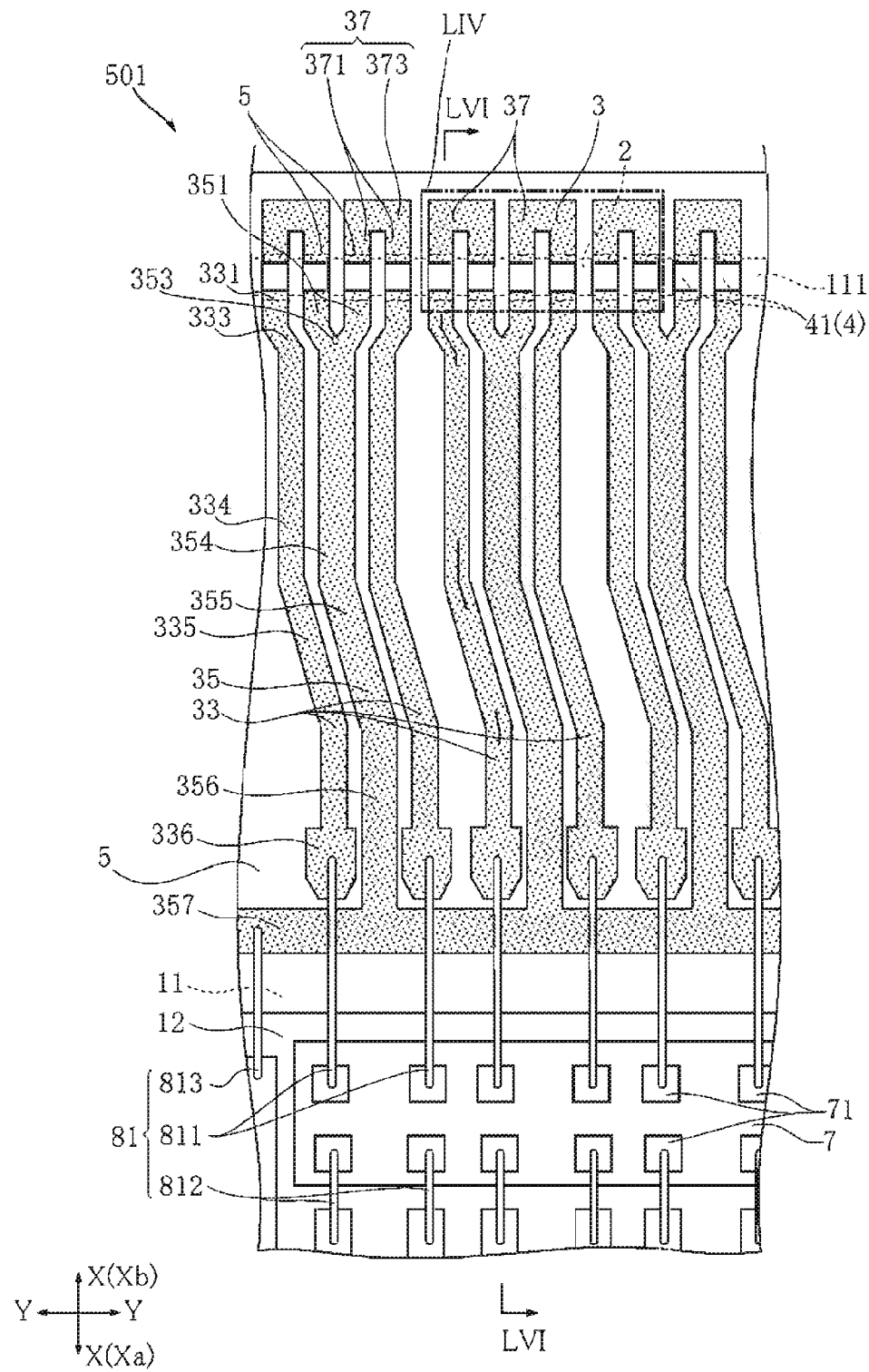
FIG. 53 is an enlarged fragmentary plan view of the thermal print head shown in FIG. 52, with a part of the structure omitted.
Figure 54:
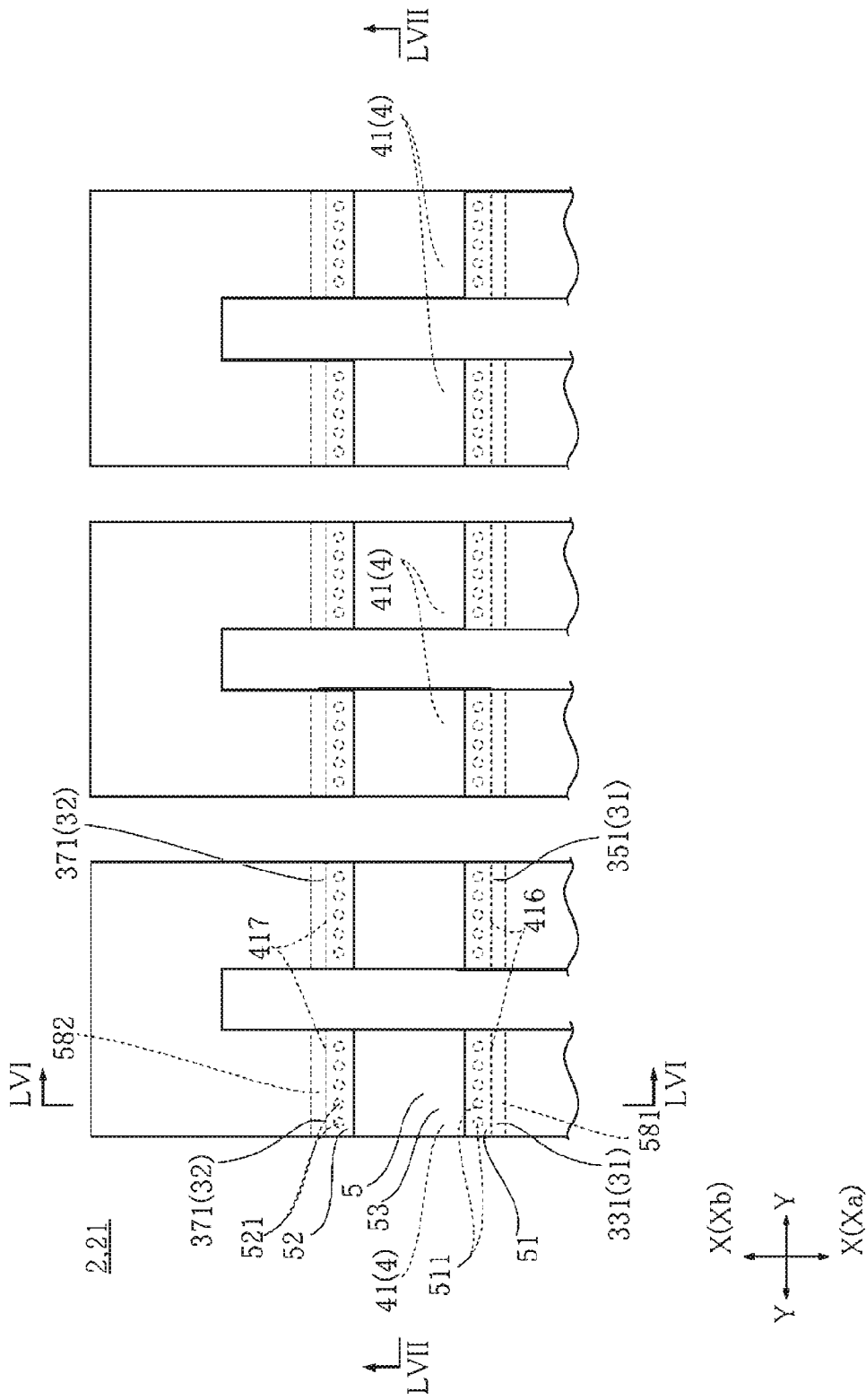
FIG. 54 is an enlarged fragmentary plan view of a region LIV in FIG. 53.
Figure 55:
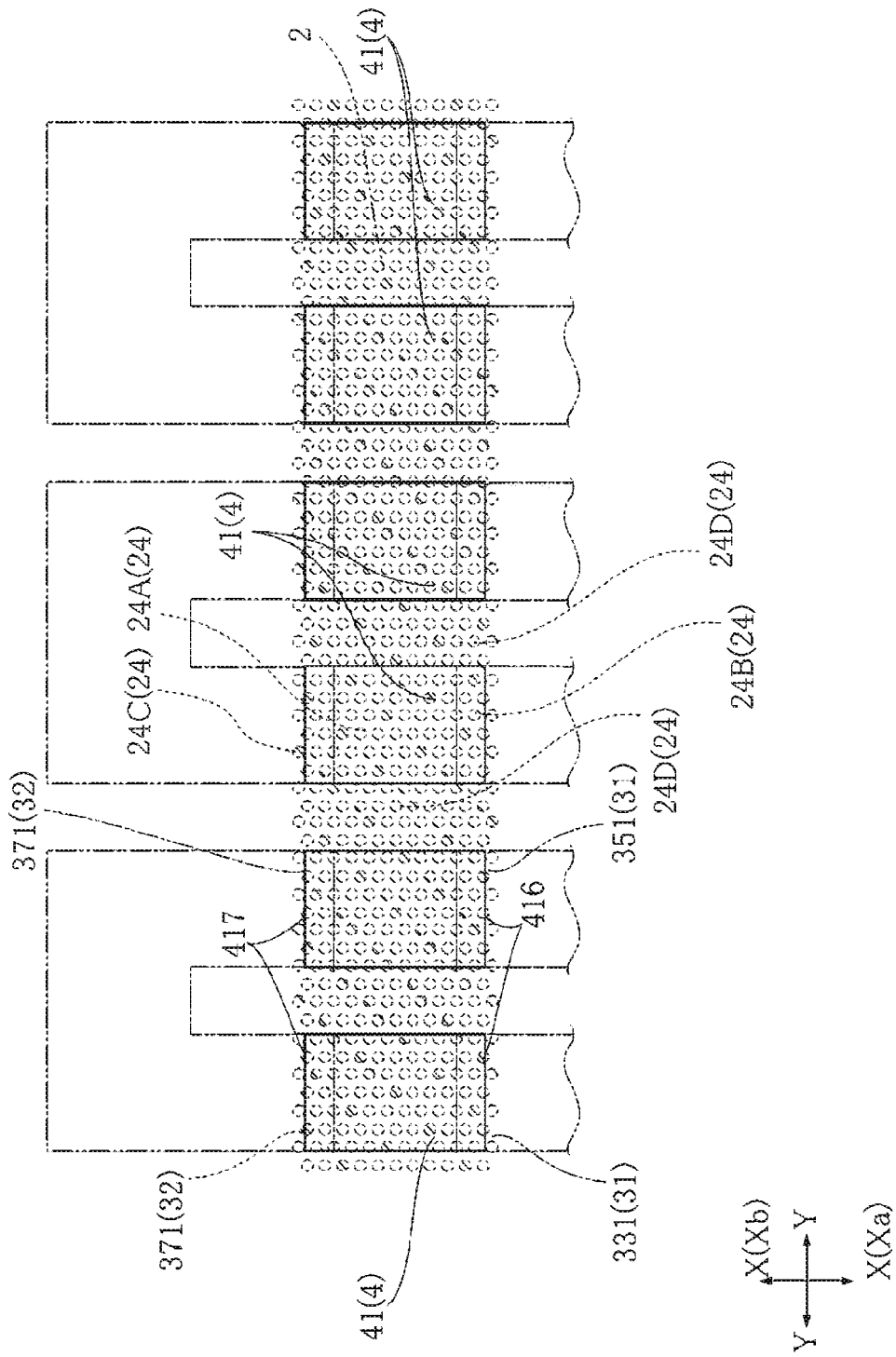
FIG. 55 is a plan view of the same region as FIG. 54, from which the electrode layer and the insulating layer are excluded.
Figure 56:
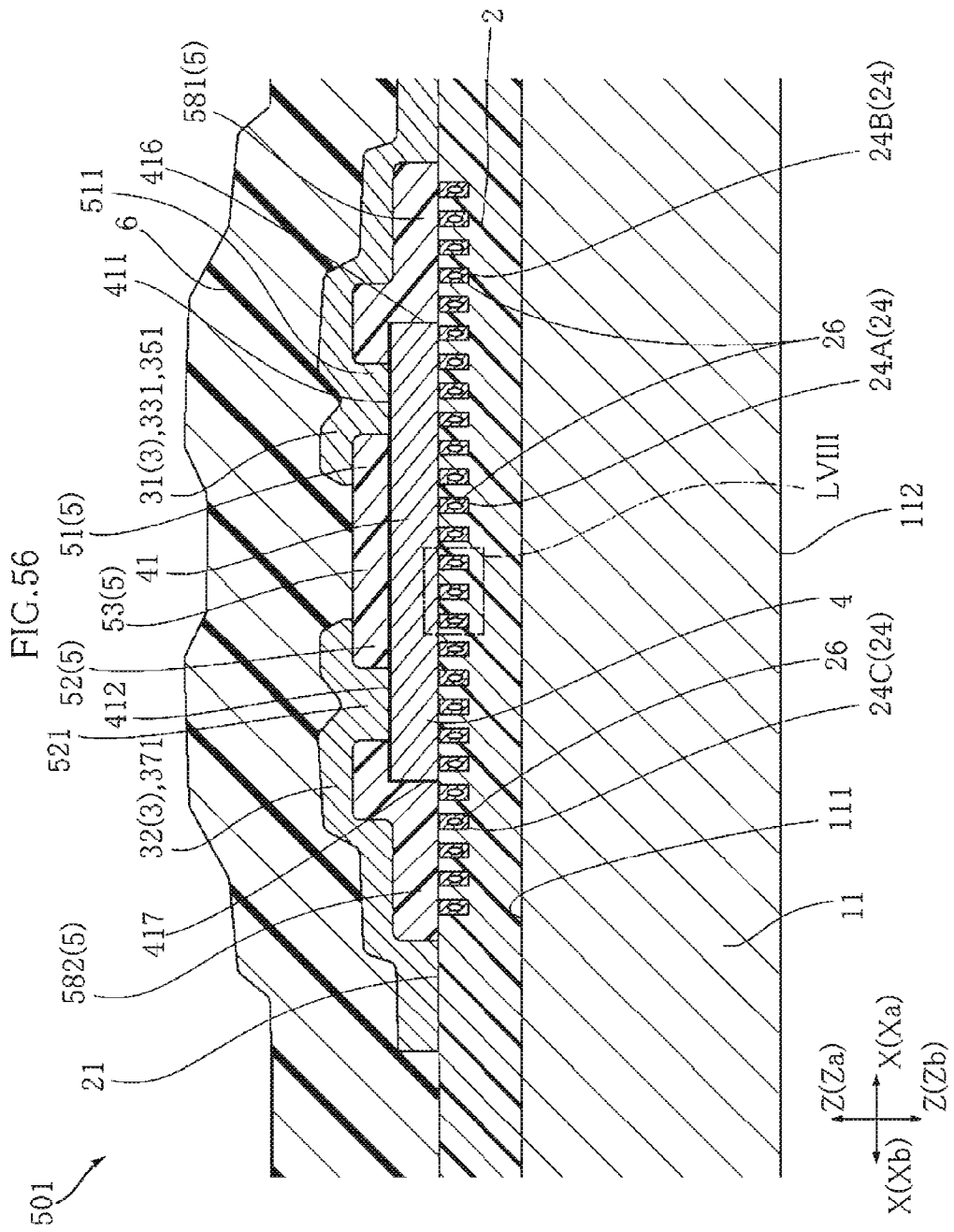
FIG. 56 is an enlarged fragmentary cross-sectional view taken along a line LVI-LVI in FIG. 53 and FIG. 54.
Figure 57:
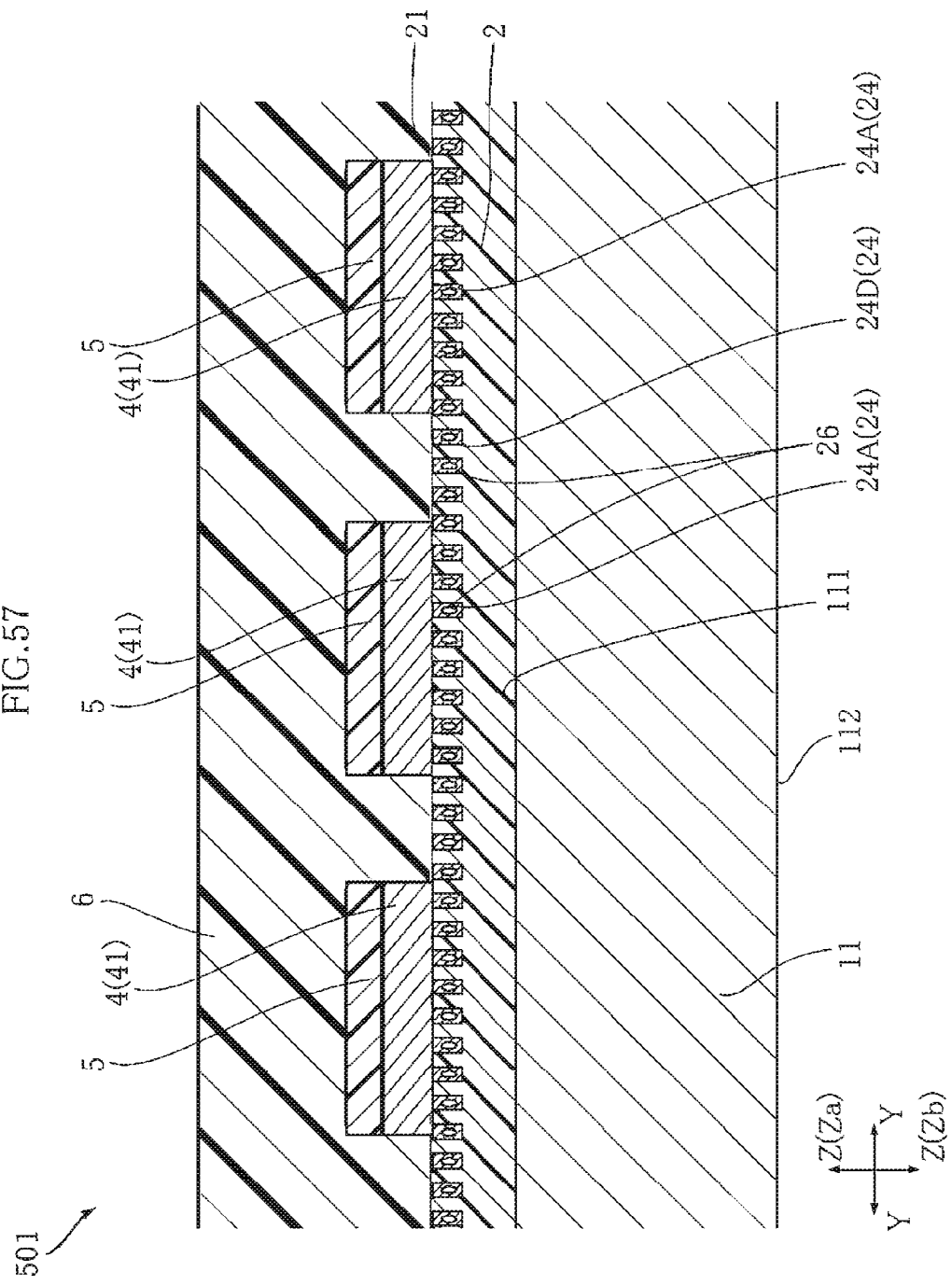
FIG. 57 is an enlarged fragmentary cross-sectional view taken along a line LVII-LVII in FIG. 54.

FIG. 53 is an enlarged fragmentary plan view of the thermal print head shown in FIG. 52, with a part of the structure omitted. FIG. 54 is an enlarged fragmentary plan view of a region LIV in FIG. 53. FIG. 55 is a plan view of the same region as FIG. 54, from which the electrode layer and the insulating layer are excluded. FIG. 56 is an enlarged fragmentary cross-sectional view taken along a line LVI-LVI in FIG. 53 and FIG. 54. FIG. 57 is an enlarged fragmentary cross-sectional view taken along a line LVII-LVII in FIG. 54.

As shown in FIG. 56 and FIG. 57, the base member 11 includes the base member front surface 111. The base member front surface 111 is a flat plane extending in the sub scanning direction X and the main scanning direction Y. The base member front surface 111 has longitudinal sides extending in the main scanning direction Y. The base member front surface 111 is oriented to one side in a thickness direction Z of the base member 11 (hereinafter, Za-side; upward in FIG. 56 and FIG. 57). In other words, the base member front surface 111 is oriented toward the resistor layer 4.

As shown in FIG. 56 and FIG. 57, the heat storage region 2 is formed in the base member 11. The heat storage region 2 covers the entirety of the base member front surface 111. The heat storage region 2 does not have to cover the entirety of the base member front surface 111, but may only cover a part of the base member front surface 111. The heat storage region 2 serves to accumulate the heat generated by the heating portion 41 (described later). The heat storage region 2 has a thickness of, for example, 3 to 10 μm. The heat storage region 2 includes the surface 21. The heat storage region surface 21 is oriented to the Za-side. In other words, the heat storage region surface 21 is oriented toward the resistor layer 4. In this embodiment, the heat storage region surface 21 is flat over its entirety.

As shown in FIG. 56 and FIG. 57, the substrate (composed of the base member 11 and the heat storage region 2) includes a plurality of recesses 24 which will be subsequently described.

The electrode layer 3 shown in FIG. 51 and FIG. 53 to FIG. 56 is formed on the base member 11. In FIG. 53, the electrode layer 3 is hatched for the sake of clarity. The electrode layer 3 is stacked on the resistor layer 4. In this embodiment, the resistor layer 4 is interposed between the electrode layer 3 and the heat storage region 2. The electrode layer 3 is electrically connected to the resistor layer 4. The electrode layer 3 provides a path for supplying power to the resistor layer 4. Examples of the material to form the electrode layer 3 include Au, Ag, Cu, Cr, Al—Si, and Ti. Unlike this embodiment, the electrode layer 3 may be interposed between the heat storage region 2 and the resistor layer 4.

As shown in FIG. 54 to FIG. 56, the electrode layer 3 includes a first conductive portion 31 and a second conductive portion 32. The first conductive portion 31 and the second conductive portion 32 are spaced from each other. The clearance between the first conductive portion 31 and the second conductive portion 32 is, for example, 105 μm.

In this embodiment, as shown in FIG. 53, the electrode layer 3 includes the plurality of individual electrodes 33 (FIG. 53 illustrates six), the common electrode 35, and the plurality of intermediate electrodes 37 (FIG. 53 illustrates six). Further details are as described hereunder.

The individual electrodes 33 are not electrically connected to each other. Accordingly, different potentials can be applied to the respective individual electrodes 33, when the printer incorporated with the thermal print head A100 is in use. The individual electrodes 33 each include the individual electrode belt-like portion 331, the bent portion 333, the individual electrode linear portion 334, the individual electrode oblique portion 335, and the bonding portion 336. As shown in FIG. 54 and FIG. 56, the individual electrode belt-like portion 331 constitutes the first conductive portion 31 in the electrode layer 3, and extend in a belt-like shape in the sub scanning direction X. The belt-like portions 331 are stacked on the resistor layer 4. The bent portion 333 continuously extends from the individual electrode belt-like portion 331, and is inclined with respect to both of the main scanning direction Y and the sub scanning direction X. The individual electrode linear portion 334 straightly extends in the sub scanning direction X. The individual electrode oblique portion 335 extends in a direction inclined with respect to both of the main scanning direction Y and the sub scanning direction X. The bonding portion 336 is a section where the wires 81 are to be bonded. In this embodiment, the individual electrode belt-like portion 331, the bent portion 333, the individual electrode linear portion 334, and the individual electrode oblique portion 335 have a width of approximately 47.5 μm for example, and the bonding portion 336 has a width of, for example, approximately 80 μm.

The common electrode 35 assumes the reverse polarity with respect to the plurality of individual electrodes 33, when the printer incorporated with the thermal print head 501 is in use. The common electrode 35 includes the plurality of common electrode belt-like portions 351, the plurality of branched portions 353, the plurality of common electrode linear portions 354, the plurality of common electrode oblique portions 355, the plurality of extending portions 356, and the stem portion 357. The common electrode belt-like portions 351 each extend in a belt-like shape in the sub scanning direction X. In the common electrode 35, as shown in FIG. 54 and FIG. 56, the common electrode belt-like portions 351 constitute the first conductive portion 31 in the electrode layer 3, and are spaced from each other in the main scanning direction Y but electrically connected to each other. The common electrode belt-like portions 351 are stacked on the resistor layer 4. The common electrode belt-like portions 351 are spaced from the individual electrode belt-like portion 331 in the main scanning direction Y. In this embodiment, a pair of common electrode belt-like portions 351 adjacent to each other is located between two belt-like portions 331. The plurality of common electrode belt-like portions 351 and the plurality of individual electrode belt-like portions 331 are aligned in the main scanning direction Y. The branched portion 353 is formed in a Y-shape so as to connect the pair of common electrode belt-like portions 351 to a single common electrode linear portion 354. The common electrode linear portion 354 straightly extends in the sub scanning direction X. The common electrode oblique portion 355 extends in a direction inclined with respect to both of the main scanning direction Y and the sub scanning direction X. The extending portion 356 continuously extends from the common electrode oblique portion 355 in the sub scanning direction X. The stem portion 357 has a belt-like shape extending in the main scanning direction Y, and the extending portions 356 are connected thereto. In this embodiment, the common electrode belt-like portion 351, the common electrode linear portion 354, the common electrode oblique portion 355, and the extending portion 356 have a width of, for example, approximately 47.5 μm.

The intermediate electrodes 37 each electrically intermediate between one of the plurality of individual electrodes 33 and the common electrode 35. The intermediate electrodes 37 each include the pair of intermediate electrode belt-like portions 371 and the joint portion 373. As shown in FIG. 54 and FIG. 56, the intermediate electrode belt-like portions 371 each constitute the second conductive portion 32 in the electrode layer 3, and extend in a belt-like shape in the sub scanning direction X. Thus, the second conductive portion 32 and the first conductive portion 31 in the electrode layer 3 are spaced from each other, in the sub scanning direction X this embodiment. The intermediate electrode belt-like portions 371 are spaced from each other in the main scanning direction Y. The intermediate electrode belt-like portions 371 are stacked on the resistor layer 4. The intermediate electrode belt-like portions 371 are located on the side opposite to the belt-like portions 331 and 351 in the sub scanning direction X, on the resistor layer 4. One of the pair of intermediate electrode belt-like portions 371 in each of the intermediate electrodes 37 is spaced from one of the plurality of common electrode belt-like portions 351 in the sub scanning direction X. The other of the pair of intermediate electrode belt-like portions 371 in each of the intermediate electrode 37 is spaced from one of the plurality of belt-like portions 331, in the sub scanning direction X. The joint portions 373 each extend in the main scanning direction Y. The joint portions 373 are each connected to the pair of intermediate electrode belt-like portions 371 in one of the intermediate electrodes 37. Thus, the intermediate electrode belt-like portions 371 constituting a pair are electrically connected to each other, in each of the intermediate electrodes 37.

It is not mandatory that the electrode layer 3 includes the intermediate electrodes 37. Instead, for example, the electrode layer 3 may include a plurality of individual electrodes and a common electrode located adjacent to the individual electrodes.

The resistor layer 4 shown in FIG. 52 to FIG. 57 is formed on the base member 11. In this embodiment, the resistor layer 4 is formed directly on the heat storage region 2. In this embodiment, the resistor layer 4 includes a plurality of rectangular portions. In the resistor layer 4, a portion where a current from the electrode layer 3 is applied generates heat. The heat thus generated forms printing dots. The resistor layer 4 is made of a material having higher resistivity than the material constituting the electrode layer 3. Examples of the material to form the resistor layer 4 include polysilicon, $TaSiO_2$, and TiON. In this embodiment, the resistor layer 4 is doped with an ion (for example, boron) so as to adjust the resistivity. The resistor layer 4 has a thickness of, for example, 0.2 μm to 1 μm.

As shown in FIG. 54 to FIG. 56, the resistor layer 4 includes the first end face 416 and the second end face 417.

As shown in FIG. 54 to FIG. 56, the first end face 416 is oriented to the side opposite to the second conductive portion 32 (intermediate electrode belt-like portion 371), i.e., to the right in FIG. 56. The second end face 417 is oriented to the side opposite to the first conductive portion 31 (individual electrode belt-like portion 331 or common electrode belt-like portion 351), i.e., to the left in FIG. 56.

As shown in FIG. 56, the resistor layer 4 includes a plurality of heating portions 41 that generate heat when the thermal print head 501 is in use. As shown in FIG. 54 and FIG. 55, the heating portions 41 are each spanned between the first conductive portion 31 and the second conductive portion 32 as viewed in the thickness direction of the base member 11. The heating portions 41 are stacked on the heat storage region 2. The heating portions 41 are aligned in the main scanning direction Y.

As shown in FIG. 56, the heating portions 41 each include the first abutment portion 411 and the second abutment portion 412. The first abutment portion 411 is in contact with the first conductive portion 31 of the electrode layer 3. The second abutment portion 412 is in contact with the second conductive portion 32 of the electrode layer 3.

As shown in FIG. 56 and FIG. 57, in this embodiment the plurality of recesses 24 are each recessed from the heat storage region surface 21. The recesses 24 are each open toward the side on which the electrode layer 3 is located in the thickness direction Z (upward in FIG. 56).

The plurality of recesses 24 include a plurality of first recesses 24A, a plurality of second recesses 24B, a plurality of third recesses 24C, and a plurality of intermediate recesses 24D. In FIG. 55, the recesses 24 are indicated by imaginary lines.

As shown in FIG. 55, the plurality of first recesses 24A are each located so as to overlap one of the plurality of heating portions 41 as viewed in the thickness direction Z. The plurality of second recesses 24B are each spaced from one of the plurality of heating portions 41 to the first side Xa (downward in FIG. 55 in this embodiment) as viewed in the thickness direction 2. The plurality of third recesses 24C are each spaced from one of the plurality of heating portions 41 to the second side Xb (upward in FIG. 55 in this embodiment) as viewed in the thickness direction Z. The plurality of third recesses 24C are located on the opposite side of the plurality of second recesses 24B, with respect to one of the plurality of heating portions 41. The plurality of intermediate recesses 24D are each located between two heating portions 41 adjacent to each other as viewed in the thickness direction 2, out of the plurality of heating portions 41.

As shown in FIG. 55, the recesses 24 (first recess 24A, second recess 24B, third recess 24C, and intermediate recess 24D) are dispersed as viewed in the thickness direction Z. In this embodiment, the recesses 24 are formed in a circular shape as viewed in the thickness direction Z. The shape of the recesses 24 as viewed in the thickness direction Z is not limited to circular, but may be hexagonal or triangular, for example. The ratio of the total area of the recesses 24 overlapping one of the heating portions 41 as viewed in the thickness direction Z, out of the plurality of recesses 24, to the area of the heating portion 41 that the mentioned recesses 24 overlap is, for example, 50 to 95%. The recesses 24 each have a depth of, for example, 1 to 5 μm. The recesses 24 each have a width of, for example, 1 to 3 μm.

It is not mandatory that the thermal print head 501 includes the second recesses 24B, the third recesses 24C, and the intermediate recesses 24D. In other words, the plurality of recesses 24 may be formed only in the region overlapping the heating portion 41 as viewed in the thickness direction Z. Alternatively, the thermal print head 501 may include the first recesses 24A and at least one of the second recesses 24B, the third recesses 24C, and the intermediate recesses 24D.

As shown in FIG. 56 and FIG. 57, the plurality of heat insulating portions 26 are respectively formed in the plurality of recesses 24. In other words, each of the plurality of heat insulating portions 26 is formed in one of the first recess 24A, the second recess 24B, the third recess 24C, and the intermediate recess 24D.

Figure 58:
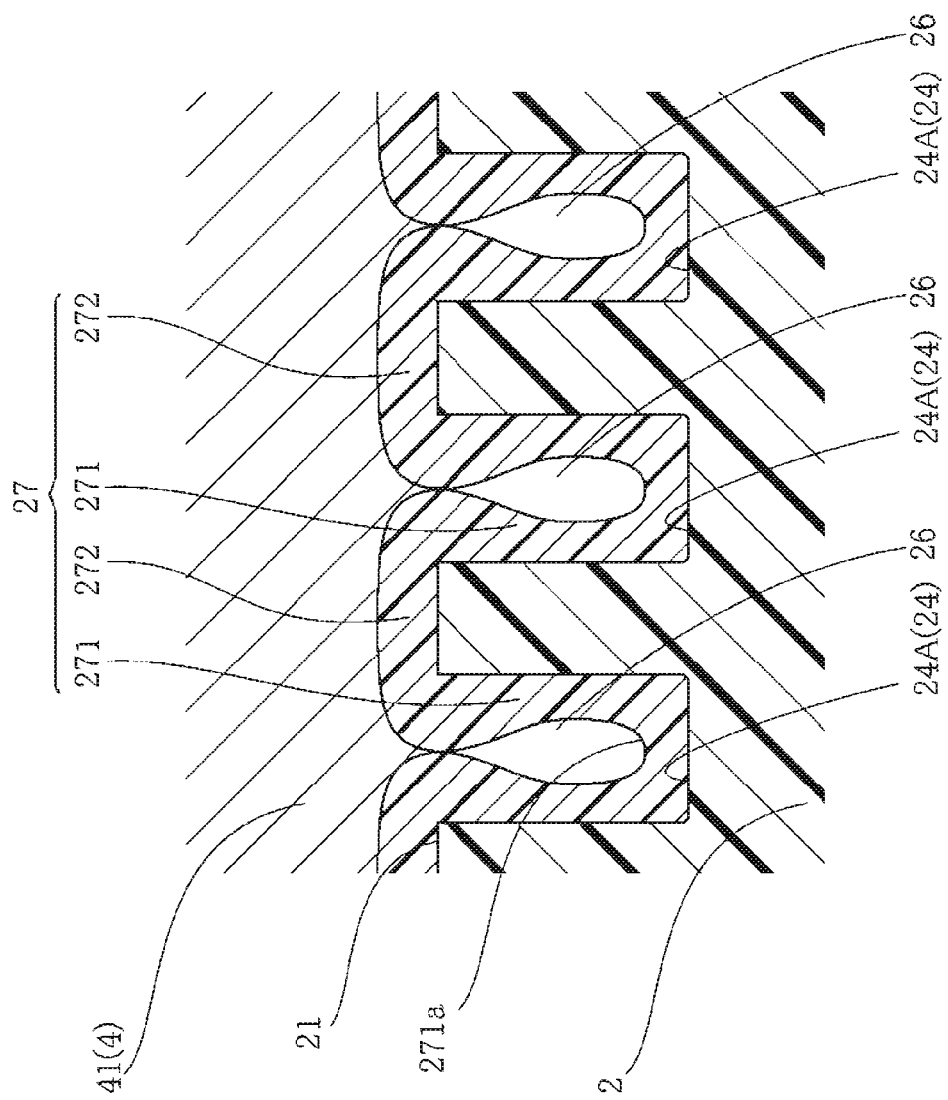
FIG. 58 is an enlarged fragmentary cross-sectional view of a region LVIII in FIG. 56.

FIG. 58 is an enlarged fragmentary cross-sectional view of a region LVIII in FIG. 56.

The heat insulating portion 26 is lower in thermal conductivity than the heat storage region 2. In this embodiment the heat insulating portion 26 is a void, filled with a gas or in a vacuum state. The gas is, for example, air.

As shown in FIG. 58, the intermediate layer 27 is located between the heat storage region 2 and the resistor layer 4 in this embodiment. In this embodiment, in addition, the intermediate layer 27 is in direct contact with the heat storage region 2 and the resistor layer 4.

The intermediate layer 27 includes a portion 271 and a portion 272.

The portion 271 is a part of the intermediate layer 27 located inside the recess 24. Thus, at least a part of the intermediate layer 27 is located inside the plurality of recesses 24. The portion 271 includes an inner surface 271a. The inner surface 271a defines a part of the void constituting the heat insulating portion 26.

The portion 272 is formed so as to cover the heat storage region surface 21. In other words, the portion 272 is located between two recesses 24 adjacent to each other as viewed in the thickness direction Z out of the plurality of recesses 24, on the heat storage region surface 21. The portion 272 is located between the heating portion 41 and the heat storage region 2. Thus, the intermediate layer 27 includes a part located between the heating portion 41 and the heat storage region 2. The portion 272 is continuous from the portion 271.

The intermediate layer 27 is formed of an insulative material, for example silicon oxide. It is not mandatory that the intermediate layer 27 is formed of an insulative material, and a conductive material may be employed to form the intermediate layer 27.

As shown in FIG. 56, the insulating layer 5 includes a portion interposed between the heating portion 41 and the electrode layer 3. Examples of the material to form the insulating layer 5 include $SiO_2$ and $SiAlO_2$. The insulating layer 5 includes a first interposed portion 51, a second interposed portion 52, and a middle portion 53. As shown in FIG. 54 and FIG. 56, the first interposed portion 51 is interposed between the first conductive portion 31 and the heating portion 41. The second interposed portion 52 is interposed between the second conductive portion 32 and the heating portion 41. The middle portion 53 is located between the first interposed portion 51 and the second interposed portion 52 as viewed in the thickness direction Z of the base member 11. The middle portion 53 is continuous with the first interposed portion 51 and the second interposed portion 52.

As shown in FIG. 54 and FIG. 56, the first interposed portion 51 includes one or more first openings 511 in this embodiment. FIG. 54 illustrates the first opening 511 in a circular shape, however the first opening 511 may be formed in different shapes, for example in a rectangular shape. Although FIG. 54 illustrates a plurality of first openings 511 in the first interposed portion 51, the first interposed portion 51 may only include one first opening 511. The first abutment portion 411 of the heating portion 41 is located so as to overlap the first opening 511. In this embodiment, further, the first opening 511 includes a part of the first conductive portion 31, as shown in FIG. 56.

In this embodiment, the second interposed portion 52 includes one or more second openings 521. FIG. 54 illustrates the second opening 521 in a circular shape, however the second opening 521 may be formed in different shapes, for example in a rectangular shape. Although FIG. 54 illustrates a plurality of second openings 521 in the second interposed portion 52, the second interposed portion 52 may only include one second opening 521. The second abutment portion 412 of the heating portion 41 is located so as to overlap the second opening 521. In this embodiment, further, the second opening 521 includes a part of the second conductive portion 32, as shown in FIG. 56.

As shown in FIG. 54 and FIG. 56, the insulating layer 5 includes portions 581 and 582 in this embodiment. The portion 581 is continuous with the first interposed portion 51 and covers the first end face 41E. The portion 582 is continuous with the second interposed portion 52 and covers the second end face 417. The portions 581 and 582 are in direct contact with the heat storage region 2. In other words, the heat storage region 2 includes a portion in direct contact with the insulating layer 5. Unlike this embodiment, the insulating layer 5 may be without the portions 581 and 582. Unlike this embodiment, in addition, the thermal print head 501 may be without the insulating layer 5.

The cover layer 6 shown in FIG. 56 and FIG. 57 covers the electrode layer 3, the resistor layer 4, and the insulating layer 5, so as to protect the electrode layer 3, the resistor layer 4, and the insulating layer 5. The cover layer 6 is made of an insulative material. Examples of the insulative material to form the cover layer 6 include polyimide, polyamide, polyethylene, SiN and $SiO_2$. In this embodiment, the cover layer 6 is in direct contact with the electrode layer 3 and the insulating layer 5.

The cover layer 6 includes the plurality of through windows 61 (FIG. 51 illustrates one). In each of the through windows 61, the bonding portion 336 is exposed.

The circuit board 12 shown in FIG. 51 is, for example, a printed circuit board. The circuit board 12 includes a base member layer and a non-illustrated wiring layer stacked thereon. For example, the base member may be formed of a glass epoxy resin and the wiring layer may be formed of Cu.

The driver IC 7 shown in FIG. 51 and FIG. 53 serves to supply a potential to each of the individual electrodes 33 and control a current supplied to the heating portion 41. When the potential is supplied to each of the individual electrodes 33, a voltage is applied between the common electrode 35 and each of the individual electrodes 33, and a current selectively flows to the heating portions 41. The driver IC 7 is mounted on the circuit board 12. As shown in FIG. 3, the driver IC 7 includes a plurality of pads 71 which are aligned, for example, in two rows.

The plurality of wires 81 shown in FIG. 51 and FIG. 53 are formed of a conductive material such as Au. Among the plurality of wires 81, wires 811 are bonded to the driver IC 7 and to the electrode layer 3. To be more detailed, the wires 811 are each bonded to one of the pads 71 of the driver IC 7 and one of the bonding portions 336. Accordingly, the driver IC 7 and each of the individual electrodes 33 are electrically connected to each other. As shown in FIG. 3, wires 812 in the plurality of wires 81 are each bonded to one of the pads 71 of the driver IC 7, and to the wiring layer of the circuit board 12. Accordingly, the driver IC 7 and the connector 83 are electrically connected to each other through the wiring layer. As shown in FIG. 3, wires 813 in the plurality of wires 81 are bonded to the stem portion 357 of the common electrode 35, and to the wiring layer of the circuit board 12. Accordingly, the common electrode 35 and the wiring layer are electrically connected to each other.

The encapsulating resin 82 shown in FIG. 51 is formed of, for example, a black resin. The encapsulating resin 82 covers the driver IC 7, the plurality of wires 81, and the cover layer 6, so as to protect the driver IC 7 and the plurality of wires 81. The encapsulating resin 82 is in direct contact with the cover layer 6. The connector 83 is fixed to the circuit board 12. The connector 83 serves to introduce power from outside to the thermal print head 501, and control the driver IC 7.

Hereunder, an example of the method of use of the thermal print head 501 will be briefly described.

The thermal print head 501 is incorporated in the thermal printer 800, to be put to use. As shown in FIG. 51, the thermal print head 501 is opposed to the platen roller 802, in thermal printer 800. When the thermal printer 800 is used, the platen roller 802 rotates to thereby feed the printing medium 801 in the sub scanning direction X between the platen roller 802 and the heating portions 41 at a constant velocity. The printing medium 801 is pressed by the platen roller 802 against the portion of the cover layer 6 covering the heating portions 41. To each of the plurality of individual electrodes 33 shown in FIG. 53, the driver IC 7 selectively supplies a potential. Accordingly, a voltage is applied between the common electrode and each of the individual electrodes 33. Then a current selectively flows to the plurality of heating portions 41, so as to generate heat. The heat generated by the heating portions 41 is transmitted to the printing medium 801 through the cover layer 6. Accordingly, a plurality of dots are printed on a first line region linearly extending in the main scanning direction Y on the printing medium 801. The heat generated by the heating portions 41 is also transmitted to the heat storage region 2, to be accumulated therein.

As the platen roller 802 rotates further, the printing medium 801 continues to be fed in the sub scanning direction X at a constant velocity. Then the printing is performed on a second line region, adjacent to the first line region, linearly extending in the main scanning direction Y on the printing medium 801, as in the printing operation on the first line region. During the printing on the second line region, the heat accumulated in the heat storage region 2 is also transmitted to the printing medium 801 in addition to the heat generated by the heating portions 41. The printing on the second line region is thus performed. The printing on the printing medium 801 can thus be performed by printing a plurality of dots on each of the line regions on the printing medium 801 linearly extending in the main scanning direction Y.

Hereunder, an example of the manufacturing method of the thermal print head 501 will be briefly described. In this embodiment, the thermal print head 501 is manufactured through a semiconductor process.

Figure 59:
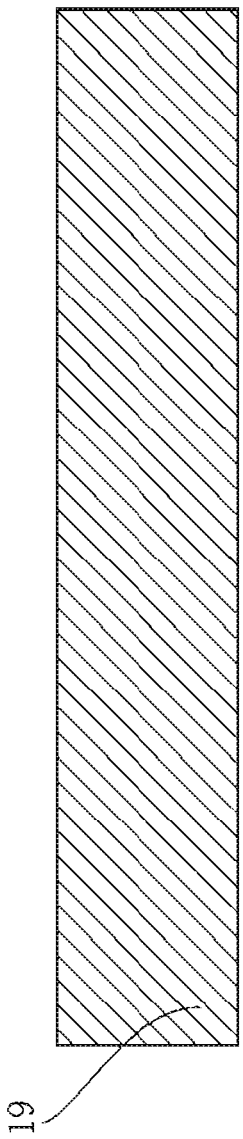
FIG. 59 is a cross-sectional view showing a step in the manufacturing process of the thermal print head according to the embodiment B1 of the present invention.
Figure 60:
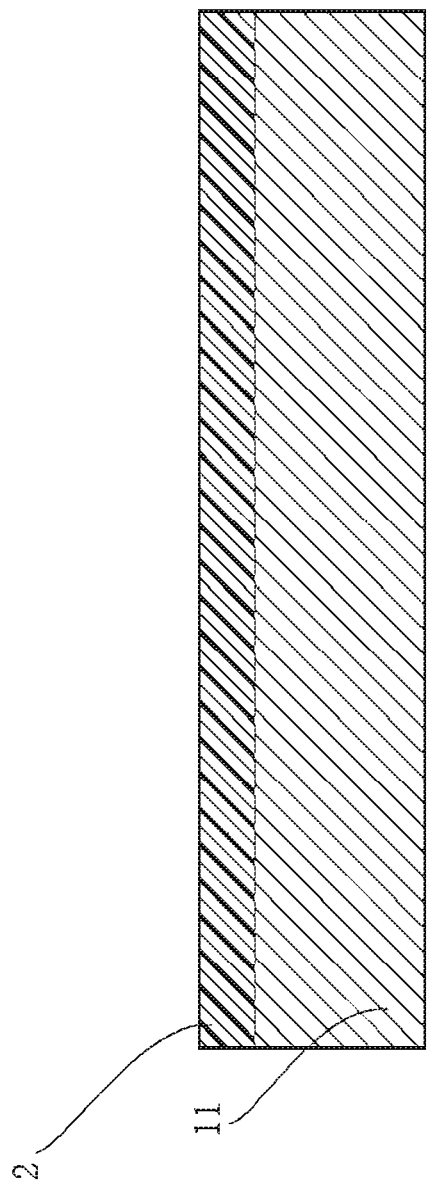
FIG. 60 is a cross-sectional view showing a step subsequent to FIG. 59.

As shown in FIG. 59, the semiconductor substrate 19 is first prepared. In this embodiment the semiconductor substrate 19 is formed of Si. Proceeding to FIG. 60, the surface of the semiconductor substrate 19 is subjected to thermal oxidation, and then to CVD or sputtering. At this point, the heat storage region 2 stacked on the base member 11 is obtained. Though not shown, the $SiO_2$ layer is also formed on the rear surface of the base member 11. It is not mandatory to perform the thermal oxidation of the surface of the semiconductor substrate 19, and the heat storage region 2 may be directly formed by CVD or sputtering.

Figure 61:
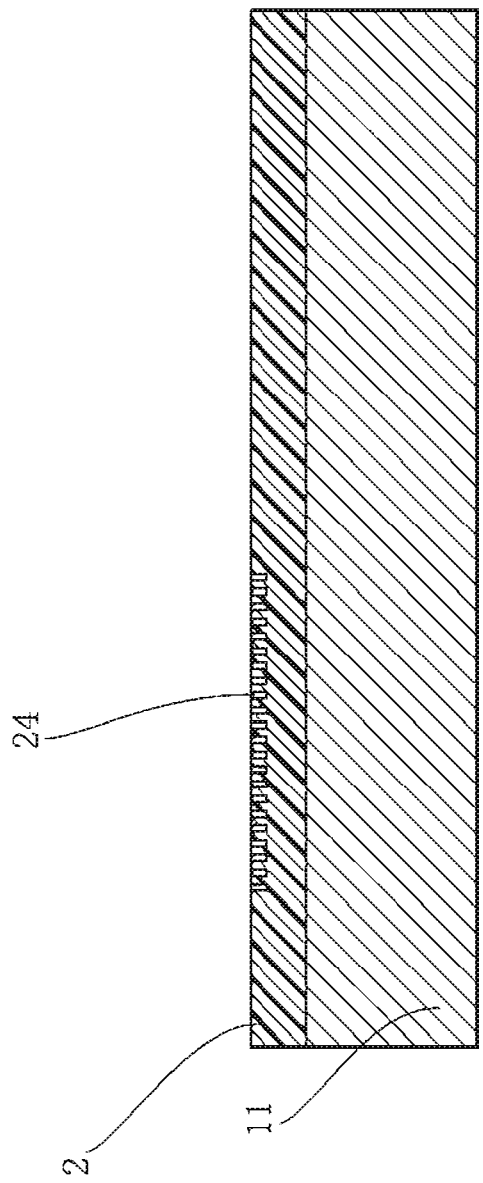
FIG. 61 is a cross-sectional view showing a step subsequent to FIG. 60.
Figure 62:
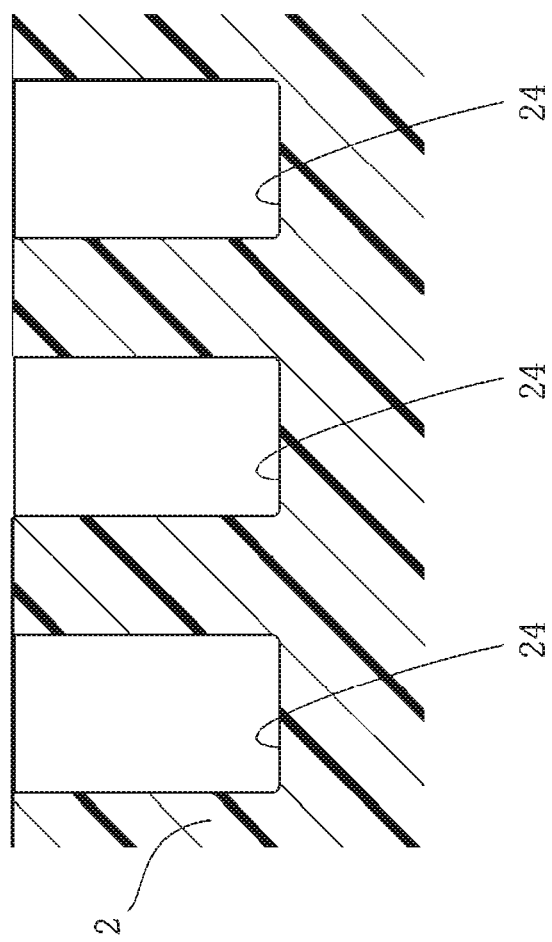
FIG. 62 is an enlarged fragmentary cross-sectional view of a part of FIG. 61.

Then the plurality of recesses 24 are formed in the heat storage region 2, as shown in FIG. 61 and FIG. 62. The plurality of recesses 24 may be formed in the heat storage region 2 by etching for example.

Figure 63:
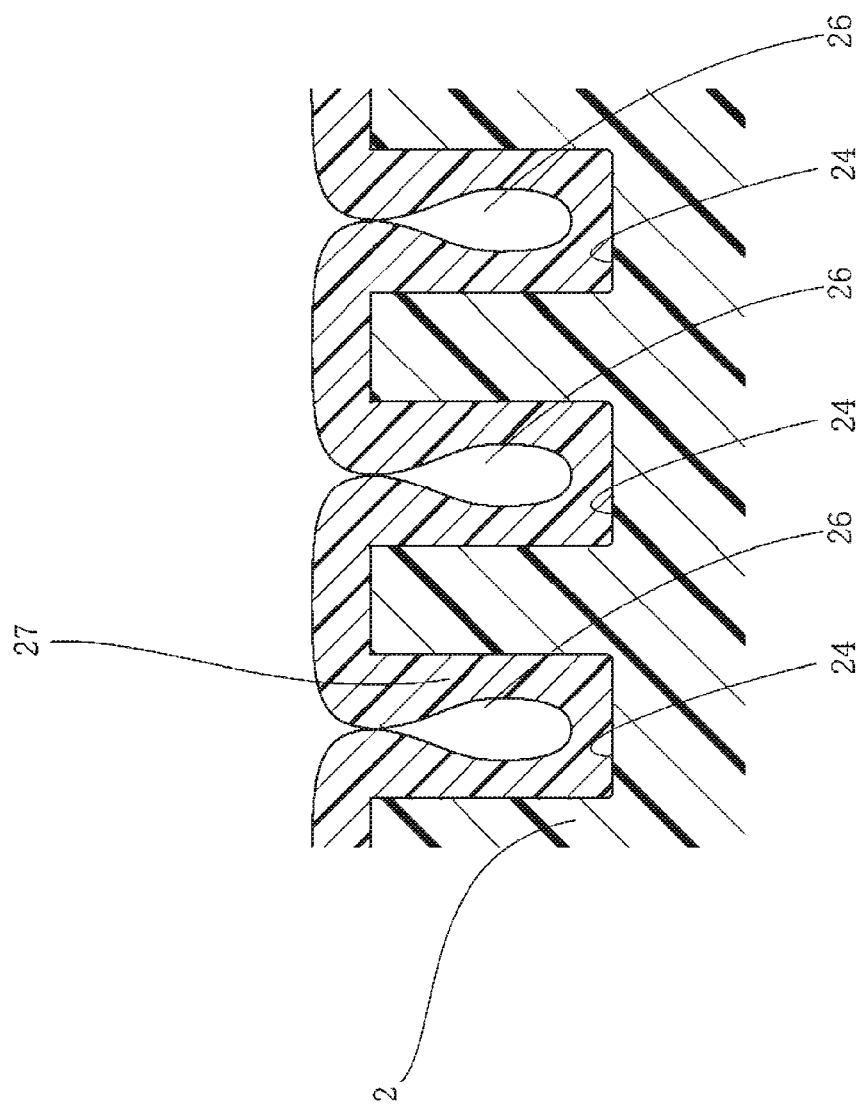
FIG. 63 is a cross-sectional view showing a step subsequent to FIG. 62.

Proceeding to FIG. 63, the intermediate layer 27 is formed on the heat storage region 2. To form the intermediate layer 27, for example CVD, sputtering, or thermal oxidation may be performed. In this embodiment, CVD is performed to form the intermediate layer 27. In the formation process of the intermediate layer 27 in the recess 24, the voids corresponding to the heat insulating portions 26 are formed.

Figure 64:
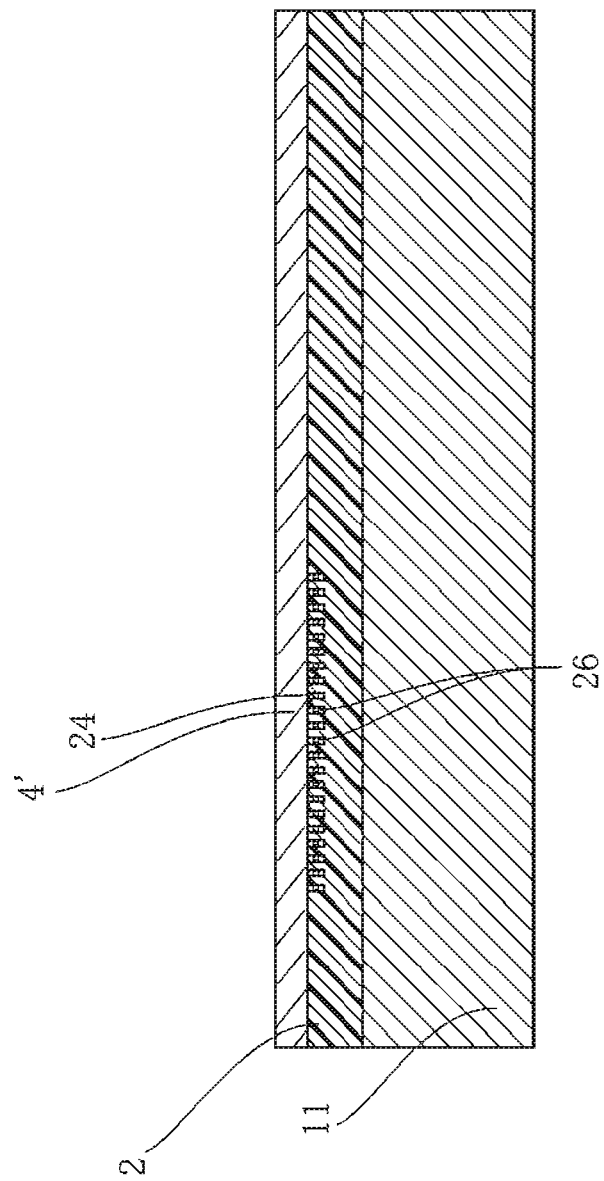
FIG. 64 is a cross-sectional view showing a step subsequent to FIG. 63.
Figure 65:
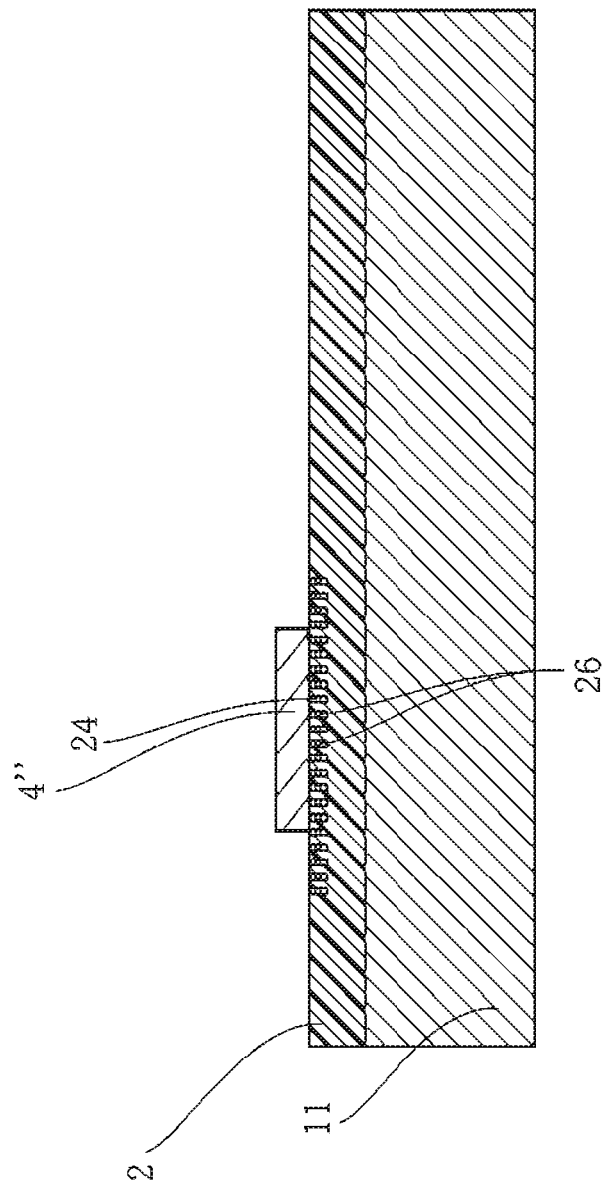
FIG. 65 is a cross-sectional view showing a step subsequent to FIG. 64.
Figure 66:
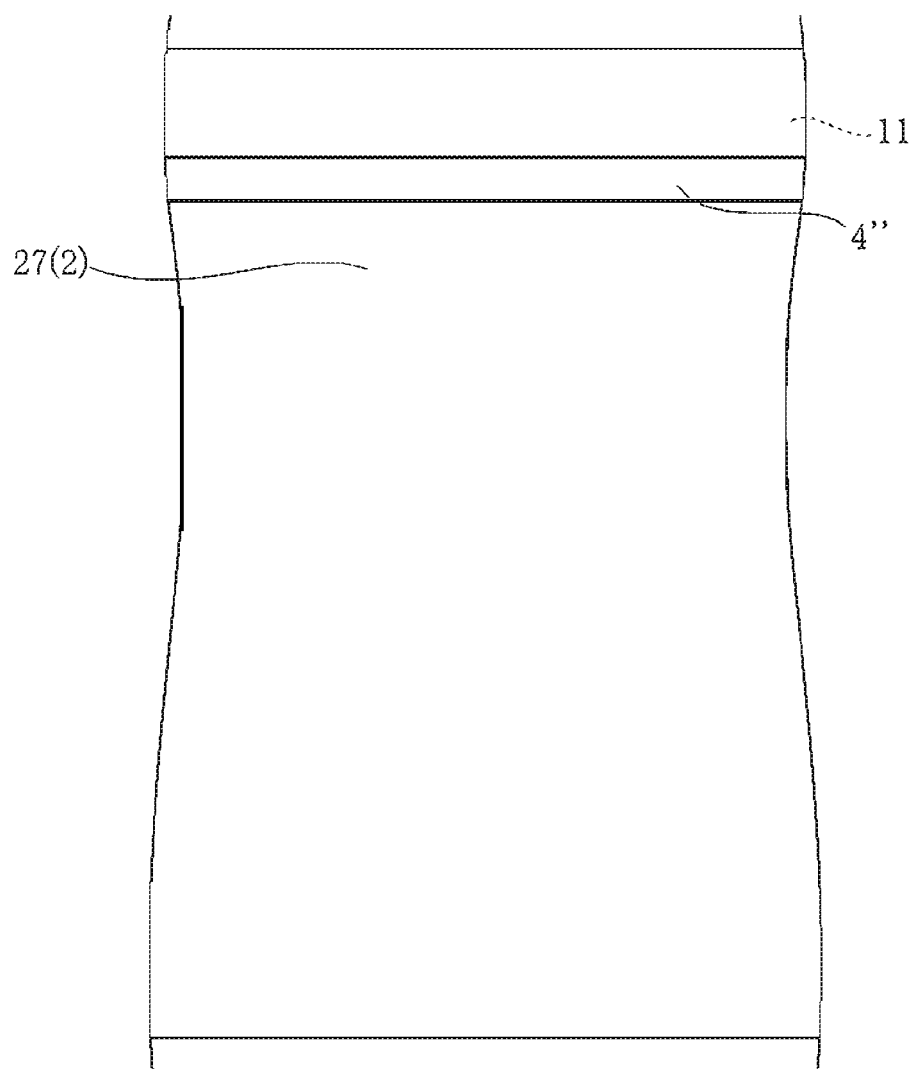
FIG. 66 is an enlarged fragmentary plan view showing a state obtained through the step of FIG. 65.

Referring then to FIG. 64, the resistor layer 4' is formed. The resistor layer 4' may be formed, for example, by CVD or sputtering. The resistor layer 4' is formed over the entirety of the surface of the base member 11. Then etching is performed on the resistor layer 4' so as to form a resistor layer 4" as shown in FIG. 65 and FIG. 66. To form the resistor layer 4', a mask pattern is formed through a photolithography process and, for example, dry etching is performed. As shown in FIG. 66, the resistor layer 4" extends in a belt-like shape in one direction in this embodiment. Then the resistor layer 4" is doped with impurity by ion implantation or gas phase diffusion (unshown), so as to grant a desired resistivity to the resistor layer 4.

Figure 67:
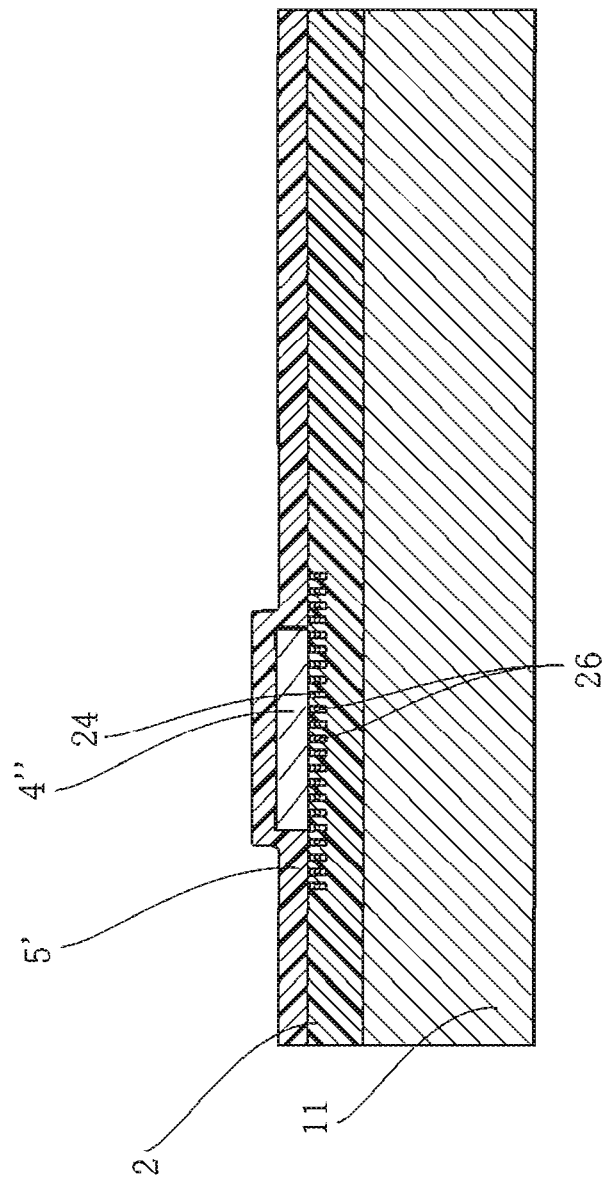
FIG. 67 is a cross-sectional view showing a step subsequent to FIG. 65.
Figure 68:
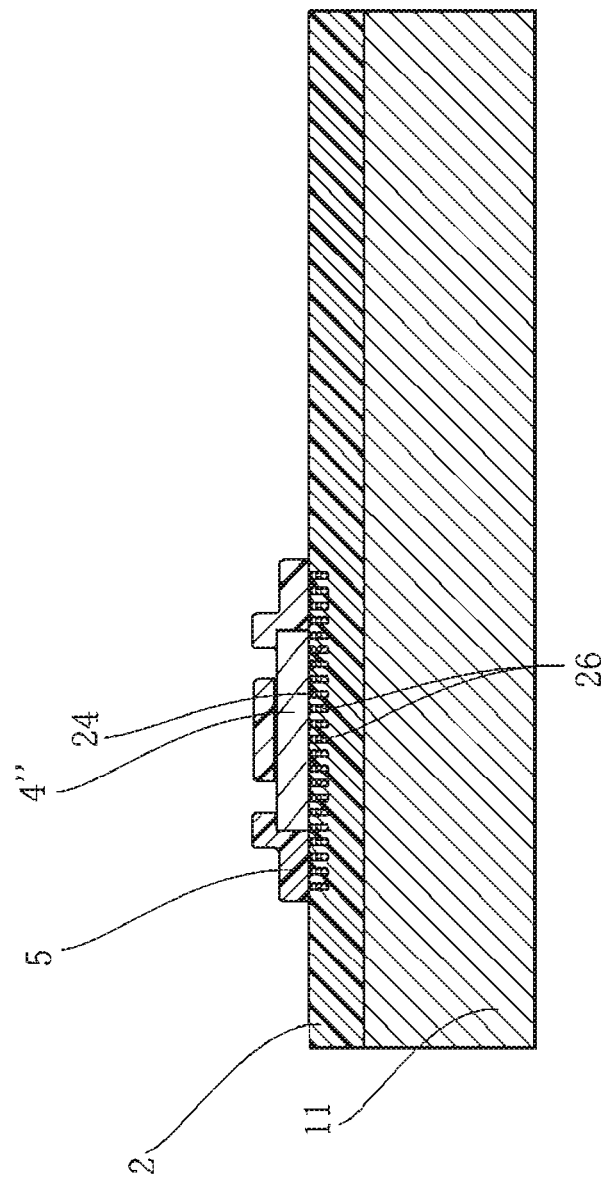
FIG. 68 is a cross-sectional view showing a step subsequent to FIG. 67.
Figure 69:
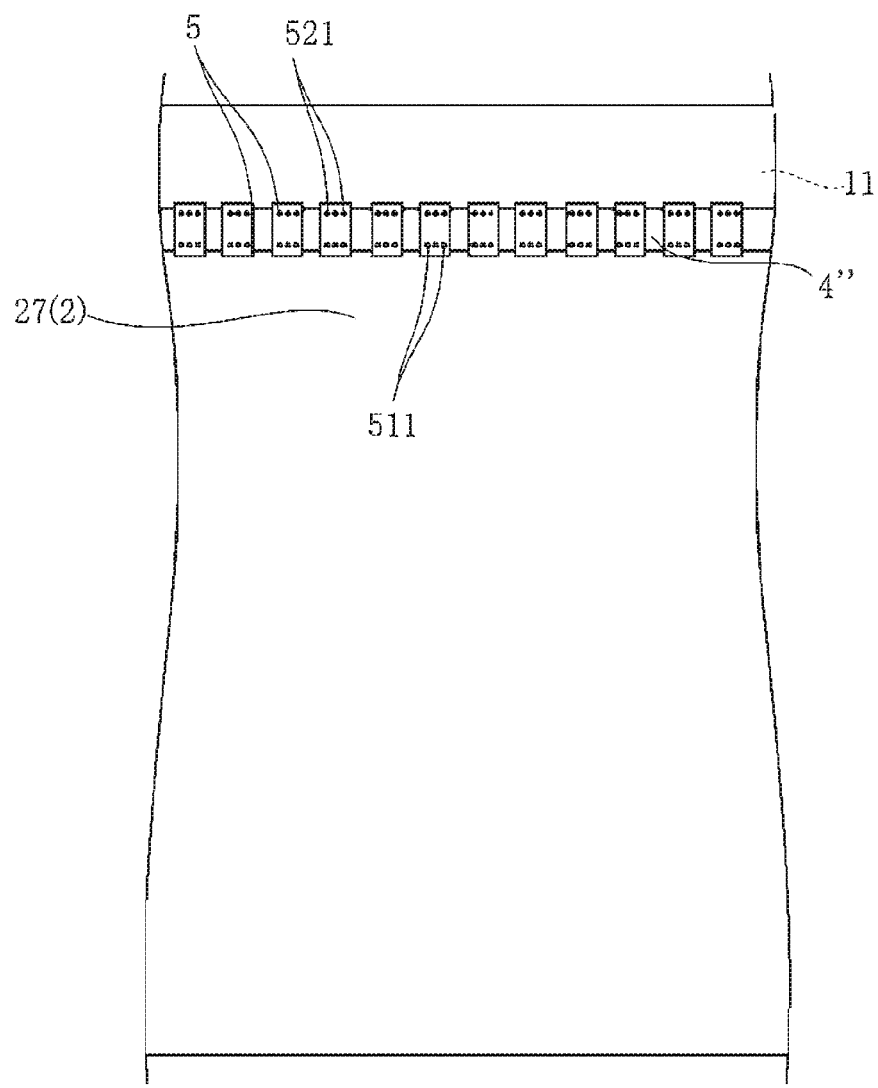
FIG. 69 is an enlarged fragmentary plan view showing a state obtained through the step of FIG. 68.

Proceeding to FIG. 67, an insulating layer 5' is formed. The insulating layer 5' may be formed, for example, by CVD or sputtering. Then as shown in FIG. 68 and FIG. 69, etching is performed on the insulating layer 5' so as to form the insulating layer 5. Through the etching process of the insulating layer 5', the first opening 511 and the second opening 521 are also formed.

Figure 70:
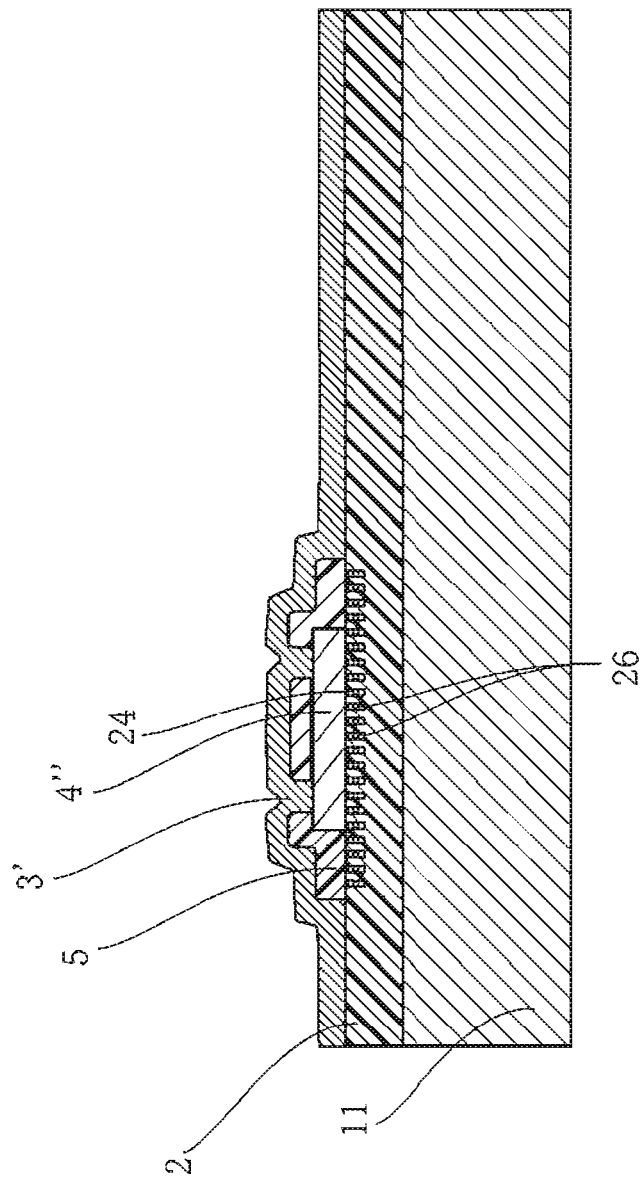
FIG. 70 is a cross-sectional view showing a step subsequent to FIG. 68.
Figure 71:
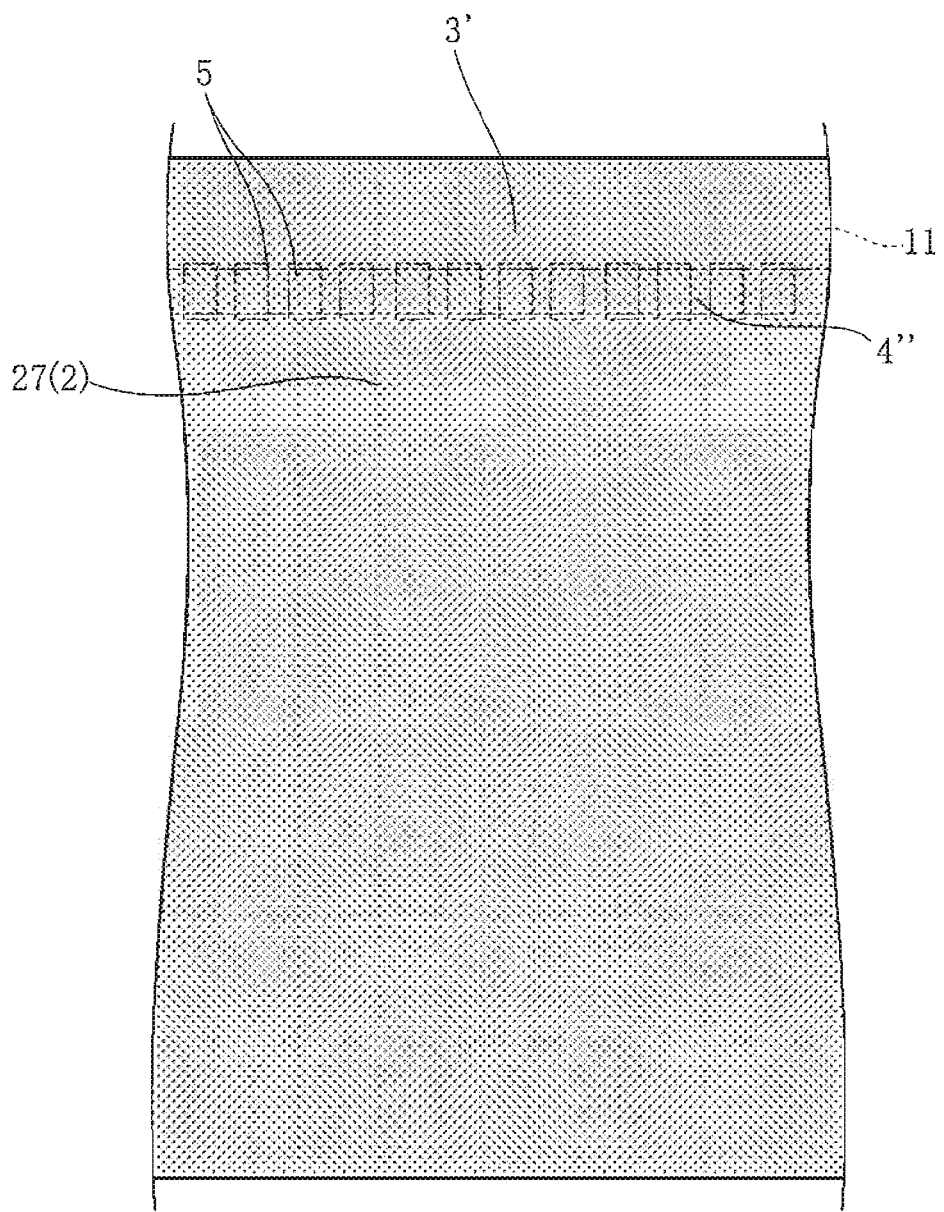
FIG. 71 is an enlarged fragmentary plan view showing a state obtained through the step of FIG. 70.
Figure 72:
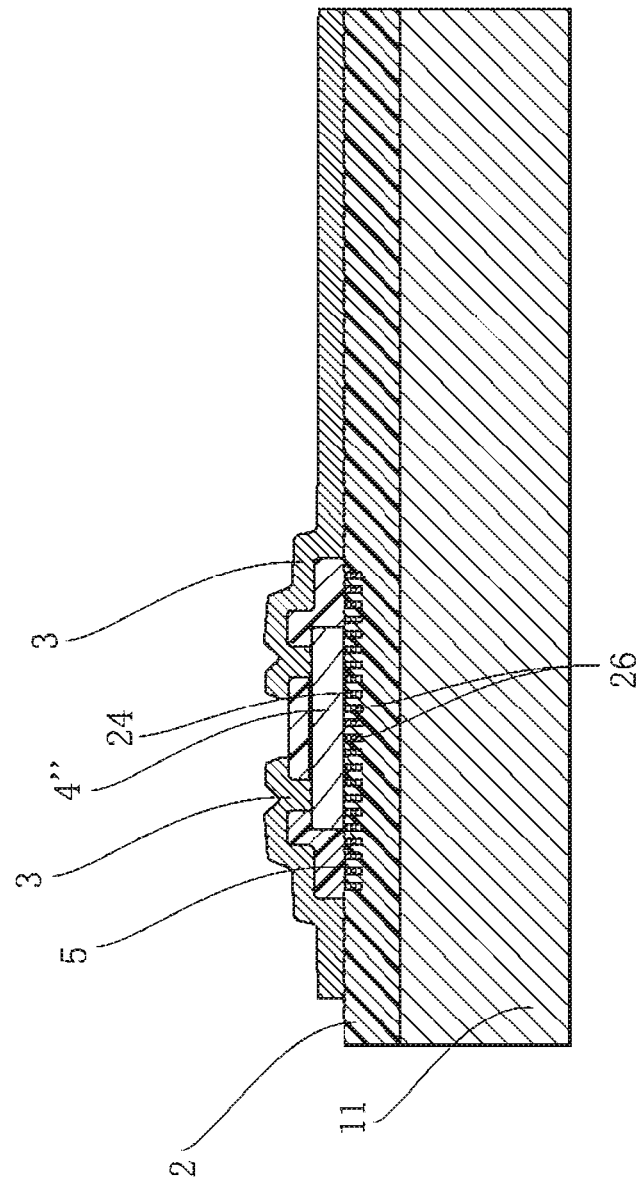
FIG. 72 is a cross-sectional view showing a step subsequent to FIG. 70.
Figure 73:
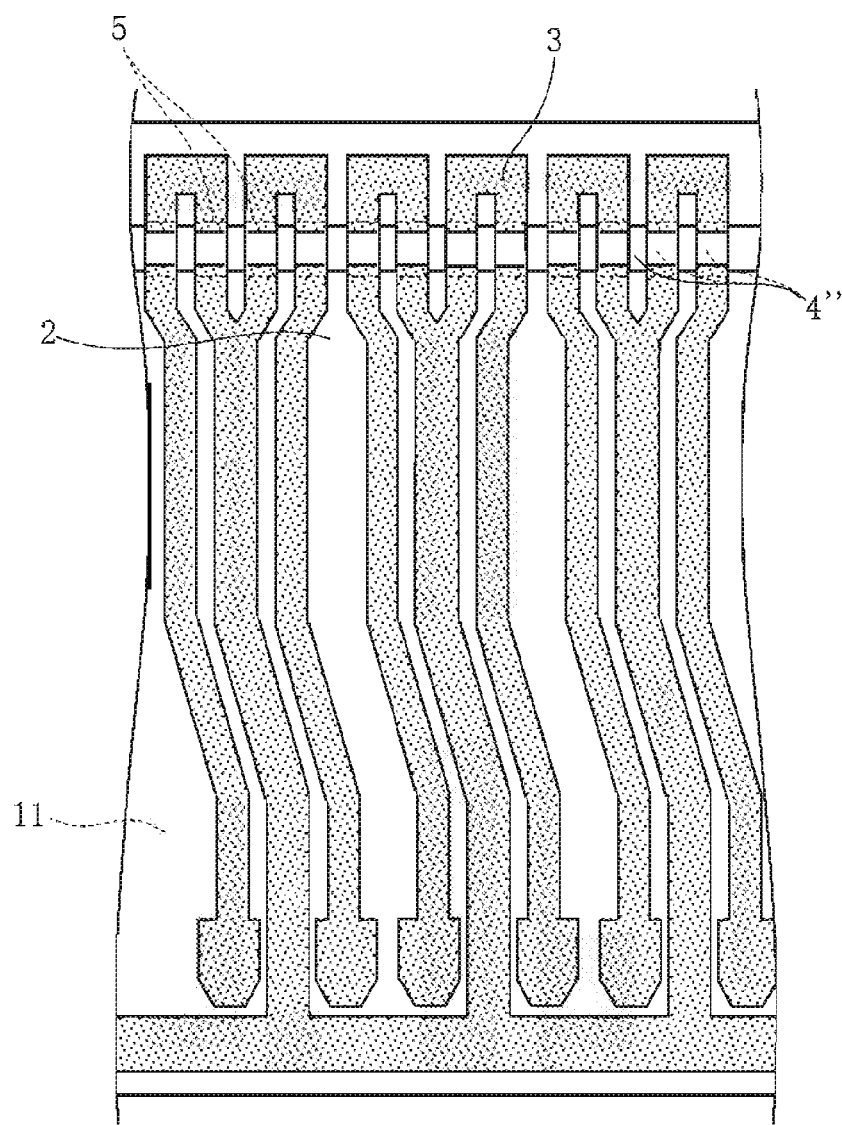
FIG. 73 is an enlarged fragmentary plan view showing a state obtained through the step of FIG. 72.

Referring to FIG. 70 and FIG. 71, the electrode layer 3' is formed. The electrode layer 3' may be formed, for example, by sputtering or CVD. Then etching is performed on the electrode layer 3' so as to form the electrode layer 3 of the mentioned shape, as shown in FIG. 72 and FIG. 73. To form the electrode layer 3', a mask pattern is formed through a photolithography process and, for example, wet etching is performed.

Figure 74:
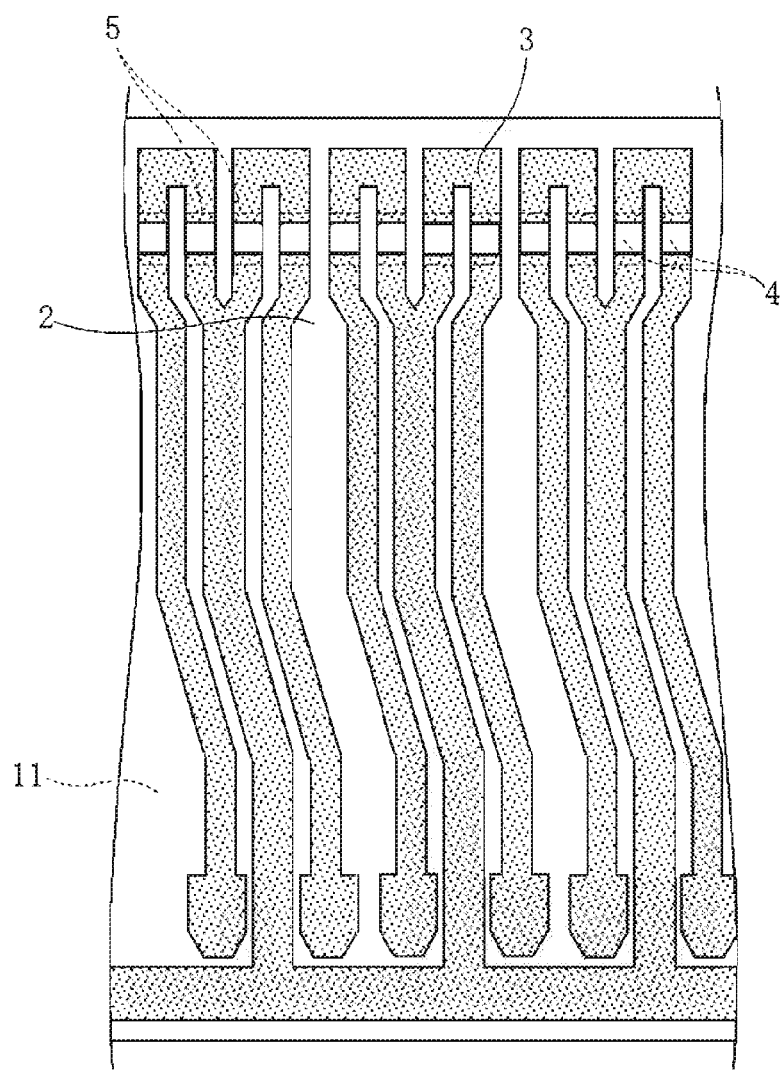
FIG. 74 is an enlarged fragmentary plan view showing a state obtained through the step subsequent to FIG. 73.

Then etching is performed on the resistor layer 4" so as to form the resistor layer 4 including the plurality of rectangular portions, as shown in FIG. 74. The rectangular portions serve to prevent the current from flowing through the resistor layer 4 in a horizontal direction in FIG. 74 when the thermal print head 501 is in use. Unlike this embodiment, the resistor layer 4 including the plurality of rectangular portions may be formed through a single etching process on the resistor layer 4', without forming the resistor layer 4" in the belt-like shape.

Figure 75:
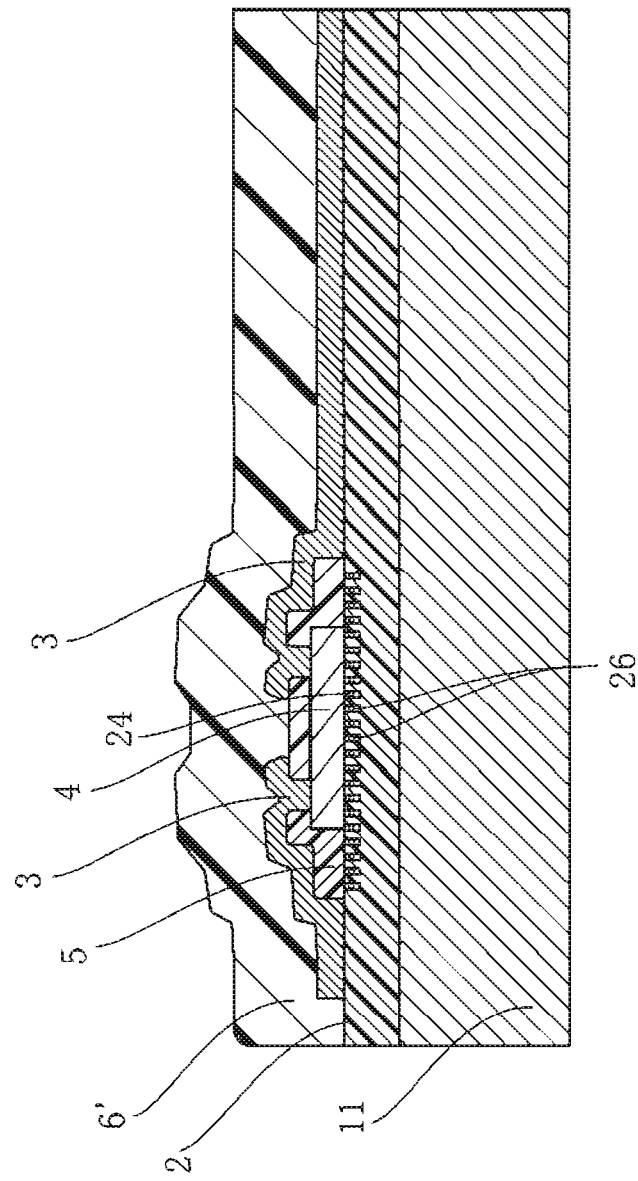
FIG. 75 is a cross-sectional view showing a step subsequent to FIG. 74.
Figure 76:
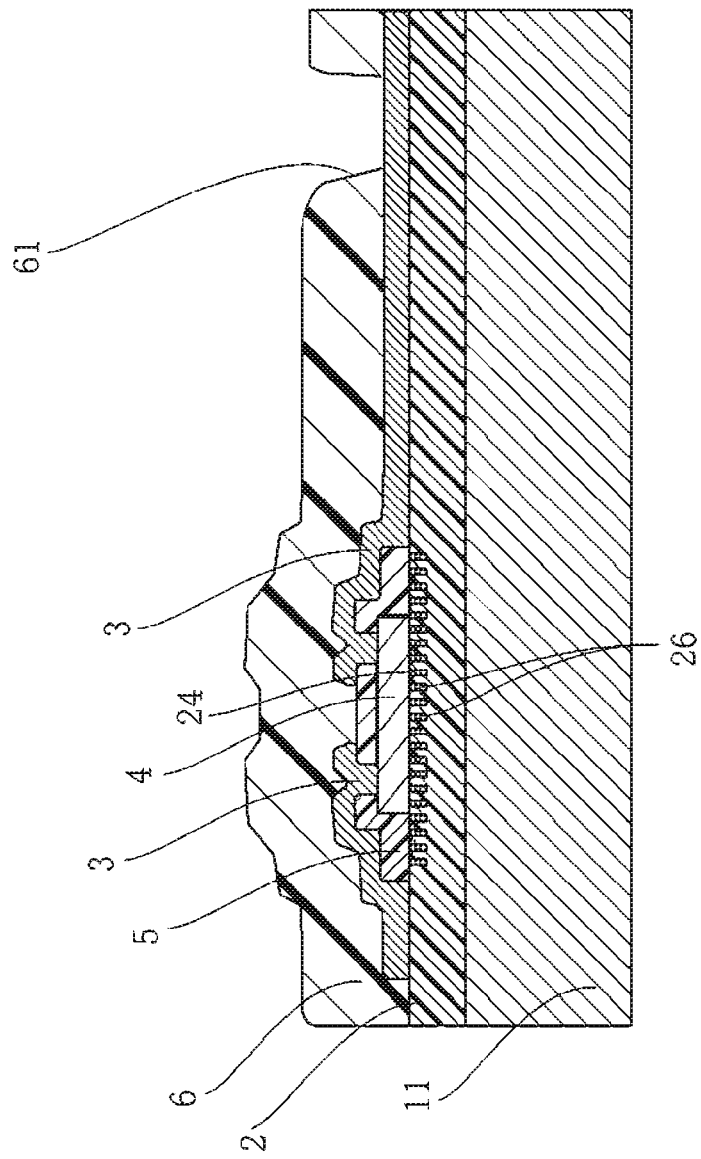
FIG. 76 is a cross-sectional view showing a step subsequent to FIG. 75.

Proceeding to FIG. 75, the cover layer 6' is formed. The cover layer 6' may be formed, for example, by CVD. Then as shown in FIG. 76, etching is performed on the cover layer 6' so as to form the plurality of through windows 61. To form the cover layer 6', a mask pattern is formed through a photolithography process and, for example, dry etching is performed.

Thereafter, though not shown, the rear surface of the base member 11 is polished to reduce the thickness thereof. Then after measuring the resistance of the resistor layer 4 and dicing the base member 11, the diced pieces and the circuit board 12 are placed on the heat dissipation plate 13. The driver IC 7 shown in FIG. 51 is then mounted on the circuit board 12, the wires 81 are bonded to predetermined positions, and the encapsulating resin 82 is formed. Through the foregoing process, the thermal print head 501 shown in FIG. 51 can be obtained.

The advantageous effects of the foregoing embodiment will be described hereunder.

In this embodiment, one of the one or more (a plurality in this embodiment) heat insulating portions 26 is formed so as to overlap one of the plurality of heating portions 41 as viewed in the thickness direction Z, and located inside the substrate (base member 11 or heat storage region 2). Accordingly, the heat insulating portion 26 suppresses the heat generated by the heating portion 41 from being transmitted to the base member 11. Such a configuration prevents the heat generated by the heating portions 41 from escaping to the base member 11 despite the material constituting the base member 11 having a high thermal conductivity, thereby allowing a larger amount of heat to be transmitted to the printing medium 801 out of the heat generated by the heating portion 41. Therefore, higher printing quality can be obtained on the printing medium 801. In addition, since a larger amount of heat can be transmitted to the printing medium 801 out of the heat generated by the heating portion 41, the power consumption of the thermal print head 501 can be reduced.

In this embodiment, the plurality of heat insulating portions 26 are dispersed as viewed in the thickness direction Z. Such a configuration allows the heat generated by the heating portion 41 to be efficiently transmitted to the heat storage region 2 while suppressing the heat transmission to the base member 11. Therefore, the heat storage region 2 can properly perform the heat storing function.

In this embodiment, the plurality of recesses 24 include the plurality of second recesses 24B. The plurality of second recesses 24B are each spaced from one of the plurality of heating portions 41 in the sub scanning direction X, as viewed in the thickness direction Z. The plurality of second recesses 24B each include one of the plurality of heat insulating portions 26. Such a configuration prevents heat transmission to the first side Xa beyond the second recess 24B. Accordingly, the heat transmission to a region on the printing medium 801 other than the target region can be prevented, and therefore appearance of printing blur on the printing medium 801 can be suppressed. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the plurality of recesses 24 include the plurality of third recesses 24C. The plurality of third recesses 24C are each located on the opposite side of the plurality of second recesses 24B with respect to one of the plurality of heating portions 41 in the sub scanning direction X, as viewed in the thickness direction Z. The plurality of third recesses 24C each include one of the plurality of heat insulating portions 26. Such a configuration prevents heat transmission to the second side Xb beyond the third recess 24C. Accordingly, the heat transmission to a region on the printing medium 801 other than the target region can be prevented, and therefore appearance of printing blur on the printing medium 801 can be suppressed. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the plurality of recesses 24 include the plurality of intermediate recesses 24D. The plurality of intermediate recesses 24D are each located between two heating portion 41 adjacent to each other out of the plurality of heating portion 41, as viewed in the thickness direction Z. The plurality of intermediate recesses 24D each include one of the plurality of heat insulating portions 26. Accordingly, the heat generated in one of the heating portion 41 can be prevented from being transmitted through the heat storage unit 2 to the region in the heat storage unit 2 corresponding to the adjacent heating portion 41. Such a configuration prevents transmission of heat to a region on the printing medium 801 other than a target region, thereby suppressing appearance of printing blur on the printing medium 801. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the thermal print head 501 includes the insulating layer 5. The insulating layer 5 includes a portion interposed between the electrode layer 3 and the heating portion 41. Such a configuration reduces the contact area between the electrode layer 3 and the heating portion 41. Accordingly, a eutectic composition of the electrode layer 3 and the heating portion 41 is generated only in a small area when the heating portion 41 receives a current and generates heat. Reducing thus the area where eutectic reaction takes place between the electrode layer 3 and the heating portion 41 suppresses fluctuation of the resistance of the thermal print head 501 during the use.

In this embodiment, the insulating layer 5 includes the first interposed portion 51 and the second interposed portion 52. The first interposed portion 51 is interposed between the first conductive portion 31 and the heating portion 41. Such a configuration suppresses eutectic reaction between the first conductive portion 31 and the heating portion 41. In this embodiment, in addition, the second interposed portion 52 is interposed between the second conductive portion 32 and the heating portion 41. Such a configuration suppresses eutectic reaction between the second conductive portion 32 and the heating portion 41. Suppressing the eutectic reaction between the first conductive portion 31 and the heating portion 41, or between the second conductive portion 32 and the heating portion 41, leads to reduction of the area where the eutectic reaction takes place between the electrode layer 3 and the heating portion 41. Consequently, fluctuation of the resistance of the thermal print head 501 during the use can be suppressed.

In the case where the electrode layer 3 is interposed between the resistor layer 4 and the heat storage region 2, the heat generated by the heating portion 41 of the resistor layer 4 may escape to the electrode layer 3. The heat that has escaped to the electrode layer 3 is not involved in the heat transmission to the printing medium 801. In this embodiment, on the other hand, the resistor layer 4 is interposed between the electrode layer 3 and the heat storage region 2. With such a configuration, even though the heat generated by the heating portion 41 of the resistor layer 4 is transmitted to the electrode layer 3, the heat transmitted to the electrode layer 3 can participate in the heat transmission to the printing medium 801. Therefore, the heat generated by the heating portion 41 can be more efficiently transmitted to the printing medium 801, so that the portion of the thermal print head 501 to be brought into contact with the printing medium 801, i.e., the cover layer 6, can be more quickly heated up. Consequently, high-speed printing can be performed on the printing medium 801.

In this embodiment, the base member 11 is made of Si. Since Si has a high thermal conductivity, the heat generated by the heating portion 41 can be rapidly transmitted to outside of the base member 11 (in this embodiment, heat dissipation plate 13). Therefore, the raised temperature of the heating portion 41 can be quickly lowered, which contributes to increasing the printing speed on the printing medium 801.

In this embodiment, the through window 61 in the cover layer 6 is formed by etching on the cover layer 6'. Through the etching process the through window 61 can be formed at a desired position in the cover layer 6, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head 501.

Figure 77:
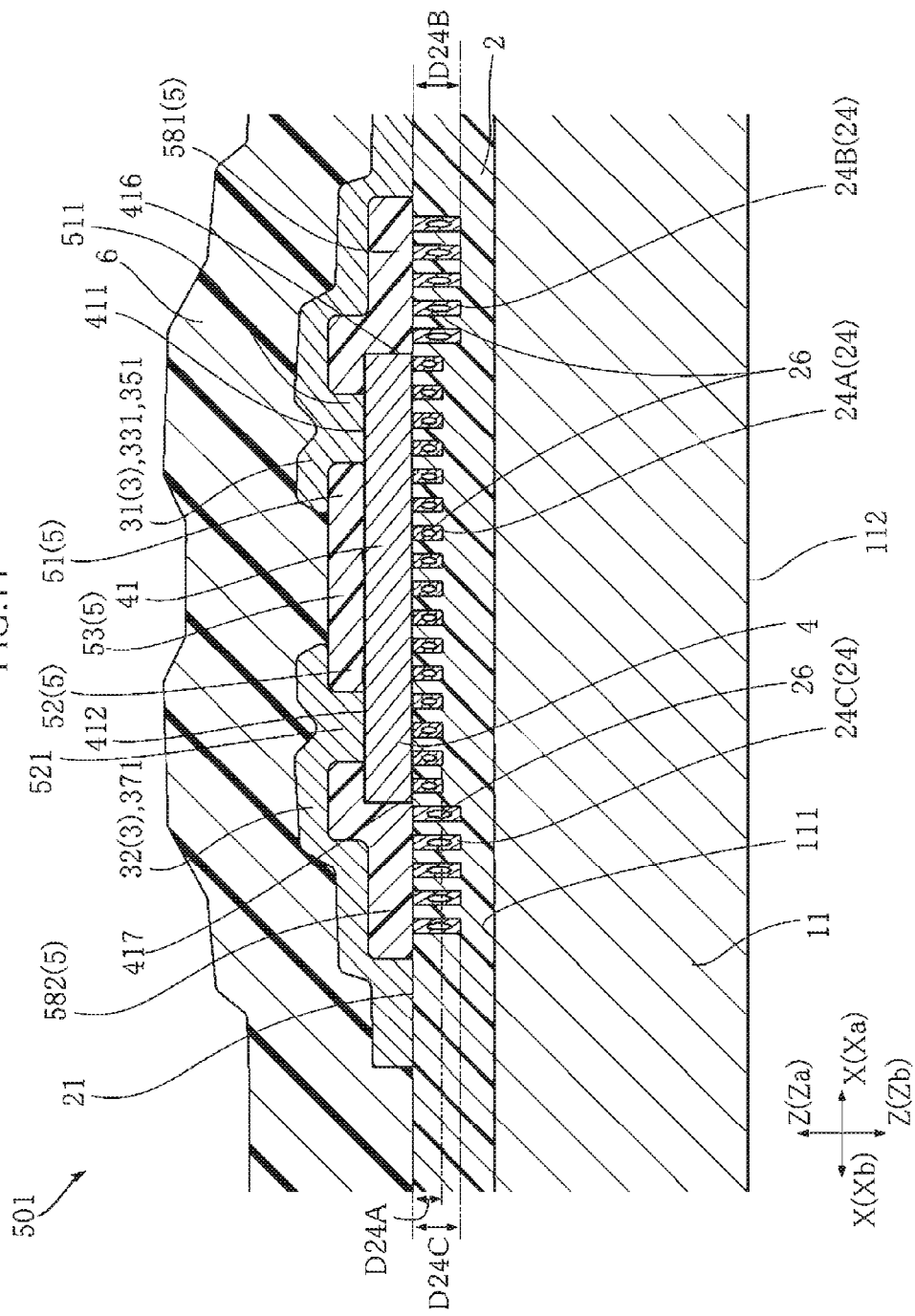
FIG. 77 is an enlarged fragmentary cross-sectional view of a thermal print head according to a variation of the embodiment B1 of the present invention.
Figure 78:
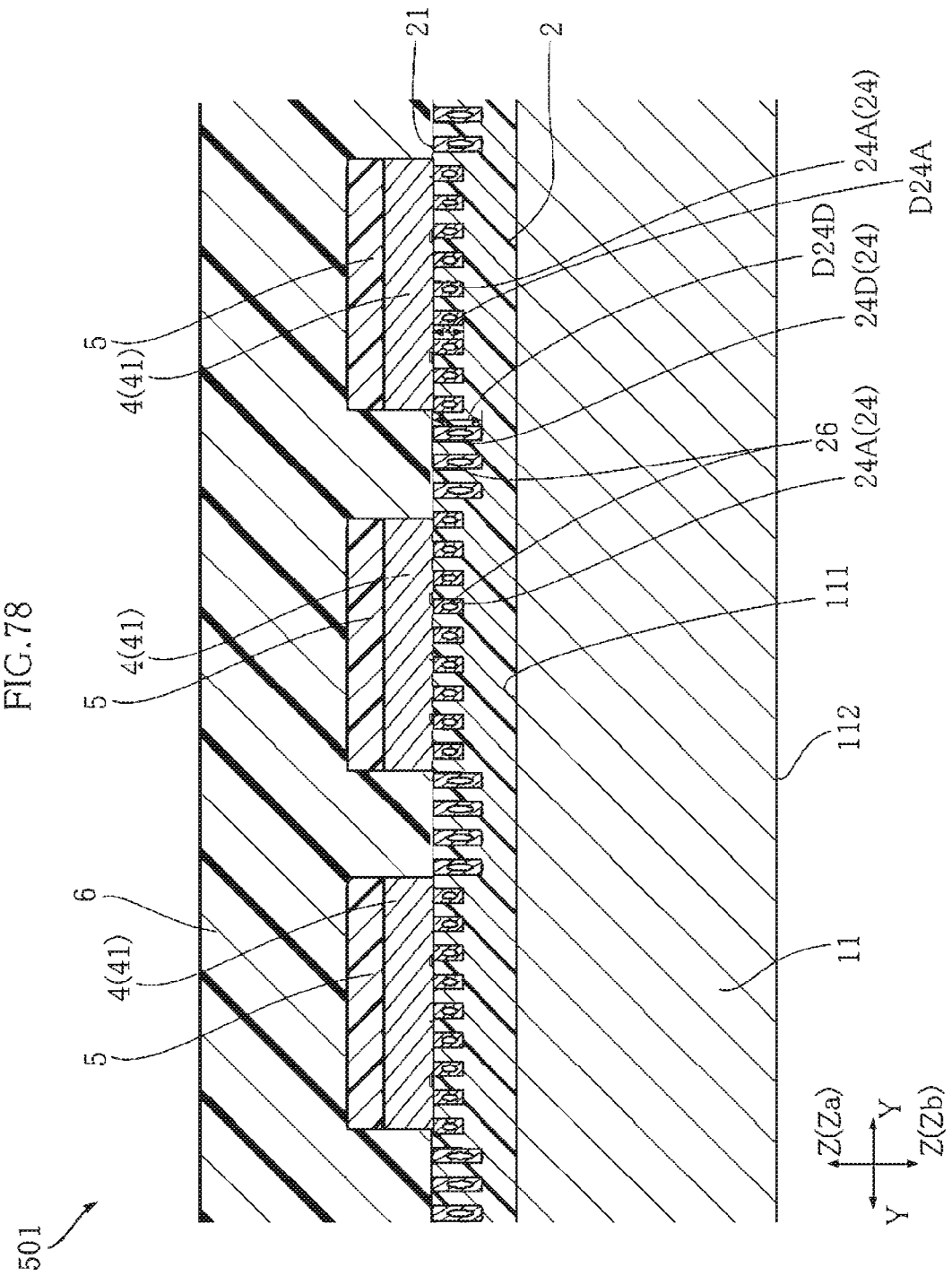
FIG. 78 is an enlarged fragmentary cross-sectional view of a thermal print head according to another variation of the embodiment B1 of the present invention.

The depths of the first recess 24A, the second recess 24B, the third recess 24C, and the intermediate recess 24D may be different from each other. FIG. 77 and FIG. 78 illustrate the case where the depth D24B of the second recess 24B, the depth D24C of the third recess 24C, the depth D24D of the intermediate recess 24D are deeper than the depth D24A of the first recess 24A.

The mentioned configuration provides the following advantageous effects, in addition to those described above.

When the depth D24B of the second recess 24B is deeper than the depth D24A of the first recess 24A, or when the depth D24C of the third recess 24C is deeper than the depth D24A of the first recess 24A, the heat transmission from the heat storage region 2 to a more distant region in the sub scanning direction X can be more effectively suppressed. Accordingly, the heat transmission to a region on the printing medium 801 other than the target region can be more securely prevented, and therefore appearance of printing blur on the printing medium 801 can be more securely suppressed.

Forming the intermediate recess 24D with the depth D24D deeper than the depth D24A of the first recess 24A further suppresses transmission of the heat generated in one of the heating portion 41 through the heat storage unit 2 to the region in the heat storage unit 2 corresponding to the adjacent heating portion 41. Therefore, transmission of heat to a region on the printing medium 801 other than a target region can be more efficiently prevented, and consequently appearance of printing blur on the printing medium 801 can be more securely suppressed.

In the description given hereunder (variations of embodiment B1, embodiment B2 and variations thereof), the constituents same as or similar to those cited above will be given the same numeral and the description thereof may be omitted.

<First Variation of Embodiment B1>

Figure 79:
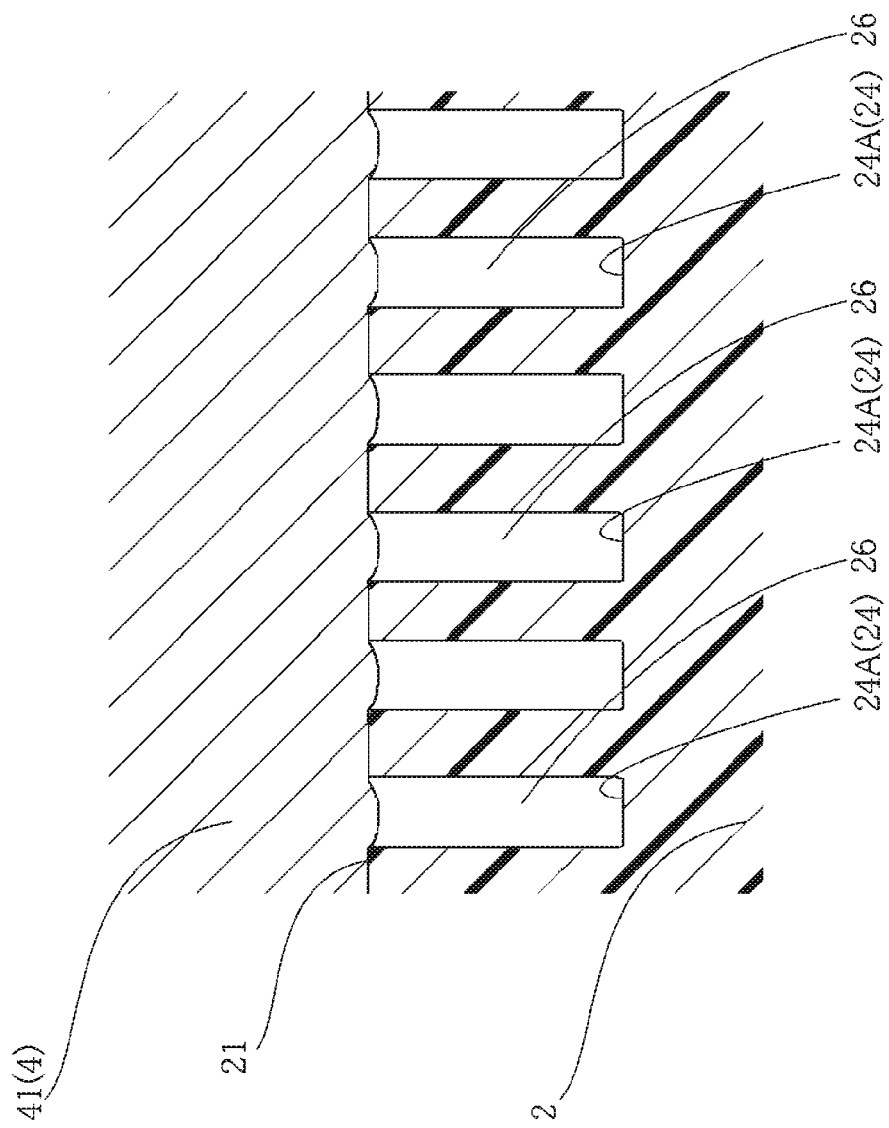
FIG. 79 is an enlarged fragmentary cross-sectional view of a thermal print head according to a first variation of the embodiment B1 of the present invention.

Referring to FIG. 79, a first variation of the embodiment B1 of the present invention will be described hereunder.

FIG. 79 is an enlarged fragmentary cross-sectional view of a thermal print head according to the first variation of the embodiment B1 of the present invention.

The thermal print head according to this variation is the same as the thermal print head 501 except that the intermediate layer 27 is excluded. In this embodiment, the heat insulating portion 26 is defined by the recess 24. Such a configuration provides the following advantageous effects, in addition to those described above.

In this variation, the plurality of recesses 24 each define a part of the void constituting the heat insulating portion 26. Such a configuration eliminates the need to form the intermediate layer 27 in the thermal print head 501, thereby contributing to improving the manufacturing efficiency of the thermal print head.

<Second Variation of Embodiment B1>

Figure 80:
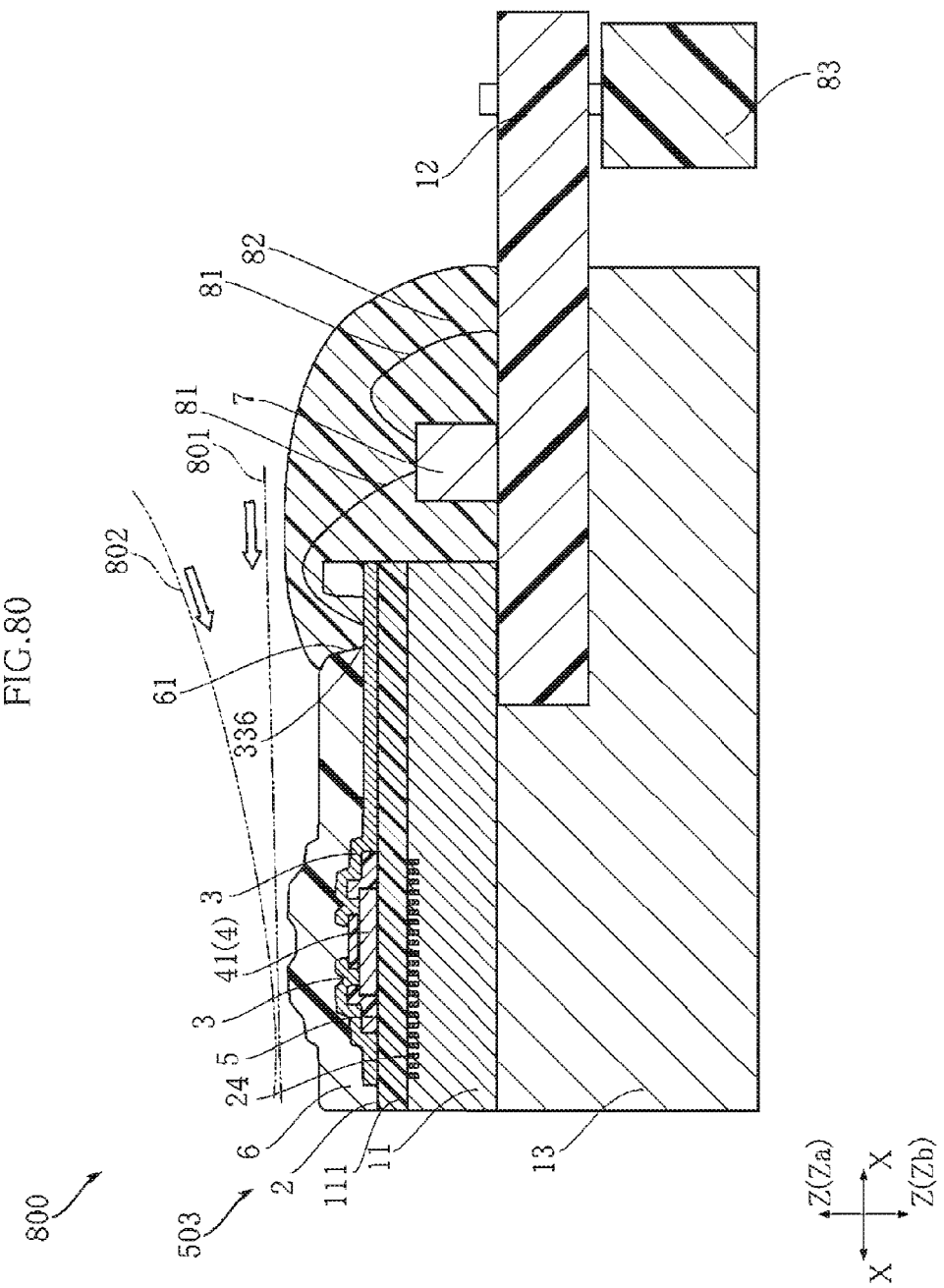
FIG. 80 is a fragmentary cross-sectional view of a thermal print head according to a second variation of the embodiment B1 of the present invention.
Figure 81:
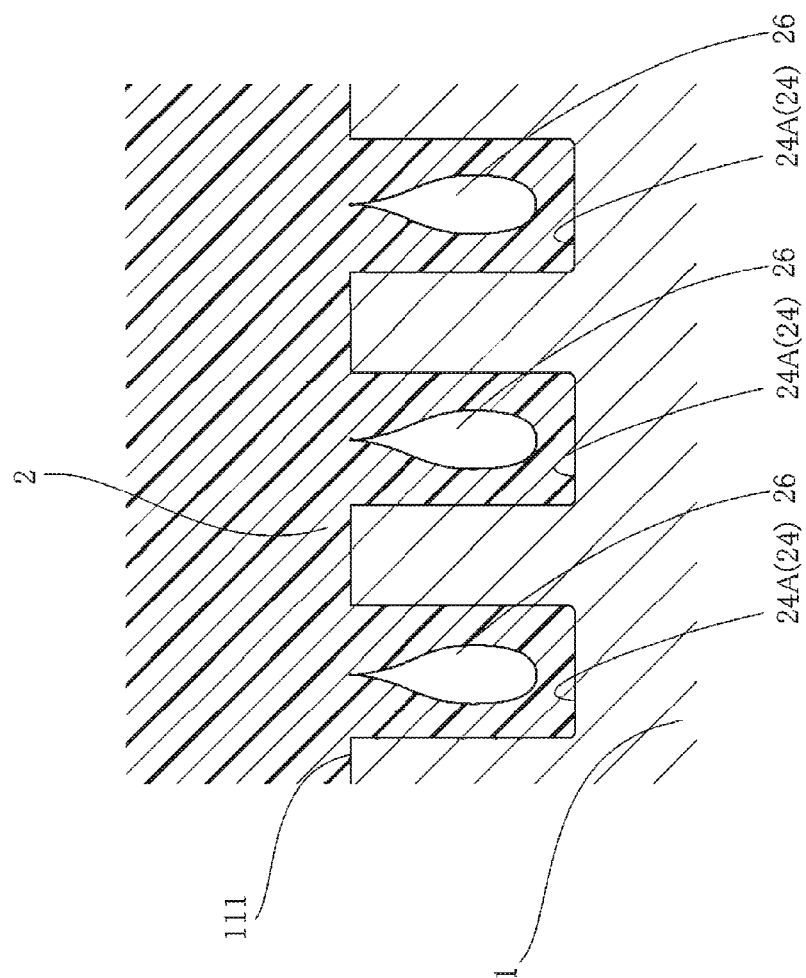
FIG. 81 is an enlarged fragmentary cross-sectional view of the thermal print head according to the second variation of the embodiment B1 of the present invention.

Referring to FIG. 80 and FIG. 81, a second variation of the embodiment B1 of the present invention will be described hereunder.

FIG. 80 is a fragmentary cross-sectional view of a thermal print head according to the second variation of the embodiment B1 of the present invention. FIG. 81 is an enlarged fragmentary cross-sectional view of the thermal print head according to the second variation of the embodiment B1 of the present invention.

The thermal print head 503 shown in the cited drawings includes the base member 11, the circuit board 12, the heat dissipation plate 13, the heat storage region 2, the plurality of heat insulating portions 26, the electrode layer 3, the resistor layer 4, the insulating layer 5, the cover layer 6, the driver IC 7, the plurality of wires 81, the encapsulating resin 82, and the connector 83. The base member 11 and the heat storage region 2 constitute the substrate.

The thermal print head 503 is different from the thermal print head 501 in that the recesses 24 are not formed in the heat storage region surface 21 but in the base member 11. In the thermal print head 503, the heat storage region 2 defines a part of the void constituting the heat insulating portion 26.

Though not shown, the recesses 24 are formed in the semiconductor substrate 19 shown in FIG. 59, in the manufacturing process of the thermal print head 503. Then the heat storage region 2 is formed through thermal oxidation of the surface of the semiconductor substrate 19. Thereafter, the resistor layer 4', the electrode layer 3' and so forth are formed on the heat storage region 2, so that the thermal print head 503 is obtained.

The mentioned configuration provides the following advantageous effects, in addition to those described above.

In this variation, the plurality of recesses 24 are formed in the base member 11. Accordingly, the heat insulating portions 26 can be located closer to the base member 11. Such a configuration enables the heat generated by the heating portion 41 to be efficiently transmitted to the heat storage region 2, while more securely preventing the heat transmitted to the heat storage region 2 from escaping to the base member 11. Therefore, higher printing quality can be obtained on the printing medium 801. In addition, since a larger amount of heat can be transmitted to the printing medium 801 out of the heat generated by the heating portion 41, the power consumption of the thermal print head 503 can be reduced.

In the thermal print head 503, the intermediate layer 27 provided in the thermal print head 501 can be excluded. Therefore, the manufacturing process of the thermal print head 503 can be simplified.

<Third Variation of Embodiment B1>

Figure 82:
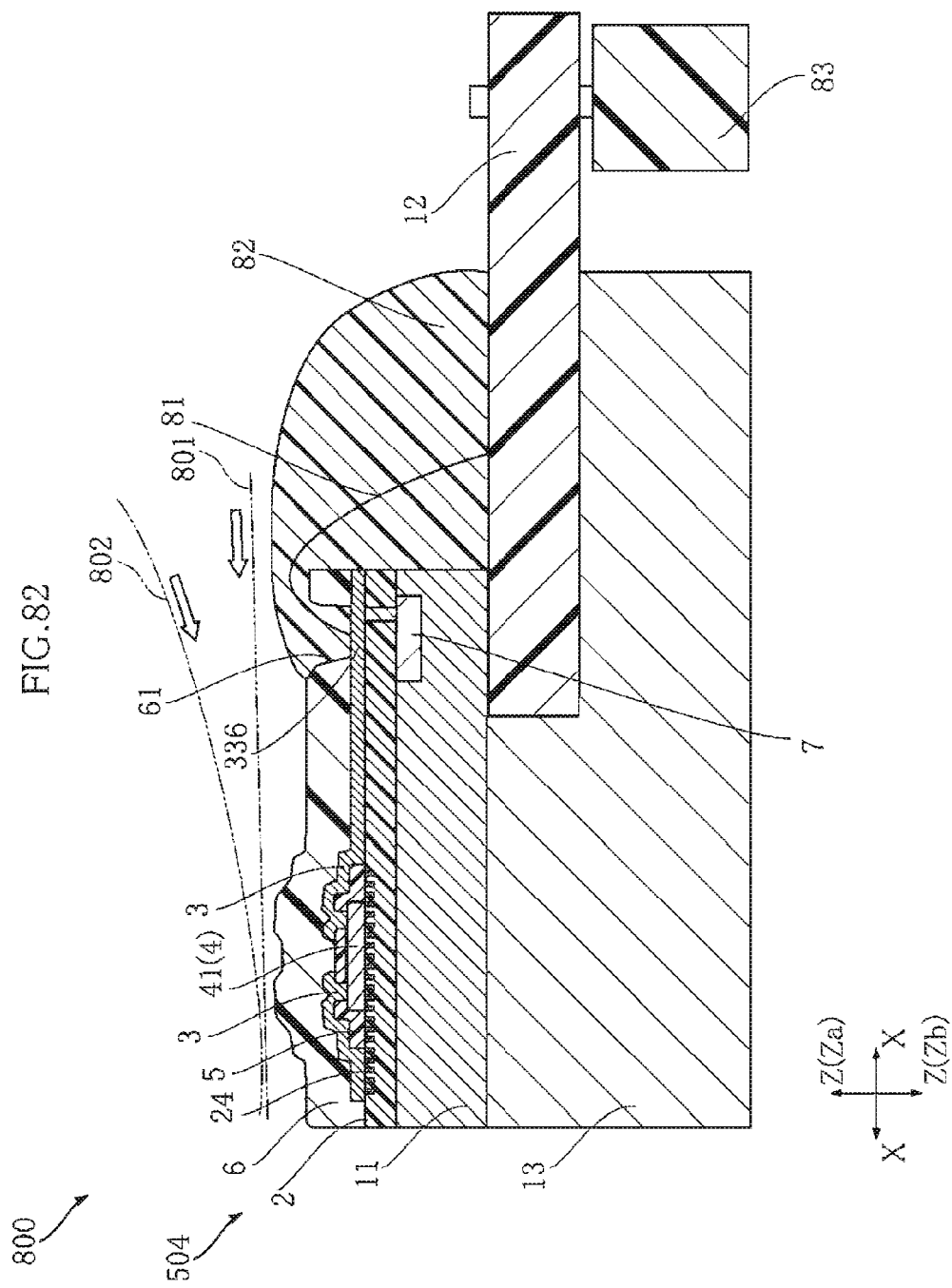
FIG. 82 is an enlarged fragmentary cross-sectional view of a thermal print head according to a third variation of the embodiment B1 of the present invention.

Referring to FIG. 82, a third variation of the embodiment B1 of the present invention will be described hereunder.

FIG. 82 is an enlarged fragmentary cross-sectional view of a thermal print head according to the third variation of the embodiment B1 of the present invention.

The thermal print head 504 shown in FIG. 82 includes the base member 11, the circuit board 12, the heat dissipation plate 13, the heat storage region 2, the plurality of heat insulating portions 26, the intermediate layer 27, the electrode layer 3, the resistor layer 4, the insulating layer 5, the cover layer 6, the driver IC 7, the plurality of wires 81, the encapsulating resin 82, and the connector 83. The base member 11 and the heat storage region 2 constitute the substrate.

The thermal print head 504 shown in FIG. 82 is the same as the thermal print head 501 only except that the driver IC 7 is mounted inside the base member 11, and therefore detailed description will be omitted. In the thermal print head 504, the base member 11 is made of a semiconductor material. In addition, the driver IC 7 and the electrode layer 3 are electrically connected to each other through a via penetrating through the heat storage region 2. Such a configuration reduces the number of parts for manufacturing the thermal print head 504. Further, the thermal print head 504 also provides the same advantageous effects as those provided by the thermal print head 501.

Embodiment B2

Figure 83:
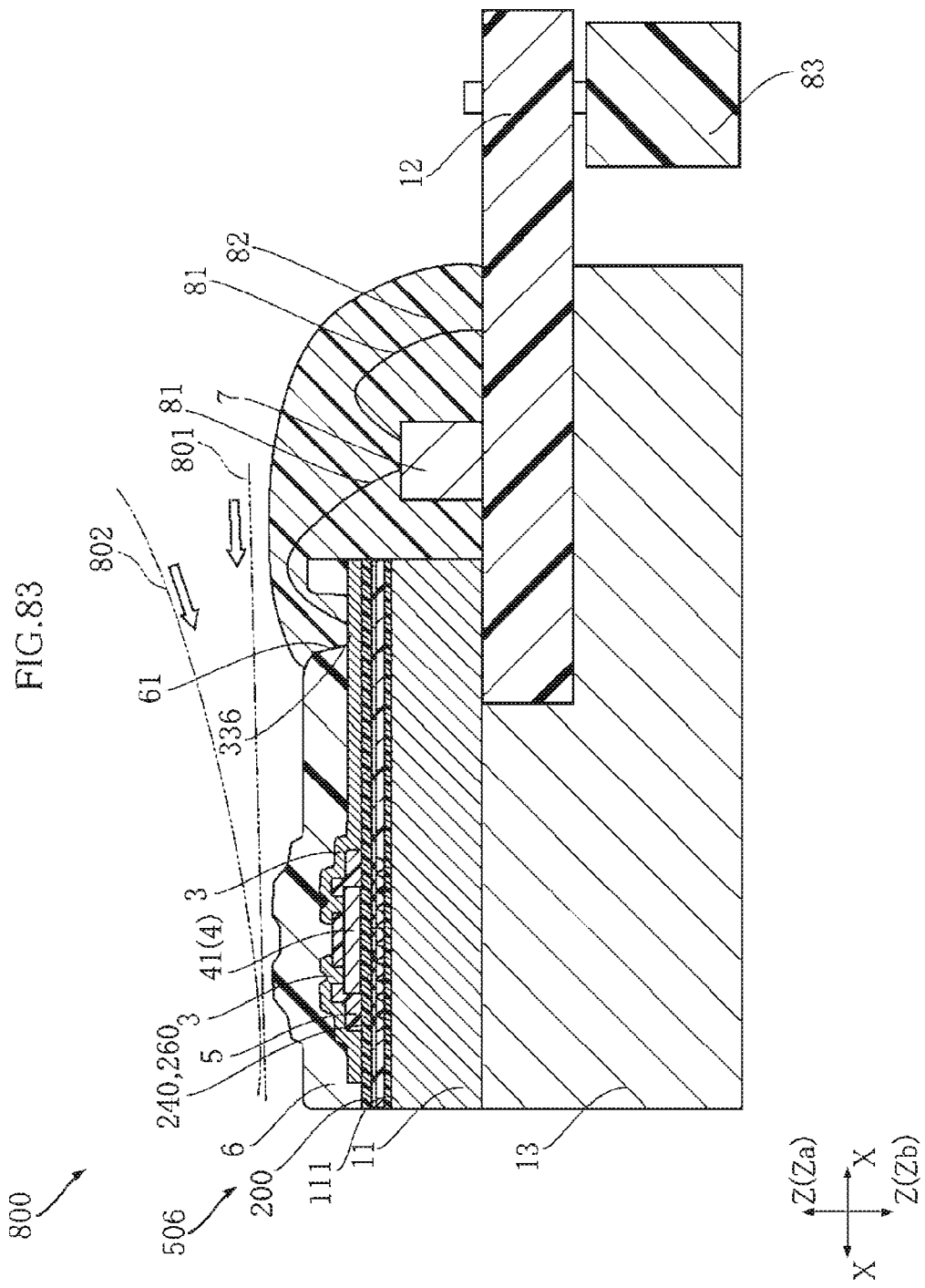
FIG. 83 is a fragmentary cross-sectional view of a thermal printer according to an embodiment B2 of the present invention.

FIG. 83 is a fragmentary cross-sectional view of a thermal printer according to an embodiment B2 of the present invention.

The thermal printer 800 shown in FIG. 83 is configured to perform a printing operation on the printing medium 801. The printing medium 801 may be, for example, a thermal paper for making out a barcode sheet or a receipt. The thermal printer 800 includes a thermal print head 506 and the platen roller 802.

The thermal print head 506 includes the base member 11, the circuit board 12, the heat dissipation plate 13, an intermediate structure 200, the plurality of heat insulating portions 260 (see also FIG. 85 to FIG. 87), the electrode layer 3, the resistor layer 4, the insulating layer 5, the cover layer 6, the driver IC 7, the plurality of wires 81, the encapsulating resin 82, and the connector 83. The base member 11 and the intermediate structure 200 constitute the substrate.

Since the base member 11, the circuit board 12, the heat dissipation plate 13, the electrode layer 3, the resistor layer 4, the insulating layer 5, the cover layer 6, the driver IC 7, the plurality of wires 81, the encapsulating resin 82, and the connector 83 of this embodiment are configured in the same way as in the thermal print head 501, and hence the description of these constituents will not be repeated.

Figure 84:
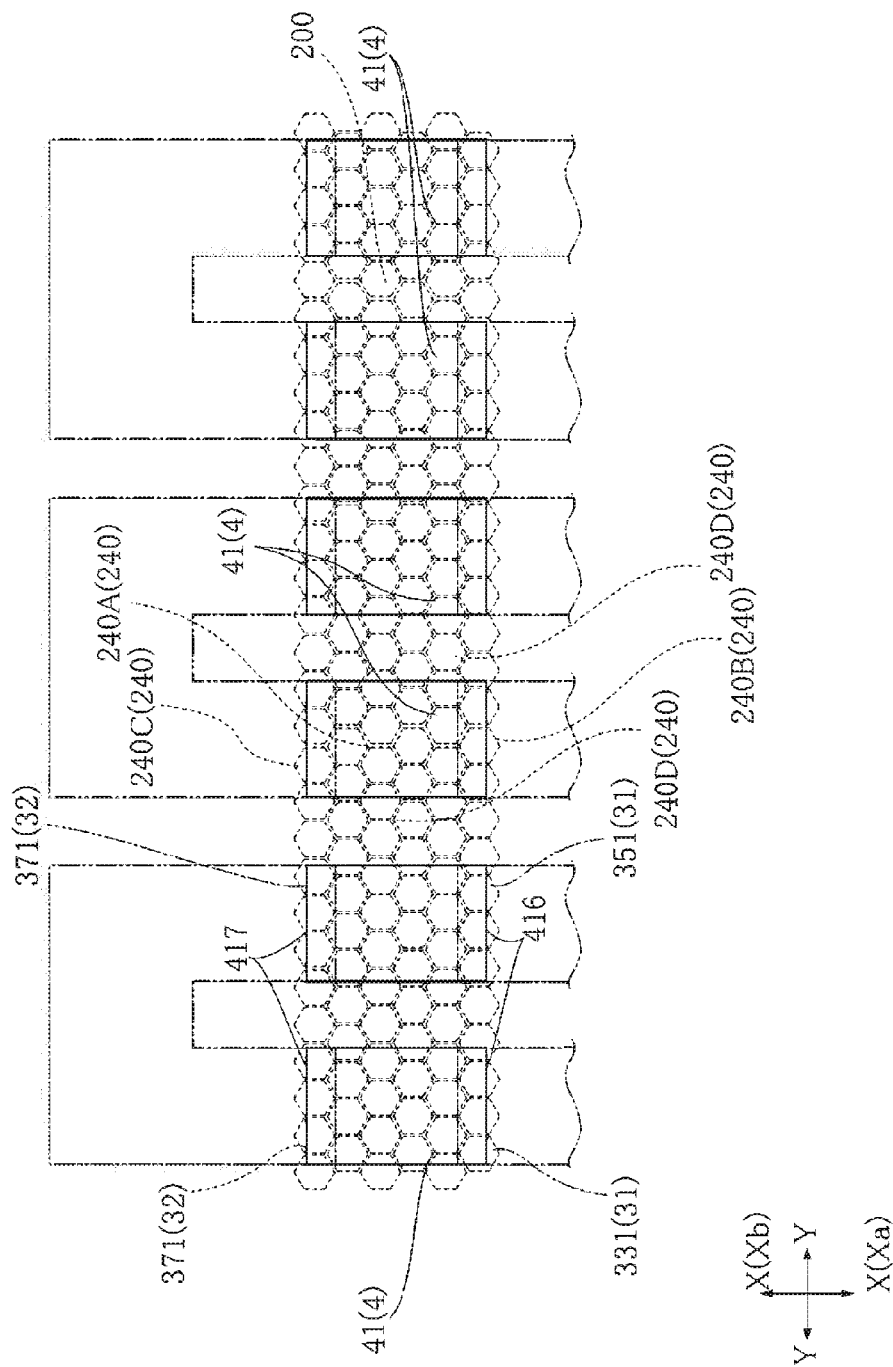
FIG. 84 is an enlarged fragmentary plan view of a thermal print head in the thermal printer shown in FIG. 83, with a part of the structure omitted.
Figure 85:
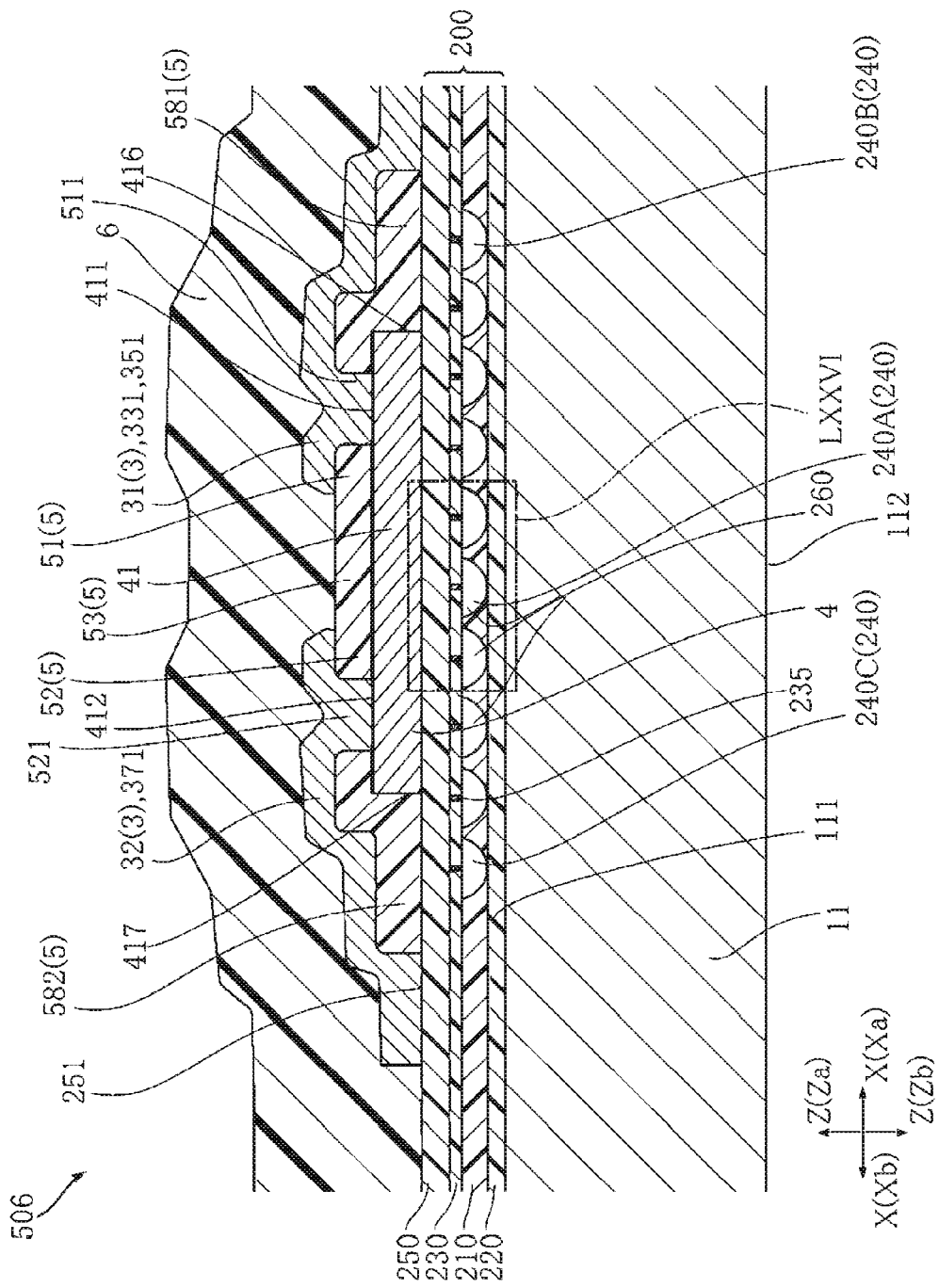
FIG. 85 is an enlarged fragmentary cross-sectional view of a part of FIG. 83.

FIG. 84 is an enlarged fragmentary plan view of a thermal print head 506 in the thermal printer 800 shown in FIG. 83, with a part of the structure omitted. FIG. 85 is an enlarged fragmentary cross-sectional view of a part of FIG. 83.

As shown in FIG. 84 and FIG. 85, the thermal print head 506 includes one or more heat insulating portions 260. The one or more heat insulating portions 260 are formed in the substrate (in the base member 11 or in the intermediate structure 200). In this embodiment, the one or more heat insulating portions 260 are formed in the intermediate structure 200. Unlike this embodiment, the one or more heat insulating portions 260 may be formed in the base member 11. In this embodiment, a plurality of the heat insulating portions 260 are provided. As shown in FIG. 84, the plurality of heat insulating portions 260 are dispersed as viewed in the thickness direction Z.

Figure 86:
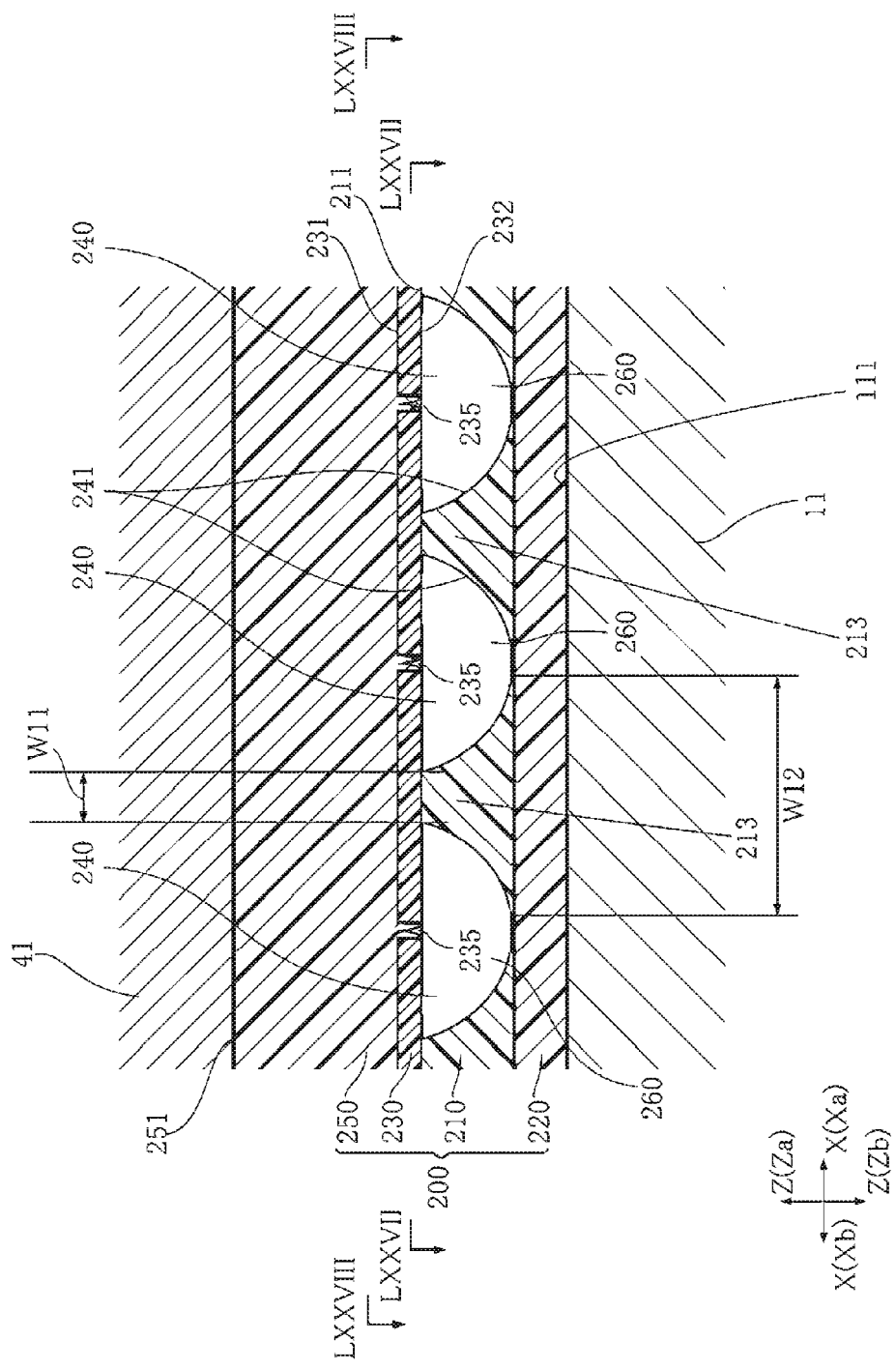
FIG. 86 is an enlarged fragmentary cross-sectional view of a region LXXVI in FIG. 85.

FIG. 86 is an enlarged fragmentary cross-sectional view of a region LXXVI in FIG. 85.

The heat insulating portion 260 is lower in thermal conductivity than the intermediate structure 200. In this embodiment the heat insulating portion 26 is a void, filled with a gas or in a vacuum state. The gas is, for example, air. Further details of the heat insulating portion 260 will be subsequently described.

As shown in FIG. 85 and FIG. 86, the intermediate structure 200 is provided on the base member 11. The intermediate structure 200 is interposed between the base member 11 and the resistor layer 4. The intermediate structure 200 covers the entirety of the front surface 111 of the base member 11.

As shown in FIG. 86, the intermediate structure 200 includes a first layer 210, a second layer 220, a blocking layer 230, and a heat storage layer 250.

The first layer 210 is provided over the base member 11. In this embodiment, the first layer 210 is stacked over the base member 11 via the second layer 220. The first layer 210 is interposed between the base member 11 and the heat storage layer 250. The first layer 210 extends along the XY-plane. The first layer 210 is, for example, formed of an insulative material. The first layer 210 is formed of, for example, $SiO_2$, or SiN. In this embodiment, the first layer 210 is formed by plasma oxidation (plasma CVD), as will be subsequently described. The first layer 210 has a thickness (size in the thickness direction Z) of, for example, 2.0 to 10.0 μm.

The first layer 210 includes a first surface 211. The first surface 211 of the first layer 210 is oriented to one side (Za-side) of the base member 11 in the thickness direction Z. In other words, the first surface 211 is oriented toward the resistor layer 4. The first surface 211 extends along the XY-plane.

In this embodiment, the first layer 210 includes one or more recesses 240. In this embodiment, a plurality of the recesses 240 are provided. The plurality of recesses 240 are each recessed from the first surface 211. The plurality of recesses 240 are each open toward the electrode layer 3 in the thickness direction Z (upward in FIG. 85).

Figure 87:
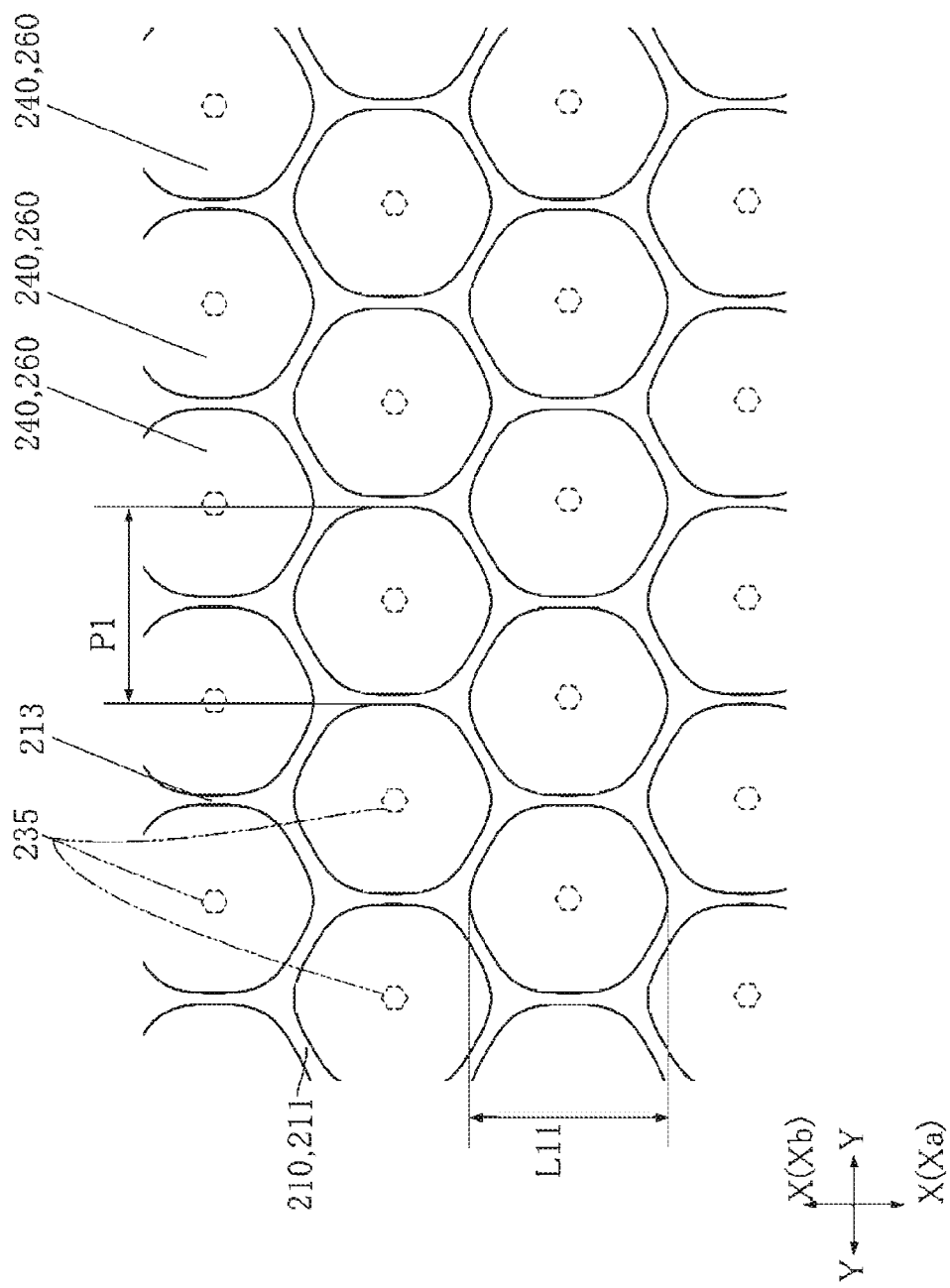
FIG. 87 is a view taken in the direction of arrows LXXVII-LXXVII in FIG. 86, with a part of the structure omitted.

FIG. 87 is a view taken in the direction of arrows LXXVII-LXXVII in FIG. 86, with a part of the structure omitted (blocking layer 230 unshown).

As shown in FIG. 87, the recesses 240 are dispersed as viewed in the thickness direction Z. The plurality of heat insulating portions 260 are located in the respective recesses 240. The recesses 240 each have a polygonal shape as viewed in the thickness direction Z. In this embodiment, the recesses 240 have a polygonal cross-sectional shape along a plane orthogonal to the thickness direction Z. In particular, the recesses 240 have a regular hexagonal cross-sectional shape along a plane orthogonal to the thickness direction Z, in this embodiment. Therefore, the plurality of recesses 240 constitute a honeycomb structure. Here, as shown in FIG. 87, the apices of the polygon (regular hexagon in this embodiment) are rounded. The cross-sectional shape of the recess 240 along a plane orthogonal to the thickness direction Z is not limited to regular hexagon, but may be circular or triangular, for example. The longest diagonal size L11 of the opening of the recess 240 is, for example, 20 to 30 μm. The pitch P1 between the recesses 240 is, for example, 22 to 35 μm.

As shown in FIG. 86, the recesses 240 each include an inner surface 241. The inner surface 241 has a curved shape. The inner surface 241 defines the heat insulating portion 260.

As shown in FIG. 84, the plurality of recesses 240 include a plurality of first recesses 240A, a plurality of second recesses 240B, a plurality of third recesses 240C, and a plurality of intermediate recesses 240D. In FIG. 84, the recesses 240 are indicated by broken lines.

As shown in FIG. 84, the plurality of first recesses 240A are each formed so as to overlap one of the plurality of heating portions 41 as viewed in the thickness direction Z. The plurality of second recesses 240B are each spaced from one of the plurality of heating portions 41 to the first side Xa (downward in FIG. 84 in this embodiment) as viewed in the thickness direction Z. The plurality of third recesses 240C are each spaced from one of the plurality of heating portions 41 to the second side Xb (upward in FIG. 84 in this embodiment) as viewed in the thickness direction Z. In addition, the plurality of third recesses 240C are located on the opposite side of the plurality of second recesses 24B, with respect to one of the plurality of heating portions 41. The plurality of intermediate recesses 240D are each located between two heating portions 41 adjacent to each other as viewed in the thickness direction 2 out of the plurality of heating portions 41.

The plurality of heat insulating portions 260 are each located in one of the plurality of first recesses 240A, the plurality of second recesses 240B, the plurality of third recesses 240C, and the plurality of intermediate recesses 240D.

It is not mandatory that the thermal print head 506 includes the second recesses 240B, the third recesses 240C, and the intermediate recesses 240D. In other words, the plurality of first recesses 240 may be formed only in the region overlapping the heating portion 41 as viewed in the thickness direction Z. Alternatively, the thermal print head 506 may include the first recesses 240A and at least one of the second recesses 240B, the third recesses 240C, and the intermediate recesses 240D.

As shown in FIG. 86 and FIG. 87, the first layer 210 includes a wall 213.

The wall 213 isolates the plurality of heat insulating portions 260 from each other. The wall 213 is erected in the thickness direction Z. The wall 213 is in contact with the blocking layer 230. The wall 213 constitutes the inner surface 241 of each of the recesses 240. The width of a narrowest portion of the wall 213 is, for example, 2 to 5 μm. The wall 213 has a size increasing in a direction away from the resistor layer 4 in the thickness direction Z. For example, the width W12 of the wall 213 at the Zb-side end (lowermost position in FIG. 86) is approximately 1.5 to 3.0 times as large as the width W11 of the wall 213 at the Za-side end (uppermost position in FIG. 86). It is because the recesses 240 are formed by wet etching (described later) that the wall 213 has a size increasing in the direction away from the resistor layer 4 in the thickness direction Z.

As shown in FIG. 86, the second layer 220 is stacked on the base member 11. The second layer 220 is interposed between the base member 11 and the first layer 210. The second layer 220 extends along the XY-plane. The second layer 220 is, for example, formed of an insulative material. The second layer 220 is in direct contact with the front surface 111 of the base member 11, as well as with the first layer 210. In this embodiment, the second layer 220 is formed by thermal oxidation as will be subsequently described. When the second layer 220 is formed by thermal oxidation, the second layer 220 is made of an oxide of the material constituting the base member 11. When the base member 11 is made of Si, the second layer 220 is made of $SiO_2$. The second layer 220 has a thickness (size in the thickness direction Z) is, for example, 0.5 to 1.5 μm. The second layer 220 serves to prevent the first layer 210 from being separated from the base member 11. Unlike this embodiment, the thermal print head 506 may be without the second layer 220.

As shown in FIG. 86, the blocking layer 230 is stacked on the first layer 210. The blocking layer 230 serves to prevent the recesses 240 from being filled with the heat storage layer 250. In this embodiment, the blocking layer 230 also serves as the mask to form the recesses 240. The blocking layer 230 is interposed between the first layer 210 and the heat storage layer 250. The blocking layer 230 extends along the XY-plane. The blocking layer 230 is, for example, formed of an insulative material. The blocking layer 230 is in direct contact with the first layer 210 and the heat storage layer 250. In this embodiment, the blocking layer 230 is formed by thermal CVD as will be subsequently described. The blocking layer 230 is formed of, for example, SiN or polysilicon. The blocking layer 230 has a thickness (size in the thickness direction Z) is, for example, 0.1 to 0.3 μm. In the case where the intermediate layer 27 of the embodiment B1 is formed in the recess 240, the thermal print head 506 may be without the blocking layer 230.

The blocking layer 230 includes a front surface 231 and a rear surface 232.

The blocking layer front surface 231 is oriented to one side (Za-side) of the base member 11 in the thickness direction Z. In other words, the blocking layer front surface 231 is oriented toward the resistor layer 4. The blocking layer front surface 231 extends along the XY-plane. The blocking layer front surface 231 is in direct contact with the heat storage layer 250.

The blocking layer rear surface 232 is oriented to the other side (Zb-side) of the base member 11 in the thickness direction 2. In other words, the blocking layer rear surface 232 is oriented to the side opposite to the resistor layer 4. The blocking layer rear surface 232 extends along the XY-plane. The blocking layer rear surface 232 is in direct contact with the first layer 210. The blocking layer rear surface 232 defines a part of the heat insulating portions 260.

The blocking layer 230 includes a plurality of through holes 235.

The through holes 235 are each formed so as to penetrate through the blocking layer 230. To be more detailed, the through holes 235 are each formed all the way from the blocking layer front surface 231 to the blocking layer rear surface 232. The through holes 235 extend in the thickness direction 2. The plurality of through holes 235 communicate with the respective recesses 240.

Figure 88:
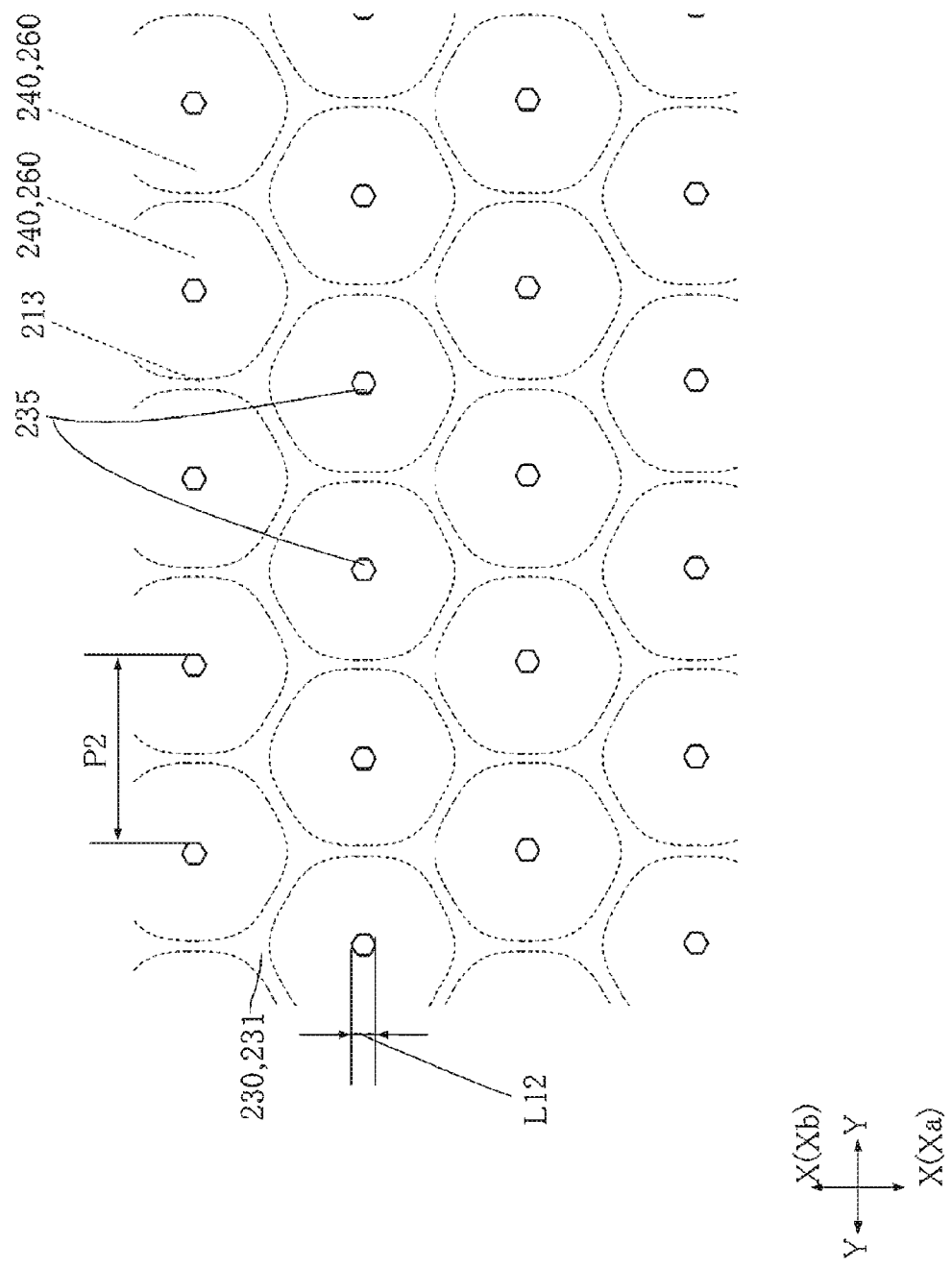

FIG. 88 is a view taken in the direction of arrows LXXVIII-LXXVIII in FIG. 86, with a part (wall 213, recess 240, and heat insulating portion 260) seen through.

The shape of the through holes 235 in a view in the thickness direction 2 determines the cross-sectional shape of the recesses 240 along the plane orthogonal to the thickness direction Z. Accordingly, the shape of the through holes 235 in the view in the thickness direction Z is similar to the cross-sectional shape of the recesses 240 along the plane orthogonal to the thickness direction Z. In this embodiment the recesses 240 have a regular hexagonal cross-sectional shape along the plane orthogonal to the thickness direction 2, and hence the shape of the through holes 235 in the view in the thickness direction 2 is also regular hexagonal as shown in FIG. 88. The longest diagonal size L12 of the opening of each through hole 235 is smaller than the size L11 of the recess 240 and, for example, 0.1 to 1.0 μm. The pitch P2 between the through holes 235 is the same as the pitch between the recesses 240 and, for example, 22 to 35 μm.

As shown in FIG. 86, the heat storage layer 250 is stacked on the blocking layer 230. The heat storage layer 250 serves to accumulate the heat generated by the heating portion 41. The heat storage layer 250 is interposed between the first layer 210 and the resistor layer 4. The heat storage layer 250 extends along the XY-plane. The heat storage layer 250 is formed of, for example, an insulative material. The heat storage layer 250 is in direct contact with the blocking layer 230 and the resistor layer 4. The heat storage layer 250 is formed of $SiO_2$ or SiN. In this embodiment, the heat storage layer 250 is formed by plasma oxidation (plasma CVD) as will be subsequently described. The heat storage layer 250 has a thickness (size in the thickness direction Z) of, for example, 1.0 to 10.0 μm. The heat storage layer 250 covers the through holes 235. In this embodiment, a part of the heat storage layer 250 is formed in each of the through holes 235. The heat insulating portions 260 are interposed between the heat storage layer 250 and the base member 11. In other words, the heat insulating portions 260 are located on the side of the base member 11, with respect to the heat storage layer 250.

The heat storage layer 250 a front surface 251. The front surface 251 is oriented to the Za-side. In other words, the front surface 251 of the heat storage layer 250 is oriented toward the resistor layer 4. In this embodiment, the front surface 251 is flat over its entirety.

Hereunder, an example of the manufacturing method of the thermal print head 506 will be briefly described. In this embodiment, the thermal print head 506 is manufactured through a semiconductor process.

Figure 89:
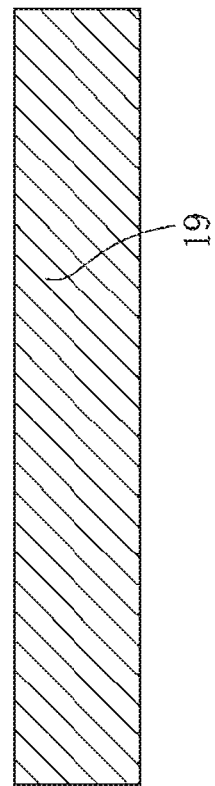
FIG. 89 is a cross-sectional view showing a step in the manufacturing process of the thermal print head according to the embodiment B2 of the present invention.
Figure 90:
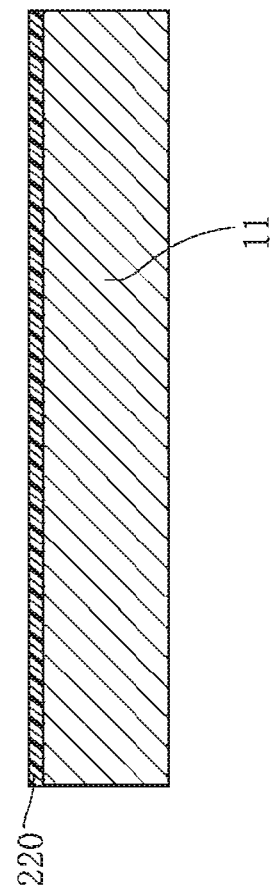
FIG. 90 is a cross-sectional view showing a step subsequent to FIG. 89.

As shown in FIG. 89, the semiconductor substrate 19 is first prepared. In this embodiment the semiconductor substrate 19 is formed of Si. Proceeding to FIG. 90, the surface of the semiconductor substrate 19 is subjected to thermal oxidation. At this point, the second layer 220 ($SiO_2$ layer in this embodiment) stacked on the base member 11 is obtained. Though not shown, the $SiO_2$ layer is also formed on the rear surface of the base member 11.

Figure 91:
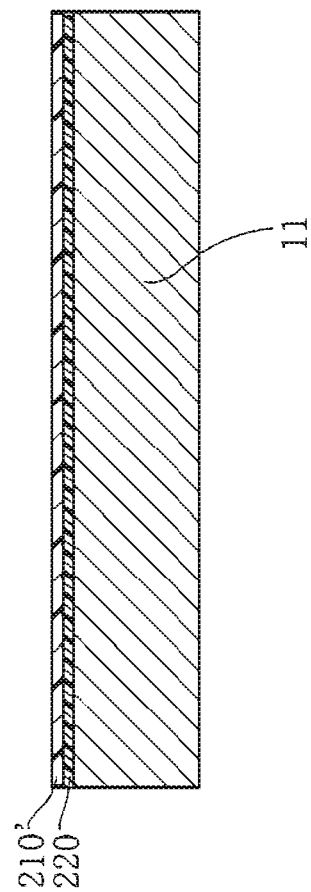
FIG. 91 is a cross-sectional view showing a step subsequent to FIG. 90.

Proceeding to FIG. 91, a first layer 210' is formed on the second layer 220. To form the first layer 210', plasma oxidation (plasma CVD) is performed.

Figure 92:
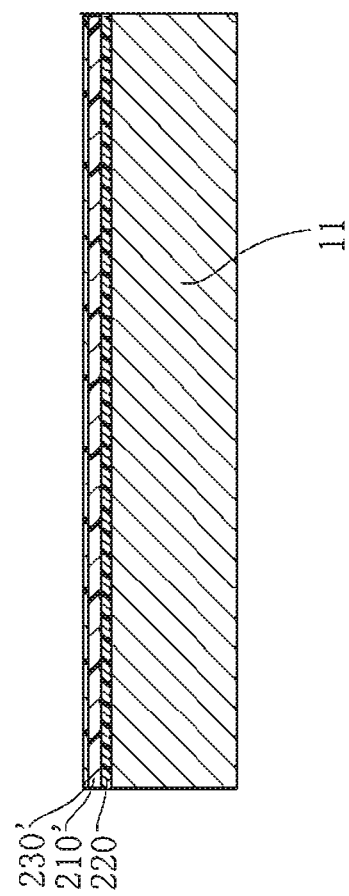
FIG. 92 is a cross-sectional view showing a step subsequent to FIG. 91.
Figure 93:
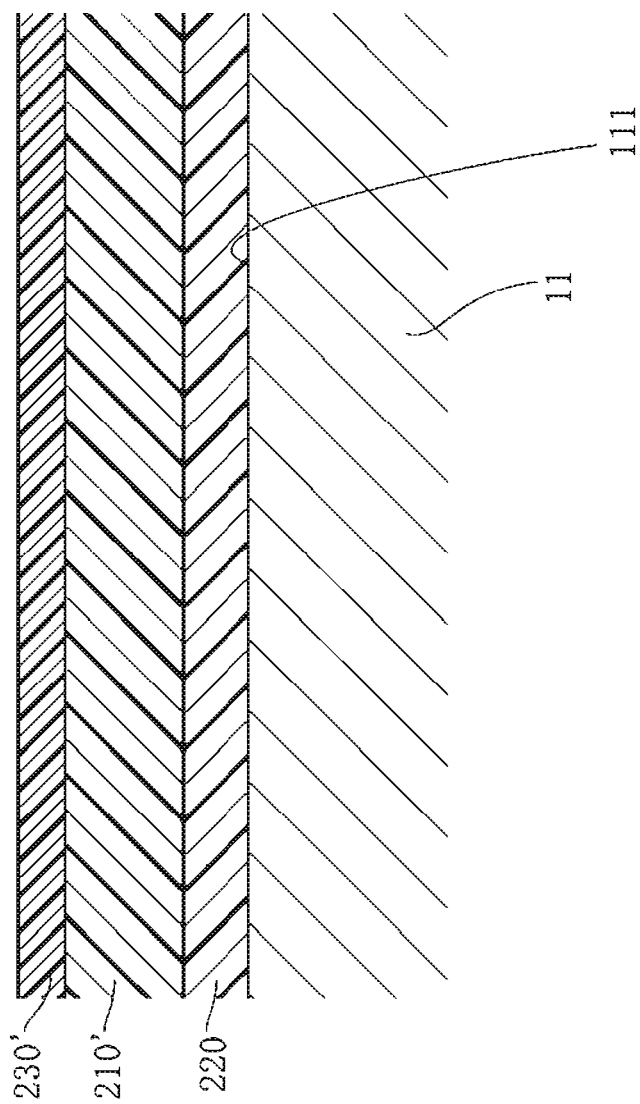
FIG. 93 is an enlarged fragmentary cross-sectional view of a part of FIG. 92.

FIG. 92 is a cross-sectional view showing a step subsequent to FIG. 91. FIG. 93 is an enlarged fragmentary cross-sectional view of a part of FIG. 92.

As shown in FIG. 92 and FIG. 93, a blocking layer 230' is formed on the first layer 210', by thermal CVD.

Figure 94:
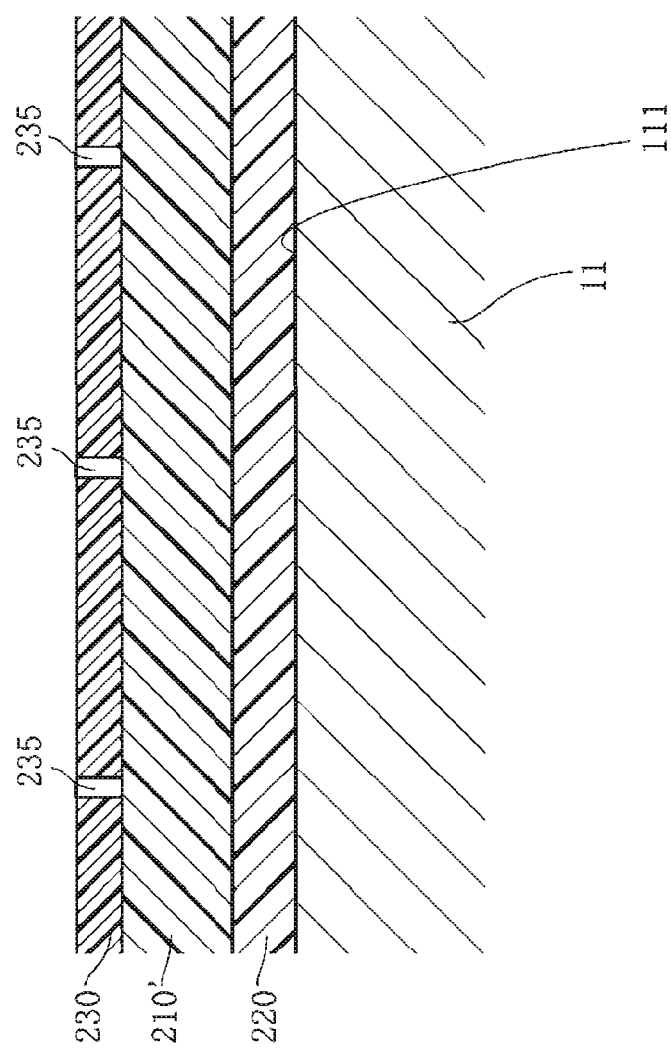
FIG. 94 is an enlarged fragmentary cross-sectional view showing a step subsequent to FIG. 93.

Proceeding to FIG. 94, the plurality of through holes 235 are formed in the blocking layer 230'. The through holes 235 may be formed through the following steps. First, a resist layer (unshown) is formed on the surface of the blocking layer 230'. Then the resist layer is for example exposed to light, so as to remove the regions overlapping the positions where the through holes 235 are to be formed. Dry etching (anisotropic etching) is then performed so as to form the through holes 235. After the through holes 235 are formed, the resist layer is removed.

Figure 95:
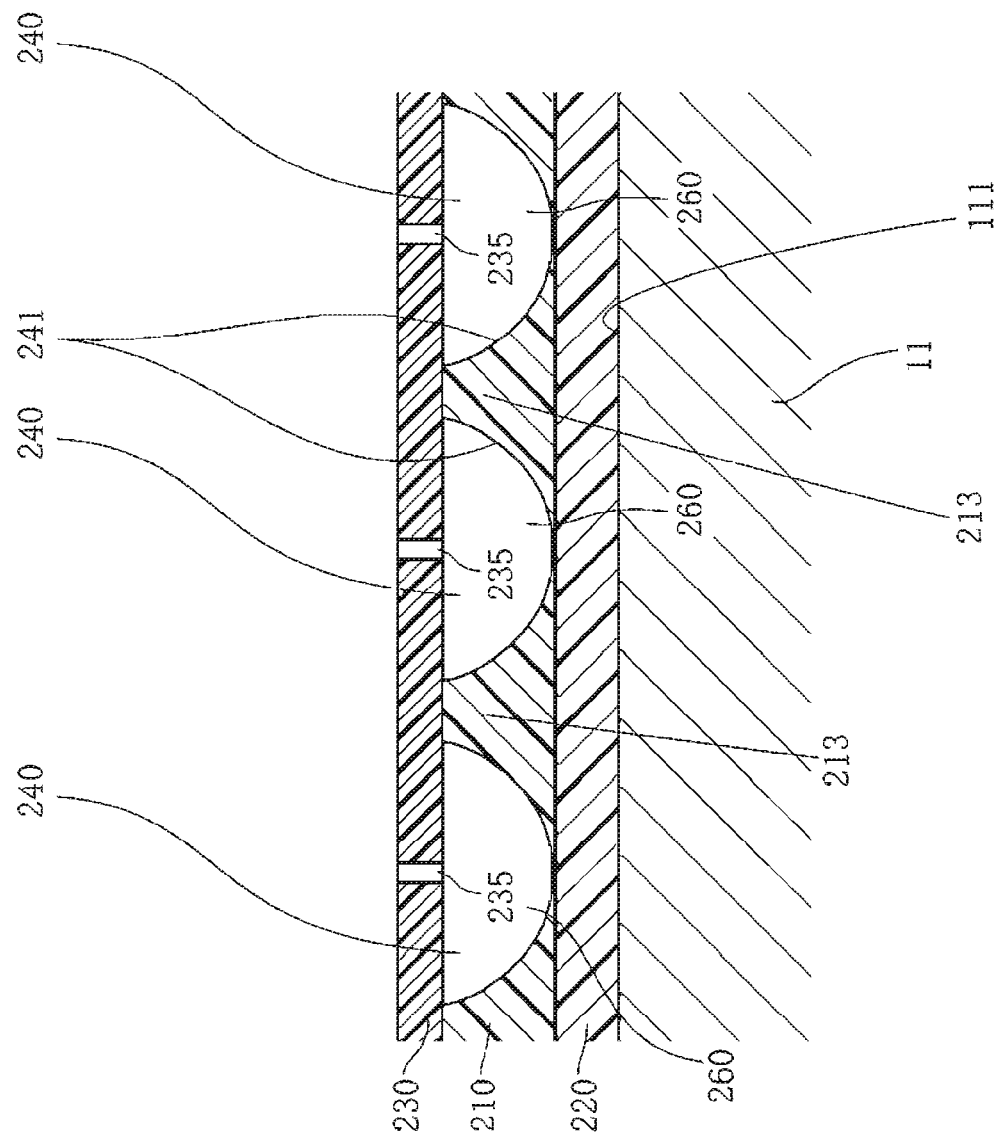
FIG. 95 is an enlarged fragmentary cross-sectional view showing a step subsequent to FIG. 94.

Proceeding to FIG. 95, one or more (a plurality in this embodiment) recesses 240 are formed in the first layer 210'. The recesses 240 are formed by wet etching. To perform the wet etching, an etching solution is employed. The etching solution passes through each of the through holes 235 and etches the first layer 210. Accordingly, one each of the recesses 240 are formed in the region under the through hole 235 in FIG. 95. The size of the recess 240 (width of the wall 213) can be controlled by adjusting the duration of the etching. Examples of the etching solution include hydrofluoric acid and buffered hydrofluoric acid.

Figure 96:
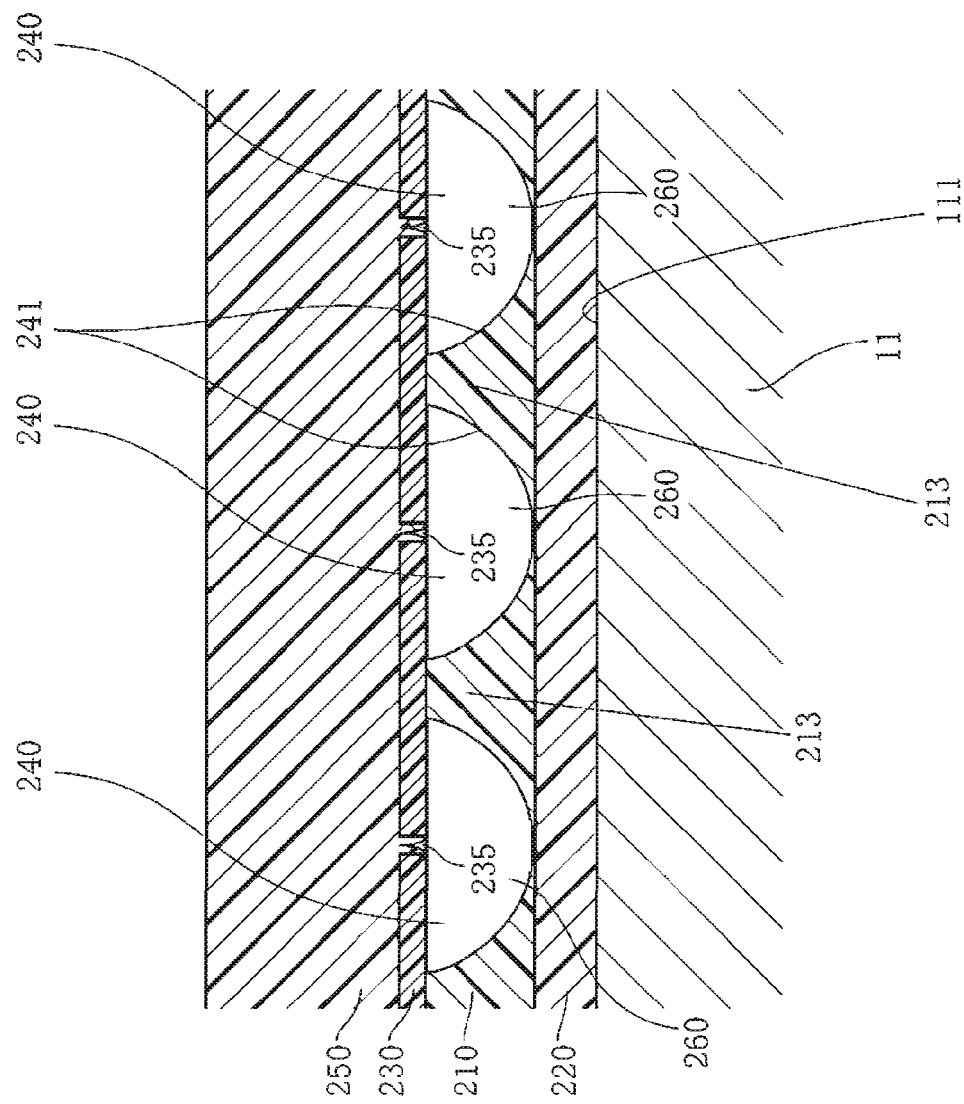
FIG. 96 is an enlarged fragmentary cross-sectional view showing a step subsequent to FIG. 95.
Figure 97:
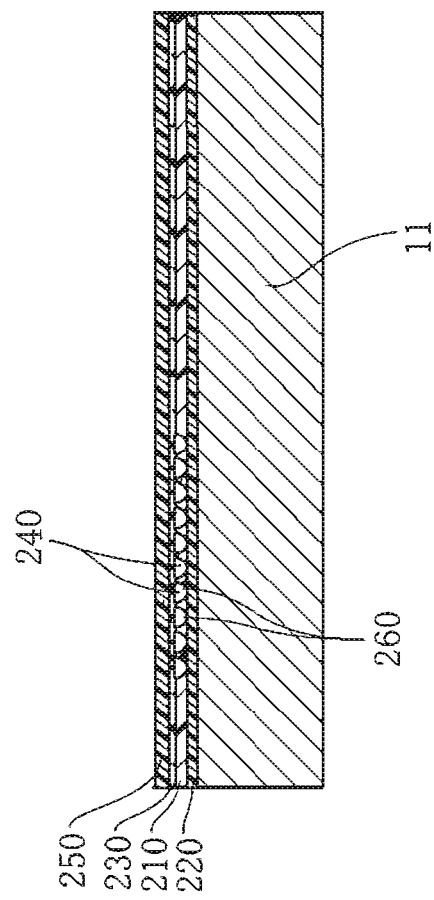
FIG. 97 is a down-scaled cross-sectional view of FIG. 96.

FIG. 96 is an enlarged fragmentary cross-sectional view showing a step subsequent to FIG. 95. FIG. 97 is a downscaled cross-sectional view of FIG. 96.

As shown in FIG. 96 and FIG. 97, the heat storage layer 250 is formed on the blocking layer 230. To form the heat storage layer 250, for example plasma oxidation (plasma CVD) is performed. During the formation of the heat storage layer 250, the through holes 235 are filled with the heat storage layer 250. In this embodiment, therefore, a part of the heat storage layer 250 is formed in the through holes 235.

Thereafter, the resistor layer 4, the insulating layer 5, the electrode layer 3, and the cover layer 6 are formed through the process described with reference to FIG. 64 to FIG. 76, so that the thermal print head 506 is obtained.

The advantageous effects of the foregoing embodiment will be described hereunder.

In this embodiment, one of the one or more (a plurality in this embodiment) heat insulating portions 260 is formed so as to overlap one of the plurality of heating portions 41 as viewed in the thickness direction 2, and located inside the substrate (base member 11 or heat storage region 2). Accordingly, the heat insulating portion 260 suppresses the heat generated by the heating portion 41 from being transmitted to the base member 11. Such a configuration prevents the heat generated by the heating portions 41 from escaping to the base member 11 despite the material constituting the base member 11 having a high thermal conductivity, thereby allowing a larger amount of heat to be transmitted to the printing medium 801 out of the heat generated by the heating portion 41. Therefore, higher printing quality can be obtained on the printing medium 801. In addition, since a larger amount of heat can be transmitted to the printing medium 801 out of the heat generated by the heating portion 41, the power consumption of the thermal print head 506 can be reduced.

In this embodiment, the intermediate structure 200 includes the heat storage layer 250. One or more heat insulating portions 260 are each interposed between the heat storage layer 250 and the base member 11. With such a configuration, the heat insulating portions 260 do not disturb the transmission of heat generated by the heating portion 41 to the heat storage layer 250. Accordingly, the heat storage layer 250 can accumulate a larger amount of heat, which contributes to improving the printing quality of the thermal print head 506. In this embodiment, thus, the region for accumulating heat and the region isolated from the heat can be separated.

In this embodiment, the first layer 210 includes the wall 213 isolating the plurality of heat insulating portions 260 from each other. The wall 213 is erected in the thickness direction Z. Accordingly, the wall 213 supports the blocking layer 230 in contact therewith. Therefore, the blocking layer 230 can be prevented from being warped or separated from the first layer 210 in the manufacturing process of the thermal print head 506.

In this embodiment, the plurality of recesses 240 have a polygonal cross-sectional shape along a plane orthogonal to the thickness direction Z. Such a configuration facilitates the opening ratio (area of the recesses per unit area in a view in the thickness direction Z) to be increased. Accordingly, the heat generated by the heating portion 41 can be more securely prevented from escaping to the base member 11, and therefore the amount of heat that can be transmitted to the printing medium 801 can be further increased, out of the heat generated by the heating portion 41. Consequently, higher printing quality can be obtained on the printing medium 801. In addition, since a larger amount of heat can be transmitted to the printing medium 801 out of the heat generated by the heating portion 41, the power consumption of the thermal print head 506 can be further reduced.

In this embodiment, the plurality of recesses 240 have a regular hexagonal cross-sectional shape along a plane orthogonal to the thickness direction Z. In other words, the thermal print head 506 possesses a honeycomb structure. Such a configuration further facilitates the opening ratio to be increased. Therefore, the mentioned advantages originating from increasing the opening ratio can be more efficiently obtained.

In the case of directly forming the first layer 210 on the base member 11 by plasma oxidation, the first layer 210 may be separated from the base member 11. In this embodiment, however, the intermediate structure 200 includes the second layer 220. The one or more heat insulating portions 260 are located between the second layer 220 and the heat storage layer 250. The second layer 220 and the first layer 210 are relatively firmly joined to each other, and therefore the first layer 210 can be prevented from being separated from the base member 11.

In this embodiment, the intermediate structure 200 includes the blocking layer 230 interposed between the first layer 210 and the heat storage layer 250. The blocking layer 230 includes the plurality of through holes 235 penetrating through the blocking layer 230. Such a configuration prevents the recesses 240 from being filled with a part of the heat storage layer 250, which is advantageous for forming the heat insulating portion 260 constituted of the void.

In this embodiment, the plurality of recesses 240 include the plurality of second recesses 240B. The plurality of second recesses 240B are each spaced from one of the plurality of heating portions 41 in the sub scanning direction X, as viewed in the thickness direction Z. The plurality of second recesses 240B each include one of the plurality of heat insulating portions 260. Such a configuration prevents heat transmission to the first side Xa beyond the second recess 240B. Accordingly, the heat transmission to a region on the printing medium 801 other than the target region can be prevented, and therefore appearance of printing blur on the printing medium 801 can be suppressed. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the plurality of recesses 240 include the plurality of third recesses 240C. The plurality of third recesses 240C are each located on the opposite side of the plurality of second recesses 240B with respect to one of the plurality of heating portions 41 in the sub scanning direction X, as viewed in the thickness direction Z. The plurality of third recesses 240C each include one of the plurality of heat insulating portions 260. Such a configuration prevents heat transmission to the second side Xb beyond the third recess 240C. Accordingly, the heat transmission to a region on the printing medium 801 other than the target region can be prevented, and therefore appearance of printing blur on the printing medium 801 can be suppressed. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the plurality of recesses 240 include the plurality of intermediate recesses 240D. The plurality of intermediate recesses 240D are each located between two heating portion 41 adjacent to each other out of the plurality of heating portion 41, as viewed in the thickness direction Z. The plurality of intermediate recesses 240D each include one of the plurality of heat insulating portions 260. Accordingly, the heat generated in one of the heating portion 41 can be prevented from being transmitted through the intermediate structure 200 to the region in the intermediate structure 200 corresponding to the adjacent heating portion 41. Such a configuration prevents transmission of heat to a region on the printing medium 801 other than a target region, thereby suppressing appearance of printing blur on the printing medium 801. The prevention of the heat transmission to a region on the printing medium 801 other than the target region contributes to improving the heat generation efficiency of the heating portion 41. Therefore, darker dots can be printed on the printing medium 801, and thus higher printing quality can be obtained on the printing medium 801.

In this embodiment, the thermal print head 506 includes the insulating layer 5. The insulating layer 5 includes a portion interposed between the electrode layer 3 and the heating portion 41. Such a configuration reduces the contact area between the electrode layer 3 and the heating portion 41. Accordingly, a eutectic composition of the electrode layer 3 and the heating portion 41 is generated only in a small area when the heating portion 41 receives a current and generates heat. Reducing thus the area where eutectic reaction takes place between the electrode layer 3 and the heating portion 41 suppresses fluctuation of the resistance of the thermal print head 506 during the use.

In this embodiment, the insulating layer 5 includes the first interposed portion 51 and the second interposed portion 52. The first interposed portion 51 is interposed between the first conductive portion 31 and the heating portion 41. Such a configuration suppresses eutectic reaction between the first conductive portion 31 and the heating portion 41. In this embodiment, in addition, the second interposed portion 52 is interposed between the second conductive portion 32 and the heating portion 41. Such a configuration suppresses eutectic reaction between the second conductive portion 32 and the heating portion 41. Suppressing the eutectic reaction between the first conductive portion 31 and the heating portion 41, or between the second conductive portion 32 and the heating portion 41, leads to reduction of the area where the eutectic reaction takes place between the electrode layer 3 and the heating portion 41. Consequently, fluctuation of the resistance of the thermal print head 506 during the use can be suppressed.

In the case where the electrode layer 3 is interposed between the resistor layer 4 and the intermediate structure 200, the heat generated by the heating portion 41 of the resistor layer 4 may escape to the electrode layer 3. The heat that has escaped to the electrode layer 3 is not involved in the heat transmission to the printing medium 801. In this embodiment, on the other hand, the resistor layer 4 is interposed between the electrode layer 3 and the intermediate structure 200. With such a configuration, even though the heat generated by the heating portion 41 of the resistor layer 4 is transmitted to the electrode layer 3, the heat transmitted to the electrode layer 3 can participate in the heat transmission to the printing medium 801. Therefore, the heat generated by the heating portion 41 can be more efficiently transmitted to the printing medium 801, so that the portion of the thermal print head 506 to be brought into contact with the printing medium 801, i.e., the cover layer 6, can be more quickly heated up. Consequently, high-speed printing can be performed on the printing medium 801.

In this embodiment, the base member 11 is made of Si. Since Si has a high thermal conductivity, the heat generated by the heating portion 41 can be rapidly transmitted to outside of the base member 11 (in this embodiment, heat dissipation plate 13). Therefore, the raised temperature of the heating portion 41 can be quickly lowered, which contributes to increasing the printing speed on the printing medium 801.

In this embodiment, the through window 61 in the cover layer 6 is formed by etching on the cover layer 6'. Through the etching process the through window 61 can be formed at a desired position in the cover layer 6, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head 506.

<First Variation of Embodiment B2>

Figure 98:
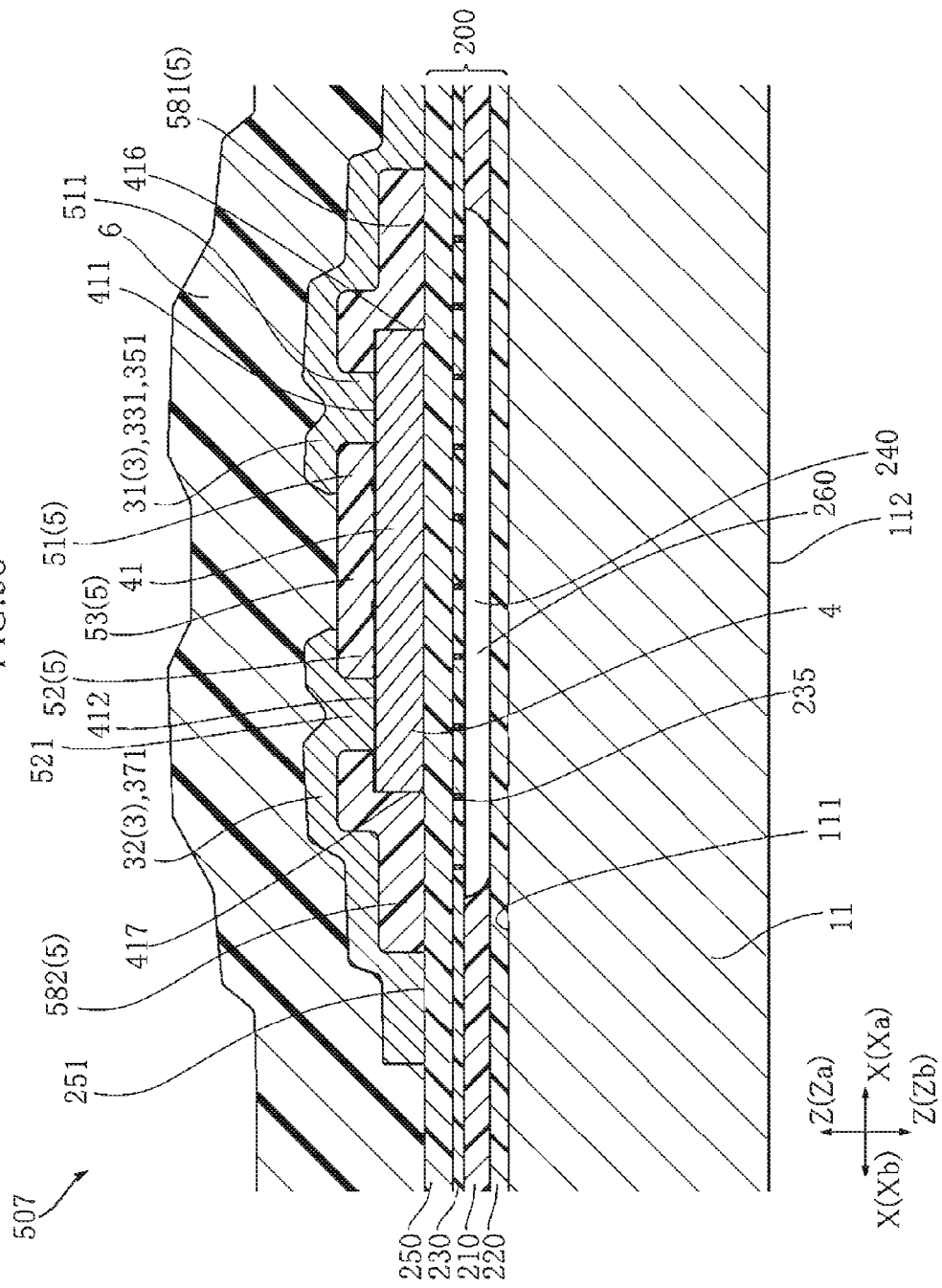
FIG. 98 is an enlarged fragmentary cross-sectional view of a thermal print head according to a first variation of the embodiment B2 of the present invention.

FIG. 98 is an enlarged fragmentary cross-sectional view of a thermal print head according to a first variation of the embodiment B2 of the present invention.

The thermal print head 507 shown in FIG. 98 includes the base member 11, the circuit board 12, the heat dissipation plate 13, the intermediate structure 200, the heat insulating portion 260, the electrode layer 3, the resistor layer 4, the insulating layer 5, the cover layer 6, the driver IC 7, the plurality of wires 81, the encapsulating resin 82, and the connector 83 (some unshown in FIG. 98; see also FIG. 83 to FIG. 86). The base member 11 and the intermediate structure 200 constitute the substrate.

Since the base member 11, the circuit board 12, the heat dissipation plate 13, the electrode layer 3, the resistor layer 4, the insulating layer 5, the cover layer 6, the driver IC 7, the plurality of wires 81, the encapsulating resin 82, and the connector 83 of this embodiment are configured in the same way as in the thermal print head 506, and hence the description of these constituents will not be repeated.

The thermal print head 507 includes at least one heat insulating portion 260. The at least one heat insulating portion 260 is formed in the substrate (in the base member 11 or in the intermediate structure 200). In this embodiment, the at least one heat insulating portion 260 is formed in the intermediate structure 200. Unlike this embodiment, the at least one heat insulating portion 260 may be formed in the base member 11. In this embodiment, the number of heat insulating portions 260 is one.

The heat insulating portion 260 is lower in thermal conductivity than the intermediate structure 200. In this embodiment, the heat insulating portion 26 is a void, filled with a gas or in a vacuum state. The gas is, for example, air. Further details of the heat insulating portion 260 will be subsequently described.

The intermediate structure 200 is provided on the base member 11. The intermediate structure 200 is interposed between the base member 11 and the resistor layer 4. The intermediate structure 200 covers the entirety of the front surface 111 of the base member 11.

The intermediate structure 200 includes the first layer 210, the second layer 220, the blocking layer 230, and the heat storage layer 250.

The first layer 210 is the same as the first layer 210 in the thermal print head 506 except that the former only includes one recess 240 and does not include the wall 213, and therefore the description will not be repeated. To form a single recess 240, the duration of the wet etching for forming the recess 240 may be prolonged.

The second layer 220, the blocking layer 230, and the heat storage layer 250 are the sane as those of the thermal print head 506, and therefore the description will not be repeated.

Hereunder, the advantageous effects of this variation will be described.

In this variation, the heat insulating portion 260 is located so as to overlap one of the plurality of heating portions 41 as viewed in the thickness direction Z, and formed in the substrate (base member 11 or intermediate structure 200). Accordingly, the heat insulating portion 260 suppresses the heat generated by the heating portion 41 from being transmitted to the base member 11. Such a configuration prevents the heat generated by the heating portions 41 from escaping to the base member 11 despite the material constituting the base member 11 having a high thermal conductivity, thereby allowing a larger amount of heat to be transmitted to the printing medium 801 out of the heat generated by the heating portion 41. Therefore, higher printing quality can be obtained on the printing medium 801. In addition, since a larger amount of heat can be transmitted to the printing medium 801 out of the heat generated by the heating portion 41, the power consumption of the thermal print head 506 can be reduced.

In this variation, the intermediate structure 200 includes the heat storage layer 250. The heat insulating portions 260 is interposed between the heat storage layer 250 and the base member 11. With such a configuration, the heat insulating portion 260 does not disturb the transmission of heat generated by the heating portion 41 to the heat storage layer 250. Accordingly, the heat storage layer 250 can accumulate a larger amount of heat, which contributes to improving the printing quality of the thermal print head 506.

In the case of directly forming the first layer 210 on the base member 11 by plasma oxidation, the first layer 210 may be separated from the base member 11. In this variation, however, the intermediate structure 200 includes the second layer 220. The heat insulating portion 260 is located between the second layer 220 and the heat storage layer 250. The second layer 220 and the first layer 210 are relatively firmly joined to each other, and therefore the first layer 210 can be prevented from being separated from the base member 11.

In this variation, the intermediate structure 200 includes the blocking layer 230 interposed between the first layer 210 and the heat storage layer 250. The blocking layer 230 includes the plurality of through holes 235 penetrating through the blocking layer 230. Such a configuration prevents the recesses 240 from being filled with a part of the heat storage layer 250, which is advantageous for forming the heat insulating portion 260 constituted of the void.

In this variation, the thermal print head 507 includes the insulating layer 5. The insulating layer 5 includes a portion interposed between the electrode layer 3 and the heating portion 41. Such a configuration reduces the contact area between the electrode layer 3 and the heating portion 41. Accordingly, a eutectic composition of the electrode layer 3 and the heating portion 41 is generated only in a small area when the heating portion 41 receives a current and generates heat. Reducing thus the area where eutectic reaction takes place between the electrode layer 3 and the heating portion 41 suppresses fluctuation of the resistance of the thermal print head 507 during the use.

In this variation, the insulating layer 5 includes the first interposed portion 51 and the second interposed portion 52. The first interposed portion 51 is interposed between the first conductive portion 31 and the heating portion 41. Such a configuration suppresses eutectic reaction between the first conductive portion 31 and the heating portion 41. In this embodiment, in addition, the second interposed portion 52 is interposed between the second conductive portion 32 and the heating portion 41. Such a configuration suppresses eutectic reaction between the second conductive portion 32 and the heating portion 41. Suppressing the eutectic reaction between the first conductive portion 31 and the heating portion 41, or between the second conductive portion 32 and the heating portion 41, leads to reduction of the area where the eutectic reaction takes place between the electrode layer 3 and the heating portion 41. Consequently, fluctuation of the resistance of the thermal print head 507 during the use can be suppressed.

In the case where the electrode layer 3 is interposed between the resistor layer 4 and the intermediate structure 200, the heat generated by the heating portion 41 of the resistor layer 4 may escape to the electrode layer 3. The heat that has escaped to the electrode layer 3 is not involved in the heat transmission to the printing medium 801. In this variation, on the other hand, the resistor layer 4 is interposed between the electrode layer 3 and the intermediate structure 200. With such a configuration, even though the heat generated by the heating portion 41 of the resistor layer 4 is transmitted to the electrode layer 3, the heat transmitted to the electrode layer 3 can participate in the heat transmission to the printing medium 801. Therefore, the heat generated by the heating portion 41 can be more efficiently transmitted to the printing medium 801, so that the portion of the thermal print head 507 to be brought into contact with the printing medium 801, i.e., the cover layer 6, can be more quickly heated up. Consequently, high-speed printing can be performed on the printing medium 801.

In this variation, the base member 11 is made of Si. Since Si has a high thermal conductivity, the heat generated by the heating portion 41 can be rapidly transmitted to outside of the base member 11 (in this variation, heat dissipation plate 13). Therefore, the raised temperature of the heating portion 41 can be quickly lowered, which contributes to increasing the printing speed on the printing medium 801.

In this variation, the through window 61 in the cover layer 6 is formed by etching on the cover layer 6'. Through the etching process the through window 61 can be formed at a desired position in the cover layer 6, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head 507.

The present invention is in no way limited to the foregoing embodiments. The specific configuration of the constituents in the present invention may be modified in various manners.

Variations of the present invention illustrated in FIG. 51 to FIG. 98 and described thus far with reference to these drawings will be cited as appendices hereunder.

[Appendix 1] A thermal print head including a substrate, a resistor layer formed on the substrate, an electrode layer formed on the substrate and electrically connected to the resistor layer, and one or more heat insulating portions, in which the resistor layer includes a plurality of heating portions spanned between two portions of the electrode layer spaced from each other as viewed in a thickness direction of the substrate, and one of the one or more heat insulating portions is located so as to overlap one of the plurality of heating portions as viewed in the thickness direction of the substrate, and formed inside the substrate. [Appendix 2] The thermal print head according to appendix 1, in which a plurality of the heat insulating portions are provided, the substrate includes a plurality of recesses each including a plurality of first recesses each located so as to overlap one of the plurality of heating portions as viewed in the thickness direction of the substrate, and the plurality of first recesses each include one of the plurality of heat insulating portions. [Appendix 3] The thermal print head according to appendix 2, in which each of the plurality of heat insulating portions is a void. [Appendix 4] The thermal print head according to appendix 3, in which the void is filled with a gas or in a vacuum state.

[Appendix 5] The thermal print head according to any one of appendices 2 to 4, in which the plurality of heat insulating portions are dispersed as viewed in the thickness direction of the substrate. [Appendix 6] The thermal print head according to appendix 5, in which a ratio of an area of the recesses overlapping one of the heating portions as viewed in the thickness direction of the substrate, out of the plurality of recesses, to an area of the heating portion that the mentioned recesses overlap is 50 to 95%. [Appendix 7] The thermal print head according to any one of appendices 2 to 6, in which the plurality of recesses are open toward the electrode layer in the thickness direction of the substrate. [Appendix 8] The thermal print head according to any one of appendices 2 to 7, in which the plurality of recesses include a plurality of second recesses, the plurality of second recesses are each spaced from one of the plurality of heating portions in the sub scanning direction as viewed in the thickness direction of the substrate, and the plurality of second recesses each include one of the plurality of heat insulating portions. [Appendix 9] The thermal print head according to appendix 8, in which a depth of each of the plurality of second recesses is deeper than a depth of one of the plurality of first recesses. [Appendix 10] The thermal print head according to appendix 8 or 9, in which the plurality of recesses include a plurality of third recesses, the plurality of third recesses are each located on the opposite side of the plurality of second recesses in the sub scanning direction with respect to one of plurality of heating portions, and the plurality of third recesses each include one of the plurality of heat insulating portions. [Appendix 11] The thermal print head according to appendix 10, in which a depth of each of the plurality of third recesses is deeper than a depth of one of the plurality of first recesses. [Appendix 12] The thermal print head according to any one of appendices 2 to 11, in which the plurality of recesses include a plurality of intermediate recesses, the plurality of intermediate recesses are each located between two heating portions adjacent to each other out of the plurality of heating portions as viewed in the thickness direction of the substrate, and the plurality of intermediate recesses each include one of the plurality of heat insulating portions. [Appendix 13] The thermal print head according to appendix 12, in which a depth of each of the plurality of intermediate recesses is deeper than a depth of one of the plurality of first recesses. [Appendix 14] The thermal print head according to any one of appendices 2 to 13, in which the substrate includes a base member and a heat storage region formed on the base member. [Appendix 15] The thermal print head according to appendix 14, in which the heat storage region includes a surface oriented to a side on which the resistor layer is located. [Appendix 16] The thermal print head according to appendix 15, in which each of the plurality of recesses is recessed from the surface of the heat storage region. [Appendix 17] The thermal print head according to appendix 3 or 4, further including an intermediate layer at least a part of which is included in the plurality of recesses, and the intermediate layer includes an inner surface that defines the void. [Appendix 18] The thermal print head according to appendix 17, in which the substrate includes a base member and a heat storage region formed on the base member, the heat storage region includes a surface oriented toward the resistor layer, and the intermediate layer includes a portion covering the surface and located between one of the plurality of heating portions and the heat storage region. [Appendix 19] The thermal print head according to appendix 17 or 18, in which the intermediate layer is in direct contact with the resistor layer. [Appendix 20] The thermal print head according to appendix 3 or 4, in which the plurality of recesses each define a part of the void. [Appendix 21] The thermal print head according to appendix 20, in which the resistor layer defines a part of the void. [Appendix 22] The thermal print head according to appendix 3 or 4, in which the substrate includes a base member and a heat storage region formed on the base member, and the plurality of recesses are formed in the base member. [Appendix 23] The thermal print head according to appendix 22, in which the heat storage regions each define a part of the void. [Appendix 24] The thermal print head according to appendix 15 or 16, in which the resistor layer is interposed between the electrode layer and the heat storage region. [Appendix 25] The thermal print head according to any one of appendices 2 to 24, in which the substrate is made of a semiconductor material. [Appendix 26] The thermal print head according to any one of appendices 2 to 25, further including a cover layer covering the resistor layer and the electrode layer. [Appendix 27] The thermal print head according to appendix 26, further including a circuit board, a plurality of wires, and a resin layer covering the circuit board, the plurality of wires, and the cover layer. [Appendix 28] The thermal print head according to appendix 27, in which the cover layer includes a through window, the electrode layer includes a bonding portion exposed in the through window, and one of the plurality of wires is bonded to the bonding portion. [Appendix 29] The thermal print head according to appendix 27 or 28, in which the resin layer is in direct contact with the cover layer. [Appendix 30] The thermal print head according to any one of appendices 2 to 29, further including a driver IC that supplies a current to the electrode layer, the driver IC being mounted inside the base member. [Appendix 31] The thermal print head according to any one of appendices 2 to 29, further including a driver IC that supplies a current to the electrode layer, the driver IC being mounted on the circuit board. [Appendix 32] The thermal print head according to any one of appendices 2 to 31, in which the resistor layer is made of at least one of polysilicon, $TaSiO_2$, and TiON. [Appendix 33] The thermal print head according to any one of appendices 2 to 32, in which the electrode layer is made of at least one of Au, Ag, Cu, Cr, Al—Si, and Ti. [Appendix 34] The thermal print head according to any one of appendices 2 to 33, further including a heat dissipation plate that supports the base member. [Appendix 35] A thermal printer including the thermal print head according to any one of appendices 2 to 34, and a platen roller opposed to the thermal print head. [Appendix 36] The thermal print head according to appendix 1, in which each of the one or more heat insulating portions is a void. [Appendix 37] The thermal print head according to appendix 36, in which the void is filled with a gas or in a vacuum state. [Appendix 38] The thermal print head according to appendix 36 or 37, in which the substrate includes a base member and an intermediate structure, the intermediate structure is interposed between the base member and the resistor layer, and the one or more heat insulating portions are formed in the intermediate structure. [Appendix 39] The thermal print head according to appendix 38, in which the intermediate structure includes a heat storage layer, and the one or more heat insulating portions are each interposed between the heat storage layer and the base member. [Appendix 40] The thermal print head according to appendix 39, in which the intermediate structure includes a first layer interposed between the heat storage layer and the base member, and the one or more heat insulating portions are formed in the first layer. [Appendix 41] The thermal print head according to appendix 40, in which the first layer includes one or more recesses, and the one or more recesses respectively include the one or more heat insulating portions. [Appendix 42] The thermal print head according to appendix 41, in which the first layer includes a first surface oriented toward the resistor layer, and the one or more recesses are recessed from the first surface. [Appendix 43] The thermal print head according to any one of appendices 40 to 42, in which the a plurality of the heat insulating portions are provided, the first layer includes a wall that isolates the plurality of heat insulating portions from each other, and the wall is erected in the thickness direction of the substrate. [Appendix 44] The thermal print head according to appendix 43, in which the wall has a width increasing in a direction away from the electrode layer, in the thickness direction of the substrate. [Appendix 45] The thermal print head according to appendix 43 or 44, in which the width of a narrowest portion of the wall is 2 to 5 μm. [Appendix 46] The thermal print head according to appendix 41, in which a plurality of the recesses are provided. [Appendix 47] The thermal print head according to appendix 46, in which the plurality of recesses each have a polygonal cross-sectional shape along a plane orthogonal to the thickness direction of the substrate. [Appendix 48] The thermal print head according to appendix 47, in which the plurality of recesses have a regular hexagonal cross-sectional shape along a plane orthogonal to the thickness direction of the substrate. [Appendix 49] The thermal print head according to appendix 47 or 48, in which a largest size of the opening of one of the plurality of recesses is 20 to 30 μm. [Appendix 50] The thermal print head according to appendix 40, in which the intermediate structure includes a second layer, and the one or more heat insulating portions are located between the second layer and the heat storage layer. [Appendix 51] The thermal print head according to appendix 41, in which the intermediate structure includes a blocking layer interposed between the first layer and the heat storage layer, and the blocking layer includes a plurality of through holes penetrating through the blocking layer. [Appendix 52] The thermal print head according to appendix 51, in which the plurality of through holes respectively communicate with the plurality of recesses. [Appendix 53] The thermal print head according to appendix 52, in which the plurality of through holes are covered with the heat storage layer. [Appendix 54] The thermal print head according to any one of appendices 51 to 53, in which the shape of the plurality of through holes is similar to the cross-sectional shape of the plurality of recesses along a plane orthogonal to the thickness direction of the substrate. [Appendix 55] The thermal print head according to any one of appendices 51 to 54, in which a largest size of one of the plurality of through holes is 0.1 to 1.0 μm. [Appendix 56] The thermal print head according to any one of appendices 36 to 55, in which the substrate is made of a semiconductor material. [Appendix 57] The thermal print head according to any one of appendices 36 to 56, further including a cover layer covering the resistor layer and the electrode layer. [Appendix 58] The thermal print head according to appendix 57, further including a circuit board, a plurality of wires, and a resin layer covering the circuit board, the plurality of wires, and the cover layer. [Appendix 59] The thermal print head according to appendix 58, in which the cover layer includes a through window, the electrode layer includes a bonding portion exposed in the through window, and one of the plurality of wires is bonded to the bonding portion. [Appendix 60] The thermal print head according to appendix 58 or 59, in which the resin layer is in direct contact with the cover layer. [Appendix 61] The thermal print head according to any one of appendices 36 to 60, further including a driver IC that supplies a current to the electrode layer. [Appendix 62] The thermal print head according to any one of appendices 36 to 61, in which the resistor layer is made of at least one of polysilicon, $TaSiO_2$, and TiON. [Appendix 63] The thermal print head according to any one of appendices 36 to 62, in which the electrode layer is made of at least one of Au, Ag, Cu, Cr, Al—Si, and Ti. [Appendix 64] The thermal print head according to any one of appendices 36 to 63, further including a heat dissipation plate that supports the base member. [Appendix 65] A thermal printer including the thermal print head according to any one of appendices 36 to 64, and a platen roller opposed to the thermal print head.

Embodiment C1

Referring to FIG. 99 to FIG. 119, an embodiment C1 of the present invention will be described hereunder.

Figure 99:
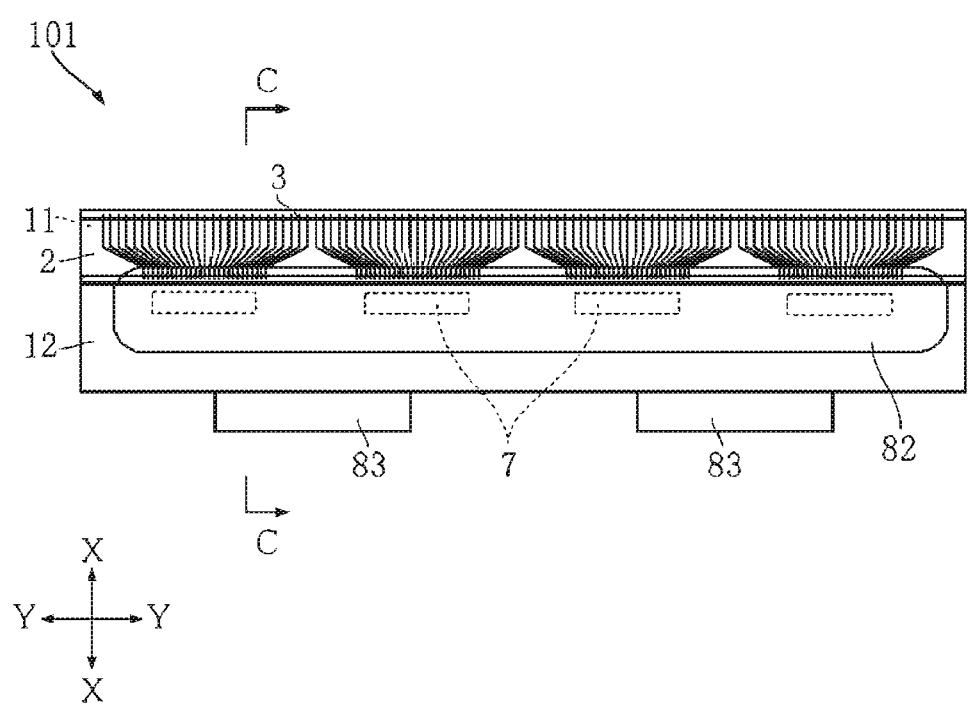
FIG. 99 is a plan view of a thermal print head according to an embodiment C1 of the present invention.
Figure 100:
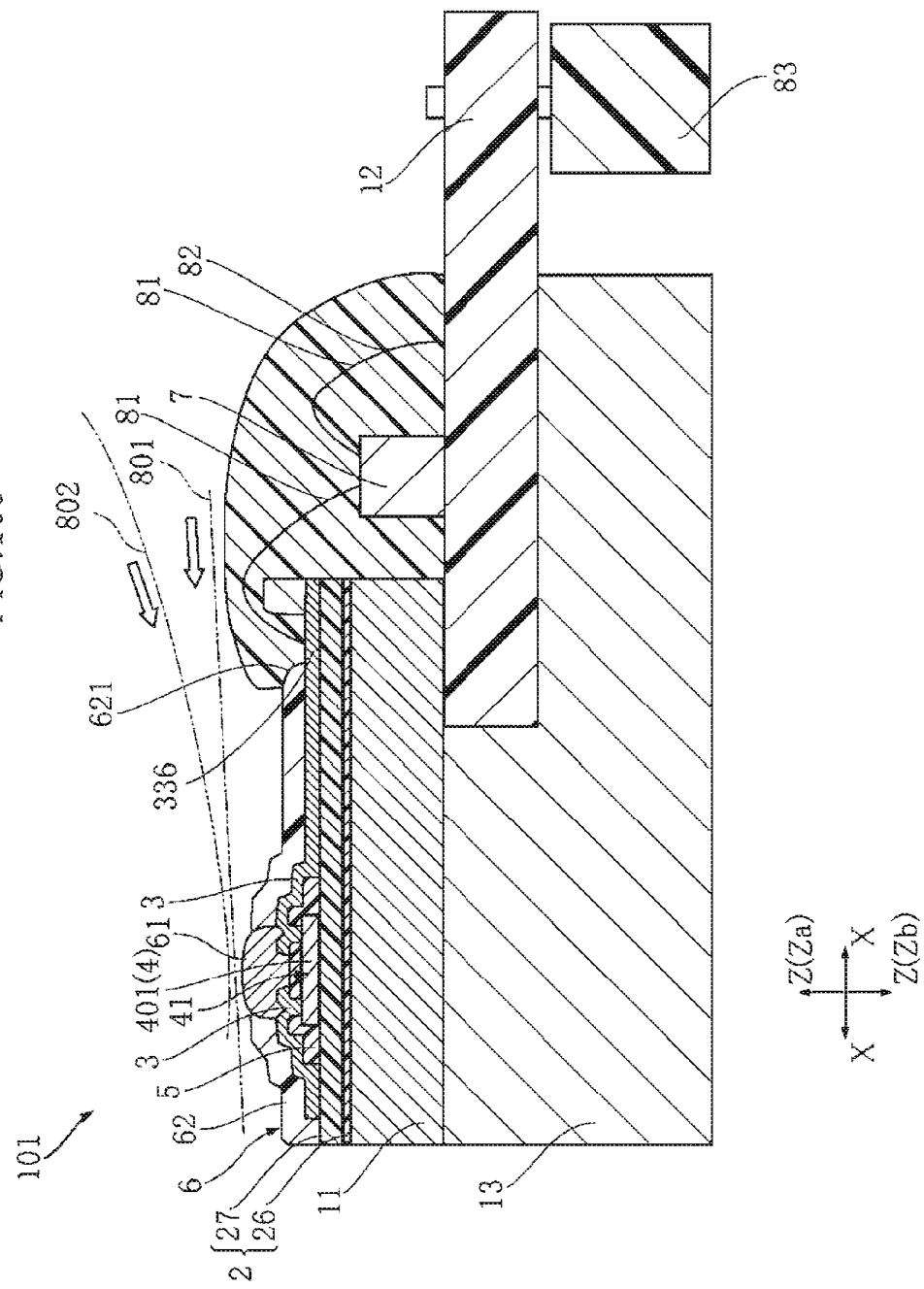
FIG. 100 is a cross-sectional view taken along a line C-C in FIG. 99.

FIG. 99 is a plan view of a thermal print head according to the embodiment C1 of the present invention. FIG. 100 is a cross-sectional view taken along a line C-C in FIG. 99.

The thermal print head 101 shown in the cited drawings includes the base member 11, the circuit board 12, the heat dissipation plate 13, the heat storage layer 2, the electrode layer 3, the resistor layer 4, the insulating layer 5, the cover layer 6 (unshown in FIG. 99), the driver IC 7, the plurality of wires 81, the encapsulating resin 82, and the connector 83. The thermal print head 101 is configured to be incorporated in the printer that performs printing on the printing medium 801. The printing medium 801 may be, for example, a thermal paper for making out a barcode sheet or a receipt.

The heat dissipation plate 13 shown in FIG. 100 serves to emit heat transmitted from the base member 11. The heat dissipation plate 13 is formed of a metal such as Al. On the heat dissipation plate 13, the base member 11 and the circuit board 12 are mounted.

The base member 11 has a plate shape. In this embodiment, the base member 11 is made of a semiconductor material. Examples of the semiconductor material to form the base member 11 include Si, SiC, GaP, GaAs, InP, and GaN. Although in this embodiment the base member 11 is made of a semiconductor material, it is not mandatory to employ a semiconductor material to form the base member 11. For example, the base member 11 may be made of an insulative material such as a ceramic. In this embodiment, the material constituting the base member 11 has a thermal conductivity of 100 to 300 W/(m·K). In this embodiment, a ratio of the thermal conductivity of the material constituting the heat storage region 2 (described later) to the thermal conductivity of the material constituting the base member 11 is 1:10 to 600. The base member 11 has a thickness of, for example, 0.625 to 0.720 mm. As shown in FIG. 52, the base member 11 has a flat plate shape extending in a main scanning direction Y. The base member 11 has a width (size in the sub scanning direction X of the base member 11) of, for example, 3 to 20 mm. The size of the base member 11 in the main scanning direction Y is, for example, 10 to 300 mm.

Figure 101:
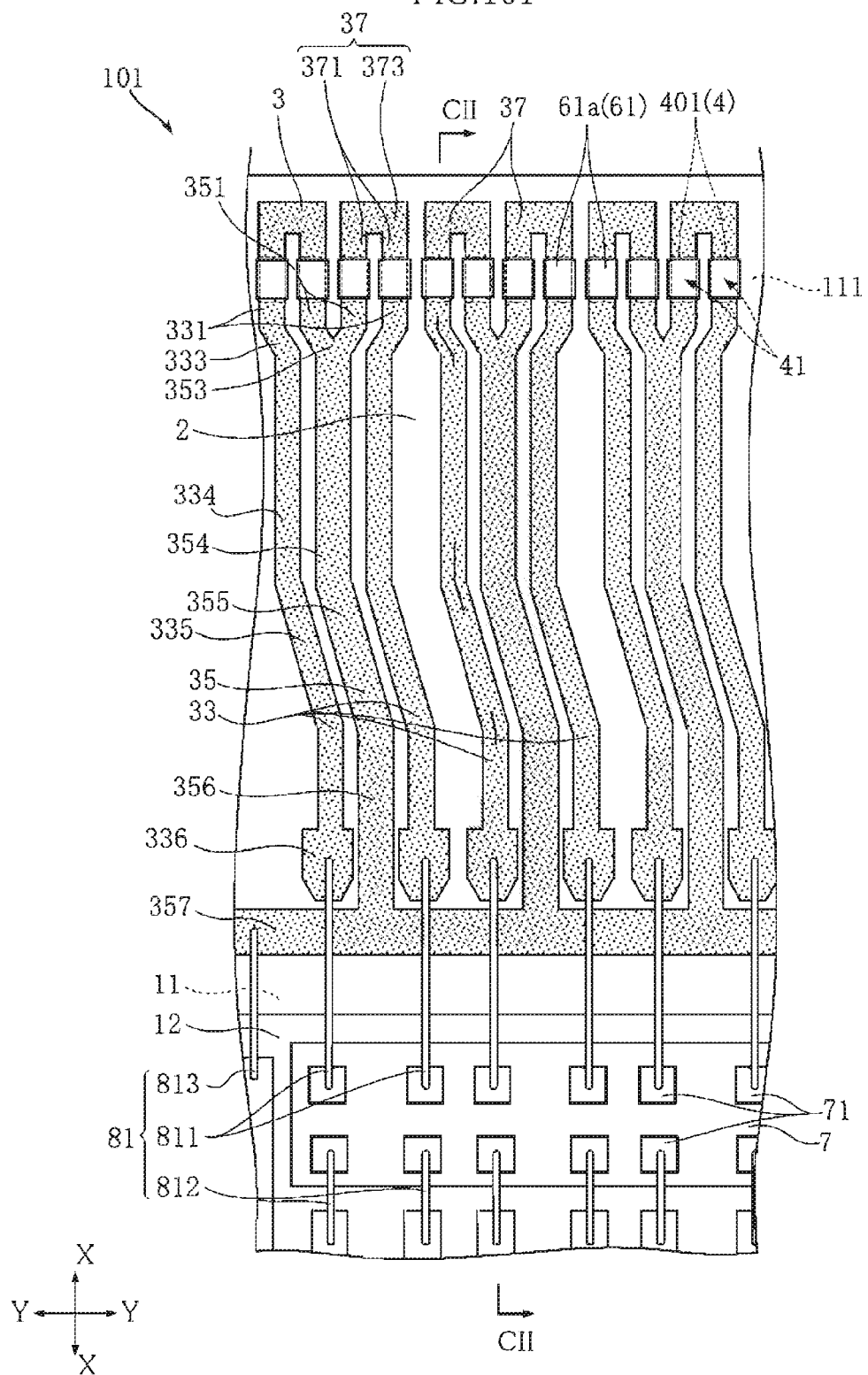
FIG. 101 is an enlarged fragmentary plan view of the thermal print head shown in FIG. 99, with a part of the structure omitted.
Figure 102:
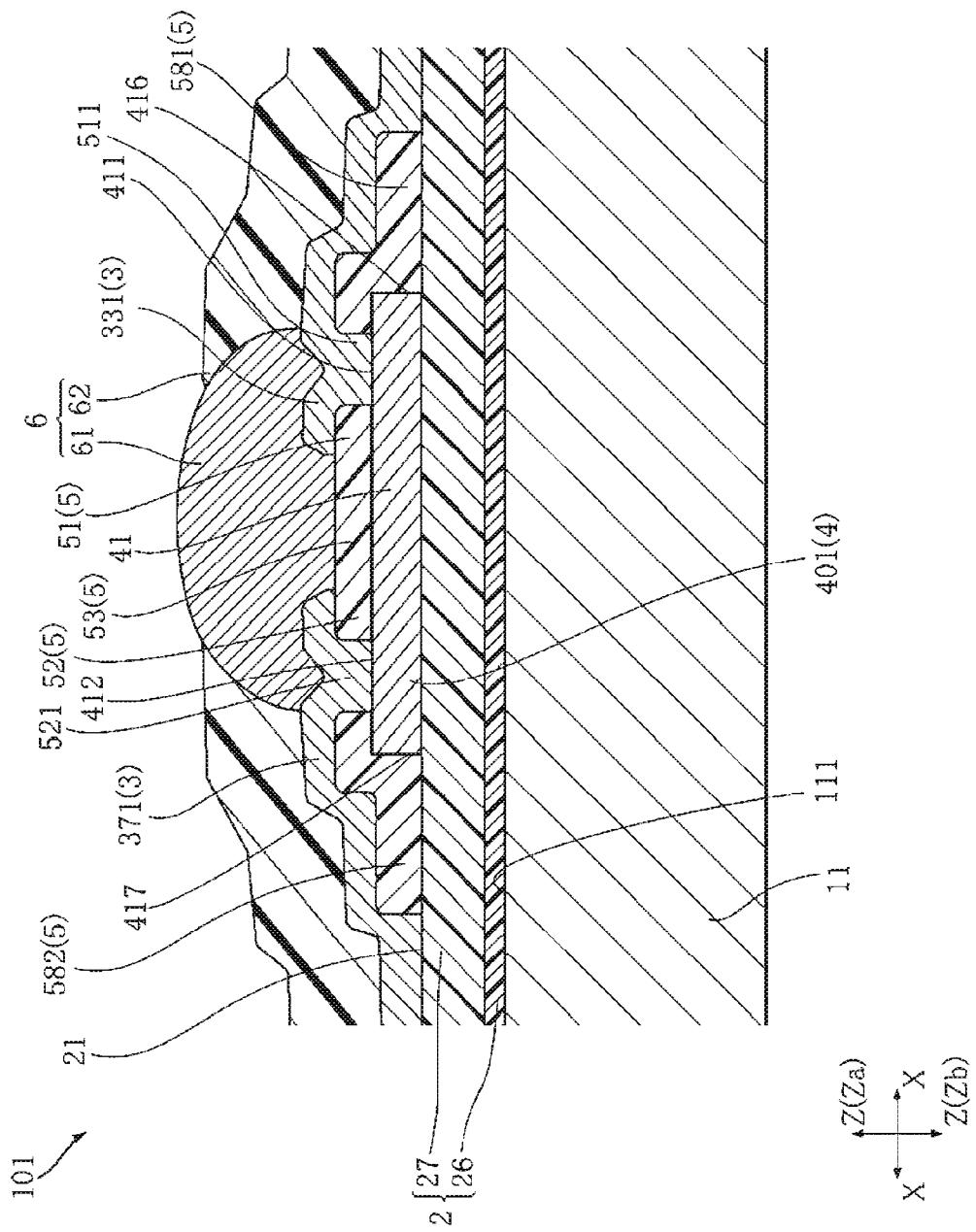
FIG. 102 is an enlarged fragmentary cross-sectional view taken along a line CII-CII in FIG. 101.

FIG. 101 is an enlarged fragmentary plan view of the thermal print head 101 shown in FIG. 99, with a part of the structure omitted. In FIG. 101, the insulating layer 5, a part of the cover layer 6, and the encapsulating resin 82 are unshown. FIG. 102 is a fragmentary cross-sectional view taken along a line CII-CII in FIG. 101, enlarged from the cross-section along the line CII-CII in FIG. 101.

As shown in FIG. 102, the base member 11 includes the base member front surface 111. The base member front surface 111 is a flat plane extending in the direction X and the direction Y. The base member front surface 111 has longitudinal sides extending in the direction Y. The base member front surface 111 is oriented to one side in a thickness direction Z of the base member 11 (hereinafter, Za-side; upward in FIG. 102). In other words, the base member front surface 111 is oriented toward the resistor layer 4.

As shown in FIG. 100 and FIG. 102, the heat storage region 2 is formed in the base member 11. The heat storage region 2 covers substantially the entirety of the base member front surface 111. The heat storage region 2 serves to accumulate the heat generated by the heating portion 41. The heat storage layer 2 has a thermal conductivity of, for example, approximately 0.5 to 5 (W/m·k). The heat storage region 2 has a thickness of, for example, at least 3 μm. As shown in FIG. 102, the heat storage region 2 includes the surface 21. The heat storage region surface 21 is oriented to the Za-side. In other words, the heat storage region surface 21 is oriented toward the resistor layer 4. In this embodiment, the heat storage region surface 21 is flat over its entirety. Forming thus the heat storage region surface 21 in a flat shape facilitates the formation of the resistor layer 4 and the insulating layer 5 through the semiconductor process.

As shown in FIG. 100 and FIG. 102, in this embodiment the heat storage layer 2 includes a first layer 26 and a second layer 27. The first layer 26 is located between the second layer 27 and the base member 11. The first layer 26 is formed by oxidation of the semiconductor material constituting the base member 11. For example, when the semiconductor material constituting the base member 11 is Si, the first layer 26 is made of $SiO_2$. The second layer 27 is made of an insulative material. The material constituting the second layer 27 is not specifically limited, but in this embodiment the second layer 27 is made of the same material constituting the first layer 26. Unlike this embodiment, the heat storage layer 2 may be a single layer instead of the two-layer structure.

The electrode layer 3 shown in FIG. 100 to FIG. 102 is formed on the base member 11. In FIG. 101, the electrode layer 3 is hatched for the sake of clarity. To be more detailed, the electrode layer 3 is stacked on the heat storage layer 2. The electrode layer 3 is also stacked on the resistor layer 4. In this embodiment, the resistor layer 4 is interposed between the electrode layer 3 and the heat storage region 2. The electrode layer 3 is electrically connected to the resistor layer 4. The electrode layer 3 provides a path for supplying power to the resistor layer 4. Examples of the material to form the electrode layer 3 include Au, Ag, Cu, Cr, Al—Si, and Ti. Unlike this embodiment, the electrode layer 3 may be interposed between the heat storage region 2 and the resistor layer 4.

In this embodiment, as shown in FIG. 101, the electrode layer 3 includes the plurality of individual electrodes 33 (FIG. 101 illustrates six), the common electrode 35, and the plurality of intermediate electrodes 37 (FIG. 101 illustrates six). Further details are as described hereunder.

The individual electrodes 33 are not electrically connected to each other. Accordingly, different potentials can be applied to the respective individual electrodes 33, when the printer incorporated with the thermal print head 101 is in use. The individual electrodes 33 each include the individual electrode belt-like portion 331, the bent portion 333, the individual electrode linear portion 334, the individual electrode oblique portion 335, and the bonding portion 336. As shown in FIG. 102, the belt-like portions 331 are stacked on the resistor layer 4. In addition, as shown in FIG. 101, the belt-like portions 331 each extend in a belt-like shape in the direction X. The bent portion 333 continuously extends from the individual electrode belt-like portion 331, and is inclined with respect to both of the direction Y and the direction X. The individual electrode linear portion 334 straightly extends in the direction X. The individual electrode oblique portion 335 extends in a direction inclined with respect to both of the direction Y and the direction X. The bonding portion 336 is a section where the wires 81 are to be bonded. In this embodiment, the individual electrode belt-like portion 331, the bent portion 333, the individual electrode linear portion 334, and the individual electrode oblique portion 335 have a width of approximately 47.5 μm for example, and the bonding portion 336 has a width of, for example, approximately 80 μm.

The common electrode 35 assumes the reverse polarity with respect to the plurality of individual electrodes 33, when the printer incorporated with the thermal print head 101 is in use. The common electrode 35 includes the plurality of common electrode belt-like portions 351, the plurality of branched portions 353, the plurality of common electrode linear portions 354, the plurality of common electrode oblique portions 355, the plurality of extending portions 356, and the stem portion 357. As shown in FIG. 102, the common electrode belt-like portions 351 are stacked on the resistor layer 4. In addition, the common electrode belt-like portions 351 each extend in a belt-like shape in the direction X. The common electrode belt-like portions 351 are spaced from the individual electrode belt-like portion 331 in the direction Y. In this embodiment, a pair of common electrode belt-like portions 351 adjacent to each other is located between two belt-like portions 331. The plurality of common electrode belt-like portions 351 and the plurality of individual electrode belt-like portions 331 are aligned in the direction Y. The branched portion 353 is formed in a Y-shape so as to connect the pair of common electrode belt-like portions 351 to a single common electrode linear portion 354. The common electrode linear portion 354 straightly extends in the direction X. The common electrode oblique portion 355 extends in a direction inclined with respect to both of the direction Y and the direction X. The extending portion 356 continuously extends from the common electrode oblique portion 355 in the direction X. The stem portion 357 has a belt-like shape extending in the direction Y, and the extending portions 356 are connected thereto. In this embodiment, the common electrode belt-like portion 351, the common electrode linear portion 354, the common electrode oblique portion 355, and the extending portion 356 have a width of, for example, approximately 47.5 μm.

The intermediate electrodes 37 each electrically intermediate between one of the plurality of individual electrodes 33 and the common electrode 35. As shown in FIG. 101, the intermediate electrodes 37 each include the pair of intermediate electrode belt-like portions 371 and the joint portion 373. The intermediate electrode belt-like portions 371 each extend in a belt-like shape in the direction X. The intermediate electrode belt-like portions 371 are spaced from each other in the direction Y. The intermediate electrode belt-like portions 371 are stacked on the resistor layer 4. The intermediate electrode belt-like portions 371 are located on the side opposite to the belt-like portions 331 and 351 in the direction X, on the resistor layer 4. One of the pair of intermediate electrode belt-like portions 371 in each of the intermediate electrodes 37 is spaced from one of the plurality of common electrode belt-like portions 351 in the direction X. The other of the pair of intermediate electrode belt-like portions 371 in each of the intermediate electrode 37 is spaced from one of the plurality of belt-like portions 331, in the direction X. The joint portions 373 each extend in the direction Y. The joint portions 373 are each connected to the pair of intermediate electrode belt-like portions 371 in one of the intermediate electrodes 37. Thus, the intermediate electrode belt-like portions 371 constituting a pair are electrically connected to each other, in each of the intermediate electrodes 37.

It is not mandatory that the electrode layer 3 includes the intermediate electrodes 37. Instead, for example, the electrode layer 3 may include a plurality of individual electrodes and a common electrode located adjacent to the individual electrodes.

The resistor layer 4 shown in FIG. 100 to FIG. 102 is formed on the base member 11. In this embodiment, the resistor layer 4 is formed directly on the heat storage region 2. In this embodiment, the resistor layer 4 includes a plurality of rectangular portions 401 aligned in the direction Y. In the resistor layer 4, a portion where a current from the electrode layer 3 is applied generates heat. The heat thus generated forms printing dots. The resistor layer 4 is made of a material having higher resistivity than the material constituting the electrode layer 3. Examples of the material to form the resistor layer 4 include polysilicon, $TaSiO_2$, and TiON. In this embodiment, the resistor layer 4 is doped with an ion (for example, boron) so as to adjust the resistivity. The resistor layer 4 has a thickness of, for example, 0.2 μm to 1 μm.

As shown in FIG. 102, the rectangular portions 401 each include the first end face 416 and the second end face 417 oriented opposite to each other in the direction X. The first end face 416 is oriented to the right in FIG. 102, and the second end face 417 is oriented to the left in FIG. 102.

As shown in FIG. 102, the rectangular portions 401 each include the heating portion 41 that generates heat when the thermal print head 101 is in use. The heating portion 41 is spanned between two portions of the electrode layer 3 spaced from each other, as viewed in the thickness direction of the base member 11. The two portions of the electrode layer 3 spaced from each other correspond to, for example, the individual electrode belt-like portion 331 and the intermediate electrode belt-like portion 371. The individual electrode belt-like portion 331 is located so as to overlap a region on the side of the first end face 416 with respect to the center of the rectangular portion 401, and the intermediate electrode belt-like portion 371 is located so as to overlap a region on the side of the second end face 417 with respect to the center of the rectangular portion 401. The individual electrode belt-like portion 331 and the intermediate electrode belt-like portion 371 are spaced from each other in the direction X, across the center of the rectangular portion 401. Likewise, the common electrode belt-like portion 351 and the intermediate electrode belt-like portion 371 may also be regarded as the two portions of the electrode layer 3 spaced from each other. The common electrode belt-like portion 351 is located so as to overlap the region on the side of the first end face 416 with respect to the center of the rectangular portion 401. The common electrode belt-like portion 351 and the intermediate electrode belt-like portion 371 are spaced from each other in the direction X, across the center of the rectangular portion 401.

As shown in FIG. 102, the heating portion 41 includes the first abutment portion 411 and the second abutment portion 412. The first abutment portion 411 is located in the region on the side of the first end face 416 with respect to the center of the rectangular portion 401, and in contact with the individual electrode belt-like portion 331 or the common electrode belt-like portion 351. The second abutment portion 412 is located in the region on the side of the second end face 417 with respect to the center of the rectangular portion 401, and in contact with the intermediate electrode belt-like portion 371.

As shown in FIG. 102, the insulating layer 5 includes a portion interposed between the heating portion 41 and the electrode layer 3. Examples of the material to form the insulating layer 5 include $SiO_2$ and $SiAlO_2$. The insulating layer 5 includes a first interposed portion 51, a second interposed portion 52, and a middle portion 53. The first interposed portion 51 is interposed between the individual electrode belt-like portion 331 or the common electrode belt-like portion 351 and the heating portion 41. The second interposed portion 52 is interposed between the individual electrode belt-like portion 371 and the heating portion 41. The middle portion 53 is located between the first interposed portion 51 and the second interposed portion 52 as viewed in the thickness direction Z of the base member 11. The middle portion 53 is continuous with the first interposed portion 51 and the second interposed portion 52.

In this embodiment, further, the insulating layer 5 includes the portions 581 and 582. The portion 581 is continuous with the first interposed portion 51 and covers the first end face 416. The portion 582 is continuous with the second interposed portion 52 and covers the second end face 417. The portions 581 and 582 are in direct contact with the heat storage region 2. In other words, the heat storage region 2 includes a portion in direct contact with the insulating layer 5. Unlike this embodiment, the insulating layer 5 may be without the portions 581 and 582.

The cover layer 6 shown in FIG. 100 and FIG. 102 covers the electrode layer 3, the resistor layer 4, and the insulating layer 5, so as to protect the electrode layer 3, the resistor layer 4, and the insulating layer 5. The cover layer 6 includes a low-temperature resistor portion 61 located so as to overlap the heating portion 41 as viewed in the thickness direction Z of the base member 11, and a high-temperature resistor portion 62 higher in thermal resistivity than the low-temperature resistor portion 61. In this embodiment, the low-temperature resistor portion 61 is exposed from the high-temperature resistor portion 62. In FIG. 101, the high-temperature resistor portion 62 is unshown in the cover layer 6.

As shown in FIG. 101, the low-temperature resistor portion 61 includes a plurality of portions aligned in the direction Y. Here, though not shown in FIG. 101, the region in the low-temperature resistor portion 61 between the plurality of portions is filled with the high-temperature resistor portion 62. Therefore, the plurality of portions of the low-temperature resistor portion 61 are isolated from each other by the high-temperature resistor portion 62. In this embodiment, the plurality of portions of the low-temperature resistor portion 61 each have a rectangular shape, and those portions will hereafter be referred to as rectangular portion 61a. In this embodiment, the rectangular portions 61a are spaced from each other in the direction Y. The number of rectangular portions 61a is the same as the number of heating portions 41, and the rectangular portions 61a are located so as overlap the respective heating portions 41.

As shown in FIG. 102, the central portion of the low-temperature resistor portion 61 in the direction X overlaps the central portion of the rectangular portion 401 and the middle portion 53 of the insulating layer 5, as viewed in the thickness direction Z of the base member 11. In addition, the right end portion of the low-temperature resistor portion 61 in the direction X in FIG. 102 overlaps the first abutment portion 411, and the left end portion in the direction X in FIG. 102 overlaps the second abutment portion 412. In this embodiment, the low-temperature resistor portion 61 is in direct contact with the insulating layer 5 and a part of the electrode layer 3.

The high-temperature resistor portion 62 constitutes a major part of the cover layer 6 except for the low-temperature resistor portion 61, and is formed of an insulative material. The high-temperature resistor portion 62 has a thickness of, for example, 1 to 5 µm. Examples of the insulative material constituting the high-temperature resistor portion 62 include polyimide, polyamide, and polyethylene. In this embodiment, the high-temperature resistor portion 62 is in direct contact with the electrode layer 3. In addition, the high-temperature resistor portion 62 of the cover layer 6 includes a plurality of through windows 621 (FIG. 100 shows just one). In each of the through windows 621, the bonding portion 336 is exposed.

The low-temperature resistor portion 61 is formed of an insulative material lower in thermal resistivity, i.e., higher in thermal conductivity than the high-temperature resistor portion 62 constituting a major part of the cover layer 6. For example, polysilicon may be employed as the insulative material constituting the low-temperature resistor portion 61. To secure the insulative performance, the polysilicon employed in this case is not doped. Other examples of the suitable insulative material to form the low-temperature resistor portion 61 include SiC, AlN, and CBN.

It is preferable to form the low-temperature resistor portion 61 in a thickness of, for example, 1 to 5 µm. In this embodiment, the thickness of the low-temperature resistor portion 61 is adjusted such that the top portion of the low-temperature resistor portion 61 in the thickness direction Z is located upper than the top portion of the high-temperature resistor portion 62 in the thickness direction Z, as shown in FIG. 102. Through such adjustment, the configuration in which a part of the low-temperature resistor portion 61 protrudes to the Za-side from the high-temperature resistor portion 62 can be easily obtained.

The circuit board 12 shown in FIG. 100 is, for example, a printed circuit board. The circuit board 12 includes a base member layer and a non-illustrated wiring layer stacked thereon. For example, the base member may be formed of a glass epoxy resin and the wiring layer may be formed of Cu.

The driver IC 7 shown in FIG. 100 and FIG. 101 serves to supply a potential to each of the individual electrodes 33 and control a current supplied to the heating portion 41. When the potential is supplied to each of the individual electrodes 33, a voltage is applied between the common electrode 35 and each of the individual electrodes 33, and a current selectively flows to the heating portions 41. The driver IC 7 is mounted on the circuit board 12. As shown in FIG. 101, the driver IC 7 includes a plurality of pads 71 which are aligned, for example, in two rows.

The plurality of wires 81 shown in FIG. 100 and FIG. 101 are formed of a conductive material such as Au. Among the plurality of wires 81, wires 811 are bonded to the driver IC 7 and to the electrode layer 3. To be more detailed, the wires 811 are each bonded to one of the pads 71 of the driver IC 7 and one of the bonding portions 336. Accordingly, the driver IC 7 and each of the individual electrodes 33 are electrically connected to each other. As shown in FIG. 101, wires 812 in the plurality of wires 81 are each bonded to one of the pads 71 of the driver IC 7, and to the wiring layer of the circuit board 12. Accordingly, the driver IC 7 and the connector 83 are electrically connected to each other through the wiring layer. As shown in FIG. 101, wires 813 in the plurality of wires 81 are bonded to the stem portion 357 of the common electrode 35, and to the wiring layer of the circuit board 12. Accordingly, the common electrode 35 and the wiring layer are electrically connected to each other.

The encapsulating resin 82 shown in FIG. 100 is formed of, for example, a black resin. The encapsulating resin 82 covers the driver IC 7, the plurality of wires 81, and the cover layer 6, so as to protect the driver IC 7 and the plurality of wires 81. The encapsulating resin 82 is in direct contact with the cover layer 6. The connector 83 is fixed to the circuit board 12. The connector 83 serves to introduce power from outside to the thermal print head A100 and control the driver IC 7.

Hereunder, an example of the method of use of the thermal print head A100 will be briefly described.

The thermal print head 101 is incorporated in the printer, to be put to use. As shown in FIG. 100, the heating portions 41 of the thermal print head 101 are opposed to the platen roller 802, in the printer. In addition, the low-temperature resistor portions 61 located so as to overlap the respective heating portions 41 are also opposed to the platen roller 802. When the printer is used, the platen roller 802 rotates to thereby feed the printing medium 801 in the direction X between the platen roller 802 and the heating portions 41 at a constant velocity. The printing medium 801 is pressed by the platen roller 802 against the low-temperature resistor portion 61. To each of the plurality of individual electrodes 33 shown in FIG. 101, the driver IC 7 selectively supplies a potential. Accordingly, a voltage is applied between the common electrode and each of the individual electrodes 33. Then a current selectively flows to the plurality of heating portions 41, so as to generate heat. The heat generated by the heating portions 41 is transmitted to the printing medium 801 through the low-temperature resistor portion 61. Accordingly, a plurality of dots are printed on a first line region linearly extending in the direction Y on the printing medium 801. The heat generated by the heating portions 41 is also transmitted to the heat storage region 2, to be accumulated therein.

As the platen roller 802 rotates further, the printing medium 801 continues to be fed in the direction X at a constant velocity. Then the printing is performed on a second line region, adjacent to the first line region, linearly extending in the direction Y on the printing medium 801, as in the printing operation on the first line region. During the printing on the second line region, the heat accumulated in the heat storage region 2 is also transmitted to the printing medium 801 in addition to the heat generated by the heating portions 41. The printing on the second line region is thus performed. The printing on the printing medium 801 can thus be performed by printing a plurality of dots on each of the line regions on the printing medium 801 linearly extending in the direction Y.

Hereunder, an example of the manufacturing method of the thermal print head 101 will be briefly described. In this embodiment, the thermal print head 101 is manufactured through a semiconductor process.

Figure 103:
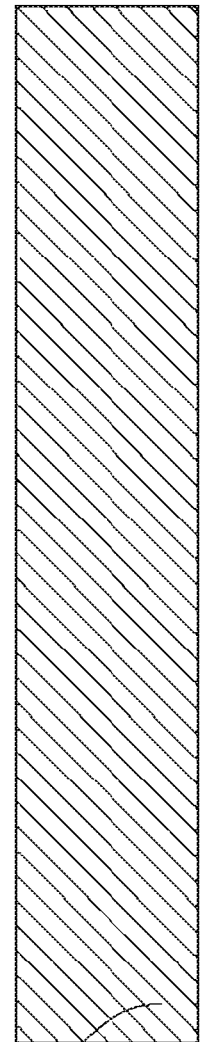
FIG. 103 is a cross-sectional view showing a step in the manufacturing process of the thermal print head according to the embodiment C1 of the present invention.
Figure 104:
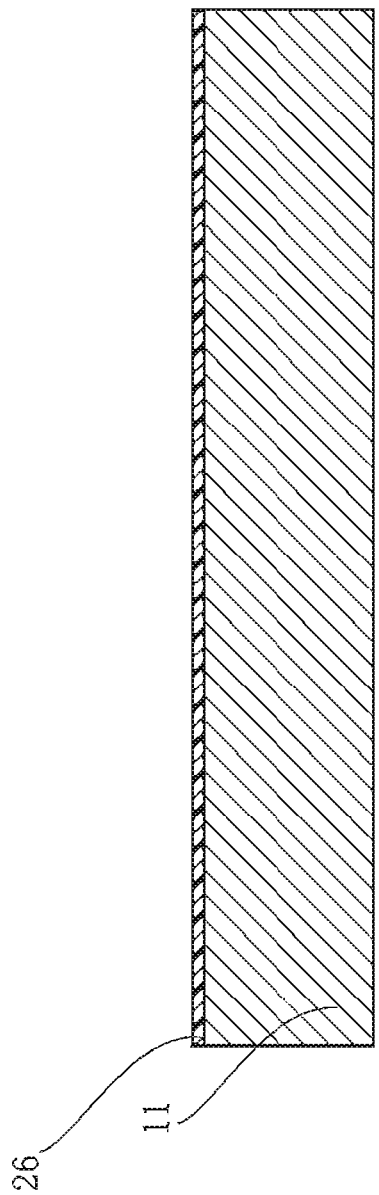
FIG. 104 is a cross-sectional view showing a step subsequent to FIG. 103.
Figure 105:
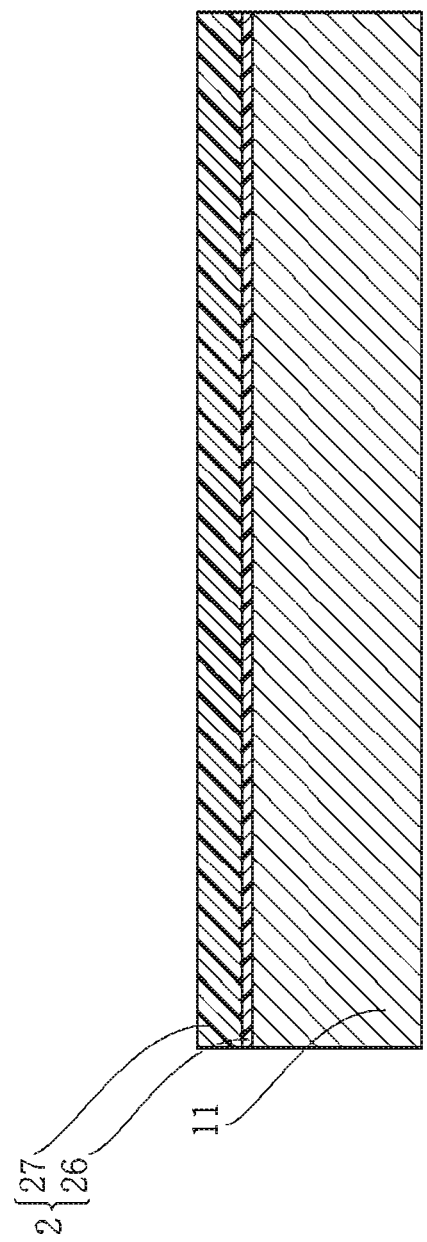
FIG. 105 is a cross-sectional view showing a step subsequent to FIG. 104.

As shown in FIG. 103, the semiconductor substrate 19 is first prepared. In this embodiment the semiconductor substrate 19 is formed of Si. Proceeding to FIG. 104, the surface of the semiconductor substrate 19 is subjected to thermal oxidation. At this point, the base member 11 and the first layer 26 stacked on the base member 11 are obtained. Then the second layer 27 is formed on the first layer 26 by CVD or sputtering as shown in FIG. 105. As a result, the heat storage region 2 stacked on the base member 11 is obtained. Though not shown, the SiO$_2$ layer is also formed on the rear surface of the base member 11. It is not mandatory to perform the thermal oxidation of the surface of the semiconductor substrate 19, and the heat storage region 2 may be directly formed by CVD or sputtering.

Figure 106:
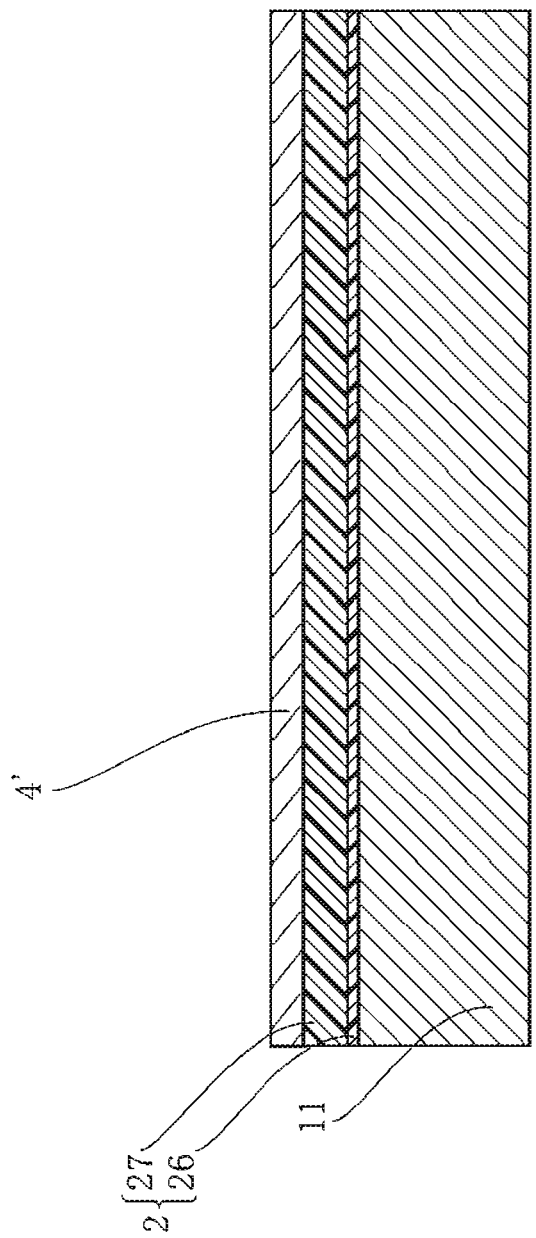
FIG. 106 is a cross-sectional view showing a step subsequent to FIG. 105.
Figure 107:
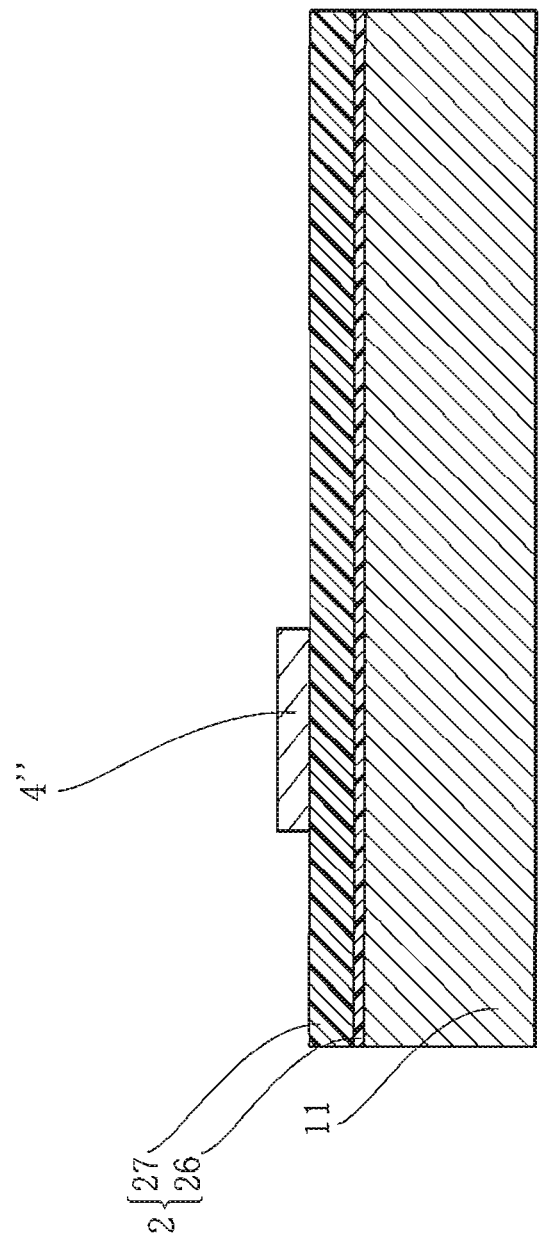
FIG. 107 is a cross-sectional view showing a step subsequent to FIG. 106.
Figure 108:
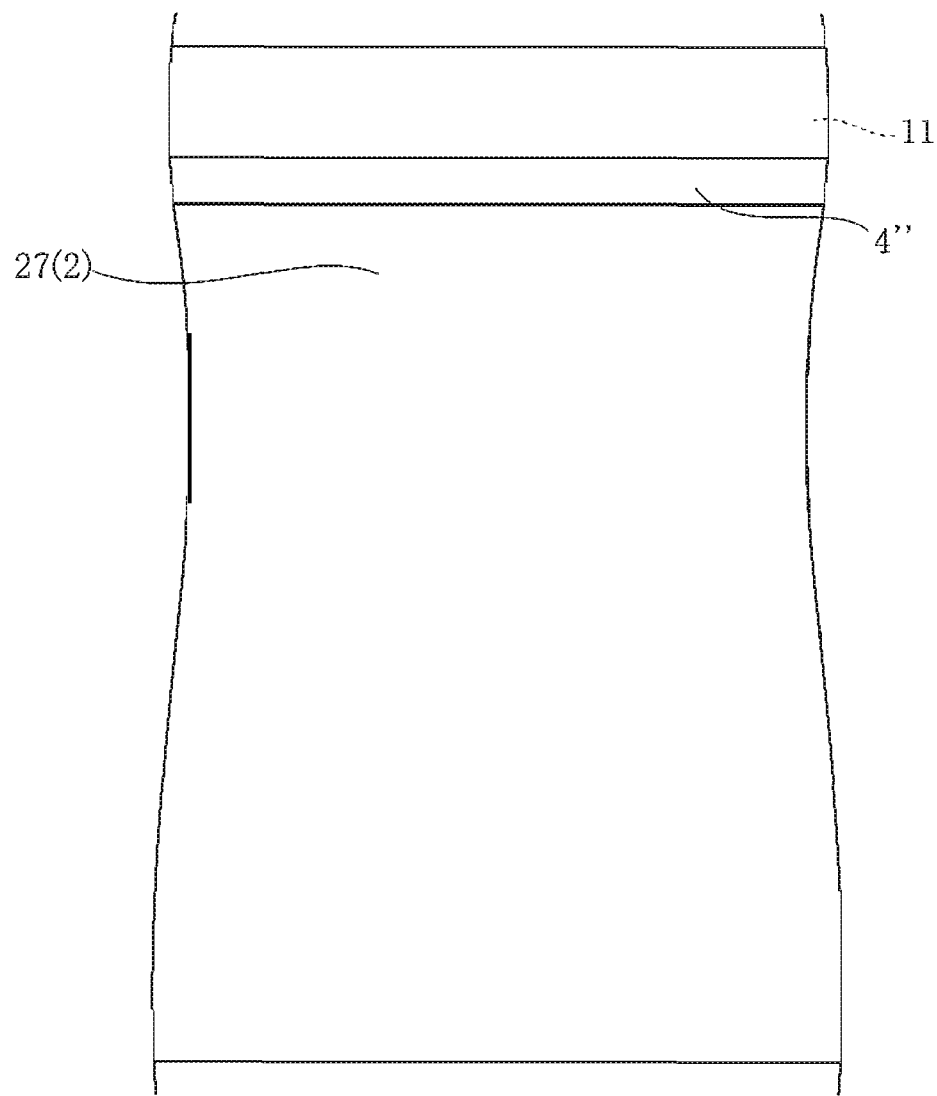
FIG. 108 is an enlarged fragmentary plan view showing a state obtained through the step of FIG. 107.

Referring then to FIG. 106, the resistor layer 4' is formed. The resistor layer 4' may be formed, for example, by CVD or sputtering. The resistor layer 4' is formed over the entirety of the surface of the base member 11. Then etching is performed on the resistor layer 4' so as to form a resistor layer 4" as shown in FIG. 1C7 and FIG. 108. For the etching of the resistor layer 4', a photolithography process may be employed. As shown in FIG. 108, the resistor layer 4" extends in a belt-like shape in one direction in this embodiment. Then the resistor layer 4" is doped with ion (unshown) so as to grant a desired resistivity to the resistor layer 4.

Figure 109:
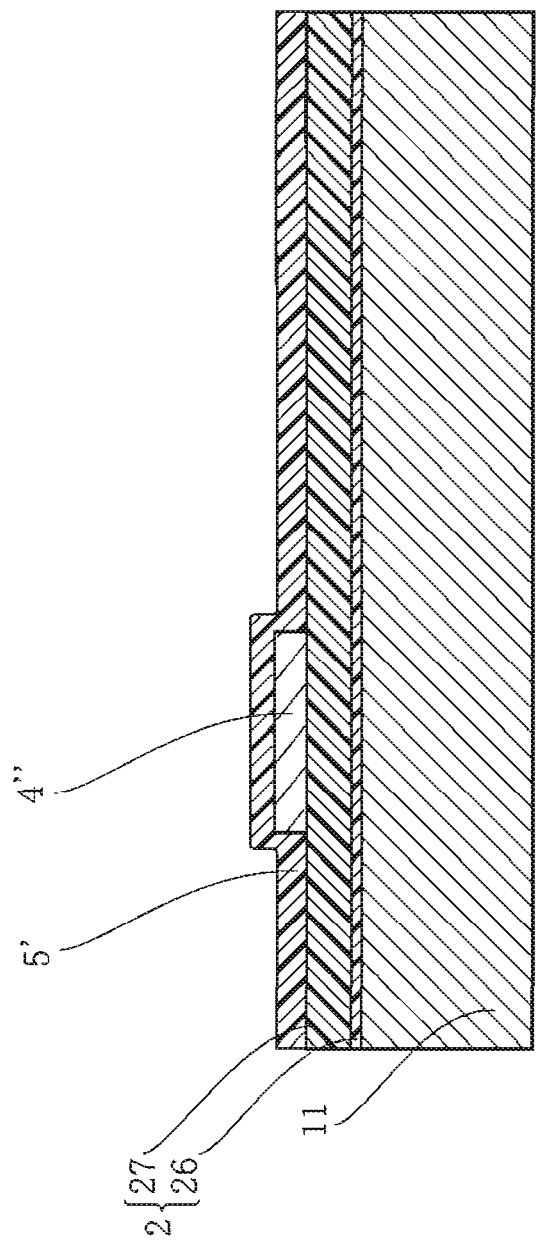
FIG. 109 is a cross-sectional view showing a step subsequent to FIG. 107.
Figure 110:
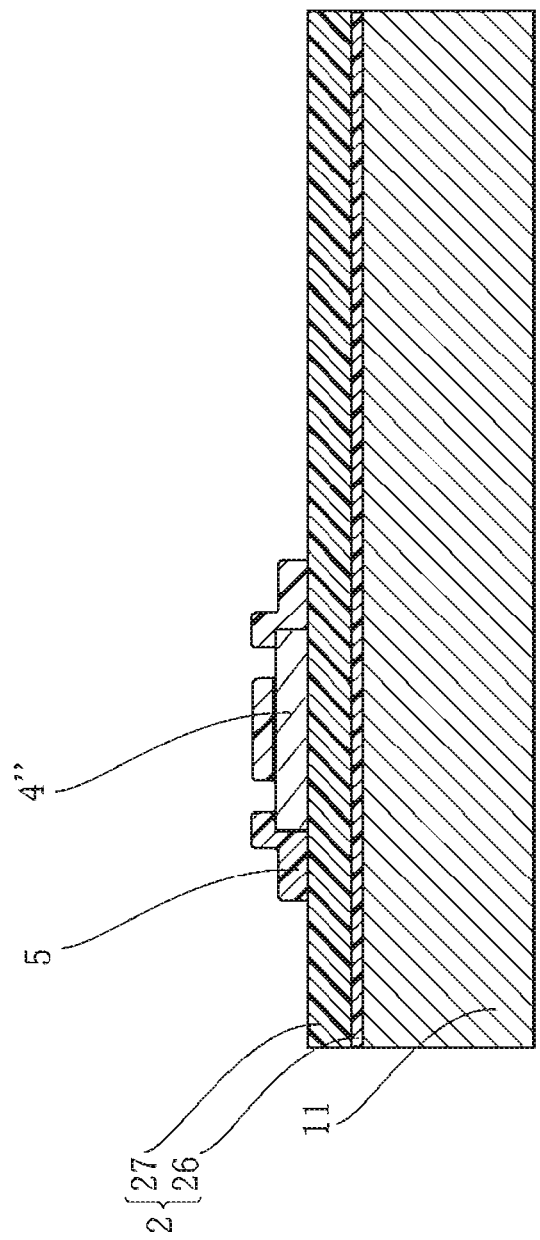
FIG. 110 is a cross-sectional view showing a step subsequent to FIG. 109.

Proceeding to FIG. 109, the insulating layer 5' is formed. The insulating layer 5' may be formed, for example, by CVD or sputtering. Then as shown in FIG. 110, etching is performed on the insulating layer 5' so as to form the insulating layer 5.

Figure 111:
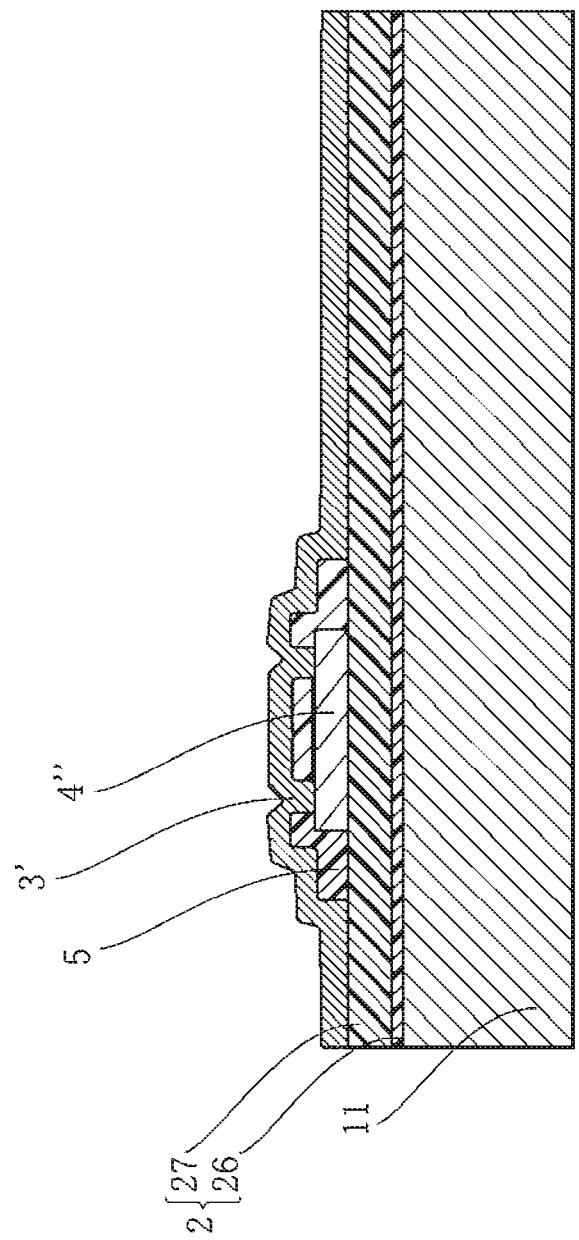
FIG. 111 is a cross-sectional view showing a step subsequent to FIG. 110.
Figure 112:
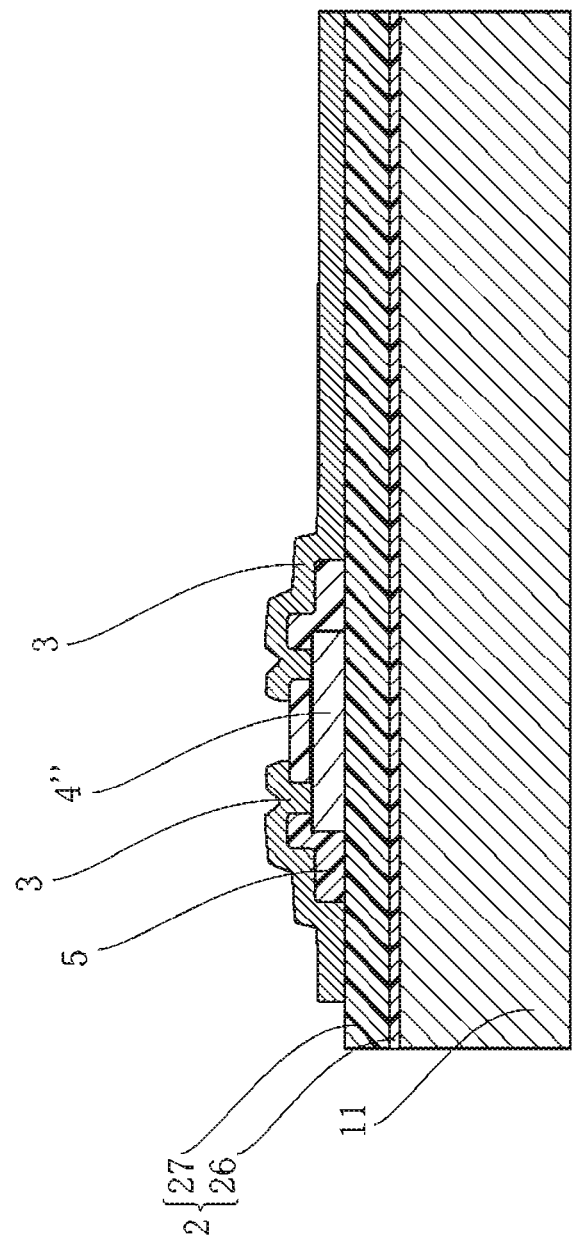
FIG. 112 is a cross-sectional view showing a step subsequent to FIG. 111.
Figure 113:
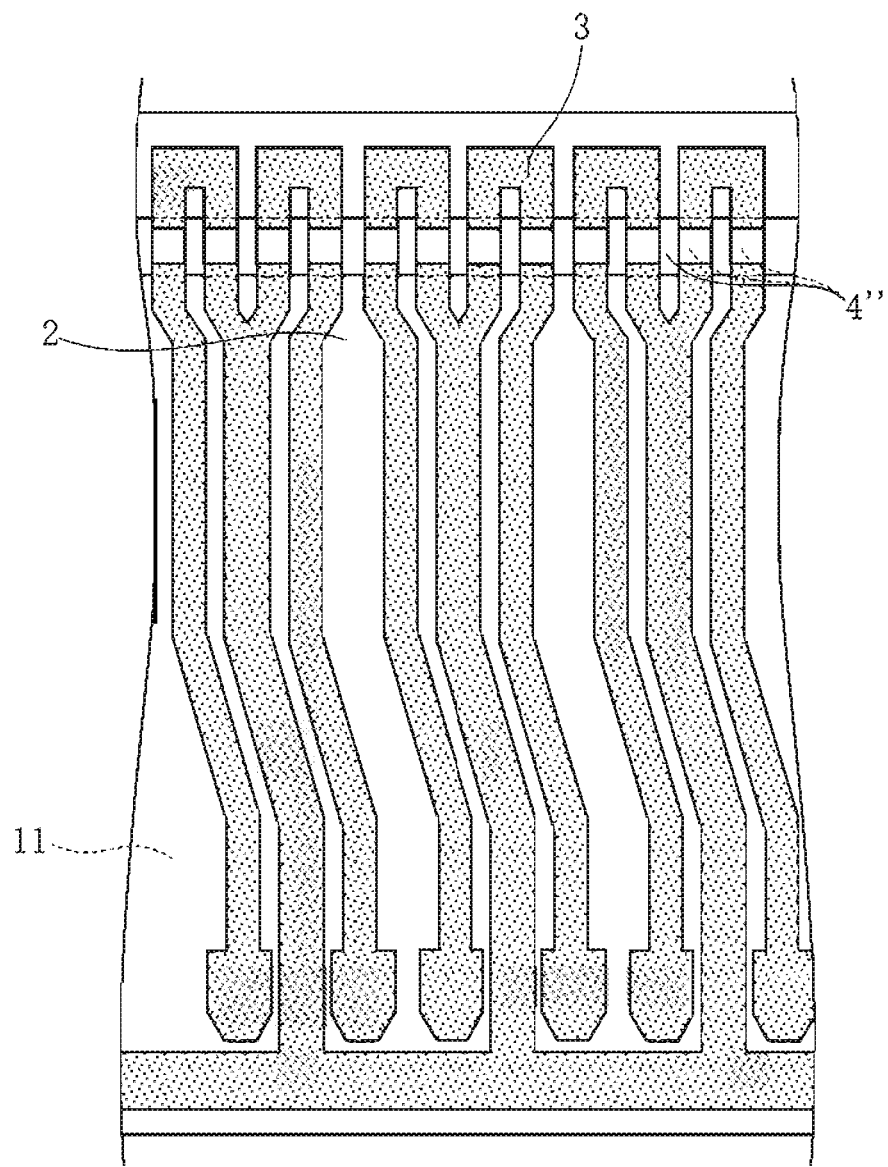
FIG. 113 is an enlarged fragmentary plan view showing a state obtained through the step of FIG. 112.

Referring to FIG. 111, the electrode layer 3' is formed. The electrode layer 3' may be formed, for example, by sputtering or CVD. Then etching is performed on the electrode layer 3' so as to form the electrode layer 3 of the mentioned shape, as shown in FIG. 112 and FIG. 113. For the etching of the electrode layer 3', a photolithography process may be employed.

Figure 114:
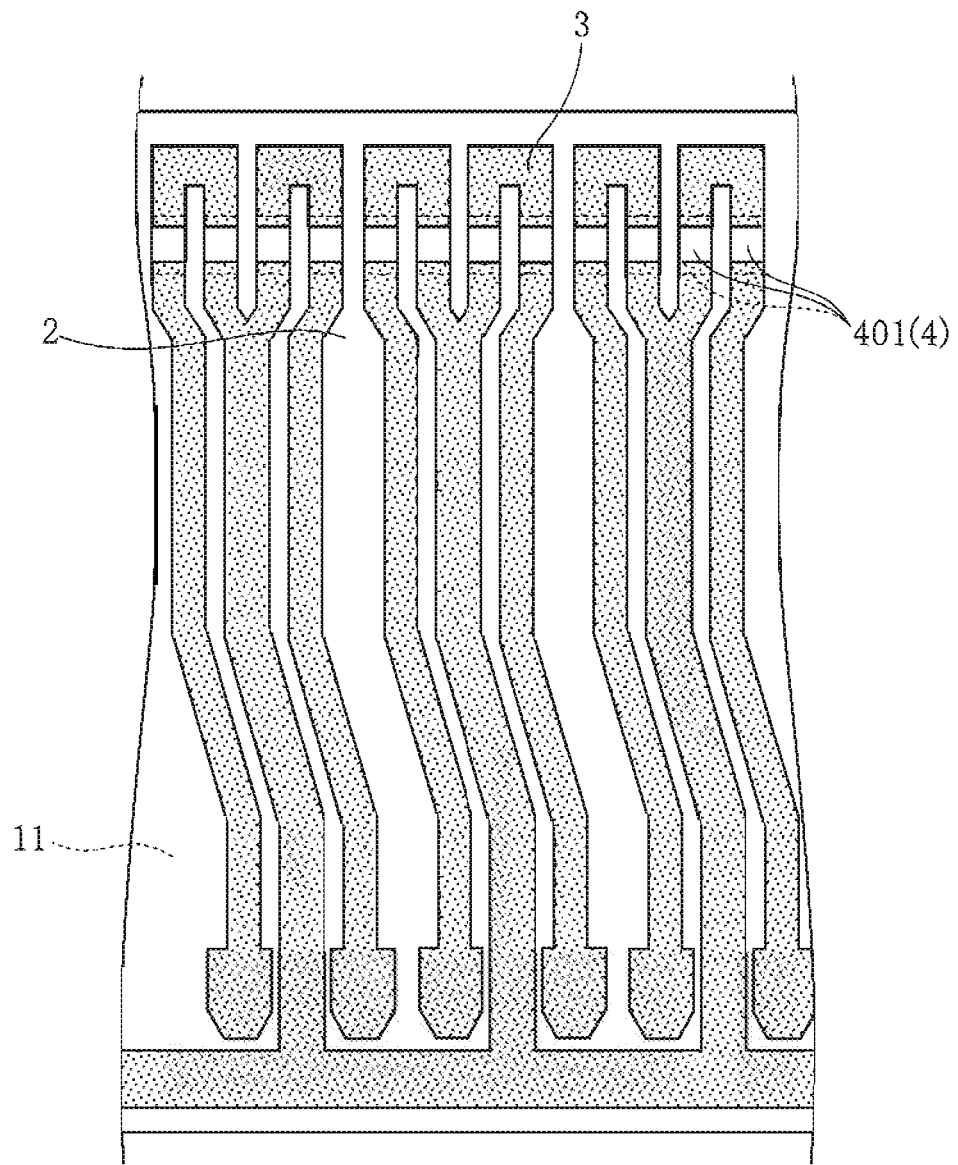
FIG. 114 is an enlarged fragmentary cross-sectional view showing a step subsequent to FIG. 112.

Then etching is performed on the resistor layer 4" so as to form the resistor layer 4 including the plurality of rectangular portions 401, as shown in FIG. 114. The rectangular portions serve to prevent the current from flowing through the resistor layer 4 in a horizontal direction in FIG. 114 when the thermal print head 101 is in use. Unlike this embodiment, the resistor layer 4 including the plurality of rectangular portions may be formed through a single etching process on the resistor layer 4', without forming the resistor layer 4" in the belt-like shape.

Figure 115:
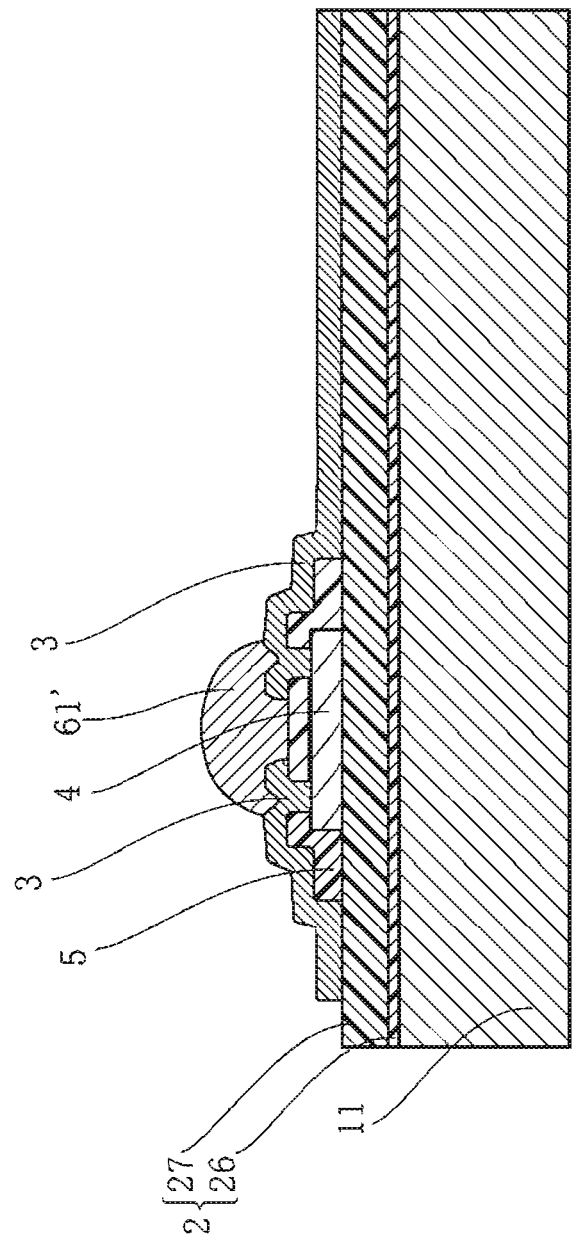
FIG. 115 is a cross-sectional view showing a step subsequent to FIG. 114.
Figure 116:
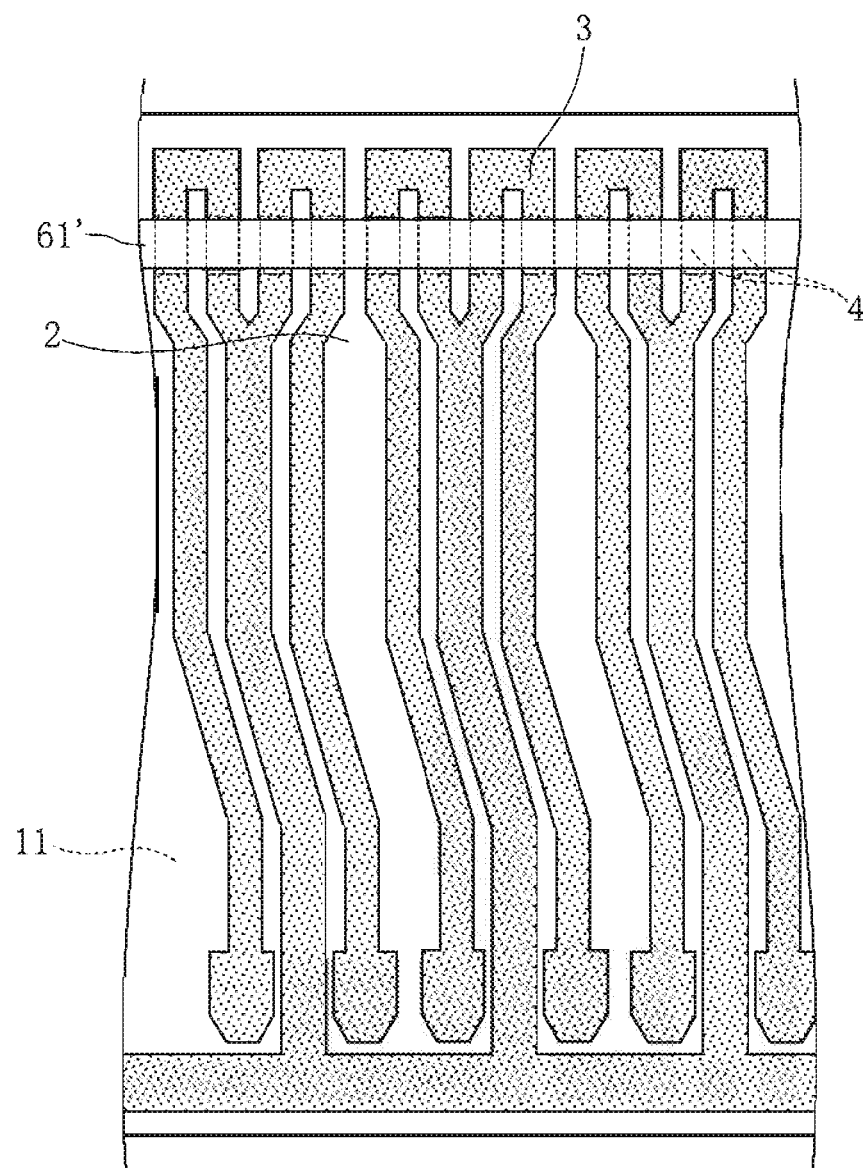
FIG. 116 is an enlarged fragmentary plan view showing a state obtained through the step of FIG. 115.
Figure 117:
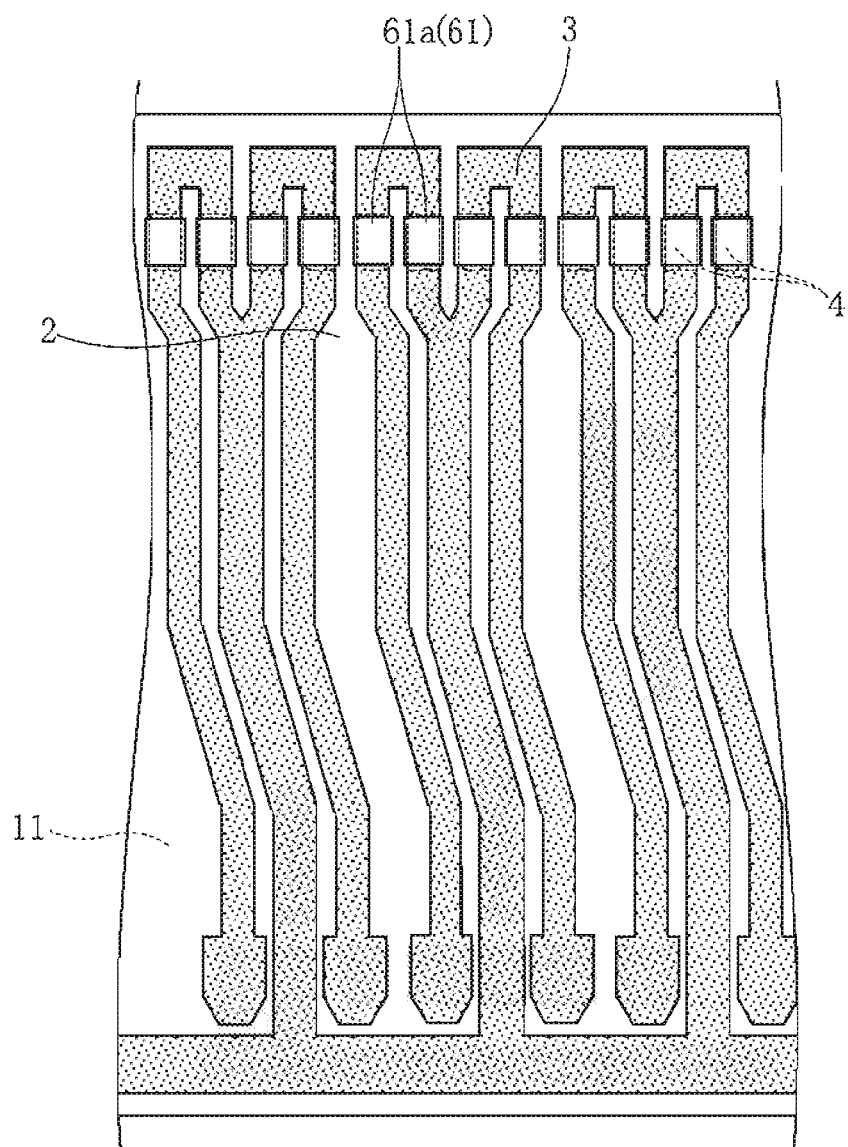
FIG. 117 is an enlarged fragmentary plan view showing a step subsequent to FIG. 116.

Proceeding to FIG. 115 and FIG. 116, the low-temperature resistor portion 61' is formed. To form the low-temperature resistor portion 61', for example, polysilicon may be applied to a belt-like shaped region, or CVD or sputtering may be performed. Then as shown in FIG. 117, etching is performed on the low-temperature resistor portion 61' so as to form the low-temperature resistor portion 61 including the plurality of rectangular portions 61a. The rectangular portions 61a serve to suppress heat transmission through the low-temperature resistor portion 61 in a horizontal direction in FIG. 116 when the thermal print head 101 is in use.

Figure 118:
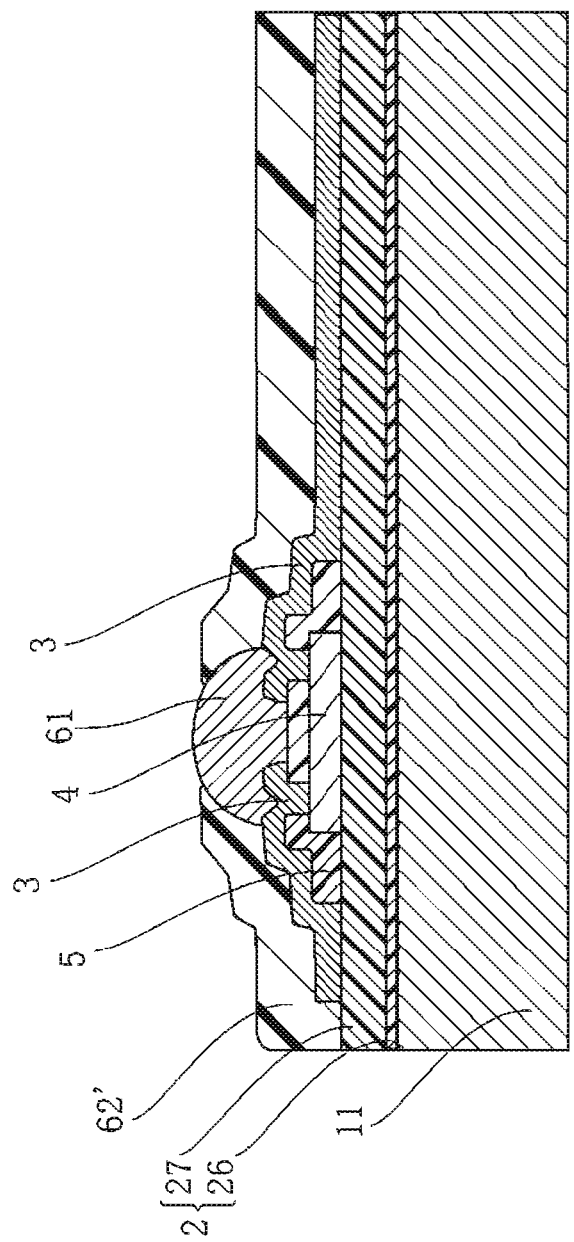
FIG. 118 is a cross-sectional view showing a step subsequent to FIG. 117.
Figure 119:
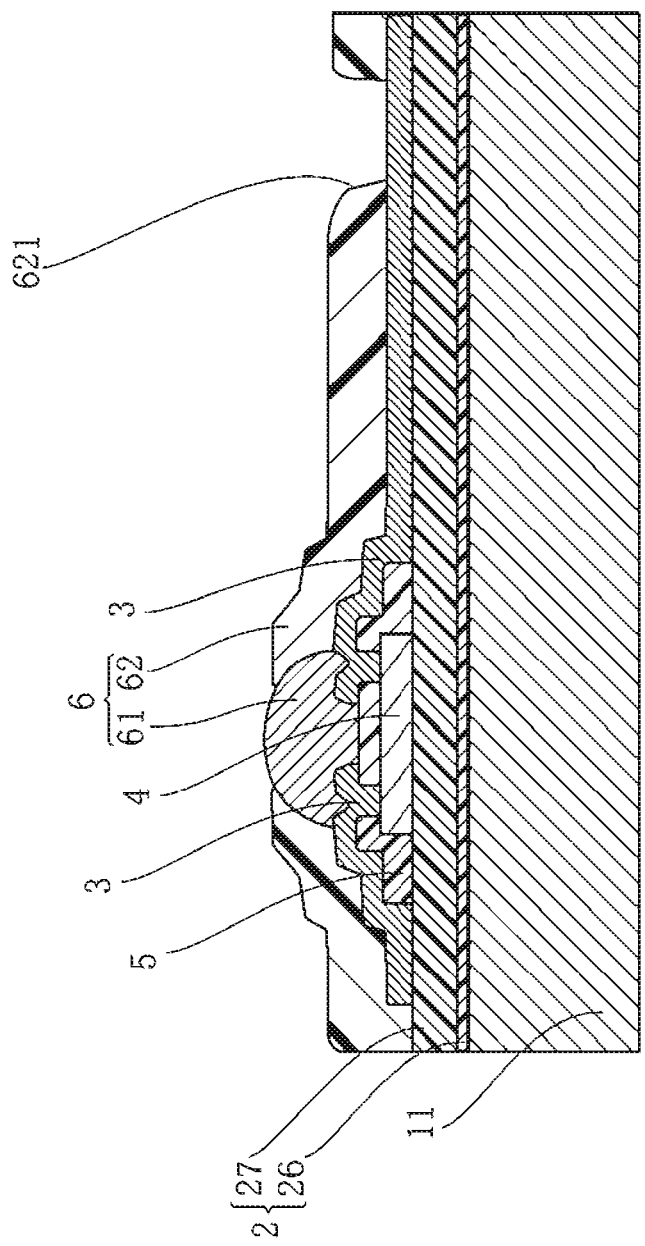
FIG. 119 is a cross-sectional view showing a step subsequent to FIG. 118.

Proceeding to FIG. 118, the high-temperature resistor portion 62' is formed. The high-temperature resistor portion 62' may be formed, for example, by CVD. Then as shown in FIG. 119, etching is performed on the high-temperature resistor portion 62' so as to form the plurality of through windows 621. For the etching of the high-temperature resistor portion 62, a photolithography process may be employed. Upon forming the low-temperature resistor portion 61 and the high-temperature resistor portion 62, the cover layer 6 is obtained.

Thereafter, though not shown, the rear surface of the base member 11 is polished to reduce the thickness thereof. Then after measuring the resistance of the resistor layer 4 and dicing the base member 11, the diced pieces and the circuit board 12 are placed on the heat dissipation plate 13. The driver IC 7 shown in FIG. 100 is then mounted on the circuit board 12, the wires 81 are bonded to predetermined positions, and the encapsulating resin 82 is formed. Through the foregoing process, the thermal print head 101 shown in FIG. 100 can be obtained.

The advantageous effects of the foregoing embodiment will be described hereunder.

In this embodiment, the cover layer 6 includes the low-temperature resistor portion 61 and the high-temperature resistor portion 62 different from each other in thermal resistivity, and the low-temperature resistor portion 61 is located so as to overlap the heating portion 41 as viewed in the thickness direction Z. The heat generated by the heating portion 41 is transmitted to the printing medium 801 through the low-temperature resistor portion 61. In this process, since the high-temperature resistor portion 62 is higher in thermal resistivity than the low-temperature resistor portion 61, the heat transmitted through the low-temperature resistor portion 61 is barely transmitted to the high-temperature resistor portion 62. In this embodiment, therefore, the heat is suppressed from diffusing in the cover layer 6, and hence the heat from the heating portion 41 can be efficiently transmitted to the printing medium 801. Consequently, the thermal print head 101 is capable of performing the printing operation with a smaller amount of heat, and contributes to reduction in power consumption during the printing operation.

In this embodiment, the low-temperature resistor portion 61 protrudes from the high-temperature resistor portion 62 so as to be exposed. Accordingly, when the thermal print head 101 mounted in the printer is put to use, the printing medium 801 is pressed against the low-temperature resistor portion 61 by the platen roller 802. Such a configuration suppresses heat diffusion through the cover layer 6.

In this embodiment, the low-temperature resistor portion 61 is divided into the plurality of rectangular portions 61a, which are isolated from each other by the high-temperature resistor portion 62 having a relatively high thermal resistivity. Such a configuration effectively suppresses diffusion of the heat generated by the heating portions 41, which is preferable from the viewpoint of suppressing appearance of printing blur on the printing medium 801.

In this embodiment, further, the thermal print head 101 includes the insulating layer 5. The insulating layer 5 includes a portion interposed between the electrode layer 3 and the heating portion 41. Such a configuration reduces the contact area between the electrode layer 3 and the heating portion 41. Accordingly, a eutectic composition of the electrode layer 3 and the heating portion 41 is generated only in a small area when the heating portion 41 receives a current and generates heat. Reducing thus the area where eutectic reaction takes place between the electrode layer 3 and the heating portion 41 suppresses fluctuation of the resistance of the thermal print head 101 during the use.

In the case where the electrode layer 3 is interposed between the resistor layer 4 and the heat storage region 2, the heat generated by the heating portion 41 of the resistor layer 4 may escape to the electrode layer 3. The heat that has escaped to the electrode layer 3 is not involved in the heat transmission to the printing medium 801. In this embodiment, on the other hand, the resistor layer 4 is interposed between the electrode layer 3 and the heat storage region 2. With such a configuration, even though the heat generated by the heating portion 41 of the resistor layer 4 is transmitted to the electrode layer 3, the heat transmitted to the electrode layer 3 can participate in the heat transmission to the printing medium 801. Therefore, the heat generated by the heating portion 41 can be more efficiently transmitted to the printing medium 801, so that the portion of the thermal print head 101 to be brought into contact with the printing medium 801, i.e., the cover layer 6, can be more quickly heated up. Consequently, high-speed printing can be performed on the printing medium 801.

In this embodiment, the base member 11 is made of Si. Since Si has a high thermal conductivity, the heat generated by the heating portion 41 can be rapidly transmitted to outside of the base member 11 (in this embodiment, heat dissipation plate 13). Therefore, the raised temperature of the heating portion 41 can be quickly lowered, which contributes to increasing the printing speed on the printing medium 801.

On the other hand, when an excessively large amount of heat is transmitted to the base member 11, the amount of heat transmitted to the cover layer 6 is decreased, which is disadvantageous from the viewpoint of reduction in power consumption during the printing operation. However, the low-temperature resistor portion 61 of this embodiment is formed of polysilicon and hence can be given a higher thermal conductivity than that of the base member 11 which is formed of Si. Accordingly, the amount of heat transmitted to the low-temperature resistor portion 61 can be relatively increased easily, and the excessive heat transmission to the base member 11 can be suppressed.

In this variation, the through window 621 in the high-temperature resistor portion 62 is formed by etching on the high-temperature resistor portion 62'. Through the etching process the through window 621 can be formed at a desired position in the high-temperature resistor portion 62, and hence there is no need to cover the portion of the electrode layer 3 uncovered with the cover layer 6 with another resin layer (solder resist layer) than the encapsulating resin 82. Eliminating thus the need to form an additional resin layer (solder resist layer) contributes to improving the manufacturing efficiency of the thermal print head 101.

Embodiment C2

Figure 120:
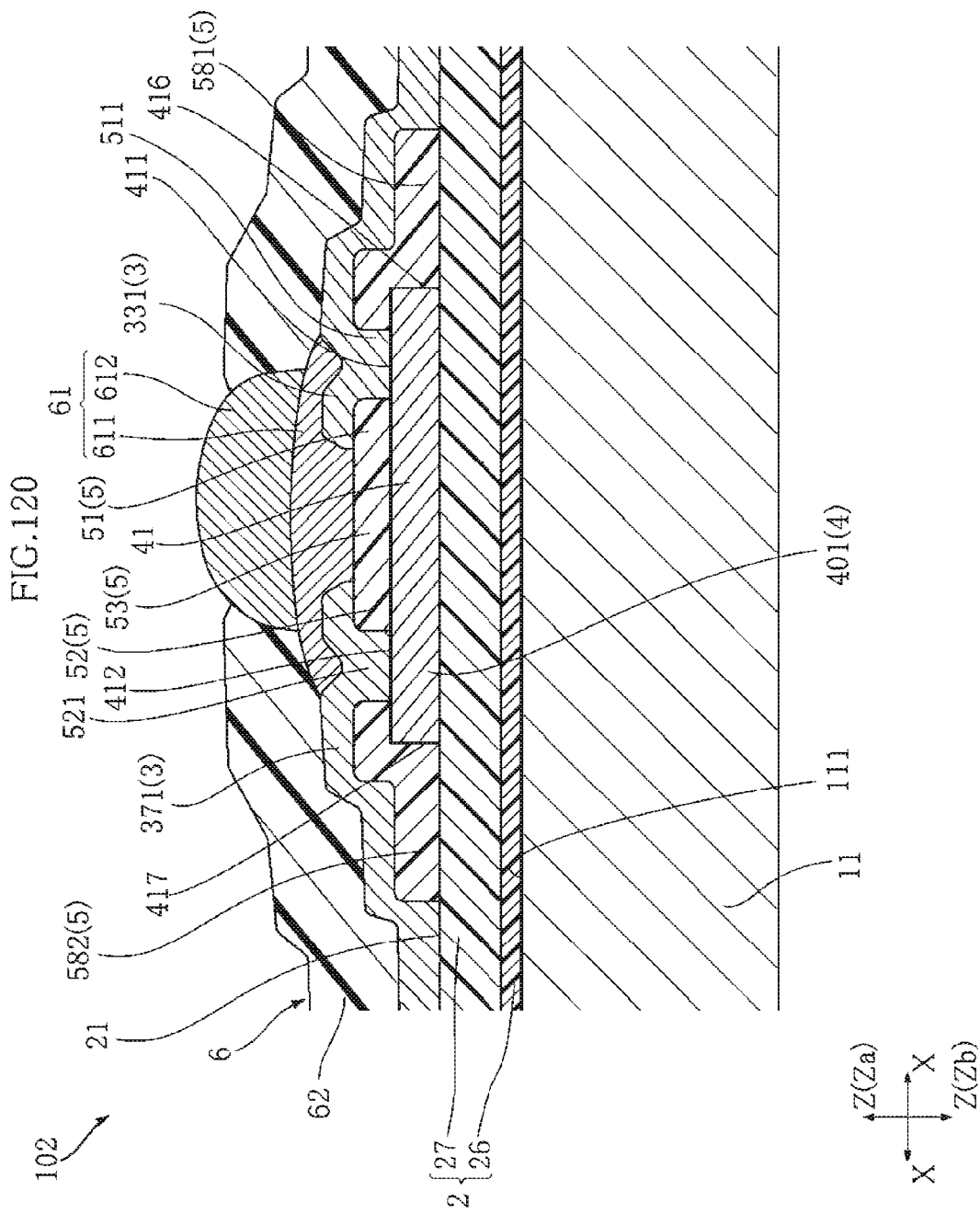

Referring to FIG. 120, an embodiment C2 of the present invention will be described hereunder.

In the description given hereunder, the constituents same as or similar to those of the embodiment C1 will be given the same numeral, and the description thereof may be omitted.

FIG. 120 is an enlarged fragmentary cross-sectional view of a thermal print head according to the embodiment C2 of the present invention.

The thermal print head 102 shown in FIG. 120 is different from the thermal print head 101 in that the low-temperature resistor portion 61 includes an insulating portion 611 and a conductor portion 612. The insulating portion 611 is interposed between the conductor portion 612 and the heating portion 41, and in direct contact with the electrode layer 3 and the insulating layer 5. The conductor portion 612 is in direct contact with the insulating portion 611. The insulating portion 611 prevents the conductor portion 612 from contacting the electrode layer 3.

The insulating portion 611 is formed of undoped polysilicon, like the low-temperature resistor portion 61 of the thermal print head 101. The conductor portion 612 is formed of a metal. More specifically, the conductor portion 612 is formed of at least one of Al, Au, Ag, Cu, Cr, Al—Si, and Ti.

In this embodiment, the heat generated by the heating portion 41 is transmitted to the printing medium 801 through the conductor portion 612. The conductor portion 612 is formed of a metal, which is lower in thermal resistivity than the high-temperature resistor portion 62, and hence heat diffusion from the insulating portion 611 to the high-temperature resistor portion 62 is suppressed. Therefore, the thermal print head 102 is also capable of efficiently transmit the heat generated by the heating portion 41 to the printing medium 801 without allowing wasteful heat diffusion. On the other hand, it is not desirable to allow the conductor portion 612 formed of a metal to make contact with the electrode layer 3, and therefore providing the insulating portion 611 is reasonable.

The insulating portion 611 may be formed of another material than polysilicon. More specifically, the insulating portion 611 may be formed of $SiO_2$ or $SiAlO_2$. Further, it is not mandatory that the conductor portion 612 is formed of a metal. For example, the conductor portion 612 may be formed of Si.

The present invention is in no way limited to the foregoing embodiments. Specific configurations of the constituents may be modified in various manners.

For example, although the insulating layer 5 is interposed between the low-temperature resistor portion 61 and the heating portion 41 in the foregoing embodiments, the heating portion 41 and the low-temperature resistor portion 61 may be in direct contact with each other. The heating portion 41 and the low-temperature resistor portion 61 can be brought into direct contact with each other by removing a part of the insulating layer 5. Although the thermal print heads 101, 102 include the insulating layer 5, the insulating layer 5 may be excluded. In this case also, the heating portion 41 and the low-temperature resistor portion 61 are brought into direct contact with each other.

Although the low-temperature resistor portion 61 includes the plurality of rectangular portions 61a in some of the embodiments, the shape of the plurality of portions of the low-temperature resistor portion 61 is not limited to rectangular but may be different. In addition, the configuration of the low-temperature resistor portion 61 may be different from including the plurality of portions respectively overlapping the heating portions 41. For example, the low-temperature resistor portion 61 may be formed in a belt-like shape extending in the direction in which the plurality of heating portions 41 are aligned.

Further, although the low-temperature resistor portion 61 protrudes from the high-temperature resistor portion 62 in some of the embodiments, different configurations may be adopted. For example, the low-temperature resistor portion 61 may be slightly recessed from the high-temperature resistor portion 62. In this case also, the printing medium 801 can still be pressed against the low-temperature resistor portion 61 by the platen roller 802.

Further, although the low-temperature resistor portion 61 is exposed from the high-temperature resistor portion 62 in some of the embodiments, different configurations may be adopted. Even though the low-temperature resistor portion 61 is fully covered with the high-temperature resistor portion 62, the presence of the low-temperature resistor portion 61 facilitates the transmission of the heat from the heating portion 41, and therefore a reasonable effect can be expected.

Variations of the present invention illustrated in FIG. 99 to FIG. 120 and described thus far with reference to these drawings will be cited as appendices hereunder.

[Appendix 1] A thermal print head including a base member, a heat storage region formed on the base member, a resistor layer formed on the base member, an electrode layer formed on the base member and electrically connected to the resistor layer, and a cover layer covering the resistor layer and the electrode layer, in which the resistor layer includes a plurality of heating portions spanned between two portions of the electrode layer spaced from each other as viewed in a thickness direction of the base member, the cover layer includes a low-temperature resistor portion located so as to overlap the plurality of heating portions as viewed in the thickness direction of the base member, and a high-temperature resistor portion higher in thermal resistivity than the low-temperature resistor portion. [Appendix 2] The thermal print head according to appendix 1, in which the plurality of heating portions are aligned in a main scanning direction, the low-temperature resistor portion includes a plurality of portions aligned in the main scanning direction, and the plurality of portions of the low-temperature resistor portion are located so as to overlap the respective heating portions. [Appendix 3] The thermal print head according to appendix 2, in which the plurality of portions the low-temperature resistor portion are spaced from each other. [Appendix 4] The thermal print head according to any one of appendices 1 to 3, in which the low-temperature resistor portion is made of an insulative material and in direct contact with the electrode layer. [Appendix 5] The thermal print head according to appendix 4, in which the low-temperature resistor portion is made of polysilicon. [Appendix 6] The thermal print head according to appendix 4, in which the low-temperature resistor portion includes an insulating portion located in direct contact with the electrode layer, and a conductor portion located in direct contact with the insulating portion. [Appendix 7] The thermal print head according to appendix 6, in which the insulating portion is interposed between the conductor portion and the heating portion. [Appendix 8] The thermal print head according to appendix 7, in which the conductor portion is formed of a metal. [Appendix 9] The thermal print head according to appendix 8, in which the conductor portion is made of at least one of Al, Au, Ag, Cu, Cr, Al—Si, and Ti. [Appendix 10] The thermal print head according to any one of appendices 6 to 9, in which the insulating portion is made of at least one of polysilicon, SiO$_2$, and SiAlO$_2$. [Appendix 11] The thermal print head according to any one of appendices 1 to 10, in which the high-temperature resistor portion is made of at least one of polyimide, polyamide, and polyethylene. [Appendix 12] The thermal print head according to any one of appendices 1 to 11, in which the low-temperature resistor portion is exposed from the high-temperature resistor portion. [Appendix 13] The thermal print head according to appendix 12, in which the low-temperature resistor portion is formed so as to protrude from the high-temperature resistor portion. [Appendix 14] The thermal print head according to any one of appendices 1 to 13, in which the low-temperature resistor portion has a thickness of 1 to 5 μm in the thickness direction of the base member. [Appendix 15] The thermal print head according to any one of appendices 1 to 14, in which the base member is made of a semiconductor material. [Appendix 16] The thermal print head according to any one of appendices 1 to 14, in which the resistor layer is interposed between the electrode layer and the heat storage layer. [Appendix 17] The thermal print head according to any one of appendices 1 to 16, further including an insulating layer interposed between the resistor layer and the electrode layer, in which the heat storage layer includes a portion in direct contact with the insulating layer. [Appendix 18] The thermal print head according to any one of appendices 1 to 17, in which the cover layer is in direct contact with the insulating layer. [Appendix 19] The thermal print head according to any one of appendices 1 to 18, further including a circuit board, a plurality of wires, and a resin layer covering the circuit board, the plurality of wires, and the cover layer. [Appendix 20] The thermal print head according to appendix 19, in which the cover layer includes a through window, the electrode layer includes a bonding portion exposed in the through window, and one of the plurality of wires is bonded to the bonding portion. [Appendix 21] The thermal print head according to appendix 19 or 20, in which the resin layer is in direct contact with the cover layer. [Appendix 22] The thermal print head according to any one of appendices 19 to 21, further including a driver IC that supplies a current to the electrode layer, the driver IC being mounted on the circuit board. [Appendix 23] The thermal print head according to appendix 17 or 18, in which the insulating layer is made of SiO$_2$ or SiAlO$_2$. [Appendix 24] The thermal print head according to any one of appendices 1 to 23, in which the resistor layer is made of at least one of polysilicon, TaSiO$_2$, and TiON. [Appendix 25] The thermal print head according to any one of appendices 1 to 24, in which the electrode layer is made of at least one of Au, Ag, Cu, Cr, Al—Si, and Ti. [Appendix 26] The thermal print head according to any one of appendices 1 to 25, further including a heat dissipation plate that supports the base member. [Appendix 27] A thermal printer including the thermal print head according to any one of appendices 1 to 26, and a platen roller opposed to the thermal print head. [Appendix 28] The thermal printer according to appendix 27, in which the low-temperature resistor portion is opposed to the platen roller.

The features of the thermal print heads described thus far may be combined as desired, irrespective of whether the features derive from the same or different embodiments.

REFERENCE SIGNS

A100, A101, A102, A103, B100, B101, B102, C100, C101, D100 thermal print head; A800, B800, C800 thermal printer; 11 base member; 111 base member front surface; 112 base member rear surface; 113a recess; 113b first groove; 113c second groove; 12 circuit board; 13 heat dissipation plate; 19 semiconductor substrate; 2 heat storage region; 21 heat storage region surface; 211 first edge; 212 second edge; 291 first barrier; 292 second barrier; 3 electrode layer; 33 individual electrode; 331 individual electrode belt-like portion; 333 bent portion; 334 individual electrode linear portion; 335 individual electrode oblique portion; 336 bonding portion; 35 common electrode; 351 common electrode belt-like portion; 353 branched portion; 354 common electrode linear portion; 355 common electrode oblique portion; 356 extending portion; 357 stem portion; 37 intermediate electrode; 371 intermediate electrode belt-like portion; 373 joint portion; 4 resistor layer; 41 heating portion; 411 first abutment portion; 412 second abutment portion; 416 first end face; 417 second end face; 5 insulating layer; 51 first interposed portion; 511 first opening; 52 second interposed portion; 521 second opening; 53 middle portion; 58 intermediate layer; 581 intermediate layer surface; 582 flat region; 583 first curved region; 584 second curved region; 6 cover layer; 61 through window; 7 driver IC; 71 pad; 81, 811, 812, 813 wire; 82 encapsulating resin; 83 connector; 802 platen roller; D11 depth; D12 depth; D13 depth; 791 first groove segment; 115a first groove sidewall (of base member); 115b first groove bottom face (of base member); 792 second groove segment; 116a second groove sidewall (of base member); 116b second groove bottom face (of base member); 793 third groove segment; 117a third groove sidewall (of base member); 117b third groove bottom face (of base member); 25a first groove sidewall (of heat storage region); 26a second groove sidewall (of heat storage region); 27a third groove sidewall (of heat storage region); 418 first side face (of resistor); 419 second side face (of resistor); 65a first groove sidewall (of cover layer); 66a second groove sidewall (of cover layer); 67a third groove sidewall (of cover layer); 59 insulating layer; 112a linear scratch; 3' electrode layer; 31 first conductive portion; 32 second conductive portion; 4', 4" resistor layer; 5' insulating layer; 6' cover layer; 801 printing medium; 281 first portion; 282 second portion; 113f trench; 113g inner circumferential surface; 26 void; X sub scanning direction; Y main scanning direction; Z thickness direction; Za side; Zb side; Xa first side; Xb second side.

The invention claimed is:

1. A thermal print head comprising:
a base member;
a heat storage region formed on the base member;

a resistor layer formed on the base member;
an electrode layer formed on the base member and electrically connected to the resistor layer; and
a cover layer covering the resistor layer,
wherein the resistor layer includes a plurality of heating portions spanned between two portions of the electrode layer spaced from each other as viewed in a thickness direction of the base member,
a first groove segment is formed at least in the heat storage region, and
the first groove segment is located between two heating portions adjacent to each other in a main scanning direction among the plurality of heating portions.

2. The thermal print head according to claim 1, wherein the first groove segment is located so as to overlap with an entirety of one of the plurality of heating portion in a sub scanning direction.

3. The thermal print head according to claim 1, wherein the heat storage region includes a first groove sidewall constituting the first groove segment.

4. The thermal print head according to claim 3, wherein the first groove segment extends as far as the base member.

5. The thermal print head according to claim 3, wherein the first groove sidewall is exposed to an open space.

6. The thermal print head according to claim 1, wherein the first groove segment extends from the cover layer.

7. The thermal print head according to claim 1, wherein a part of the cover layer is formed in the first groove segment.

8. The thermal print head according to claim 1, wherein each of the plurality of heating portions includes a first side face and a second side face that are spaced from each other in the main scanning direction, and the first side face and the second side face are both covered with the cover layer.

9. The thermal print head according to claim 1, wherein the electrode layer includes an intermediate electrode connecting two heating portions adjacent to each other in the main scanning direction among the plurality of generators, a second groove segment is formed at least in the heat storage region, and the intermediate electrode is located between the second groove segment and the plurality of heating portions in a sub scanning direction.

10. The thermal print head according to claim 9, wherein the second groove extends in the main scanning direction.

11. The thermal print head according to claim 10, wherein the heat storage region includes a second groove sidewall constituting the second groove segment.

12. The thermal print head according to claim 11, wherein the second groove segment extends as far as the base member.

13. The thermal print head according to claim 11, wherein the second groove sidewall is exposed to an open space.

14. The thermal print head according to claim 9, wherein the second groove segment extends from the cover layer.

15. The thermal print head according to claim 9, wherein a part of the cover layer is formed in the second groove segment.

16. The thermal print head according to claim 9, wherein the second groove segment is continuous with the first groove segment.

17. The thermal print head according to claim 9, wherein a third groove segment is formed at least in the heat storage region, and the third groove segment is located between two heating portions connected to each other via the intermediate electrode among the plurality of heating portions.

18. The thermal print head according to claim 17, wherein the heat storage region includes a heat storage region surface oriented to a side opposite to the base member, the first groove segment is recessed from the heat storage region surface, and the second groove segment is recessed from the heat storage region surface.

19. The thermal print head according to claim 1, wherein the resistor layer is interposed between the electrode layer and the heat storage region.

20. The thermal print head according to claim 1, further comprising an insulating layer interposed between the resistor layer and the electrode layer, wherein the heat storage region includes a portion held in direct contact with the insulating layer.

21. The thermal print head according to claim 20, wherein the cover layer is in direct contact with the insulating layer.

22. The thermal print head according to claim 20, wherein the insulating layer is made of $SiO_2$ or $SiAlO_2$.

23. The thermal print head according to claim 1, wherein the base member is made of a semiconductor material.

24. The thermal print head according to claim 1, further comprising a circuit board, a plurality of wires, and a resin layer covering the circuit board, the plurality of wires, and the cover layer.

25. The thermal print head according to claim 24, wherein the cover layer includes a through window, the electrode layer includes a bonding portion exposed through the through window, and one of the plurality of wires is bonded to the bonding portion.

26. The thermal print head according to claim 24, wherein the resin layer is in direct contact with the cover layer.

27. The thermal print head according to claim 24, further including a driver IC that supplies a current to the electrode layer, wherein the driver IC is mounted on the circuit board.

28. The thermal print head according to claim 1, further comprising a driver IC that supplies a current to the electrode layer, wherein the driver IC is built in the base member.

29. The thermal print head according to claim 1, wherein the resistor layer is made of at least one of polysilicon, $TaSiO_2$, and TiON.

30. The thermal print head according to claim 1, wherein the electrode layer is made of at least one of Au, Ag, Cu, Cr, Al—Si, and Ti.

31. The thermal print head according to claim 1, further comprising a heat dissipation plate that supports the base member.

32. A thermal printer comprising:
a thermal print head according to claim 1; and
a platen roller facing the thermal print head.

* * * * *